US012677588B2

(12) United States Patent
Ahn et al.

(10) Patent No.: US 12,677,588 B2
(45) Date of Patent: Jul. 7, 2026

(54) LIGHT EMITTING DEVICE AND ORGANOMETALLIC COMPOUND FOR LIGHT EMITTING DEVICE

(71) Applicant: Samsung Display Co., Ltd., Yongin-si (KR)

(72) Inventors: Eunsoo Ahn, Jinju-si (KR); Soo-Byung Ko, Yongin-si (KR); Sungbum Kim, Yongin-si (KR); Eunyoung Lee, Sejong-si (KR); Jaesung Lee, Hwaseong-si (KR); Jinhee Ju, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1011 days.

(21) Appl. No.: 17/837,330

(22) Filed: Jun. 10, 2022

(65) Prior Publication Data

US 2023/0117263 A1 Apr. 20, 2023

(30) Foreign Application Priority Data

Aug. 6, 2021 (KR) ........................ 10-2021-0103940

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC ............. H01L 51/0077; H01L 51/0078; H01L 51/0079; H01L 51/008; H01L 51/0081;
(Continued)

(56) References Cited

U.S. PATENT DOCUMENTS 7,381,479 B2 6/2008 Lamansky et al.
7,393,599 B2 7/2008 Thompson et al.
(Continued)

FOREIGN PATENT DOCUMENTS

CN 104370974 2/2015
JP 2007-45742 2/2007
(Continued)

OTHER PUBLICATIONS

Li, Tian-Yi, et al. "N-heterocyclic carbenes: versatile second cyclometalated ligands for neutral iridium (III) heteroleptic complexes." Inorganic Chemistry 54.1 (2015): 161-173. (Year: 2015).*
(Continued)

*Primary Examiner* — Braelyn R Watson
(74) *Attorney, Agent, or Firm* — Womble Bond Dickinson (US) LLP

(57) ABSTRACT

A light emitting device of an embodiment includes a first electrode, a hole transport region disposed on the first electrode, an emission layer disposed on the hole transport region, an electron transport region disposed on the emission layer, and a second electrode disposed on the electron transport region, wherein the emission layer includes an organometallic compound represented by Formula 1, thereby showing long life and high efficiency.

20 Claims, 6 Drawing Sheets

(51) Int. Cl.

| | |
|---|---|
| ***C09K 11/06*** | (2006.01) |
| ***H10K 50/11*** | (2023.01) |
| ***H10K 101/00*** | (2023.01) |
| ***H10K 101/10*** | (2023.01) |

(52) U.S. Cl.

CPC .. *C07B 2200/05* (2013.01); *C09K 2211/1044* (2013.01); *C09K 2211/185* (2013.01); *H10K 50/11* (2023.02); *H10K 2101/10* (2023.02); *H10K 2101/90* (2023.02)

(58) Field of Classification Search

CPC ............. H01L 51/0082; H01L 51/0083; H01L 51/0084; H01L 51/0085; H01L 51/0086; H01L 51/0087; H01L 51/0088; H01L 51/0089; H01L 51/0091; H01L 51/0092; H10K 85/30–351; H10K 85/371; H10K 85/381; C09K 11/06; C09K 2211/182–188; C07F 5/00; C07F 5/003; C07F 5/06–069; C07F 7/00; C07F 7/003; C07F 7/22–28; C07F 9/00; C07F 9/005

See application file for complete search history.

(56) References Cited

U.S. PATENT DOCUMENTS

| | | | | |
|---|---|---|---|---|
| 7,585,573 | B2 | 9/2009 | Lee et al. | |
| 7,776,458 | B2 | 8/2010 | Ragini et al. | |
| 8,106,199 | B2 | 1/2012 | Jabbour et al. | |
| 8,389,725 | B2 | 3/2013 | Li et al. | |
| 8,669,364 | B2 | 3/2014 | Li et al. | |
| 8,680,760 | B2 | 3/2014 | Cheng et al. | |
| 8,816,080 | B2 | 8/2014 | Li et al. | |
| 8,846,940 | B2 | 9/2014 | Li et al. | |
| 8,946,417 | B2 | 2/2015 | Jian et al. | |
| 9,051,344 | B2 | 6/2015 | Lin et al. | |
| 9,076,974 | B2 | 7/2015 | Li et al. | |
| 9,203,039 | B2 | 12/2015 | Li et al. | |
| 9,221,857 | B2 | 12/2015 | Li et al. | |
| 9,224,963 | B2 | 12/2015 | Li et al. | |
| 9,238,668 | B2 | 1/2016 | Li et al. | |
| 9,312,502 | B2 | 4/2016 | Li et al. | |
| 9,324,957 | B2 | 4/2016 | Li et al. | |
| 9,382,273 | B2 | 7/2016 | Li et al. | |
| 9,425,415 | B2 | 8/2016 | Li et al. | |
| 9,698,359 | B2 | 7/2017 | Li et al. | |
| 9,899,614 | B2 | 2/2018 | Li et al. | |
| 9,972,793 | B2 | 5/2018 | Wu et al. | |
| 11,844,266 | B2 | 12/2023 | Min et al. | |
| 2005/0287394 | A1 | 12/2005 | Yang et al. | |
| 2005/0287396 | A1* | 12/2005 | Nakamura ........... | H10K 85/342 428/917 |
| 2008/0018221 | A1 | 1/2008 | Egen et al. | |
| 2014/0309428 | A1 | 10/2014 | Egen et al. | |
| 2015/0105556 | A1* | 4/2015 | Li .......................... | C09K 11/06 546/4 |
| 2015/0171348 | A1* | 6/2015 | Stoessel ............... | H10K 85/346 252/301.16 |
| 2017/0271611 | A1* | 9/2017 | Li ........................ | H10K 50/121 |
| 2019/0288223 | A1 | 9/2019 | Sim et al. | |
| 2020/0199164 | A1 | 6/2020 | Kim et al. | |
| 2020/0354393 | A1 | 11/2020 | Bae et al. | |
| 2020/0395560 | A1 | 12/2020 | Bae et al. | |

FOREIGN PATENT DOCUMENTS

| | | |
|---|---|---|
| KR | 10-0730115 | 6/2007 |
| KR | 10-2015-0043225 A | 4/2015 |
| KR | 10-2019-0108223 A | 9/2019 |
| KR | 10-2020-0076583 | 6/2020 |
| KR | 10-2020-0095395 A | 8/2020 |
| KR | 10-2020-0129965 | 11/2020 |
| KR | 10-2020-0143234 A | 12/2020 |
| KR | 10-2020-0143237 | 12/2020 |
| WO | 2012/121936 | 9/2012 |

OTHER PUBLICATIONS

Fleetham, Tyler, et al. "Efficient" pure "blue OLEDs employing tetradentate Pt complexes with a narrow spectral bandwidth." Advanced Materials (Deerfield Beach, Fla.) 26.41 (2014): 7116-7121. (Year: 2014).*

* cited by examiner

LIGHT EMITTING DEVICE AND ORGANOMETALLIC COMPOUND FOR LIGHT EMITTING DEVICE

CROSS-REFERENCE TO RELATED APPLICATION(S)

This application claims priority to and benefits of Korean Patent Application No. 10-2021-0103940 under 35 U.S.C. § 119, filed on Aug. 6, 2021 in the Korean Intellectual Property Office, the entire contents of which are incorporated herein by reference.

BACKGROUND

1. Technical Field

The disclosure herein relates to a light emitting device and an organometallic compound for a light emitting device.

2. Description of the Related Art

Active development continues for an organic electroluminescence display as an image display. The organic electroluminescence display is different from a liquid crystal display and is a so-called self-luminescent display in which holes and electrons respectively injected from a first electrode and a second electrode recombine in an emission layer so that a light emitting material including an organic compound in the emission layer emits light to achieve display.

In the application of an organic electroluminescence device to an image display, there is a demand for decreasing driving voltage increasing emission efficiency, and increasing the life of the organic electroluminescence device, and continuous development is required on materials for an organic electroluminescence device which is capable of stably achieving such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an organometallic compound having excellent emission efficiency and long-life characteristics.

The disclosure also provides a light emitting device having high efficiency and long-life characteristics by including an organometallic compound in an emission layer.

An embodiment provides a light emitting device which may include a first electrode, a hole transport region disposed on the first electrode, an emission layer disposed on the hole transport region, an electron transport region disposed on the emission layer, and a second electrode disposed on the electron transport region, wherein the emission layer may include an organometallic compound represented by Formula 1.

[Formula 1]

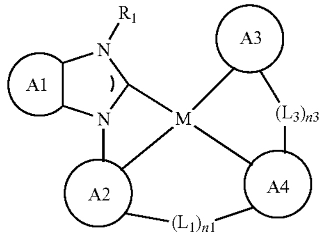

In Formula 1, M may be Pt, Pd, Cu, Ag, Au, Rh, Ir, Ru, or Os, rings A1, A2, and A3 may each independently be a substituted or unsubstituted hydrocarbon ring group of 5 to 60 ring-forming carbon atoms, or a substituted or unsubstituted heterocyclic group of 1 to 60 ring-forming carbon atoms, $L_1$ and $L_3$ may each independently be a direct linkage, *—O—*', *—S—*', *—C($R_{a1}$)($R_{a2}$)—', *—C($R_{a3}$)=*', *=C($R_{a4}$)—', *—C($R_{a5}$)=C($R_{a6}$)—*', *—C(=O)—*', *—C(=S)—*', *—B($R_{a7}$)—*', *—N($R_{a8}$)—*', *—P($R_{a9}$)—*', *—Si($R_{a10}$)($R_{a11}$)—*', *—P($R_{a12}$)($R_{a13}$)—*', or *—Ge($R_{a14}$)($R_{a15}$)—*', where * and *' are each a bonding site, $R_1$, and $R_{a1}$ to $R_{a15}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n1 and n3 may each independently be 0 or 1, and ring A4 may be a group represented by any one of Formula 2-1 to Formula 2-3.

[Formula 2-1]

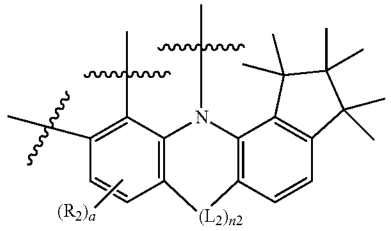

[Formula 2-2]

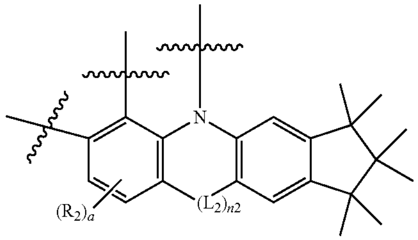

[Formula 2-3]

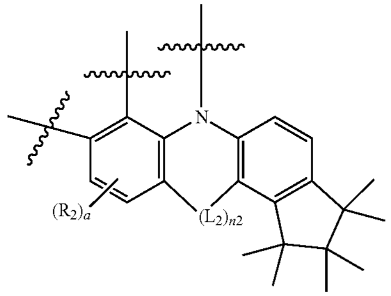

In Formula 2-1 to Formula 2-3,

is a bonding site, $L_2$ may be a direct linkage, *—O—*', *—S—*', *—C($R_{a1'}$)($R_{a2'}$)—*', *—C($R_{a3'}$)═*', *═C($R_{a4'}$)—*', *—C($R_{a5'}$)═C($R_{a6'}$)—*', *—C(═O)—*', *—C(═S)—*', *—C≡C—*', *—B($R_{a7'}$)—*', *—N($R_{a8'}$)—*', *—P($R_{a9'}$)—*', *—Si($R_{a10'}$)($R_{a11'}$)—*', *—P($R_{a12'}$)($R_{a13'}$)—*', or *—Ge($R_{a14'}$)($R_{a15'}$)—*', where * and *' are each a bonding site, $R_2$, and $R_{a1'}$ to $R_{a15'}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, a may be an integer from 0 to 2, and n2 may be 0 or 1.

In an embodiment, the emission layer may emit phosphorescence.

In an embodiment, the emission layer may include a host and a dopant, and the dopant may include the organometallic compound represented by Formula 1.

In an embodiment, the emission layer may include a host, a dopant, and a sensitizer, and the sensitizer may include the organometallic compound represented by Formula 1.

In an embodiment, ring A2 may be a group represented by any one of Formula A-1 to Formula A-3.

[Formula A-1]

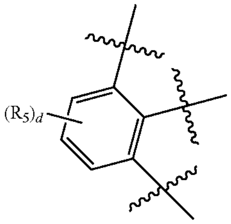

[Formula A-2]

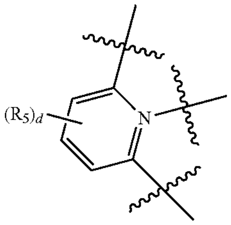

[Formula A-3]

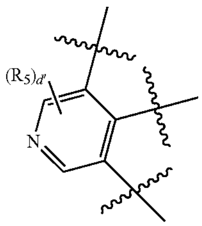

In Formula A-1 to Formula A-3,

is a bonding site, $R_5$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, d may be an integer from 0 to 3, and d' may be an integer from 0 to 2.

In an embodiment, ring A3 may be a group represented by any one of Formula B-1 to Formula B-4.

[Formula B-1]

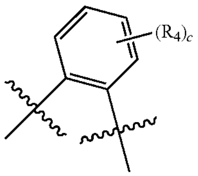

[Formula B-2]

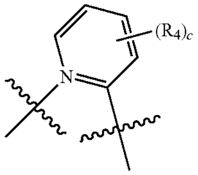

[Formula B-3]

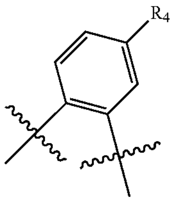

[Formula B-4]

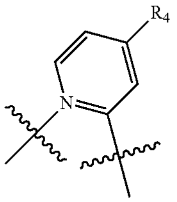

In Formula B-1 to Formula B-4,

is a bonding site, $R_4$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and c may be an integer from 0 to 4.

In an embodiment, the organometallic compound represented by Formula 1 may be represented by Formula 3.

[Formula 3]

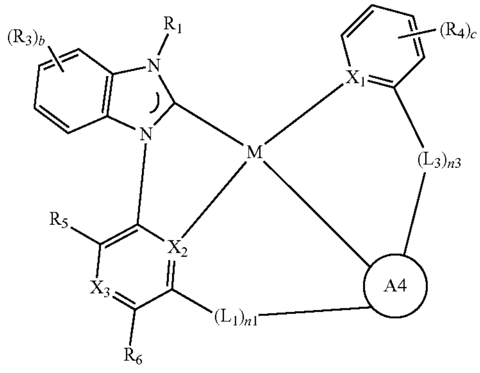

In Formula 3, $X_1$ to $X_3$ may each independently be N or $C(R_b)$, $X_1$ or $X_2$ may be N, $R_3$ to $R_6$ and $R_b$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and b and c may each independently be an integer from 0 to 4.

In Formula 3, M, ring A4, $L_1$, $L_3$, n1, n3, and $R_1$ are the same as defined in Formula 1.

In an embodiment, the organometallic compound represented by Formula 3 may be represented by Formula 4.

[Formula 4]

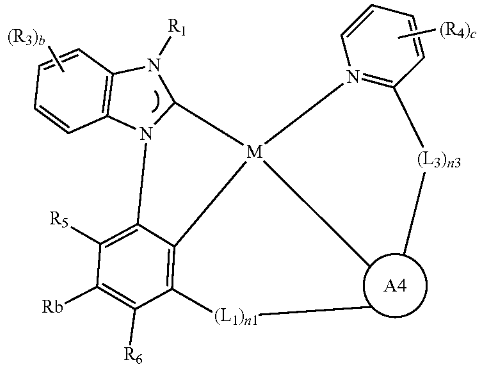

In Formula 4, M, ring A4, $L_1$, $L_3$, n1, n3, b, c, $R_1$, $R_3$ to $R_6$, and $R_b$ are the same as defined in Formula 3.

In an embodiment, $R_5$ and $R_6$ may each be a hydrogen atom, and $R_b$ may be a substituted or unsubstituted alkyl group of 1 to 20 carbon atoms.

In an embodiment, the organometallic compound represented by Formula 3 may be represented by Formula 5.

[Formula 5]

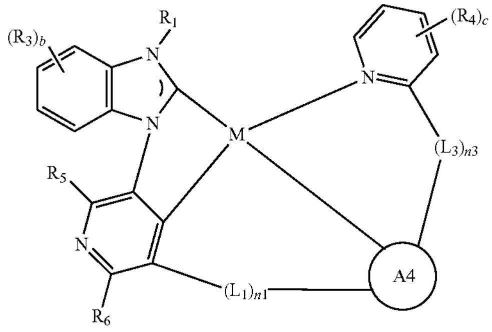

In Formula 5, M, ring A4, $L_1$, $L_3$, n1, n3, b, c, $R_1$, and $R_3$ to $R_6$ are the same as defined in Formula 3.

In an embodiment, the organometallic compound represented by Formula 3 may be represented by Formula 6.

[Formula 6]

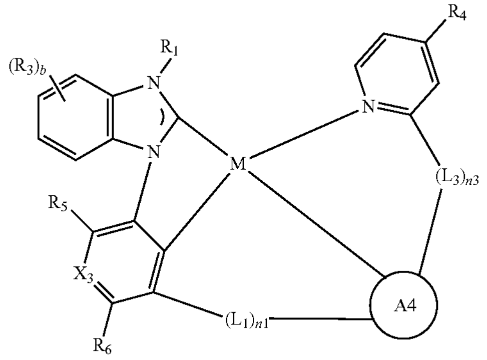

In Formula 6, $R_4$ may be a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 6, M, ring A4, $L_1$, $L_3$, n1, n3, b, $X_3$, $R_1$, $R_3$, $R_5$, and $R_6$ are the same as defined in Formula 3.

In an embodiment, the organometallic compound represented by Formula 3 may be represented by any one of Formula 7-1 to Formula 7-3.

[Formula 7-1]

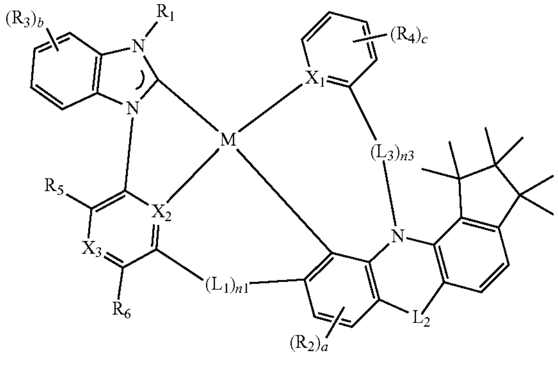

-continued

[Formula 7-2]

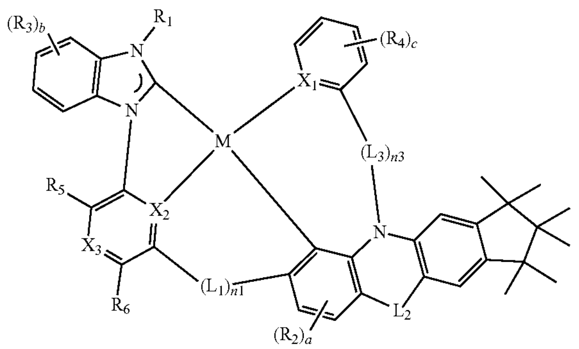

[Formula 7-3]

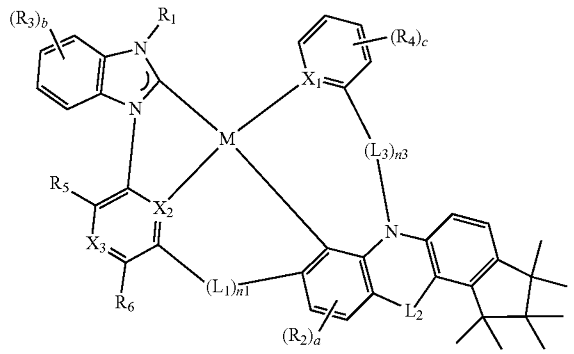

In Formula 7-1 to Formula 7-3, $L_2$ may be a direct linkage, *—O—*', or *—$C(R_{a1'})(R_{a2'})$—*', where * and *' are each a bonding site, $R_2$, $R_{a1'}$, and $R_{a2'}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and a may be an integer from 0 to 2.

In Formula 7-1 to Formula 7-3, M, $L_1$, $L_3$, n1, n3, b, c, $R_1$, and $R_3$ to $R_6$ are the same as defined in Formula 3.

In an embodiment, the organometallic compound represented by Formula 1 may be at least one selected from Compound Group 1, which is explained below.

An organometallic compound according to an embodiment may be represented by Formula 1.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
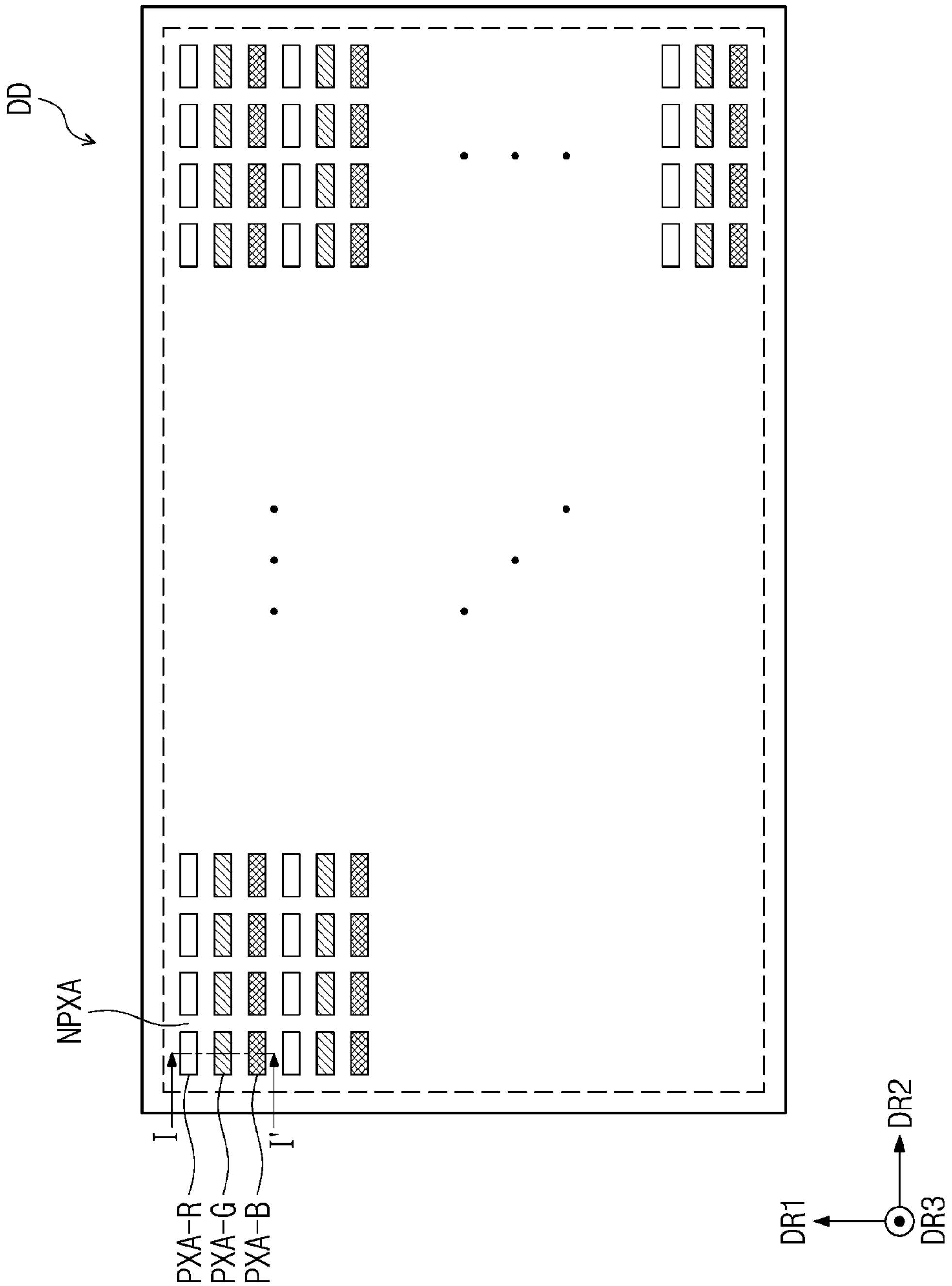
FIG. 1 is a plan view of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification, the term "substituted or unsubstituted" may mean a group that is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may itself be substituted or unsubstituted. For example, a biphenyl group may be interpreted as an aryl group, or may be interpreted as a phenyl group substituted with a phenyl group.

In the specification, the term "combined with an adjacent group to form a ring" may mean a group that is combined with an adjacent group to form a substituted or unsubstituted hydrocarbon ring or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring that is formed by the combination of adjacent groups may itself be combined with another ring to form a spiro structure.

In the specification, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. For example, in 4,5-dimethylphenanthrene, two methyl groups may be interpreted as "adjacent groups" to each other.

In the specification, examples of a halogen atom may include a fluorine atom, a chlorine atom, a bromine atom, or an iodine atom.

In the specification, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the specification, a hydrocarbon ring group may be an aliphatic hydrocarbon ring group or an aromatic hydrocarbon ring group. The aromatic hydrocarbon ring group may be an aryl group. The aliphatic hydrocarbon ring and the aromatic hydrocarbon ring may each independently be monocyclic or polycyclic.

In the specification, an aliphatic hydrocarbon ring group may be any functional group or substituent derived from a saturated hydrocarbon ring of 5 to 20 ring-forming carbon atoms.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the specification, a fluorenyl group may be substituted, and two substituents may be combined with each other to form a spiro structure. Examples of substituted fluorenyl groups are as follows, but embodiments are not limited thereto.

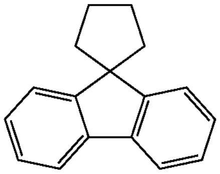

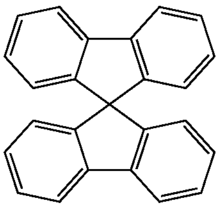

-continued

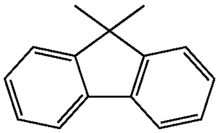

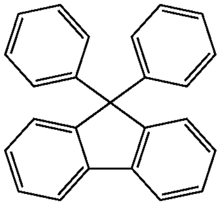

In the specification, a heterocyclic group may be any functional group or substituent derived from a ring including one or more of B, O, N, P, Si, or S as heteroatoms. The heterocyclic group may be an aliphatic heterocyclic group or an aromatic heterocyclic group. The aromatic heterocyclic group may be a heteroaryl group. The aliphatic heterocyclic group and the aromatic heterocyclic group may each independently be monocyclic or polycyclic.

In the specification, a heterocyclic group may include one or more of B, O, N, P, Si, or S as heteroatoms. If the heterocyclic group includes two or more heteroatoms, the two or more heteroatoms may be the same as or different from each other. The heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 20, or 2 to 10.

In the specification, an aliphatic heterocyclic group may include one or more of B, O, N, P, Si, or S as heteroatoms. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the specification, a heteroaryl group may include one or more B, O, N, P, Si, or S as heteroatoms. If the heteroaryl group includes two or more heteroatoms, two or more heteroatoms may be the same as or different from each other. The heteroaryl group may be a monocyclic heterocyclic group or polycyclic heterocyclic group. The number of ring-forming carbon atoms in the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the specification, the above explanation on the aryl group may be applied to an arylene group, except that the arylene group is a divalent group. The above explanation on the heteroaryl group may be applied to a heteroarylene group, except that the heteroarylene group is a divalent group.

In the specification, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the specification, the number of carbon atoms in an amino group is not specifically limited, but may be 1 to 30. The amino group may be an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

In the specification, a thio group may be an alkyl thio group or an aryl thio group. The thio group may be a sulfur atom that is combined with an alkyl group or an aryl group as described above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the specification, an alkenyl group may be a linear chain or a branched chain. The number of carbon atoms in the alkynyl group is not specifically limited, but may be 2 to 30, 2 to 20, or 2 to 10. Examples of the alkynyl group may include a vinyl group, a 1-butenyl group, a 1-pentenyl group, a 1,3-butadienyl aryl group, a styrenyl group, a styrylvinyl group, etc., without limitation.

In the specification, the number of carbon atoms in an amine group is not specifically limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the specification, an alkyl group in an alkylthio group, an alkylsulfoxy group, an alkylaryl group, an alkylamino group, an alkylboron group, an alkyl silyl group, or an alkyl amine group may be the same as the examples of the above-described alkyl group.

In the specification, an aryl group in an aryloxy group, an arylthio group, an arylsulfoxy group, an aryl amino group, an arylboron group, an aryl silyl group, or an aryl amine group may be the same as the examples of the above-described aryl group.

In the specification, a direct linkage may be a single bond.

In the specification, ——* and

each represent a bonding site to a neighboring atom.

Hereinafter, embodiments will be explained with reference to the drawings.

Figure 2:
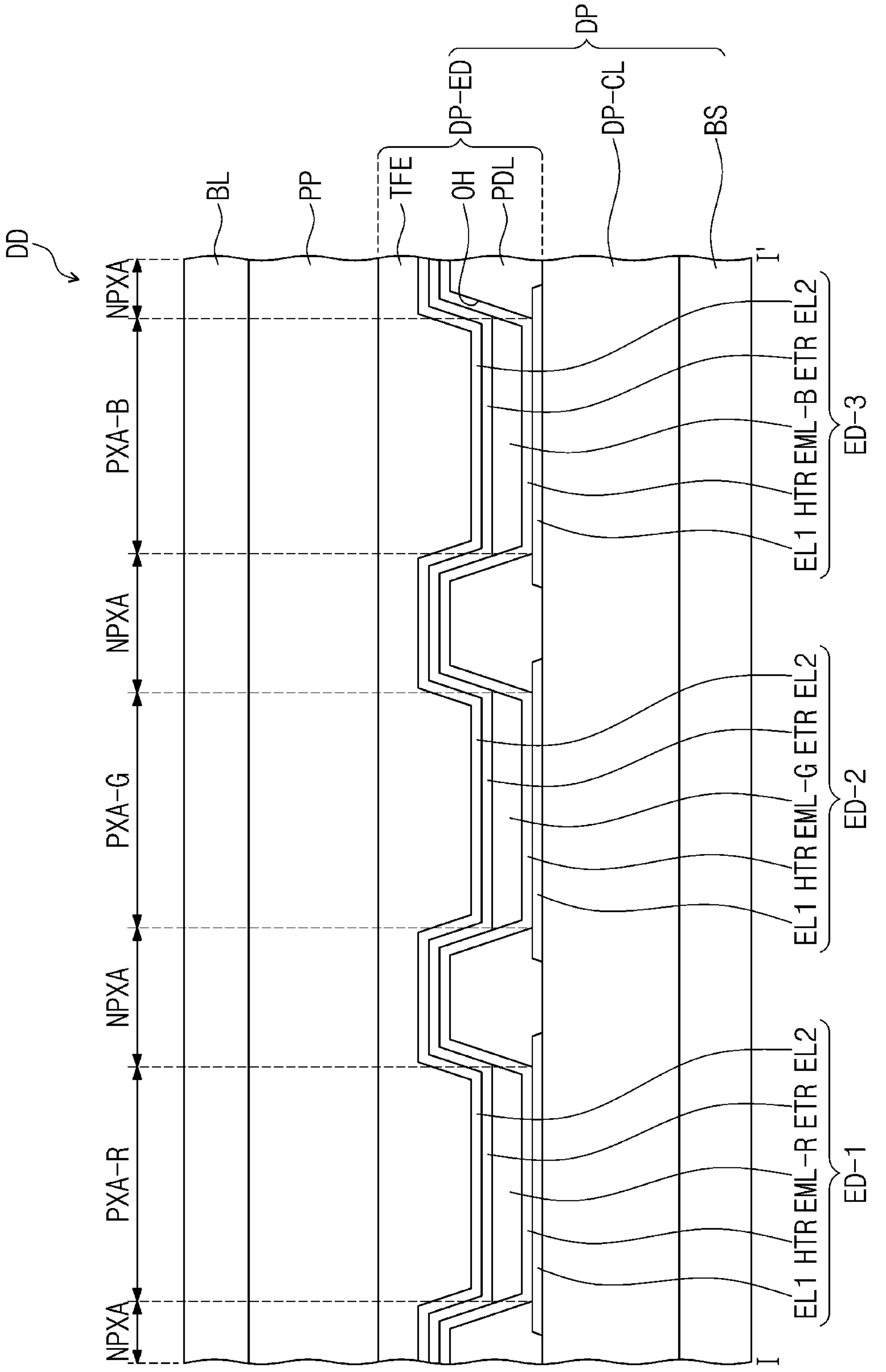
FIG. 2 is a schematic cross-sectional view of a display apparatus according to an embodiment.

FIG. 1 is a plan view showing an embodiment of a display apparatus DD. FIG. 2 is a schematic cross-sectional view of a display apparatus DD of an embodiment. FIG. 2 is a schematic cross-sectional view showing a part corresponding to line I-I' in FIG. 1.

The display apparatus DD may include a display panel DP and an optical layer PP disposed on the display panel DP. The display panel DP includes light emitting devices ED-1, ED-2, and ED-3. The display apparatus DD may include multiples of each of the light emitting devices ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

A base substrate BL may be disposed on the optical layer PP. The base substrate BL may provide a base surface where the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one of an acrylic resin, a silicon-based resin, or an epoxy-based resin.

The display panel DP may include a base layer BS, a circuit layer DP-CL provided on the base layer BS, and a display device layer DP-ED. The display device layer DP-ED may include a pixel definition layer PDL, light emitting devices ED-1, ED-2, and ED-3 disposed in the pixel definition layer PDL, and an encapsulating layer TFE disposed on the light emitting devices ED-1, ED-2, and ED-3.

The base layer BS may provide a base surface where the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include switching transistors and driving transistors for driving the light emitting devices ED-1, ED-2, and ED-3 of the display device layer DP-ED.

Each of the light emitting devices ED-1, ED-2, and ED-3 may have a structure of a light emitting device ED of an embodiment according to FIG. 3 to FIG. 6, which will be explained later. Each of the light emitting devices ED-1, ED-2, and ED-3 may include a first electrode EL1, a hole transport region HTR, emission layers EML-R, EML-G, and EML-B, an electron transport region ETR, and a second electrode EL2.

FIG. 2 shows an embodiment where the emission layers EML-R, EML-G, and EML-B of light emitting devices ED-1, ED-2, and ED-3 are disposed in openings OH defined in a pixel definition layer PDL, and a hole transport region HTR, an electron transport region ETR, and a second electrode EL2 are each provided as common layers in all light emitting devices ED-1, ED-2, and ED-3. However, embodiments are not limited thereto. Although not shown in FIG. 2, in an embodiment, the hole transport region HTR and the electron transport region ETR may each be patterned and provided in the openings OH defined in the pixel definition layer PDL. For example, in an embodiment, the hole transport region HTR, the emission layers EML-R, EML-G, and EML-B, and the electron transport region ETR of the light emitting devices ED-1, ED-2, and ED-3 may be patterned by an ink jet printing method and provided.

An encapsulating layer TFE may cover the light emitting devices ED-1, ED-2, and ED-3. The encapsulating layer TFE may encapsulate the display device layer DP-ED. The encapsulating layer TFE may be a thin film encapsulating layer. The encapsulating layer TFE may be a single layer or a stack of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed to fill the openings OH.

Referring to FIG. 1 and FIG. 2, the display apparatus DD may include non-luminous areas NPXA and luminous areas PXA-R, PXA-G, and PXA-B. The luminous areas PXA-R, PXA-G, and PXA-B may be areas emitting light produced from the light emitting devices ED-1, ED-2, and ED-3, respectively. The luminous areas PXA-R, PXA-G, and PXA-B may be separated from each other on a plane.

The luminous areas PXA-R, PXA-G, and PXA-B may be areas separated by the pixel definition layer PDL. The non-luminous areas NPXA may be areas between neighboring luminous areas PXA-R, PXA-G, and PXA-B and may correspond to the pixel definition layer PDL. For example, in an embodiment, each of the luminous areas PXA-R, PXA-G, and PXA-B may correspond to a pixel. The pixel definition layer PDL may separate the light emitting devices ED-1, ED-2, and ED-3. The emission layers EML-R, EML-G and EML-B of the light emitting devices ED-1, ED-2, and ED-3 may be disposed in the openings OH defined in the pixel definition layer PDL and separated from each other.

The luminous areas PXA-R, PXA-G, and PXA-B may be divided into groups according to the color of light produced from each of the light emitting devices ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, the light emitting devices ED-1, ED-2, and ED-3 may each emit light having different wavelength regions. For example, in an embodiment, the display apparatus DD may include a first light emitting device ED-1 emitting red light, a second light emitting device ED-2 emitting green light, and a third light emitting device ED-3 emitting blue light. For example, each of the red luminous area PXA-R, the green luminous area PXA-G, and the blue luminous area PXA-B of the display apparatus DD may respectively correspond to the first light emitting device ED-1, the second light emitting device ED-2, and the third light emitting device ED-3.

However, embodiments are not limited thereto, and the first to third light emitting devices ED-1, ED-2, and ED-3 may emit light in a same wavelength region, or at least one thereof may emit light in a different wavelength region. For example, all of the first to third light emitting devices ED-1, ED-2, and ED-3 may emit blue light.

The luminous areas PXA-R, PXA-G, and PXA-B in the display apparatus DD according to an embodiment may be arranged in a stripe configuration. Referring to FIG. 1, the red luminous areas PXA-R, the green luminous areas PXA-G, and the blue luminous areas PXA-B may be arranged along a second directional axis DR2. In another embodiment, the red luminous area PXA-R, the green luminous area PXA-G, and the blue luminous area PXA-B may be arranged by turns along a first directional axis DR1.

In FIG. 1 and FIG. 2, the areas of the luminous areas PXA-R, PXA-G, and PXA-B are shown as being similar to one another, but embodiments are not limited thereto. The areas of the luminous areas PXA-R, PXA-G, and PXA-B may be different from each other according to a wavelength region of light emitted. The areas of the luminous areas PXA-R, PXA-G, and PXA-B may be areas in a plan view that are defined by the first directional axis DR1 and the second directional axis DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the display quality characteristics which are required for the display apparatus DD. For example, the arrangement type of the luminous areas PXA-R, PXA-G, and PXA-B may be a PENTILE™ arrangement type, or a diamond arrangement type.

In an embodiment, the areas of the luminous areas PXA-R, PXA-G, and PXA-B may be different in size from each other. For example, in an embodiment, an area of the green luminous area PXA-G may be smaller than an area of the blue luminous area PXA-B, but embodiments are not limited thereto.

Hereinafter, FIG. 3 to FIG. 6 are each a schematic cross-sectional view of at least a portion along a line I-I' of FIG. 1 showing a light emitting device according to embodiments. The light emitting device ED according to an embodiment may include a first electrode EL1, a hole transport region HTR, an emission layer EML, an electron transport region ETR, and a second electrode EL2 stacked in that order.

Figure 3:
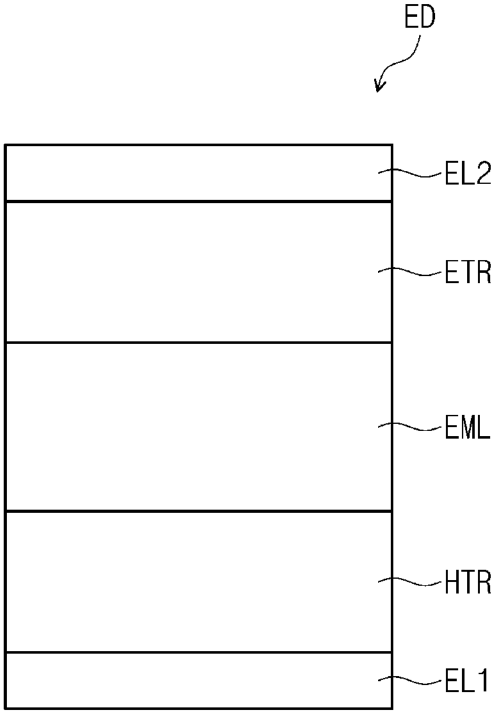
FIG. 3 is a schematic cross-sectional view showing a light emitting device according to an embodiment.
Figure 4:
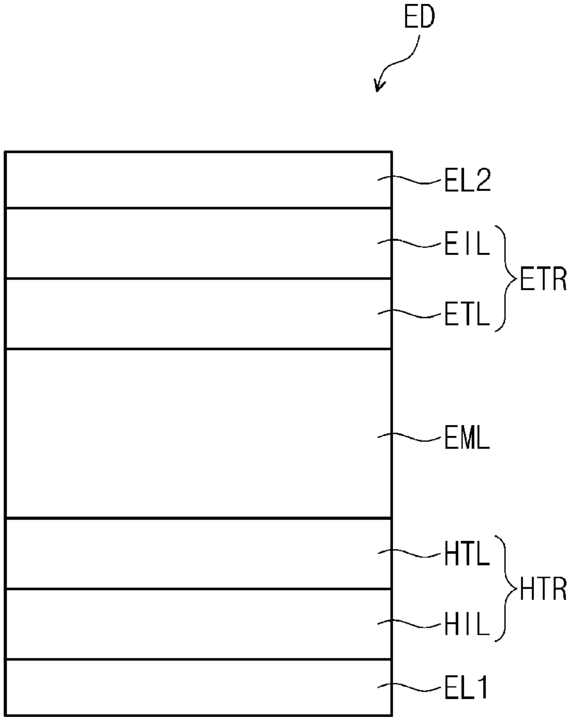
FIG. 4 is a schematic cross-sectional view showing a light emitting device according to an embodiment.
Figure 5:
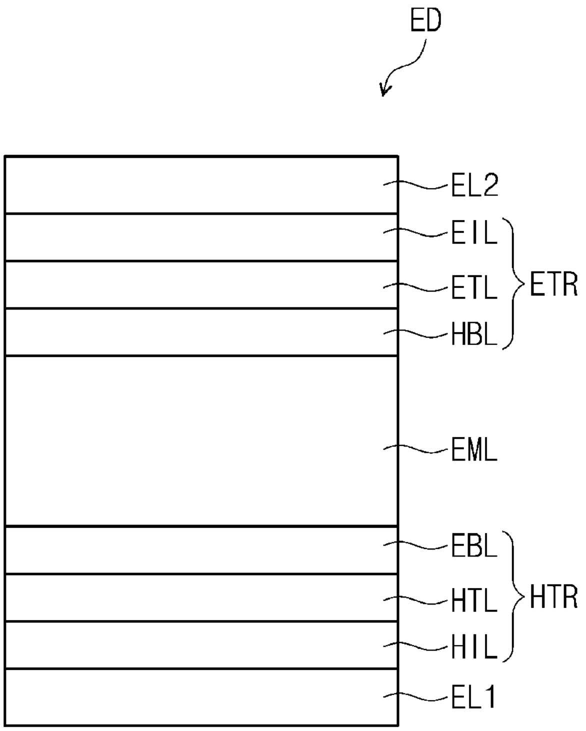
FIG. 5 is a schematic cross-sectional view showing a light emitting device according to an embodiment.
Figure 6:
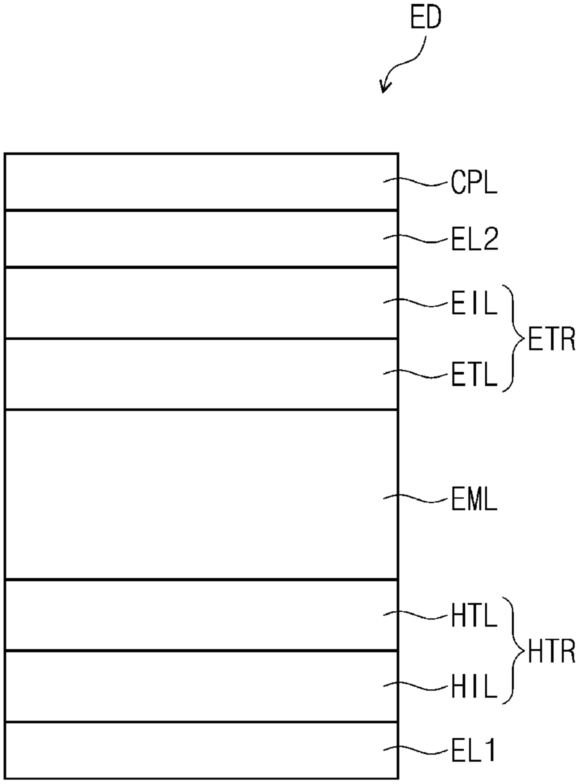
FIG. 6 is a schematic cross-sectional view showing a light emitting device according to an embodiment.

In comparison to FIG. 3, FIG. 4 shows a schematic cross-sectional view of a light emitting device ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of a light emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of a light emitting device ED of an embodiment that includes a capping layer CPL disposed on the second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In another embodiment, the first electrode EL1 may have a structure including multiple layers including a reflective layer or a transflective layer formed of the above materials, and a transmissive conductive layer formed of ITO, IZO, ZnO, or ITZO. For example, the first electrode EL1 may include a three-layer structure of ITO/Ag/ITO. However, embodiments are not limited thereto. The first electrode EL1 may include the above-described metal materials, combinations of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission auxiliary layer (not shown), or an electron blocking layer EBL. A thickness of the hole transport region HTR may be in a range of about 50 Å to about 15,000 Å.

The hole transport region HTR may be a layer formed of a single material, a layer formed of different materials, or a multilayer structure including layers formed of different materials.

For example, the hole transport region HTR may have the structure of a single layer of a hole injection layer HIL or a hole transport layer HTL, or may have a structure of a single layer formed of a hole injection material and a hole transport material. In other embodiments, the hole transport region HTR may have a structure of a single layer formed of different materials, or may have a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL, are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1.

[Formula H-1]

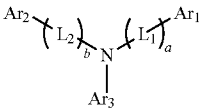

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, a and b may each independently be an integer from 0 to 10. If a or b is 2 or more, multiple $L_1$ groups and multiple $L_2$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

In an embodiment, the compound represented by Formula H-1 may be a monoamine compound. In another embodiment, the compound represented by Formula H-1 may be a diamine compound in which at least one of $Ar_1$ to $Ar_3$ includes an amine group as a substituent. In still another embodiment, the compound represented by Formula H-1 may be a carbazole-based compound in which at least one of $Ar_1$ to $Ar_3$ includes a substituted or unsubstituted carbazole group, or a fluorene-based compound in which at least one of $Ar_1$ to $Ar_3$ includes a substituted or unsubstituted fluorene group.

The compound represented by Formula H-1 may be any one selected from Compound Group H. However, the compounds shown in Compound Group H are only examples, and the compound represented by Formula H-1 is not limited to the compounds listed in Compound Group H.

[Compound Group H]

H-1-1

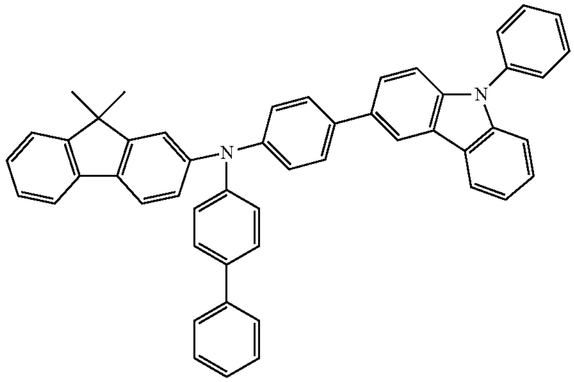

-continued

H-1-2

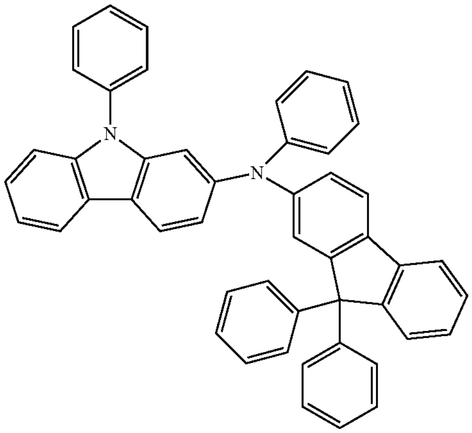

H-1-3

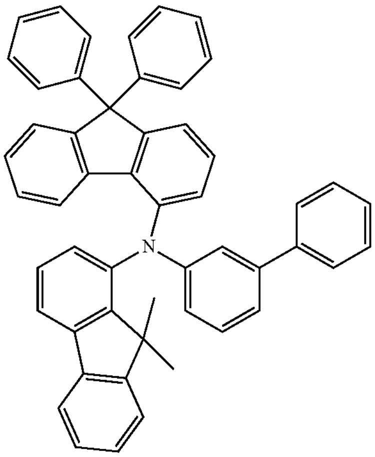

H-1-4

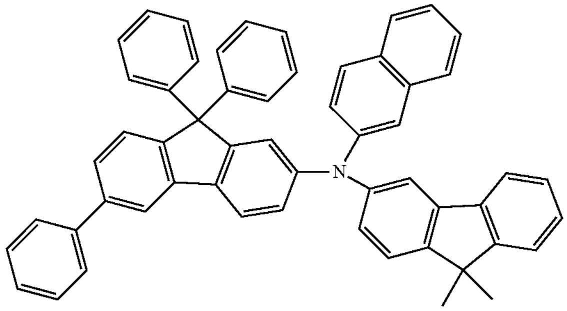

H-1-5

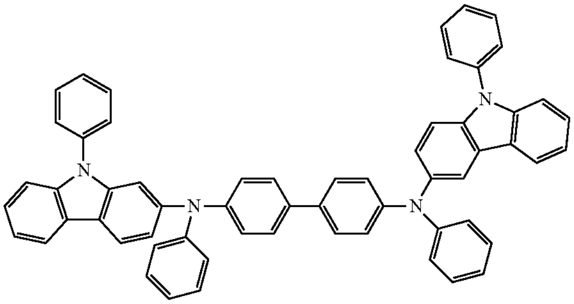

-continued
H-1-6
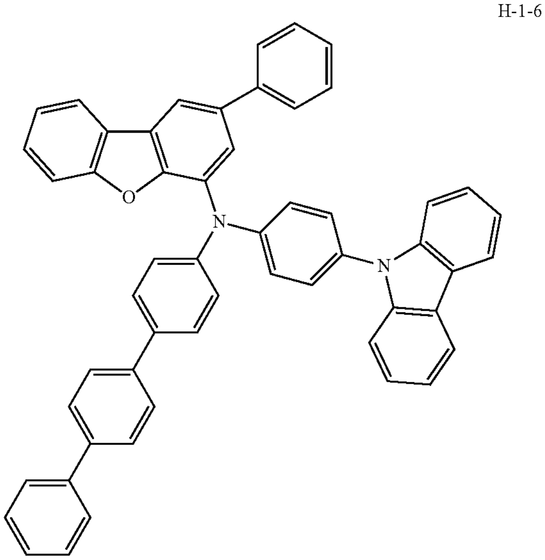
H-1-7
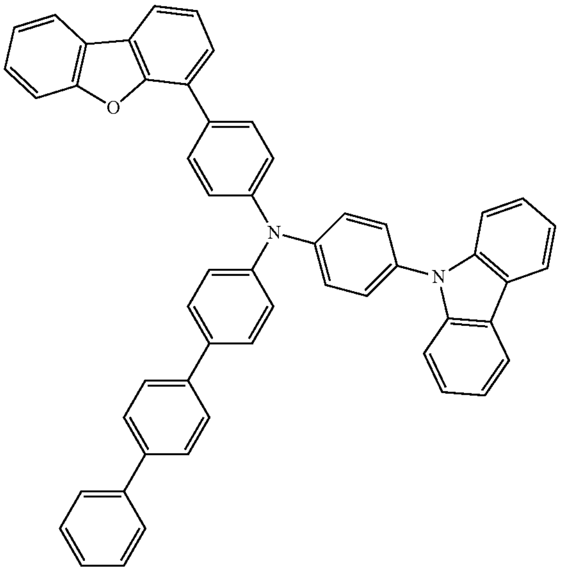
H-1-8
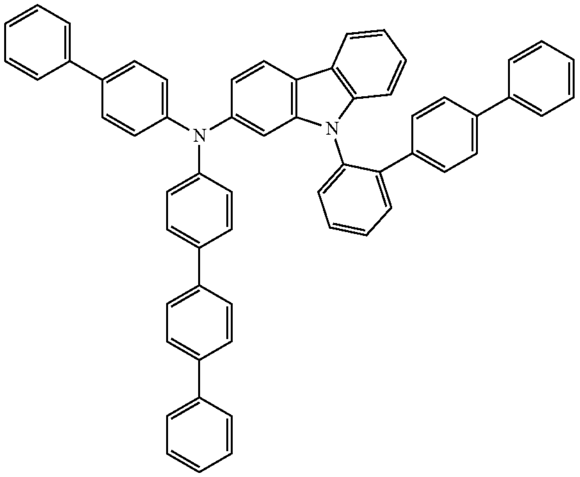
-continued
H-1-9
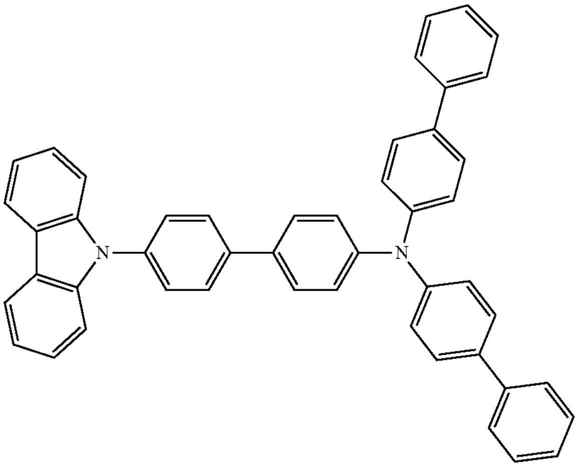
H-1-10
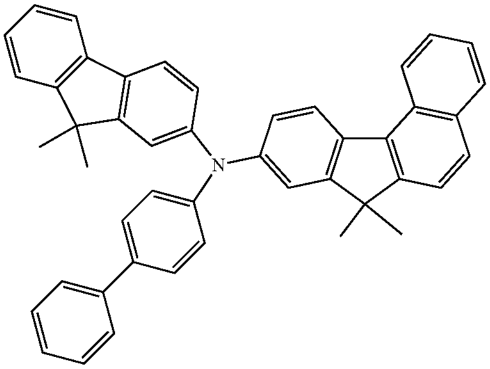
H-1-11
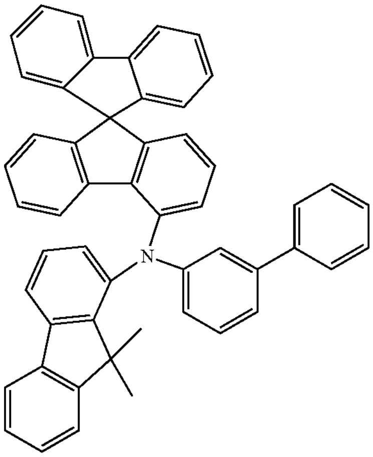

-continued
H-1-12
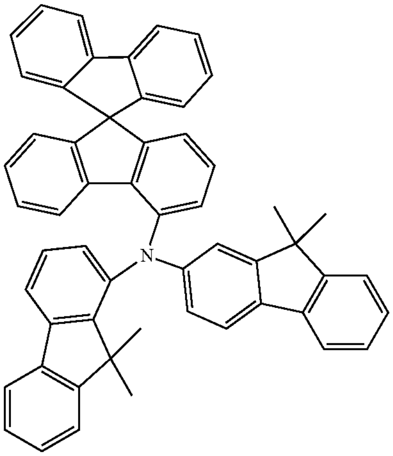
H-1-13
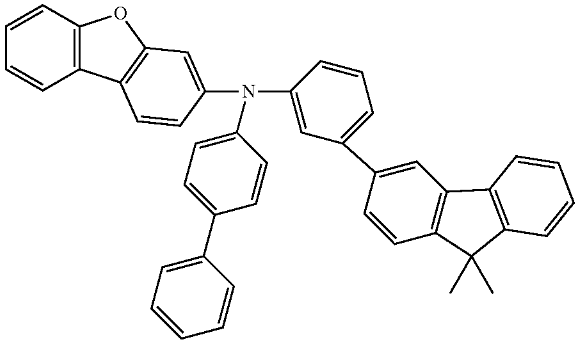
H-1-14
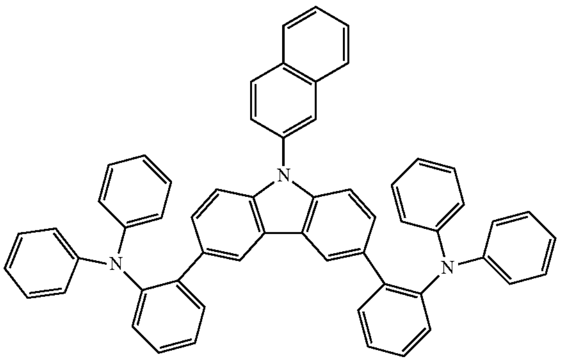
-continued
H-1-15
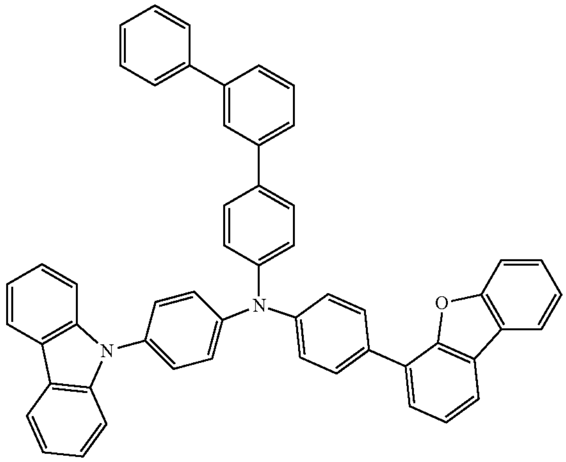
H-1-16
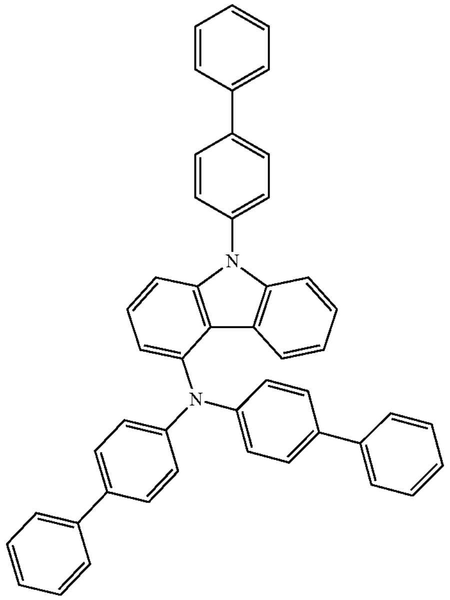
H-1-17
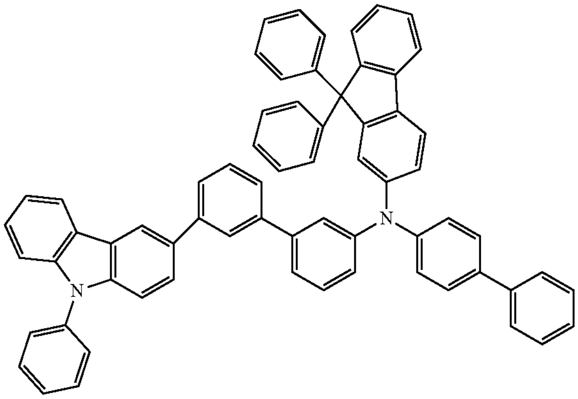

-continued

H-1-18

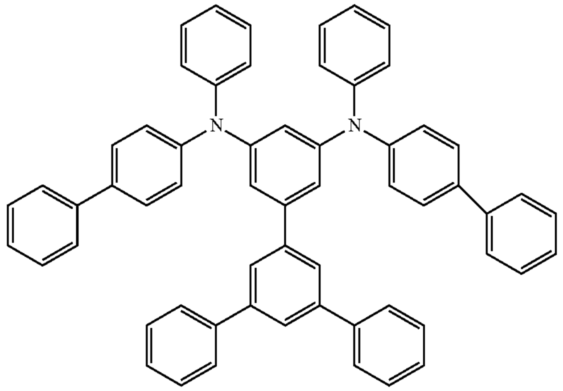

H-1-19

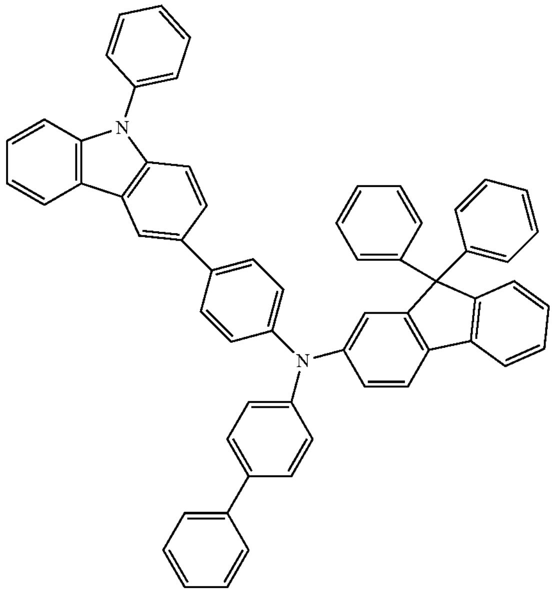

The hole transport region HTR may include a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h]quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine](TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of the hole injection layer HIL, the hole transport layer HTL, or the electron blocking layer EBL.

A thickness of the hole transport region HTR may be in a range of about 100 Å to about 10,000 Å. For example, the thickness of the hole transport region HTR may be in a range of about 100 Å to about 5,000 Å. In case where the hole transport region HTR includes a hole injection layer HIL, a thickness of the hole injection region HIL may be, for example, in a range of about 30 Å to about 1,000 Å. In case where the hole transport region HTR includes a hole transport layer HTL, thickness of the hole transport layer HTL may be in a range of about 30 Å to about 1,000 Å. In case where the hole transport region HTR includes an electron blocking layer, a thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase of driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of metal halide compounds, quinone derivatives, metal oxides, and cyano group-containing compounds, without limitation. For example, the p-dopant may include metal halide compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, cyano group-containing compounds such as dipyrazino[2,3-f: 2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NPD9), etc., without limitation.

As described above, the hole transport region HTR may further include at least one of a buffer layer (not shown) or an electron blocking layer EBL, in addition to the hole injection layer HIL and the hole transport layer HTL. The buffer layer (not shown) may increase emission efficiency by compensating for a resonance distance according to a wavelength of light emitted from an emission layer EML. As materials included in the buffer layer (not shown), materials which may be included in the hole transport region HTR may be used. The electron blocking layer EBL may block the injection of electrons from an electron transport region ETR to a hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

In a light emitting device ED of an embodiment, the emission layer EML may include an organometallic compound of an embodiment.

The organometallic compound according to an embodiment may be represented by Formula 1.

[Formula 1]

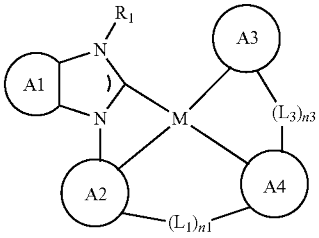

In Formula 1, M may be Pt, Pd, Cu, Ag, Au, Rh, Ir, Ru, or Os.

In Formula 1, rings A1, A2, and A3 may each independently be a substituted or unsubstituted hydrocarbon ring group of 5 to 60 ring-forming carbon atoms, or a substituted or unsubstituted heterocyclic group of 2 to 60 ring-forming carbon atoms.

In Formula 1, $L_1$ and $L_3$ may each independently be a direct linkage, *—O—*', *—S—*', *—C($R_{a1}$)($R_{a2}$)—*', *—C($R_{a3}$)=*', *=C($R_{a4}$)—*', *—C($R_{a5}$)=C($R_{a6}$)—*', *—C(=O)—*', *—C(=S)—*', *—B($R_{a7}$)—*', *—N($R_{a8}$)—*', *—P($R_{a9}$)—*', *—Si($R_{a10}$)($R_{a11}$)—*', *—P($R_{a12}$)($R_{a13}$)—*', or *—Ge($R_{a14}$)($R_{a15}$)—*', where * and *' are each a bonding site.

In Formula 1, $R_1$, and $R_{a1}$ to $R_{a15}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 1, n1 and n3 may each independently be 0 or 1.

In Formula 1, ring A4 may be a group represented by any one of Formula 2-1 to Formula 2-3.

[Formula 2-1]

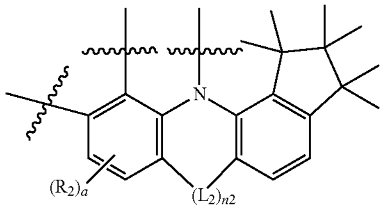

[Formula 2-2]

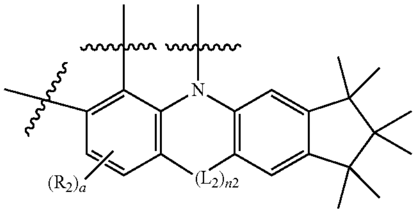

-continued

[Formula 2-3]

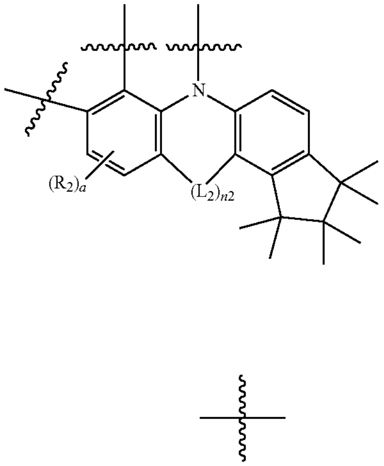

In Formula 2-1 to Formula 2-3, is a bonding site, and $L_2$ may be a direct linkage, *—O—*', *—S—*', *—C($R_{a1'}$)($R_{a2'}$)—*', *—C($R_{a3'}$)=*', *=C($R_{a4'}$)—*', *—C($R_{a5'}$)=C($R_{a6'}$)—*', *—C(=O)—*', *—C(=S)—*', *—C≡C—*', *—B($R_{a7'}$)—*', *—N($R_{a8'}$)—*', *—P($R_{a9'}$)—*', *—Si($R_{a10'}$)($R_{a11'}$)—*', *—P($R_{a12'}$)($R_{a13'}$)—*', or *—Ge($R_{a4'}$)($R_{a15'}$)—*', where * and *' are each a bonding site.

In Formula 2-1 to Formula 2-3, n2 may be 0 or 1.

In Formula 2-1 to Formula 2-3, $R_2$, and $R_{a1'}$ to $R_{a15'}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 2-1 to Formula 2-3, a may be an integer from 0 to 2. If a is 2, multiple $R_2$ groups may be the same as or different from each other.

The organometallic compound of an embodiment represented by Formula 1 includes a moiety represented by one of Formula 2-1 to Formula 2-3, to enrich electrons in ring A3 which corresponds to the lowest unoccupied molecular orbital (LUMO) and to reinforce the bonding force with a central metal. If the organometallic compound of an embodiment is used as a material for an emission layer, the efficiency of a light emitting device may be improved.

In an embodiment, ring A2 in Formula 1 may be a group represented by any one of Formula A-1 to Formula A-3.

[Formula A-1]

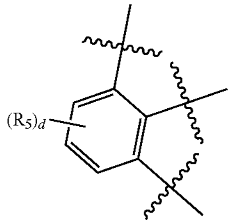

-continued

[Formula A-2]

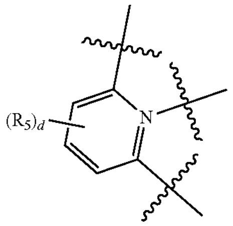

[Formula A-3]

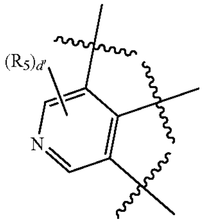

In Formula A-1 to Formula A-3,

is a bonding site, and $R_5$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula A-1 to Formula A-3, d may be an integer from 0 to 3, and d' may be an integer from 0 to 2. If d is 2 or more, multiple $R_5$ groups may be the same as or different from each other, and if d' is 2, multiple $R_5$ groups may be the same as or different from each other.

In an embodiment, ring A3 in Formula 1 may be a group represented by any one of Formula B-1 to Formula B-4.

[Formula B-1]

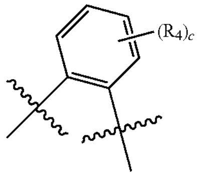

[Formula B-2]

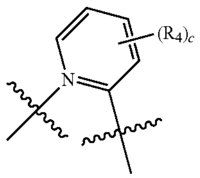

-continued

[Formula B-3]

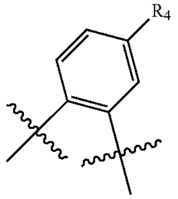

[Formula B-4]

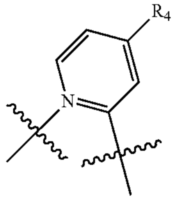

In Formula B-1 to Formula B-4,

is a bonding site, and $R_4$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula B-1 to Formula B-2, c may be an integer from 0 to 4. If c is 2 or more, multiple $R_4$ groups may be the same as or different from each other.

In an embodiment, the organometallic compound represented by Formula 1 may be represented by Formula 3.

[Formula 3]

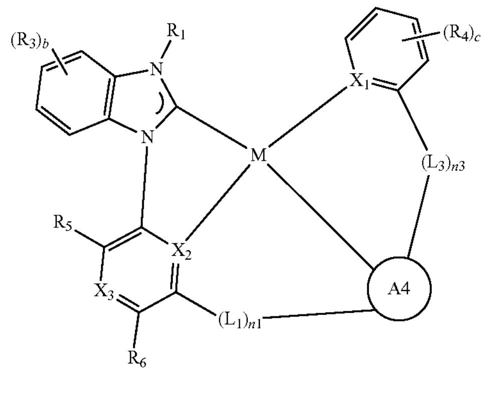

In Formula 3, $X_1$ to $X_3$ may each independently be N or $C(R_b)$, and $X_1$ or $X_2$ may be N.

In Formula 3, $R_3$ to $R_6$ and $R_b$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 3, b and c may each independently be an integer from 0 to 4. If b is 2 or more, multiple $R_3$ groups may be the same as or different from each other, and if c is 2 or more, multiple $R_4$ groups may be the same as or different from each other.

In Formula 3, M, ring A4, $L_1$, $L_3$, n1, n3, and $R_1$ are the same as defined in Formula 1.

In an embodiment, the organometallic compound represented by Formula 3 may be represented by Formula 4.

[Formula 4]

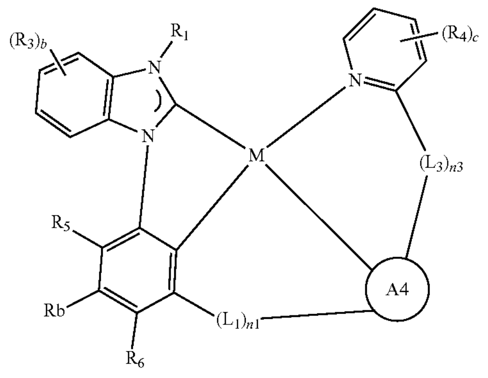

In Formula 4, M, ring A4, $L_1$, $L_3$, n1, n3, b, c, $R_1$, $R_3$ to $R_6$, and $R_b$ are the same as defined in Formula 3.

In an embodiment, $R_5$ and $R_6$ of Formula 4 may each be a hydrogen atom, and $R_b$ may be a substituted or unsubstituted alkyl group of 1 to 20 carbon atoms.

In an embodiment, the organometallic compound represented by Formula 3 may be represented by Formula 5.

[Formula 5]

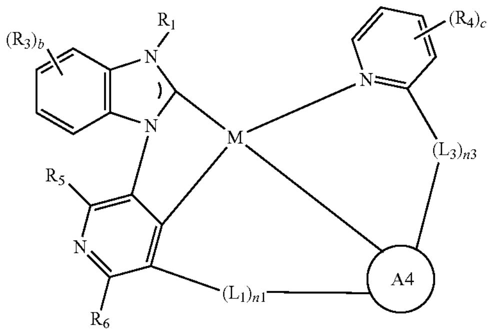

In Formula 5, M, ring A4, $L_1$, $L_3$, n1, n3, b, c, $R_1$, and $R_3$ to $R_6$ are the same as defined in Formula 3.

In an embodiment, the organometallic compound represented by Formula 3 may be represented by Formula 6.

[Formula 6]

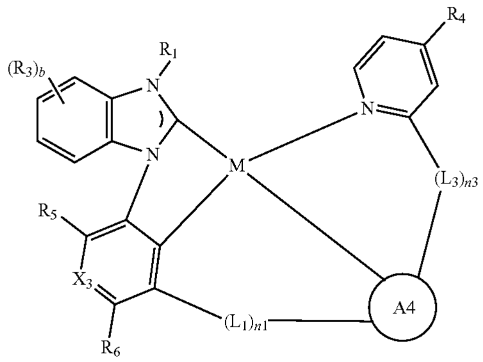

In Formula 6, $R_4$ may be a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 6, M, ring A4, $L_1$, $L_3$, n1, n3, b, $X_3$, $R_1$, $R_3$, $R_5$, and $R_6$ are the same as defined in Formula 3.

In an embodiment, the organometallic compound represented by Formula 3 may be represented by any one of Formula 7-1 to Formula 7-3.

[Formula 7-1]

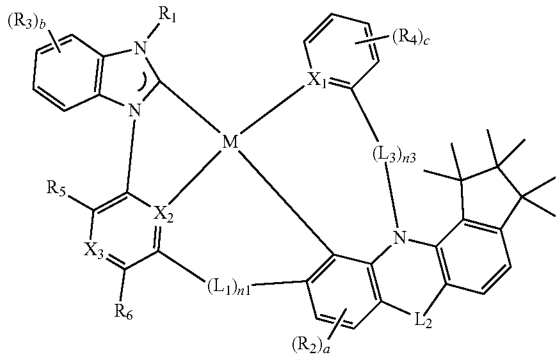

[Formula 7-2]

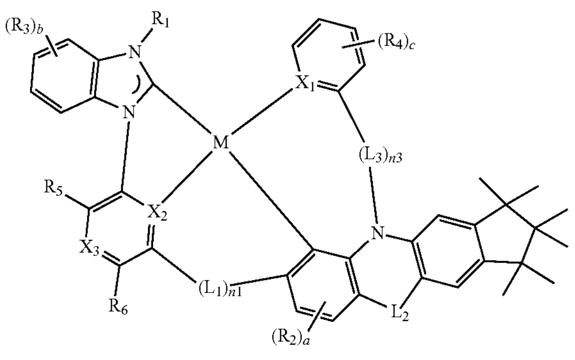

-continued

[Formula 7-3]

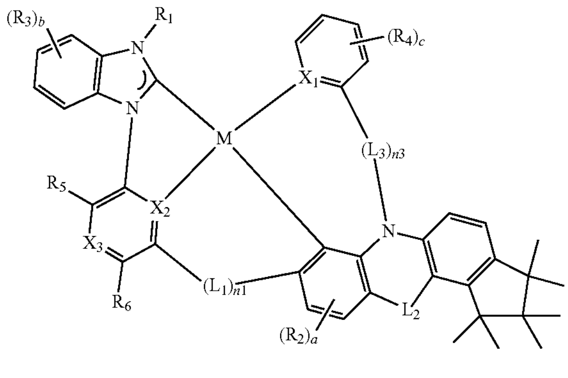

In Formula 7-1 to Formula 7-3, $L_2$ may be a direct linkage, *—O—*', or *—C($R_{a1'}$)($R_{a2'}$)—*', where * and *' are each a bonding site.

In Formula 7-1 to Formula 7-3, $R_2$, $R_{a1'}$, and $R_{a2'}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 7-1 to Formula 7-3, a may be an integer from 0 to 2. If a is 2, multiple $R_2$ groups may be the same as or different from each other.

In Formula 7-1 to Formula 7-3, M, $L_1$, $L_3$, n1, n3, b, c, $R_1$, and $R_3$ to $R_6$ are the same as defined in Formula 3.

The organometallic compound of an embodiment may be any one selected from Compound Group 1. An emission layer EML may include at least one organometallic compound selected from Compound Group 1.

[Compound Group 1]

1

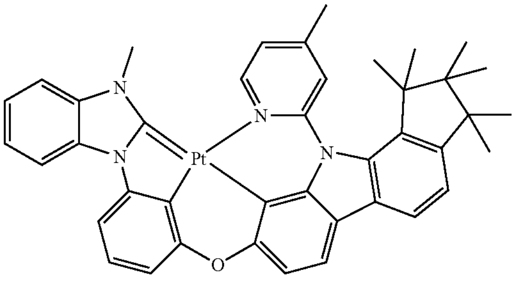

2

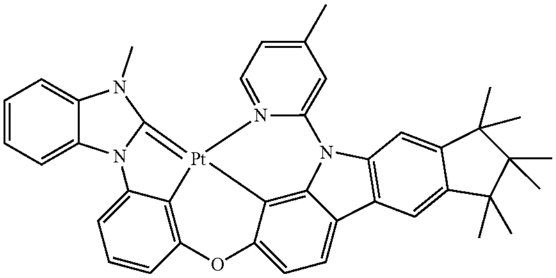

-continued

3

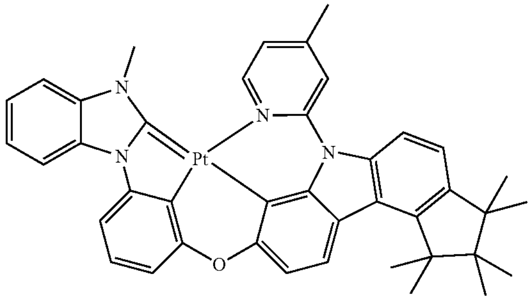

4

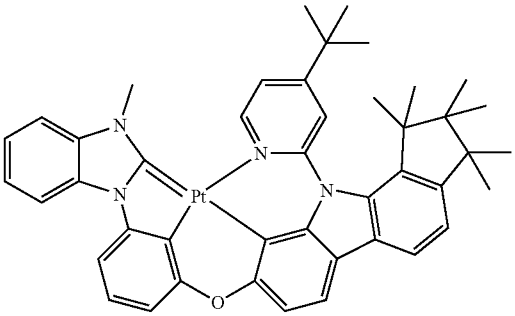

5

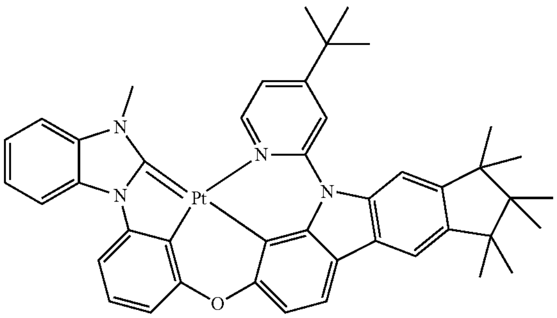

6

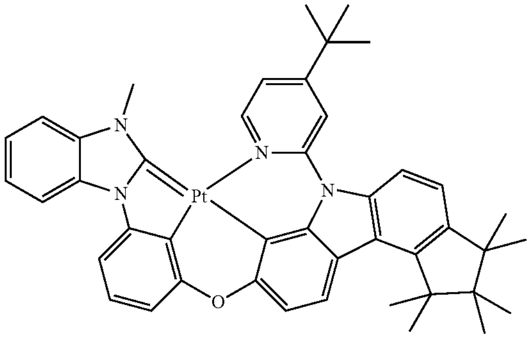

-continued
7
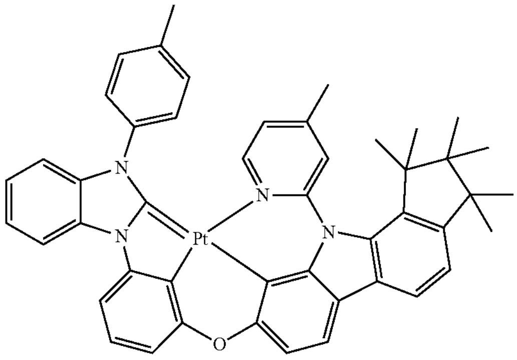
8
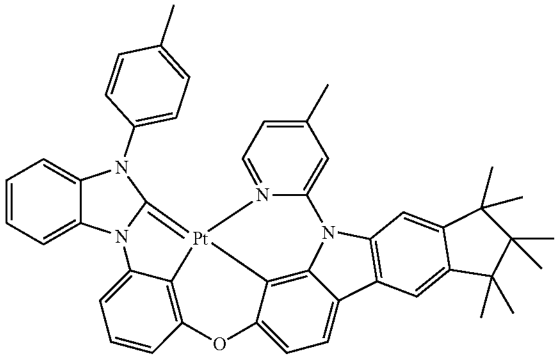
9
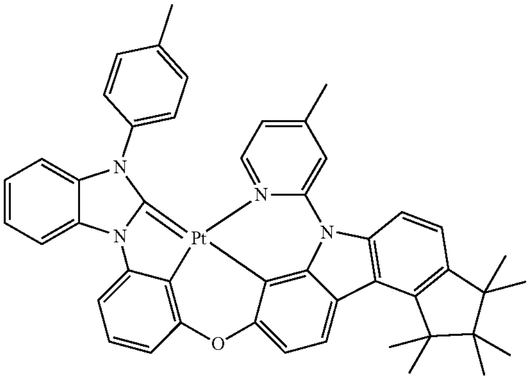
10
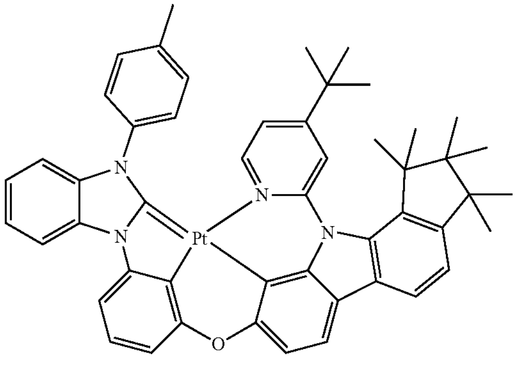
-continued
11
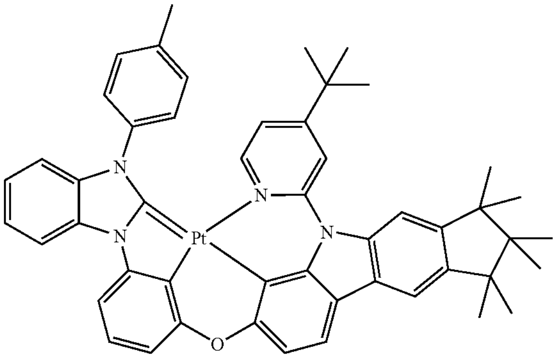
12
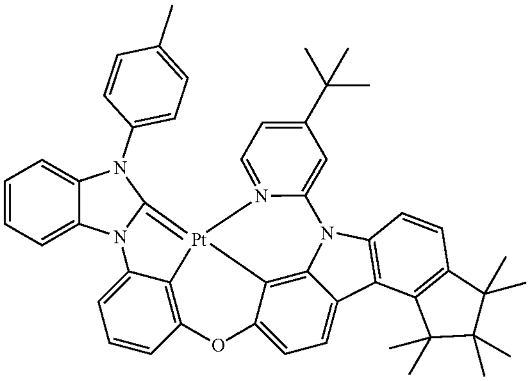
13
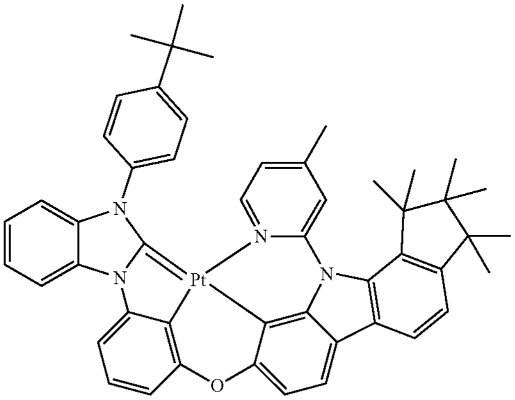
14
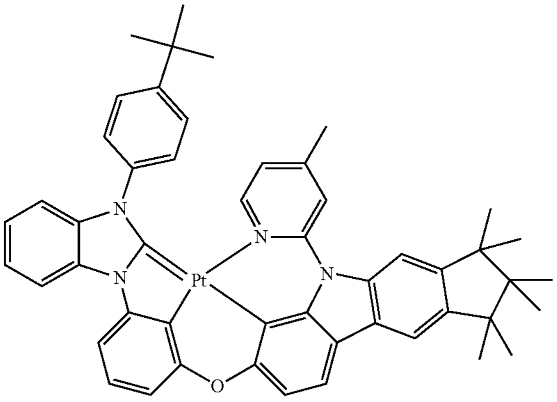

-continued
15
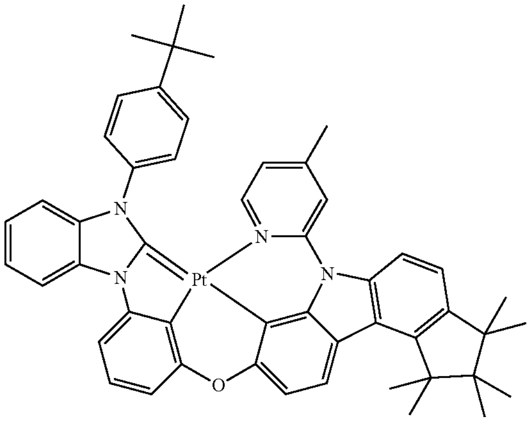
16
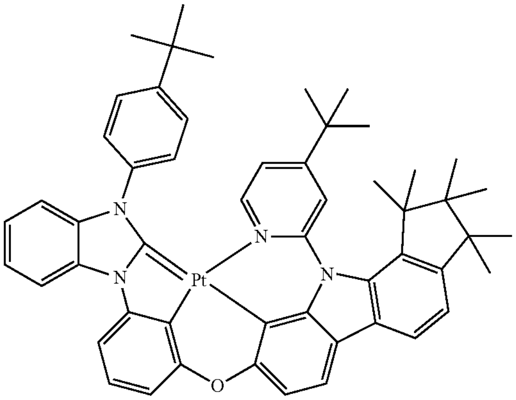
17
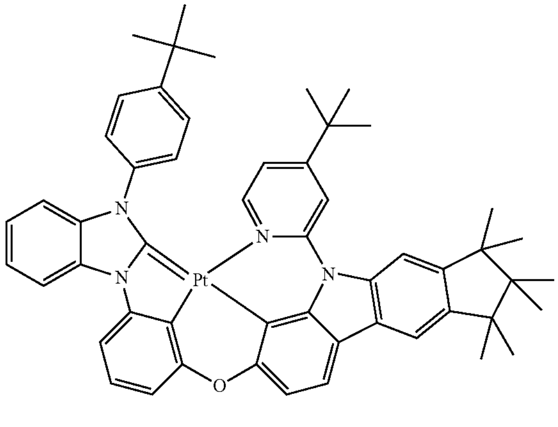
-continued
18
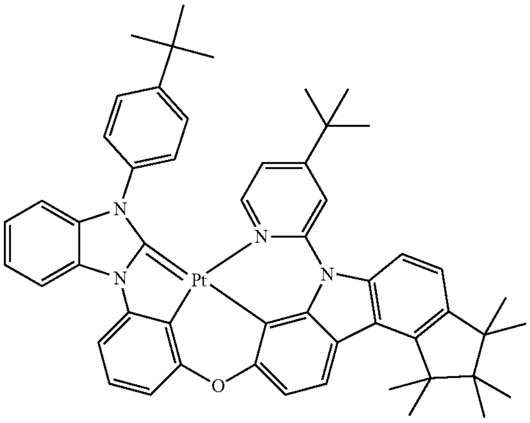
19
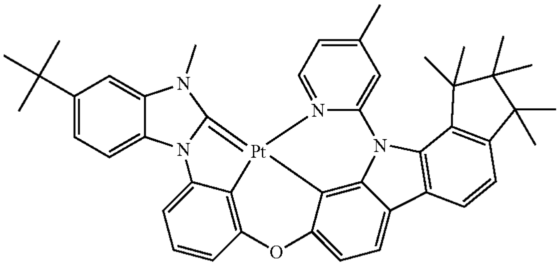
20
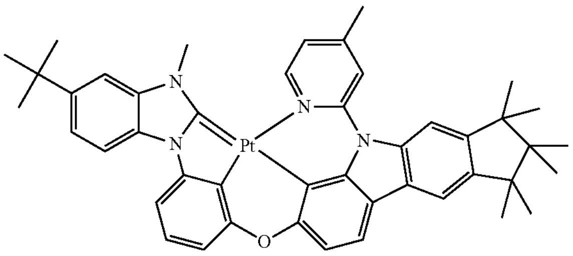
21
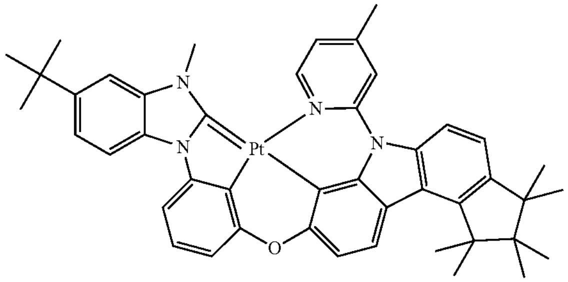
22
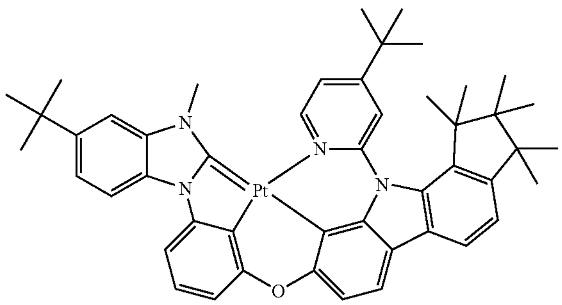

-continued
23
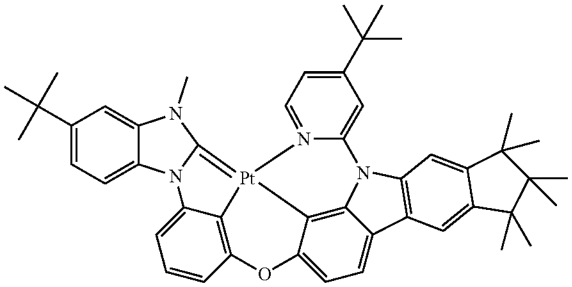
24
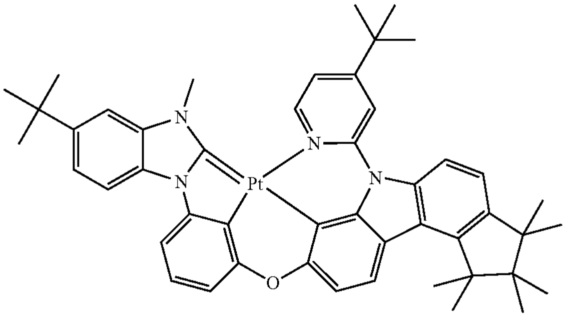
25
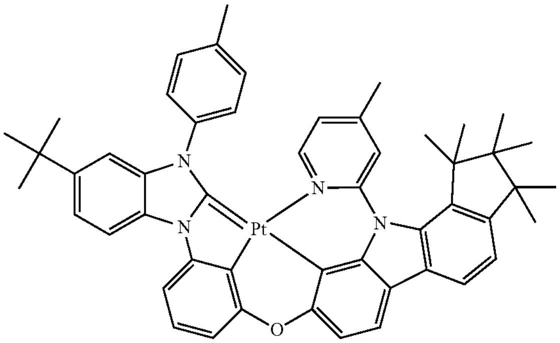
26
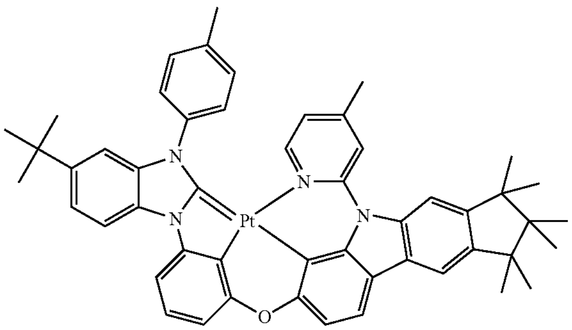
-continued
27
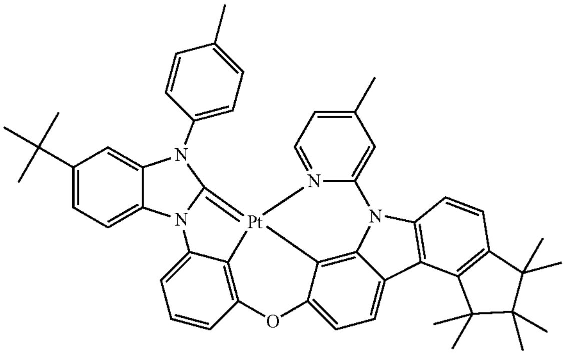
28
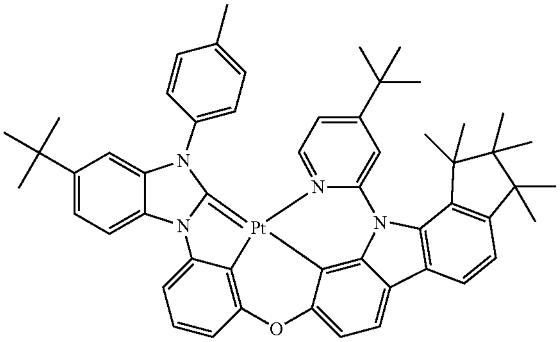
29
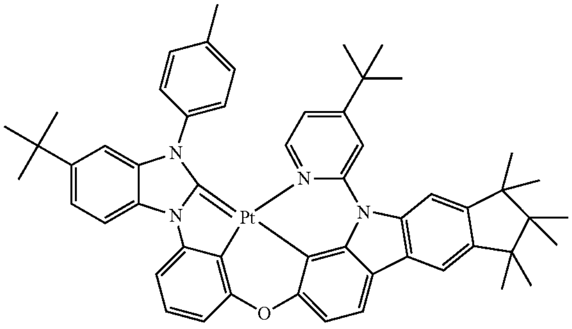
30
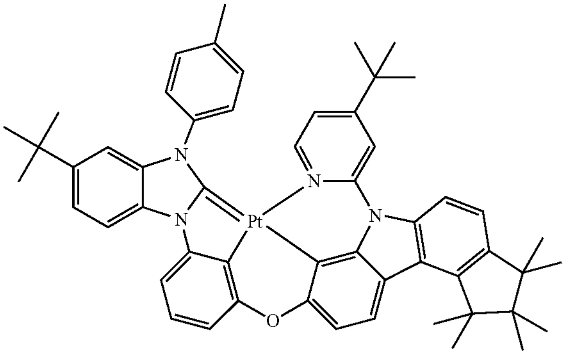

-continued
31
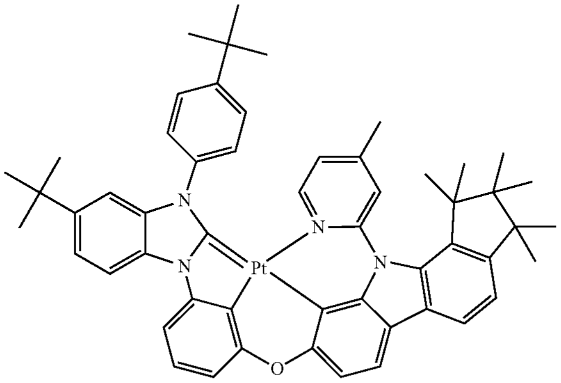
32
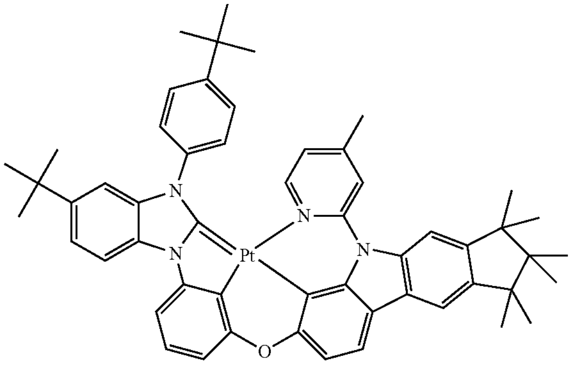
33
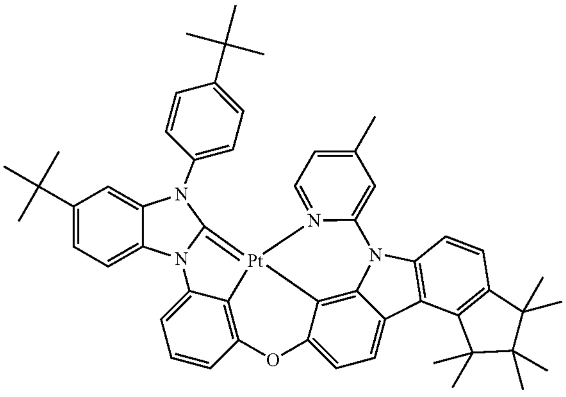
34
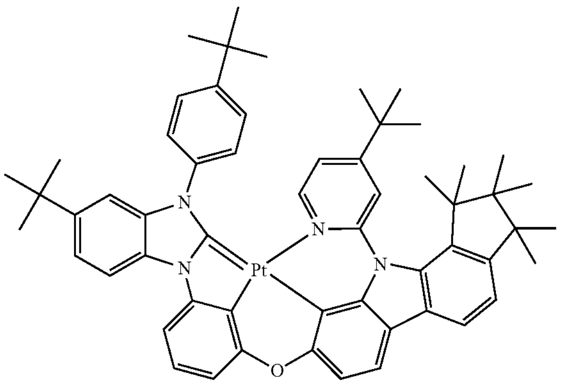
-continued
35
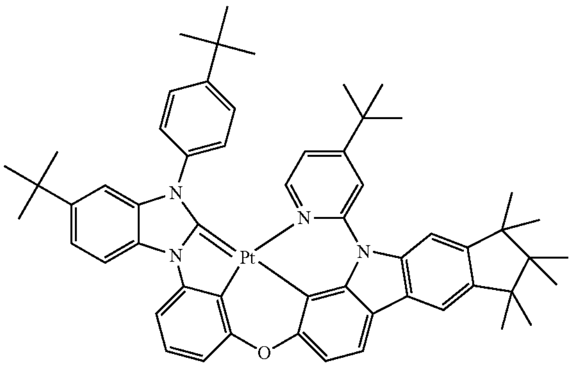
36
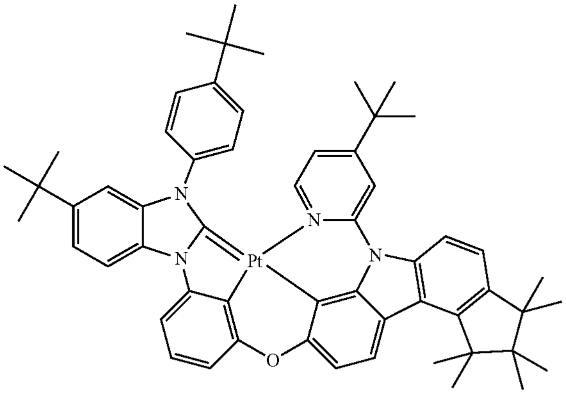
37
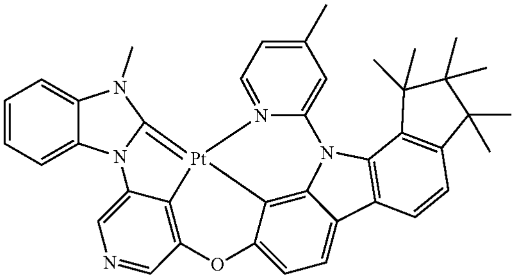
38
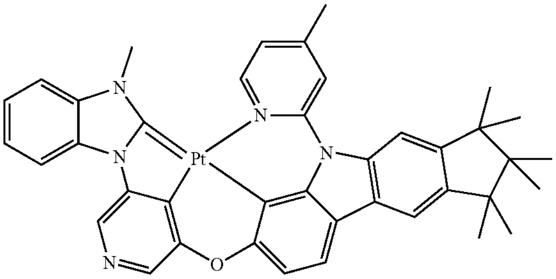

-continued
39
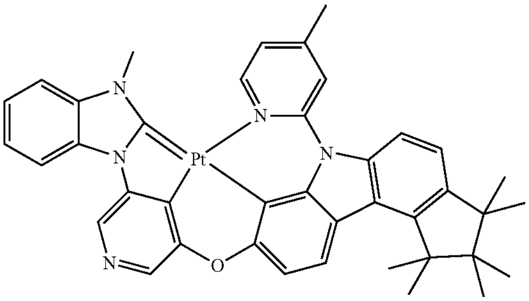
40
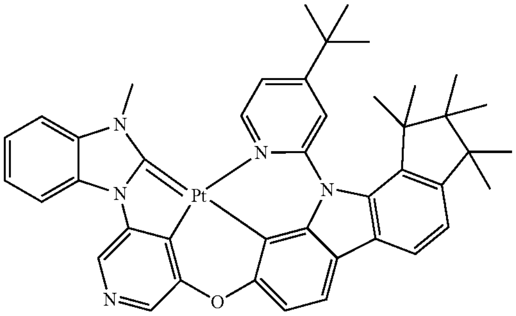
41
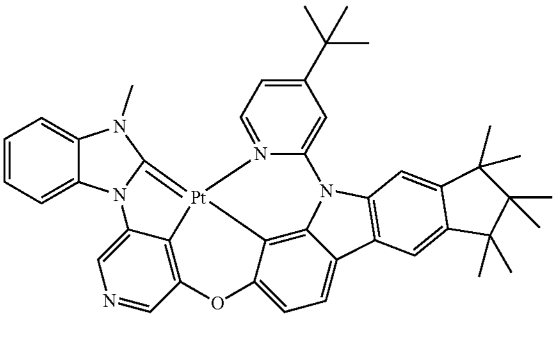
42
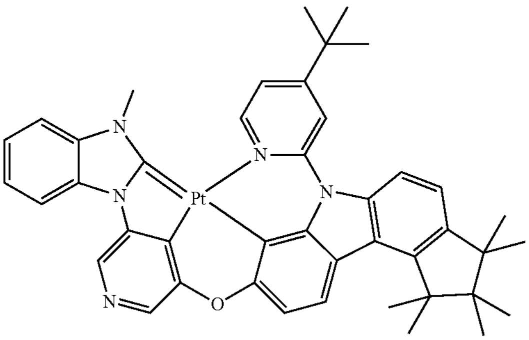
-continued
43
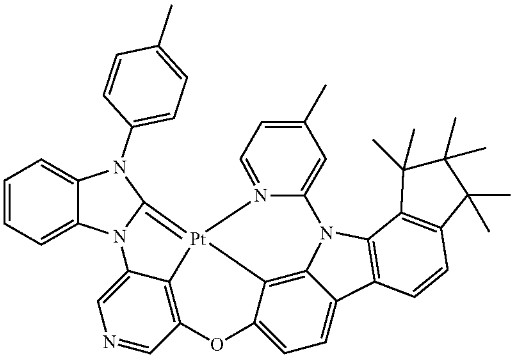
44
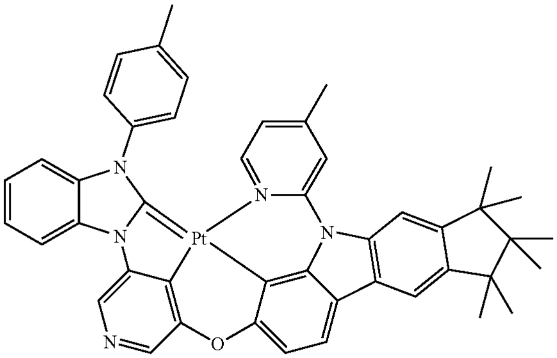
45
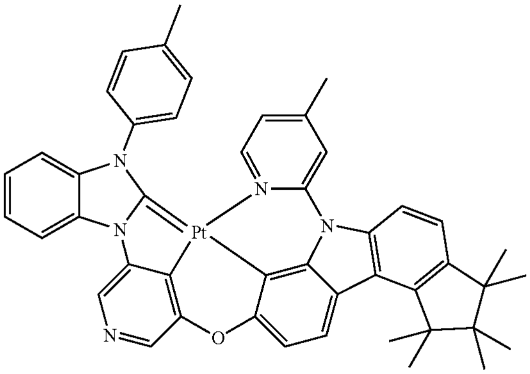
46
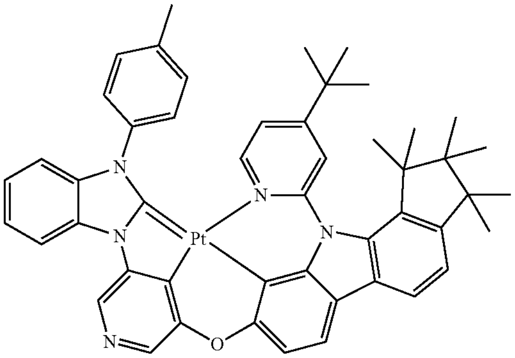

-continued
47
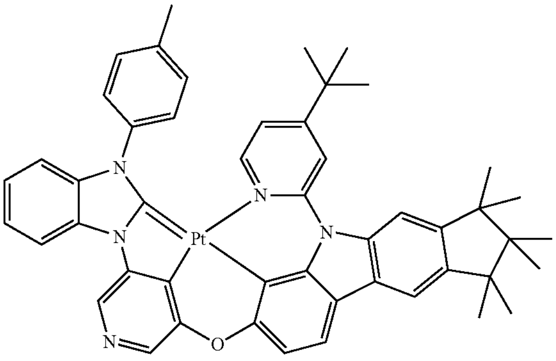
48
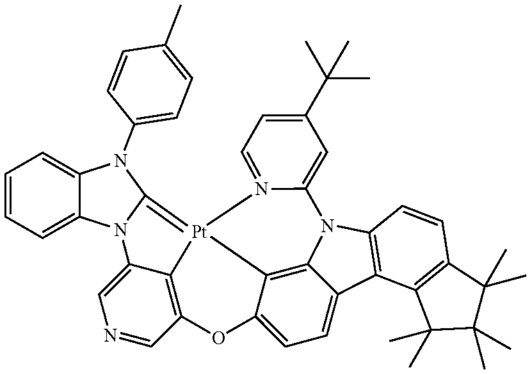
49
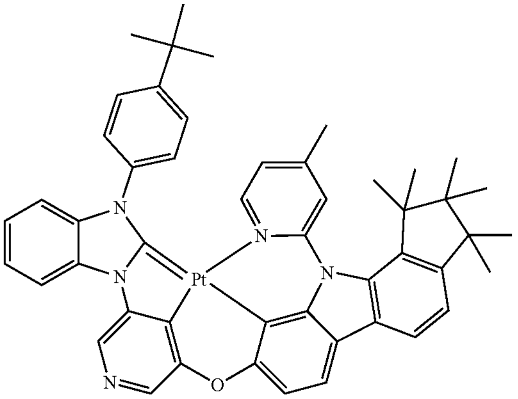
50
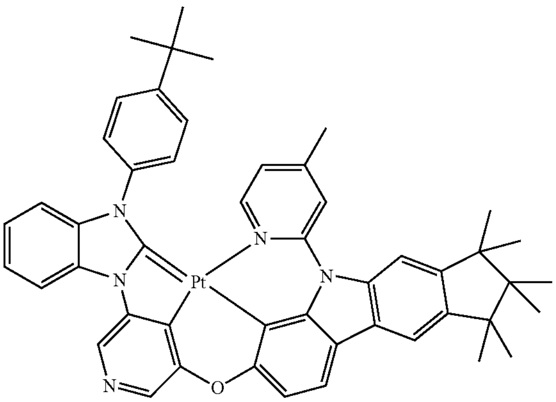
-continued
51
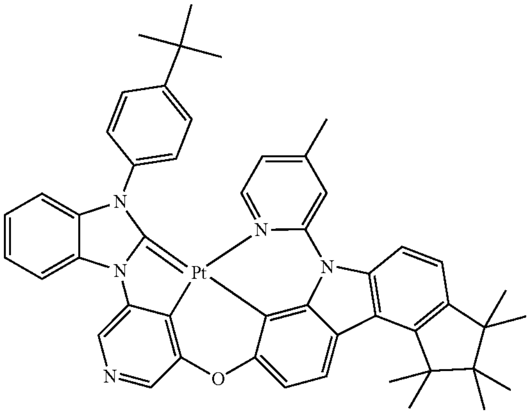
52
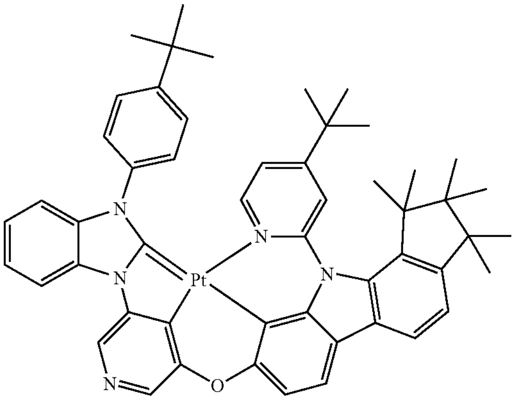
53
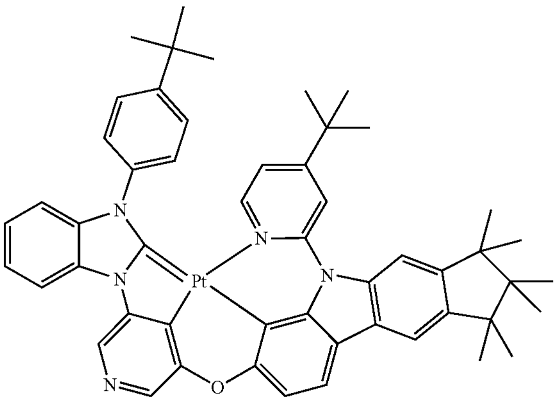

-continued
54
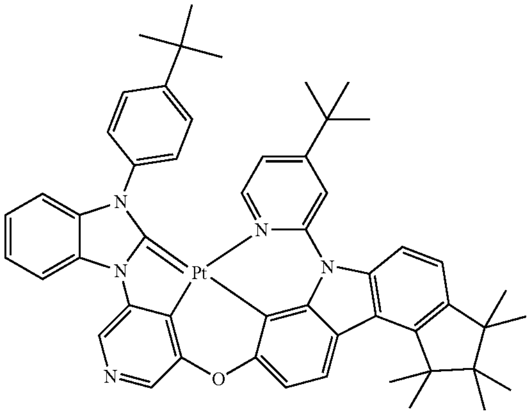
55
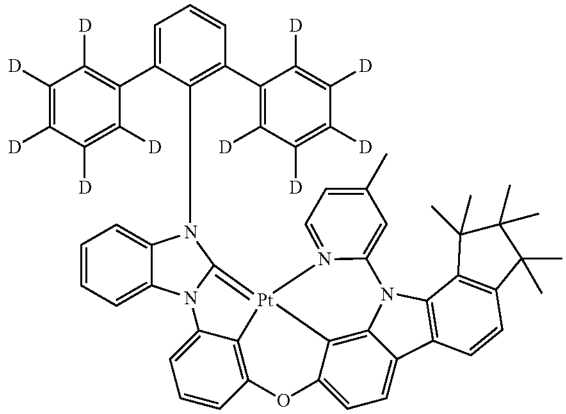
56
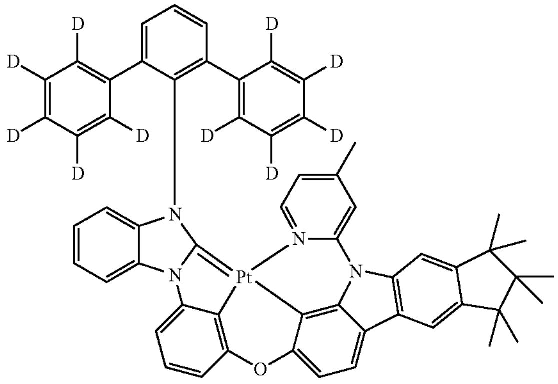
-continued
57
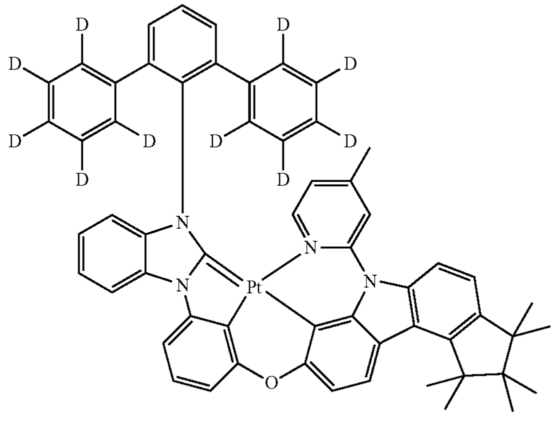
58
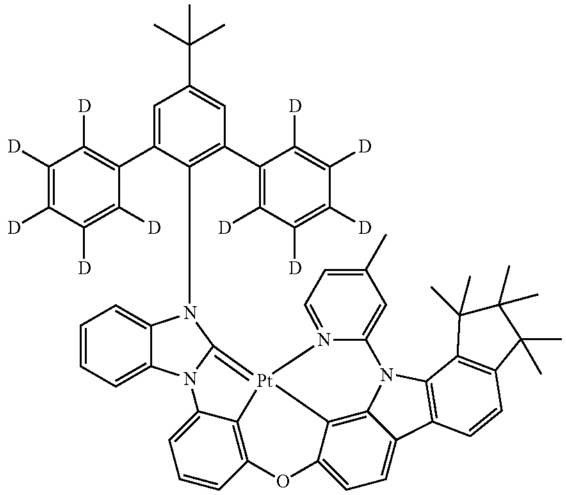
59
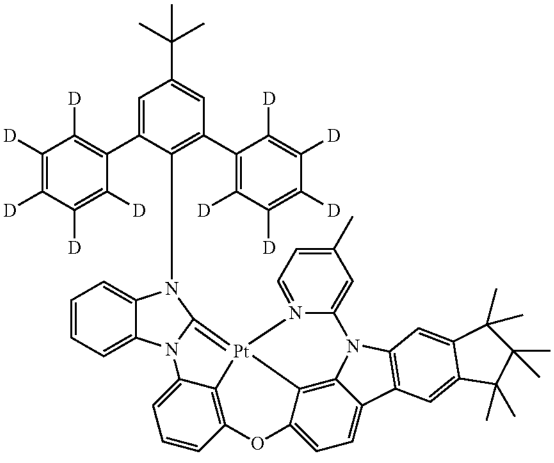

-continued
60
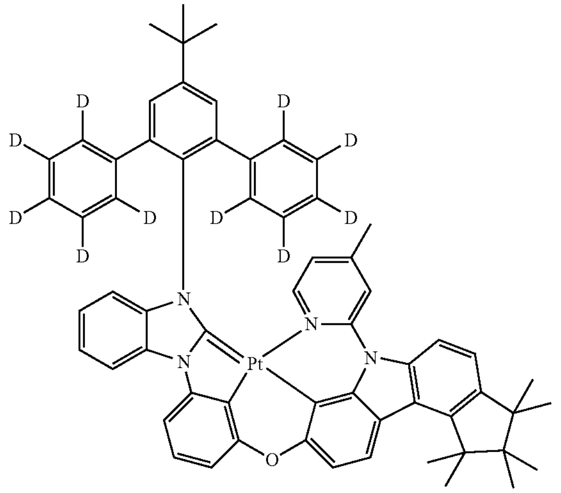
61
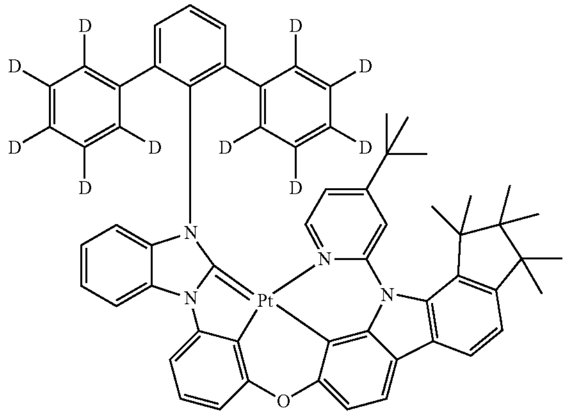
62
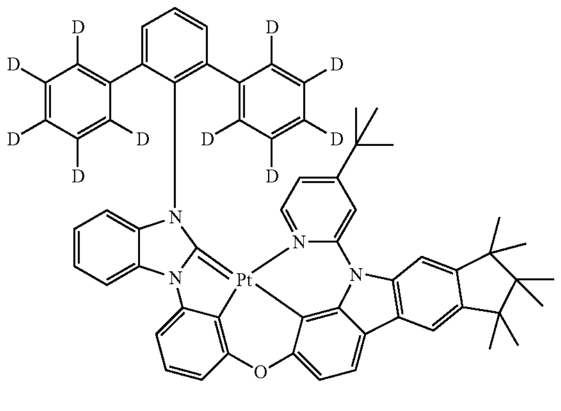
-continued
63
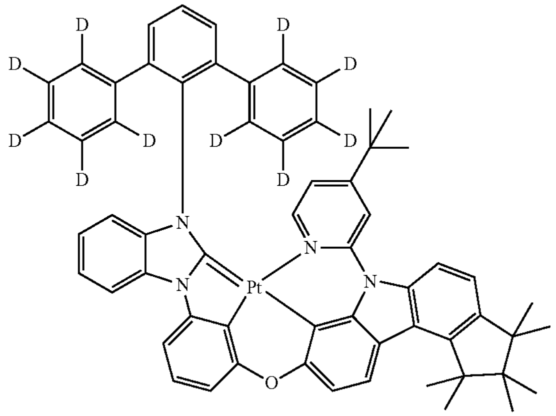
64
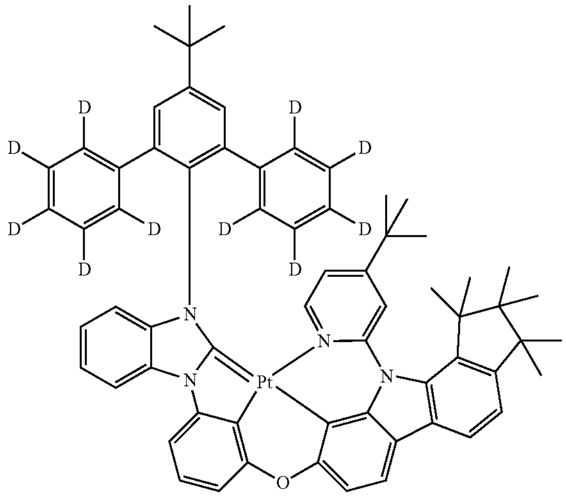
65
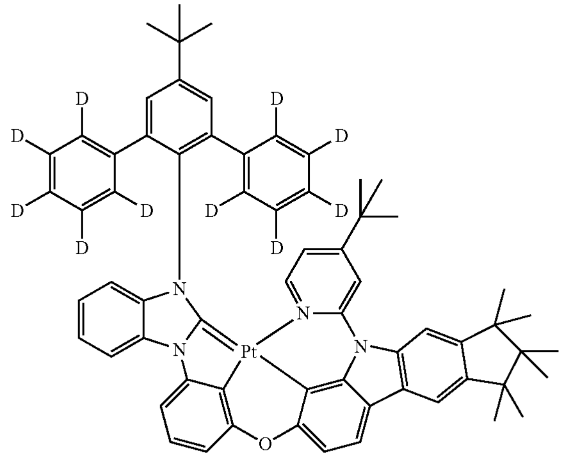

-continued
66
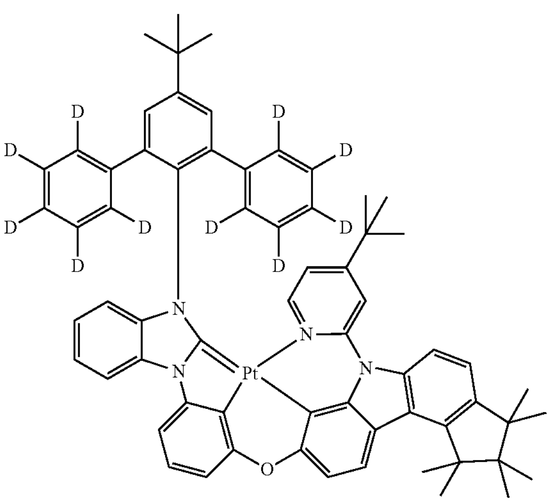
67
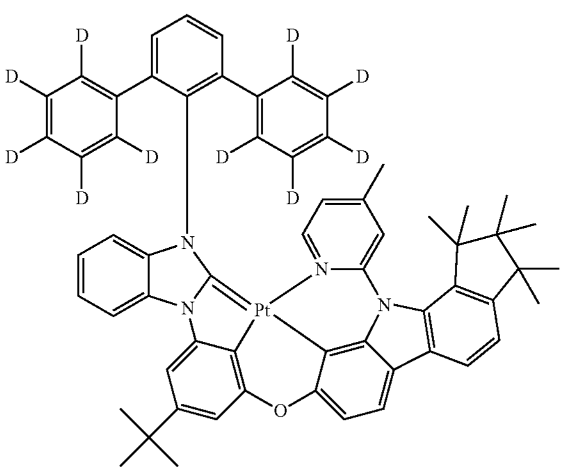
68
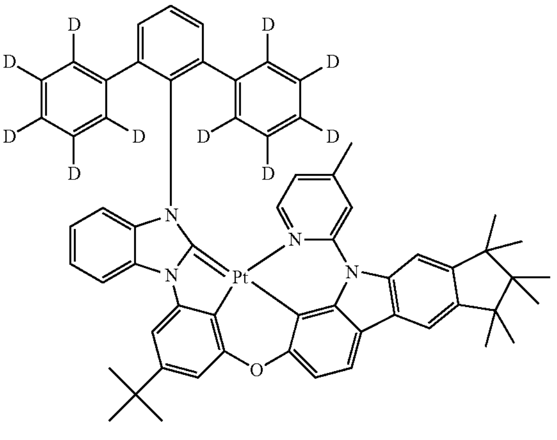
-continued
69
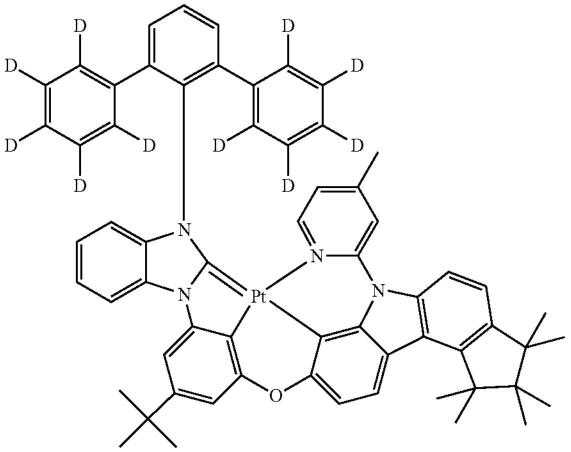
70
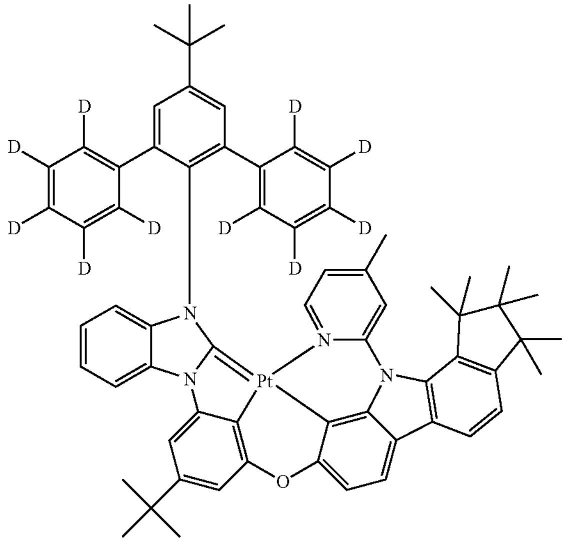
71
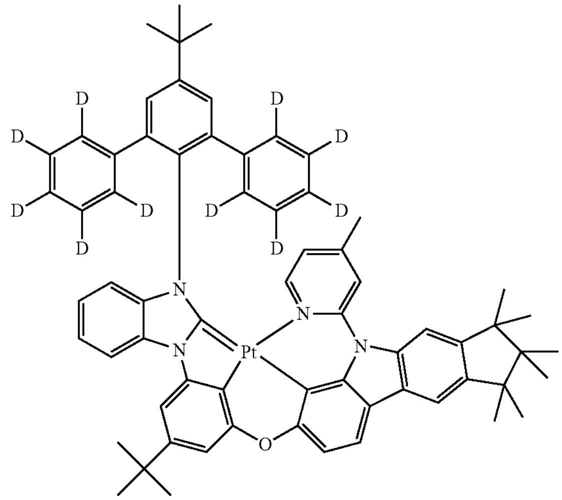

-continued
72
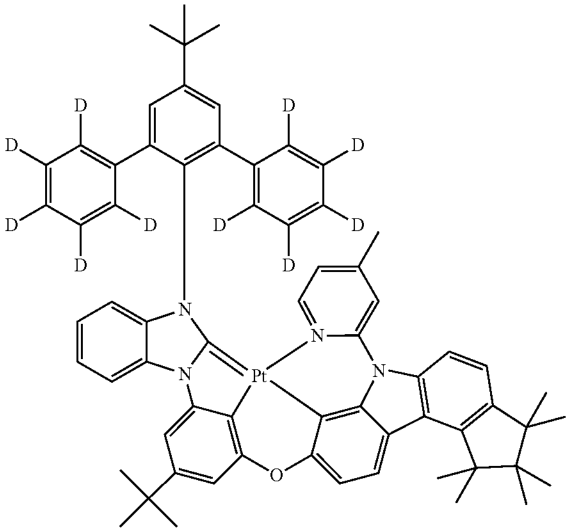
73
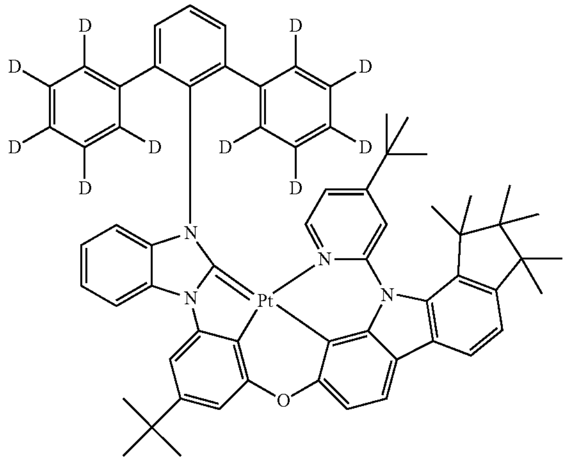
74
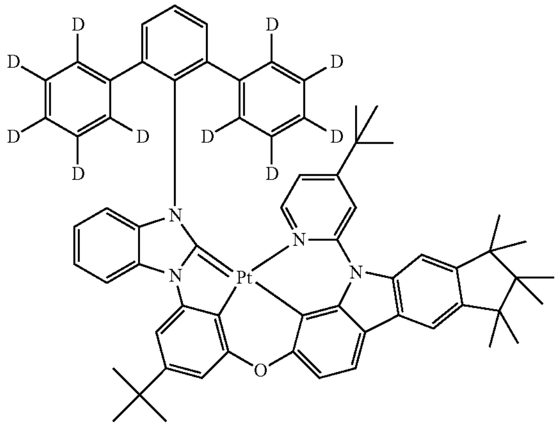
-continued
75
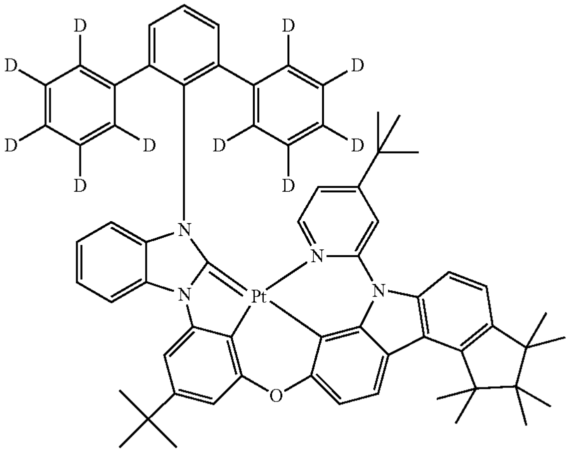
76
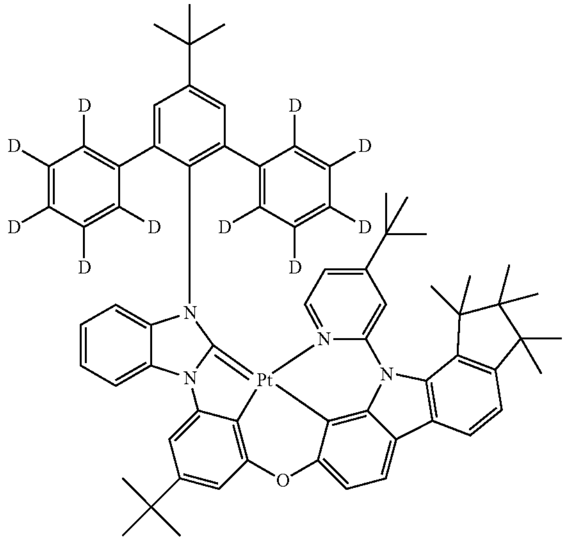
77
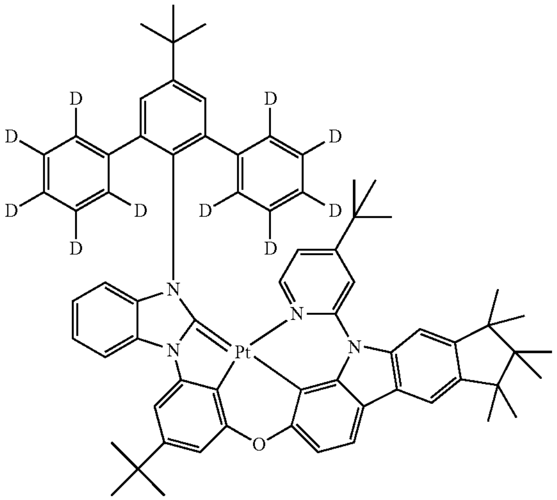

-continued
78
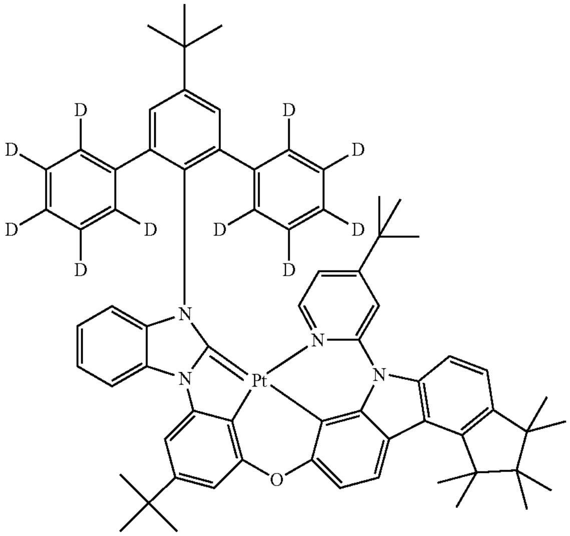
79
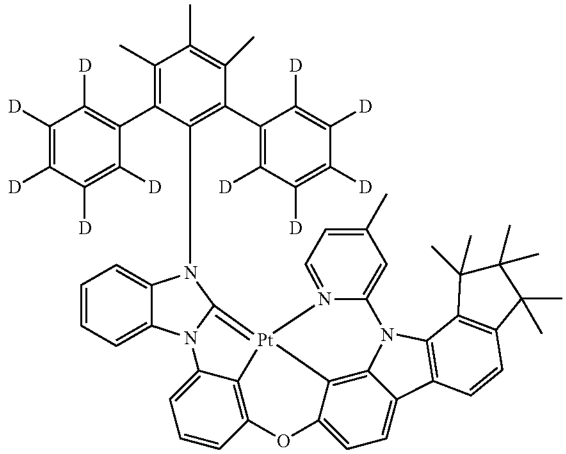
80
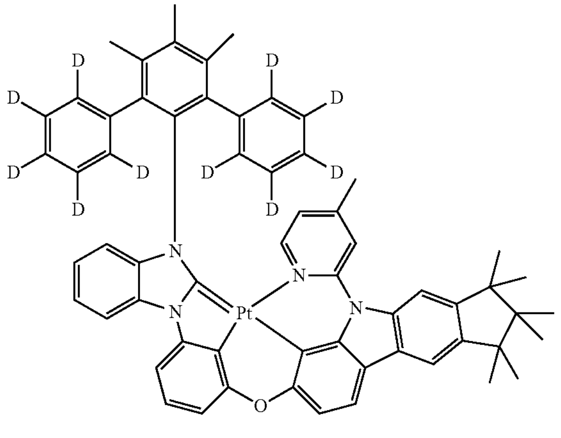
-continued
81
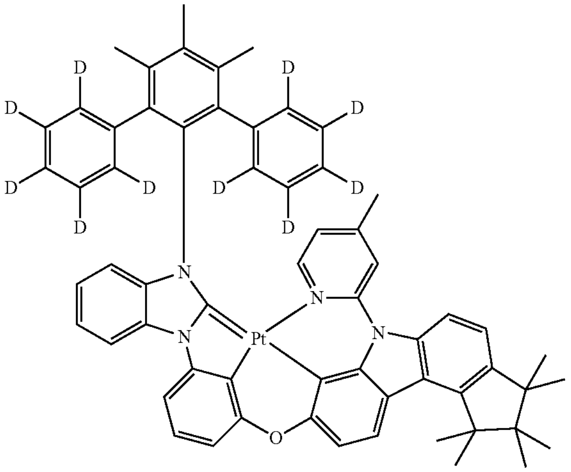
82
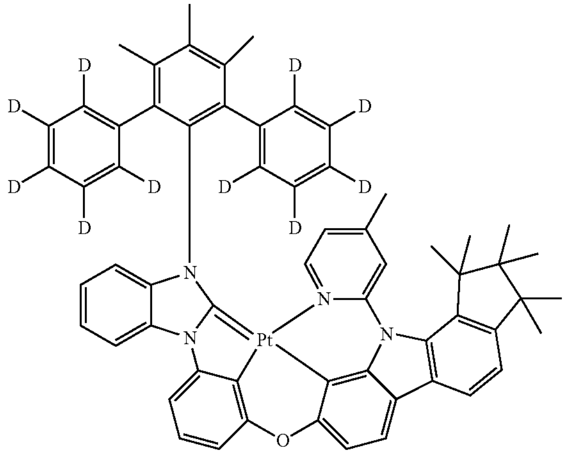
83
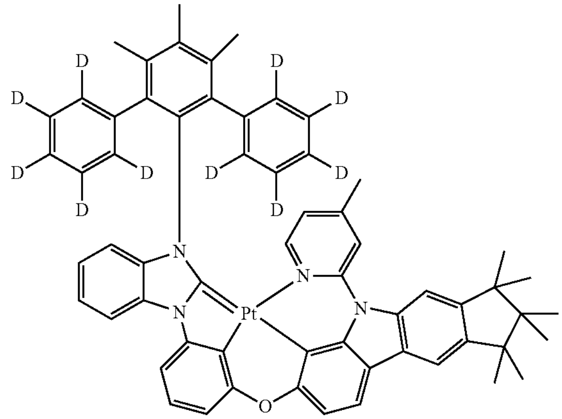

-continued
84
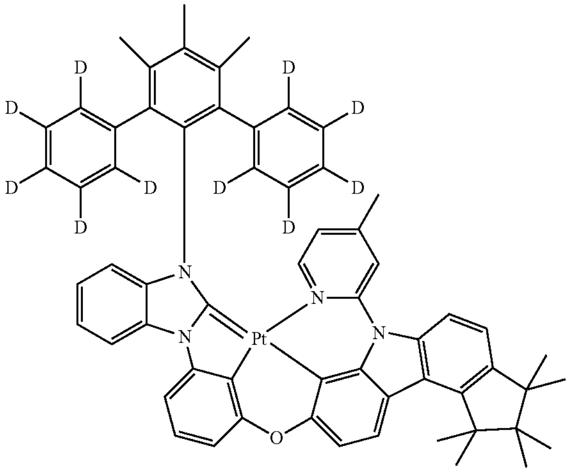
85
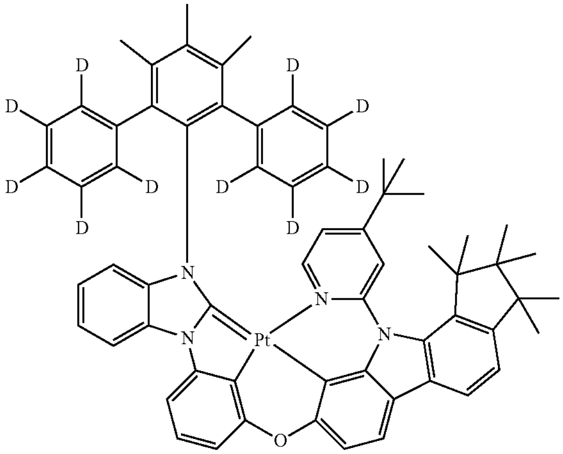
86
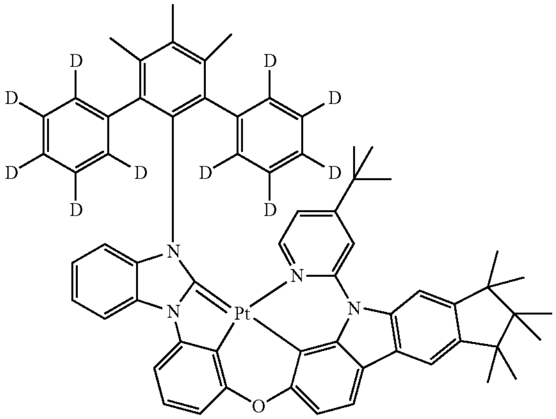
-continued
87
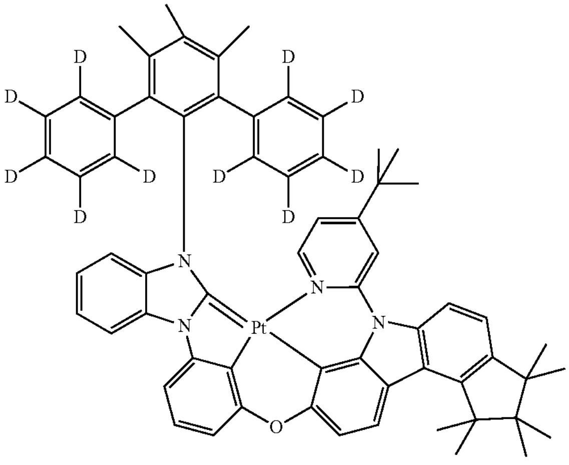
88
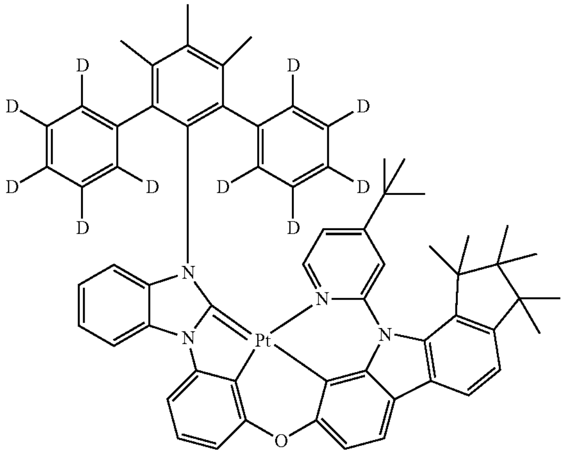
89
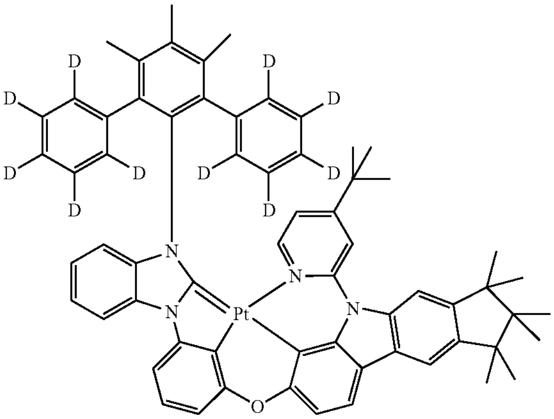

-continued
90
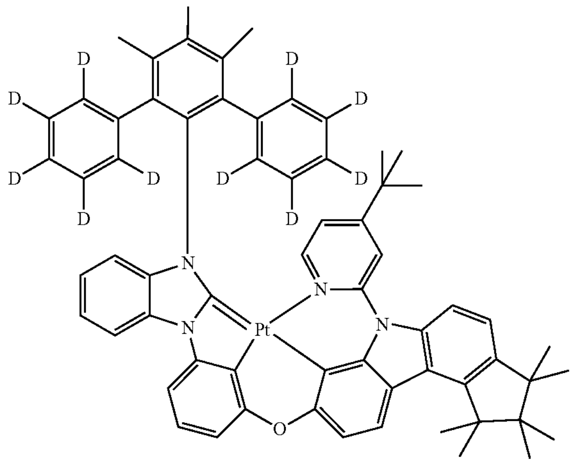
91
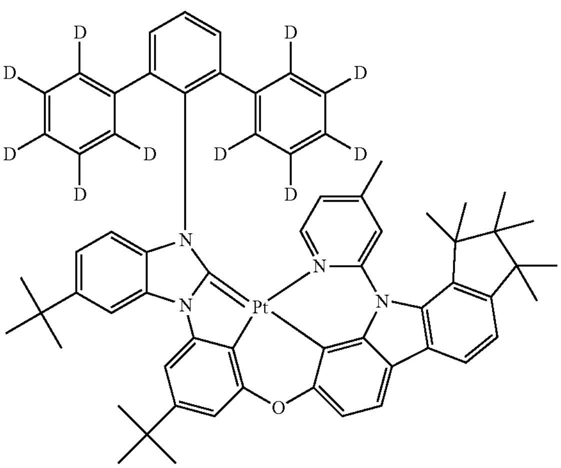
92
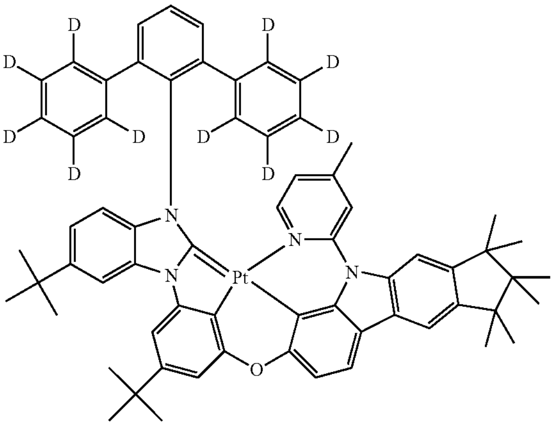
-continued
93
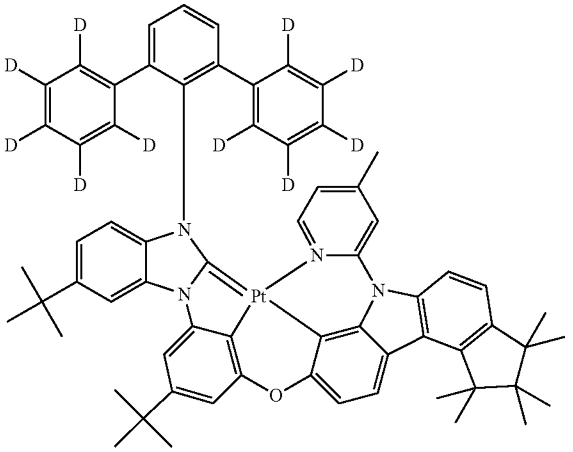
94
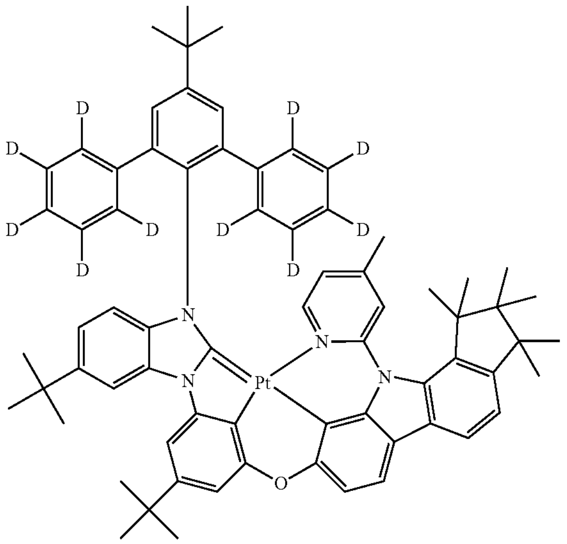
95
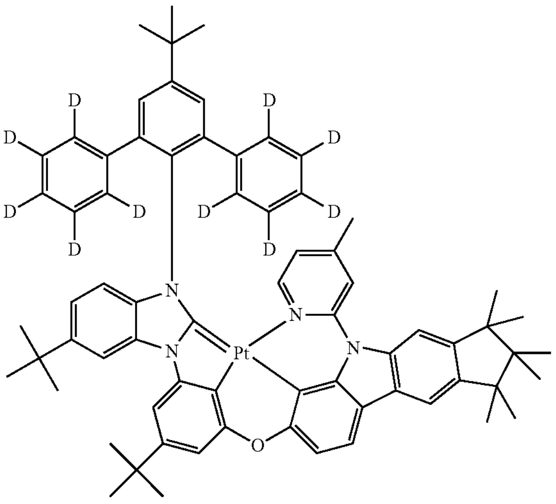

96
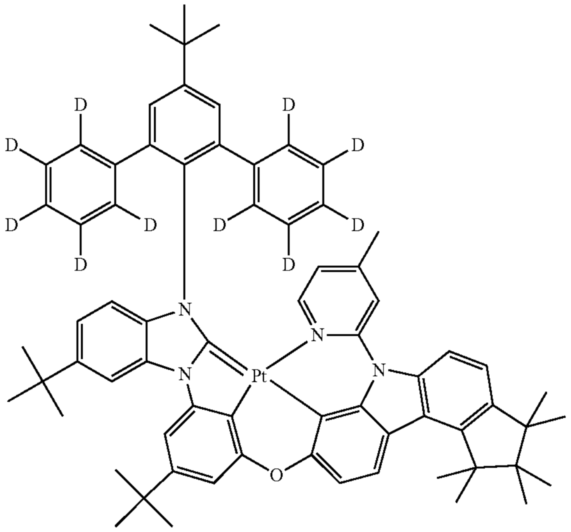
97
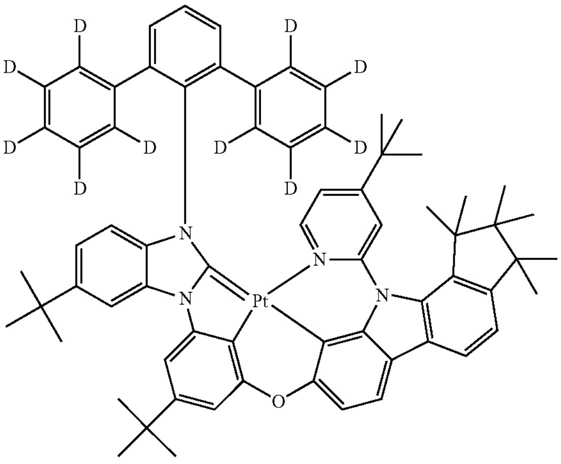
98
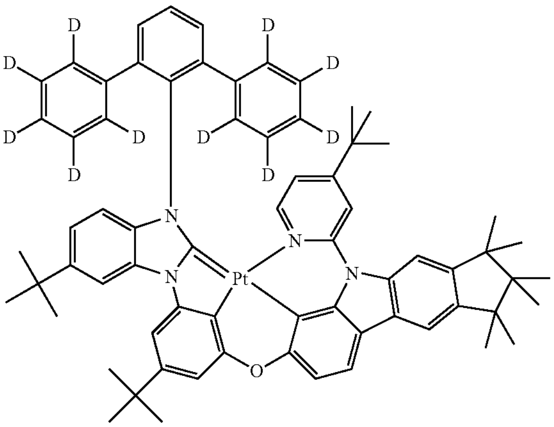
99
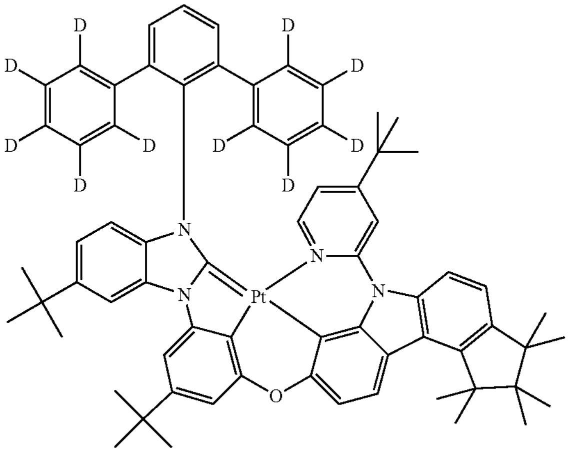
100
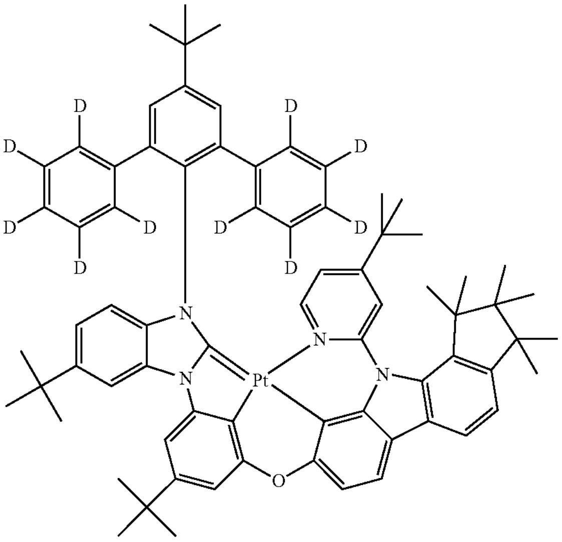
101
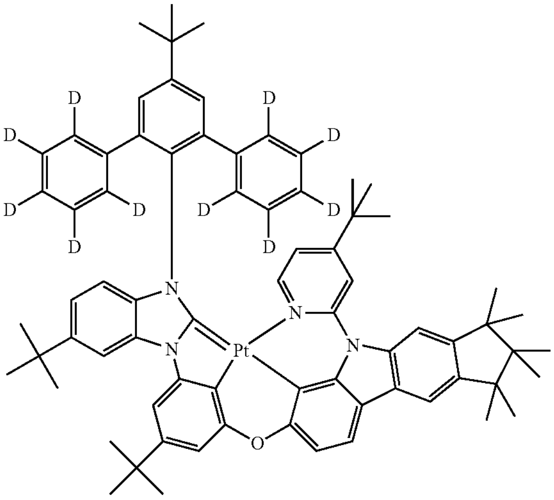

-continued
102
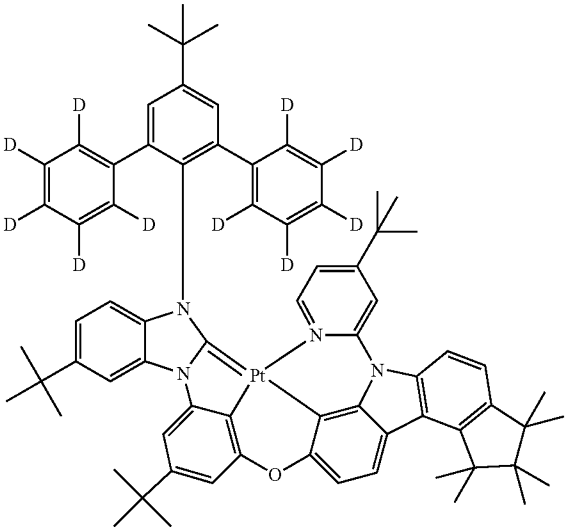
103
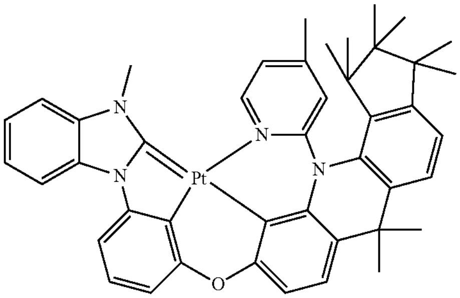
104
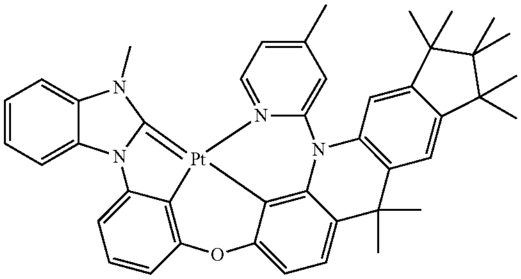
105
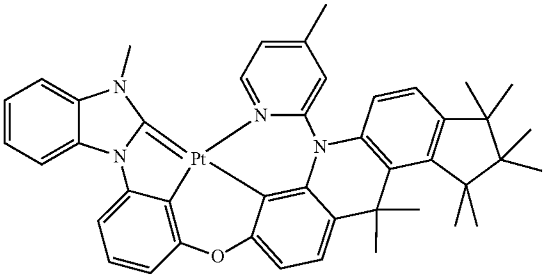
-continued
106
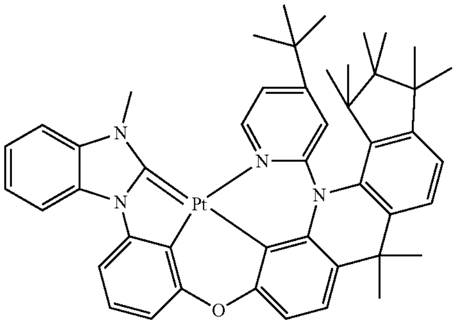
107
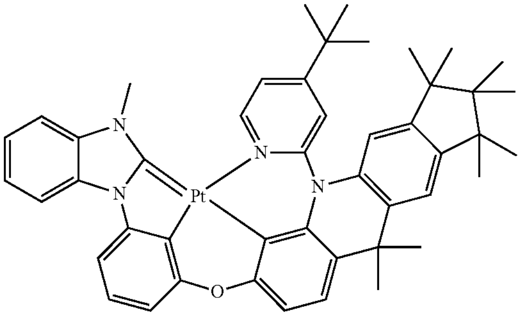
108
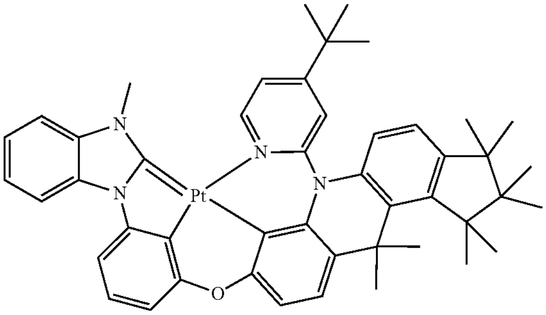
109
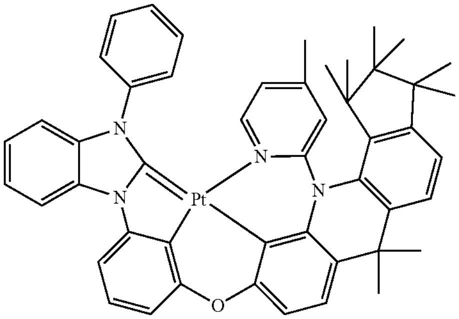

-continued
110
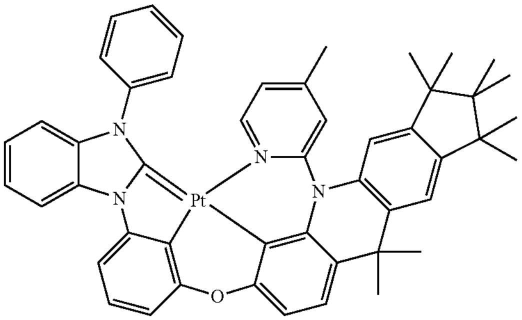
111
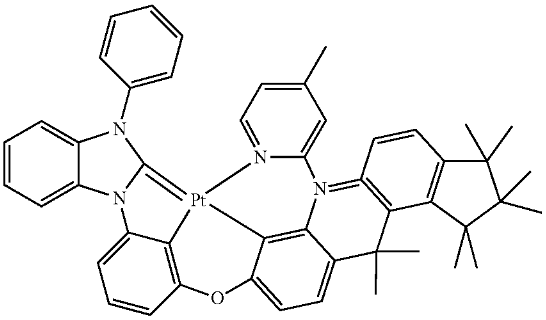
112
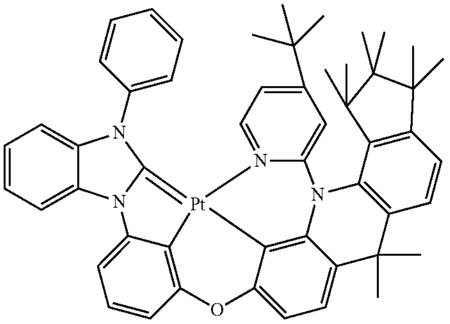
113
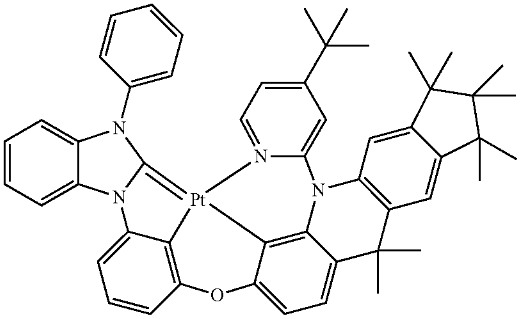
-continued
114
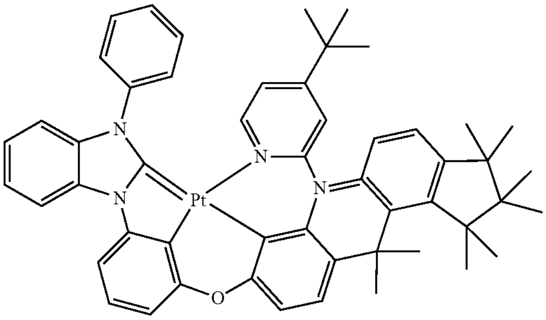
115
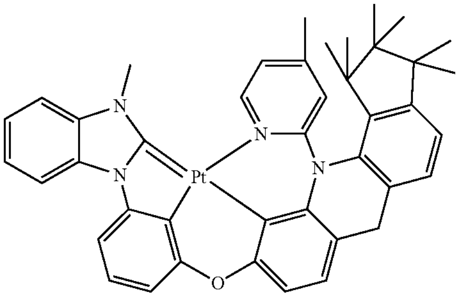
116
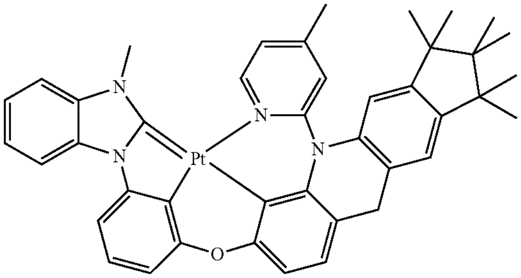
117
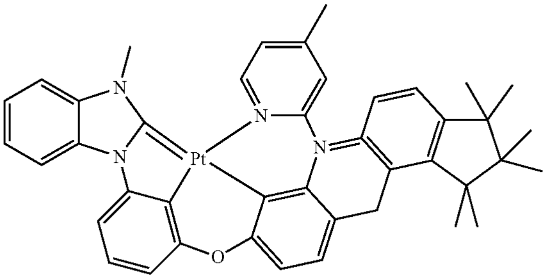
118
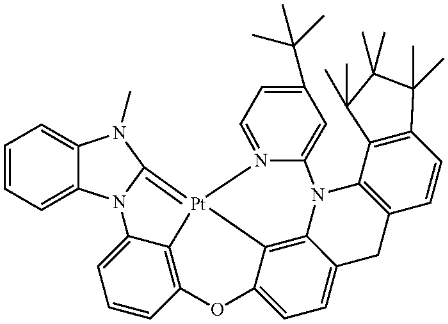

-continued

119

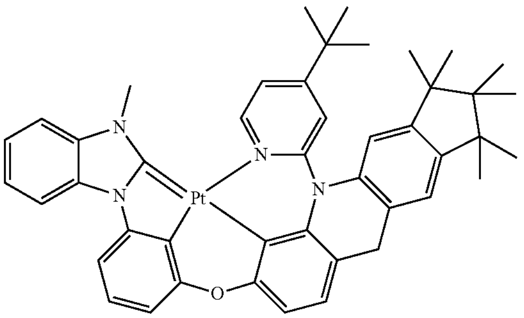

120

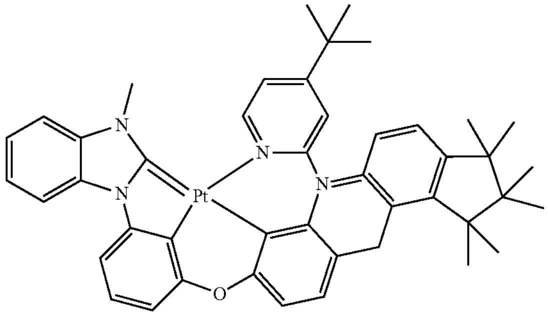

121

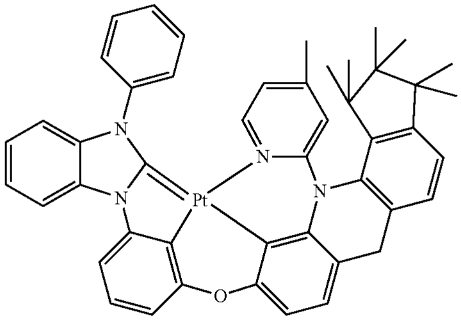

122

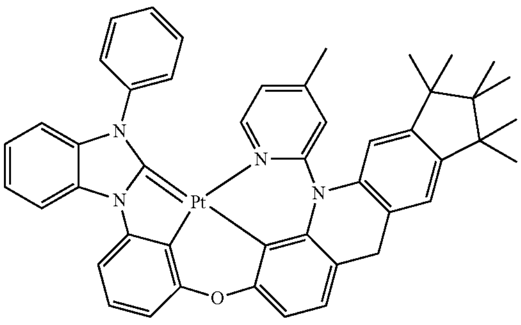

-continued

123

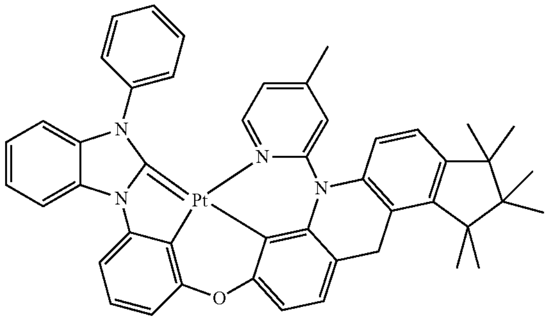

124

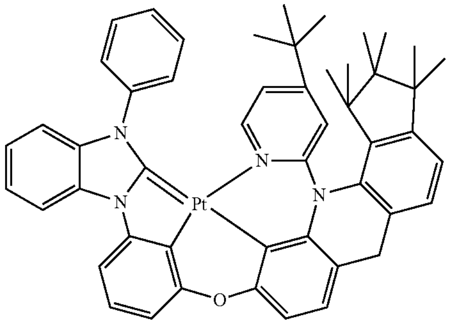

125

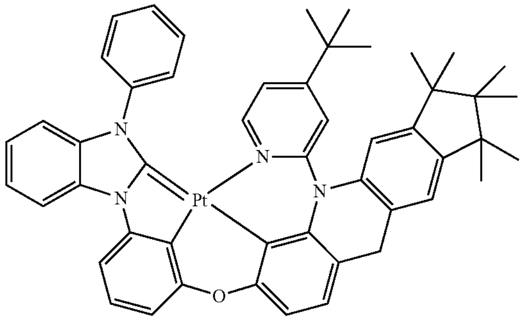

126

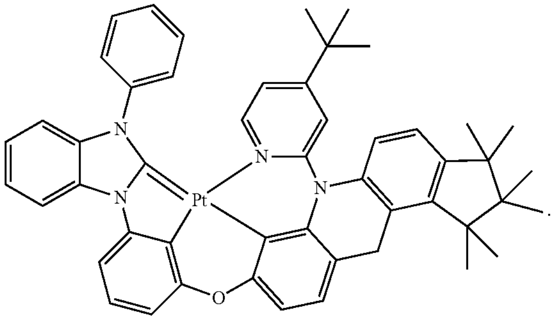

In a light emitting device ED of an embodiment, an emission layer EML includes the organometallic compound of an embodiment and may show improved emission efficiency properties.

In the light emitting devices ED of embodiments as shown in FIG. 3 to FIG. 6, an emission layer EML may include a host and a dopant, and the emission layer EML may include the organometallic compound represented by Formula 1 as a dopant material.

In an embodiment, the emission layer EML may emit phosphorescence. For example, the organometallic compound according to an embodiment, represented by Formula 1, may be a phosphorescence dopant.

In another embodiment, the emission layer EML may include a host, a dopant, and a sensitizer, and the sensitizer of the emission layer EML may include the organometallic compound represented by Formula 1. The organometallic compound included in the emission layer EML may function as a sensitizer and may facilitate the transfer of energy from the host to the light-emitting dopant. For example, the organometallic compound may function as an auxiliary dopant to accelerate energy transfer to a first compound which is a light-emitting dopant to increase the light-emitting ratio of the first compound. Accordingly, the emission efficiency of the emission layer EML of an embodiment may be improved. In the case of increasing the energy transfer to the light-emitting dopant through the sensitizer, excitons formed in the emission layer EML may not be accumulated in the emission layer EML but may emit light rapidly, and the deterioration of a device may be reduced. Accordingly, the life of the light emitting device ED of an embodiment may increase.

The emission layer EML may further include a host material in addition to the organometallic compound of an embodiment. In the light emitting device ED of an embodiment, the emission layer EML may include common materials of the art as a host material. In the light emitting device ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In an embodiment, the emission layer EML may include a compound represented by Formula E-1. The compound represented by Formula E-1 may be used as a fluorescence host material.

[Formula E-1]

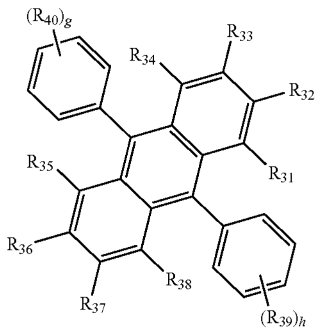

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-1, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, g and h may each independently be an integer from 0 to 5. If g is 2 or more, multiple $R_{40}$ groups may be the same as or different from each other, and if h is 2 or more, multiple $R_{39}$ groups may be the same as or different from each other.

The compound represented by Formula E-1 may be any one selected from Compound E1 to Compound E19.

E1

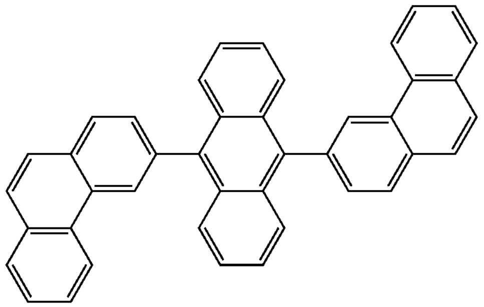

E2

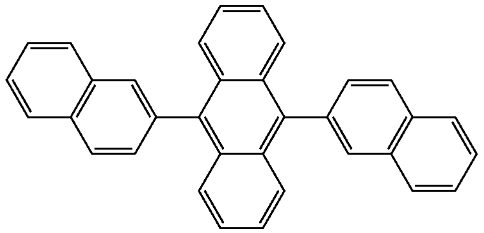

E3

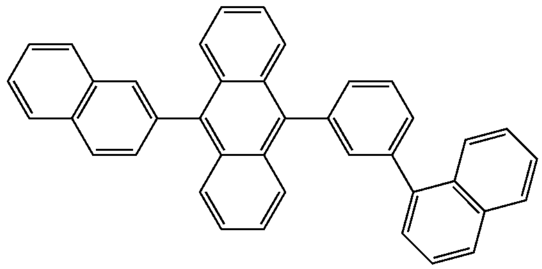

E4

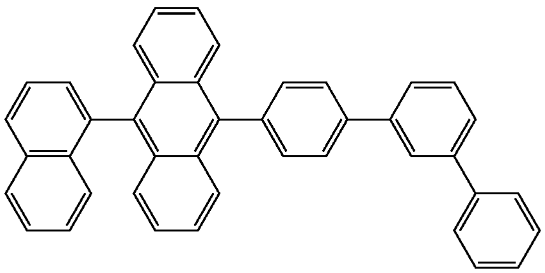

-continued
E5
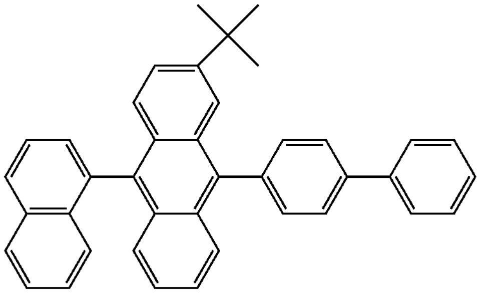
E6
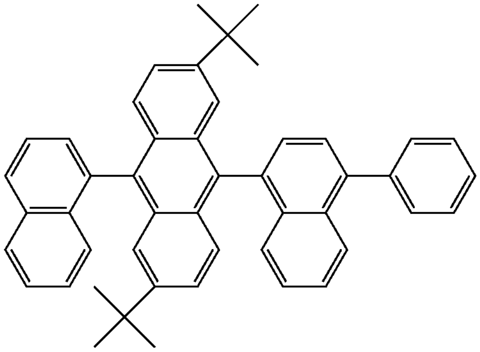
E7
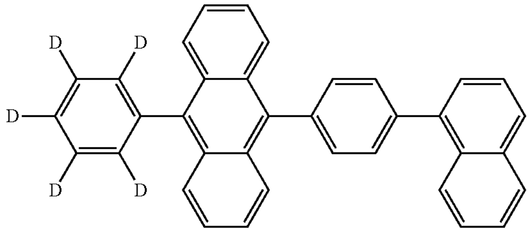
E8
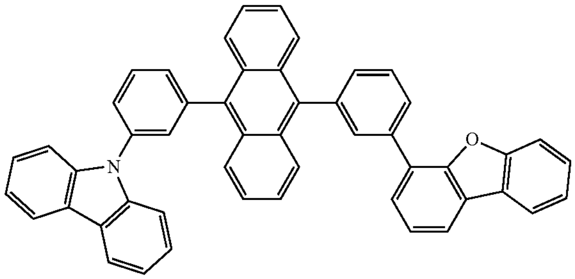
E9
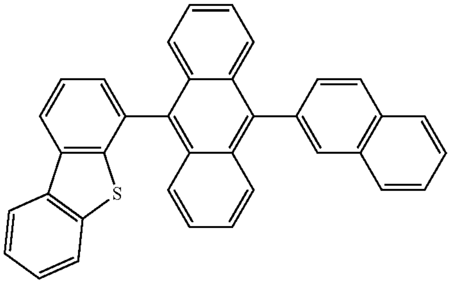
-continued
E10
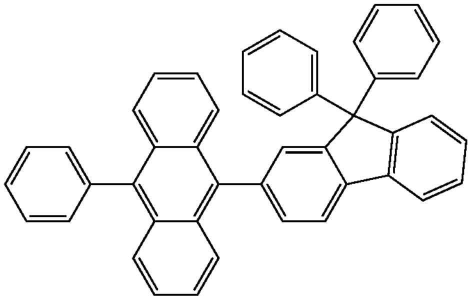
E11
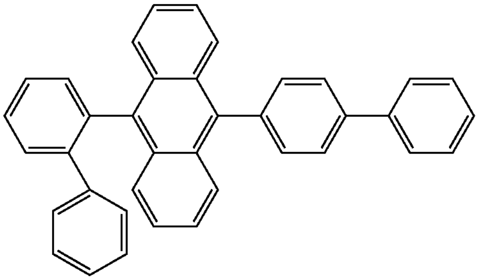
E12
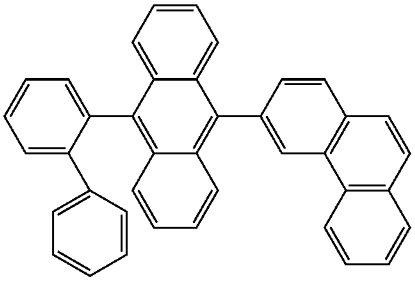
E13
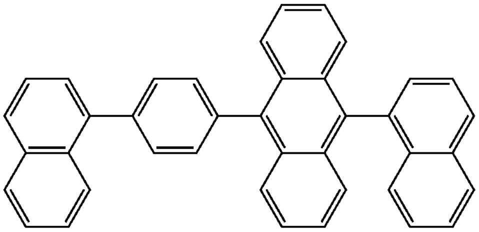
E14
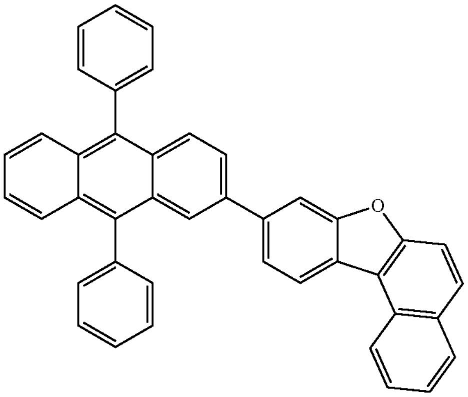

-continued

E15

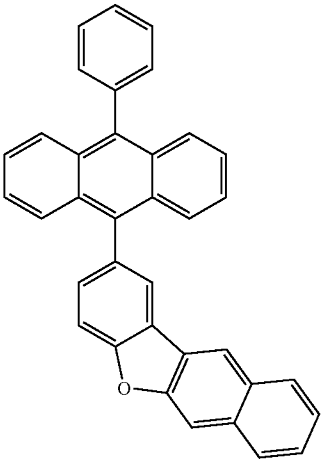

E16

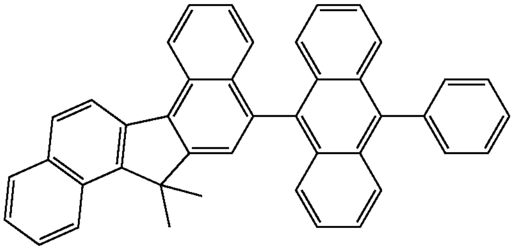

E17

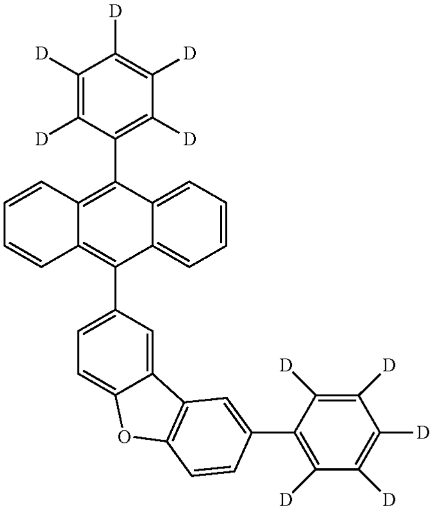

E18

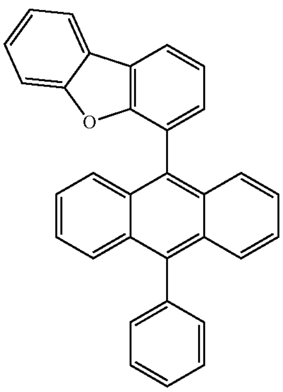

-continued

E19

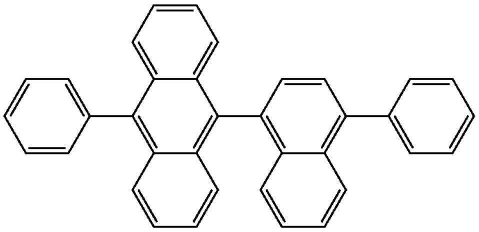

In an embodiment, the emission layer EML may include a compound represented by Formula E-2a or Formula E-2b. The compound represented by Formula E-2a or Formula E-2b may be used as a phosphorescence host material.

[Formula E-2a]

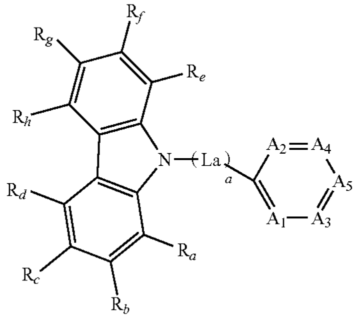

In Formula E-2b, a may be an integer from 0 to 10, and $L_a$ may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple $L_a$ groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or C(Ri). $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(Cbz1)-(L_b)_b-(Cbz2)$$

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2. However, the compounds listed in Compound Group E-2 are only examples, and the compound represented by Formula E-2a or Formula E-2b is not limited to the compounds listed in Compound Group E-2.

[Compound Group E-2]

E-2-1

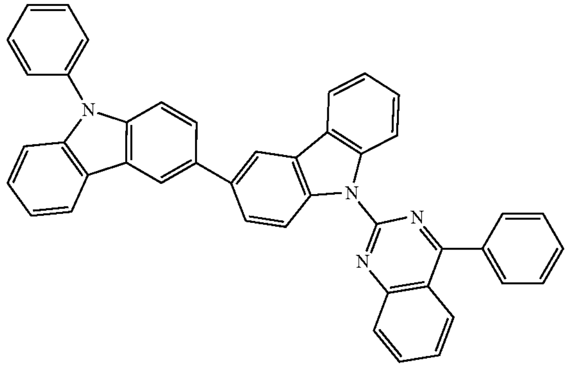

E-2-2

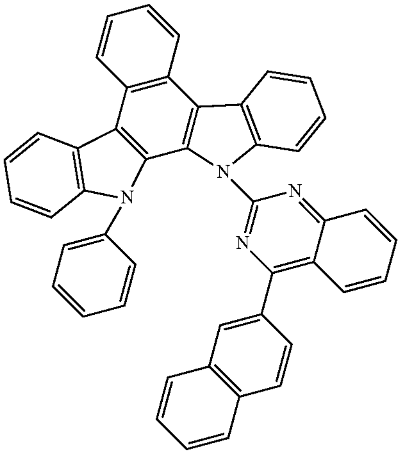

E-2-3

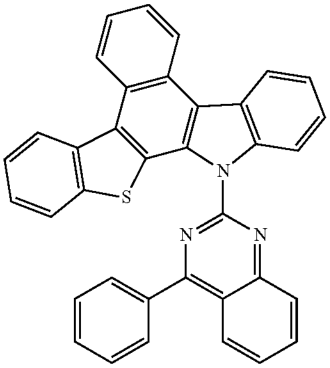

-continued

E-2-4

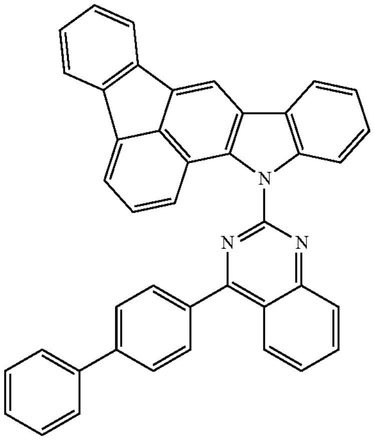

E-2-5

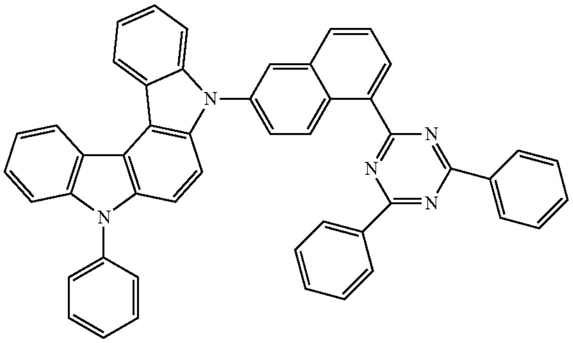

E-2-6

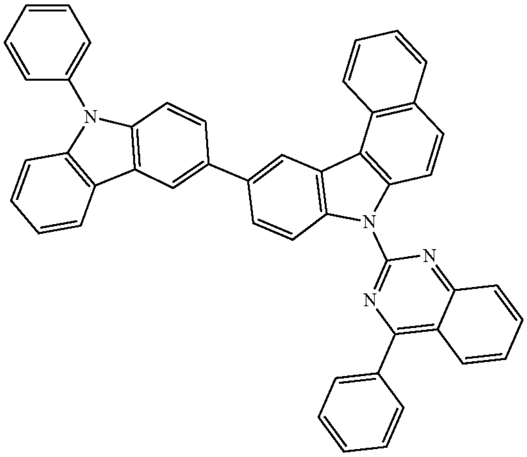

-continued
E-2-7
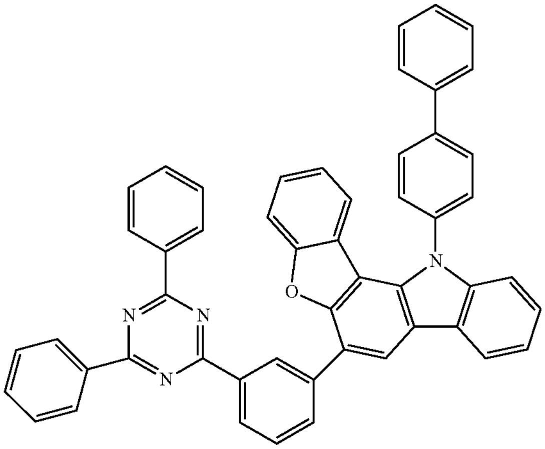
E-2-8
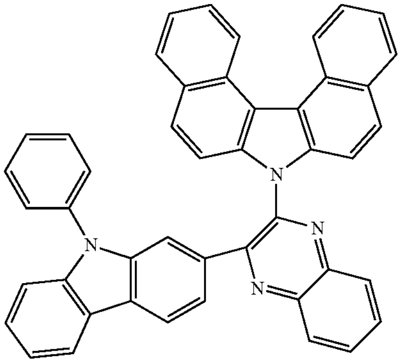
E-2-9
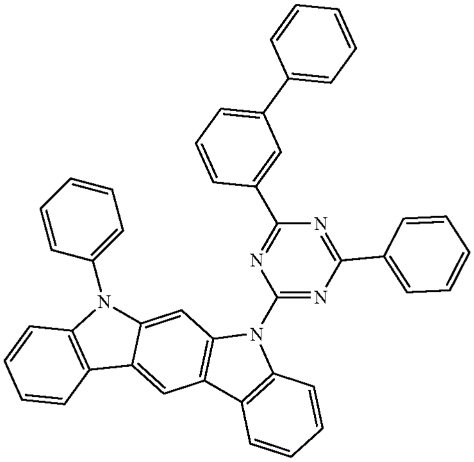
-continued
E-2-10
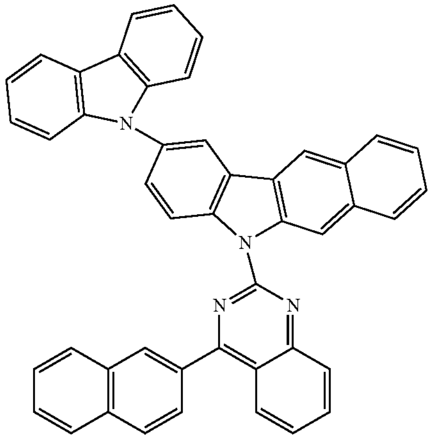
E-2-11
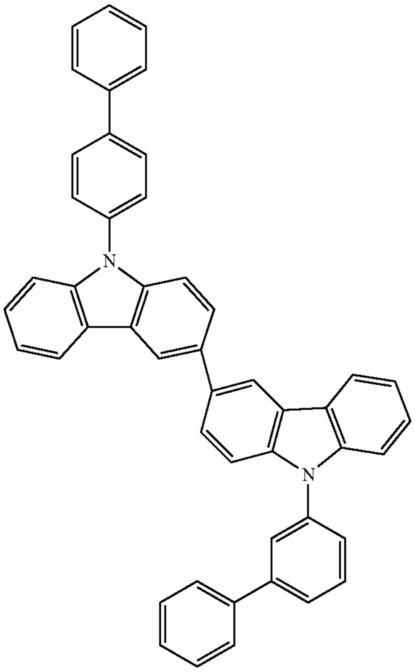
E-2-12
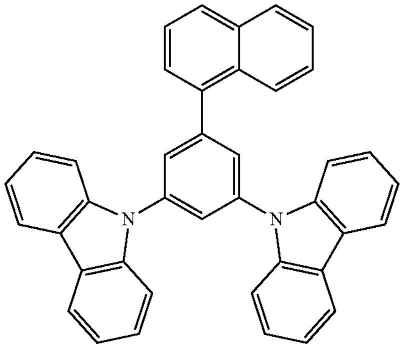

-continued
E-2-13
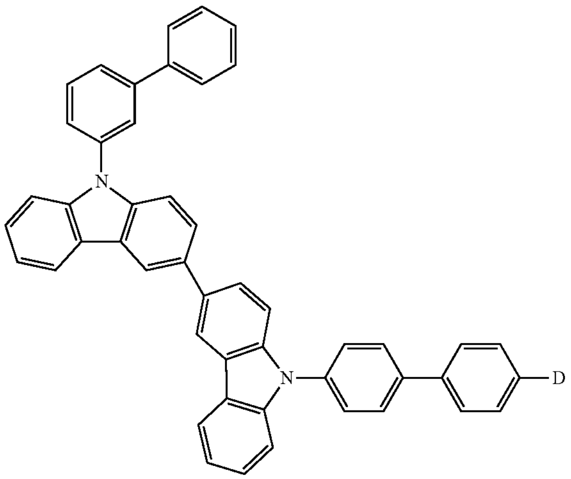
E-2-14
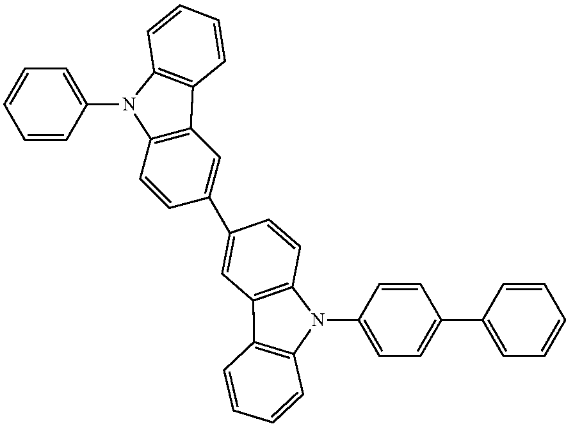
E-2-15
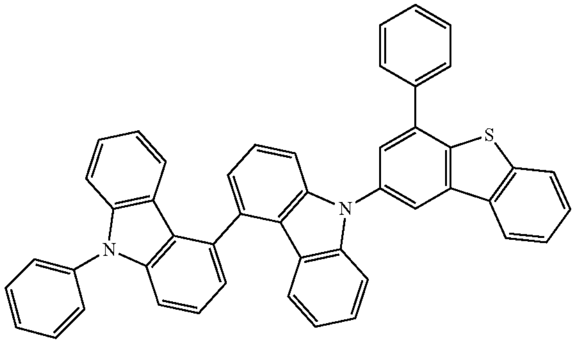
-continued
E-2-16
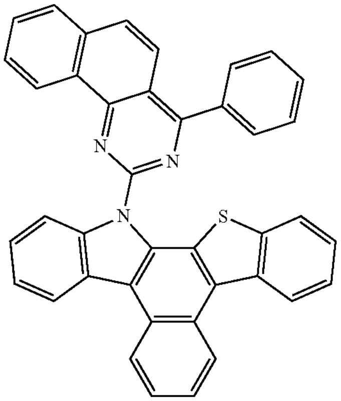
E-2-17
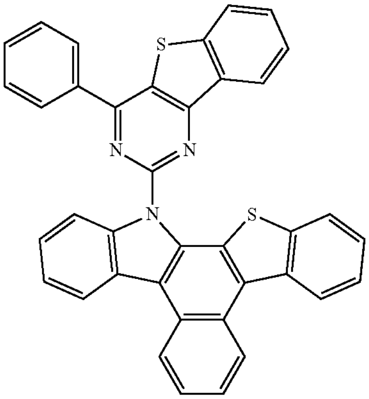
E-2-18
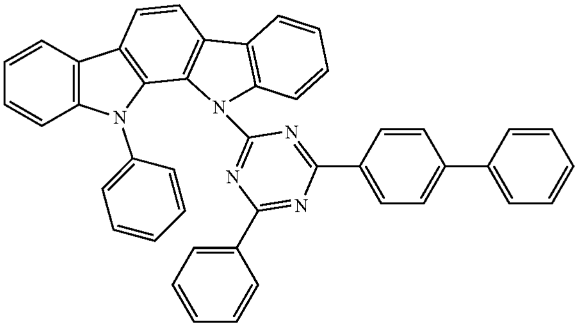
E-2-19
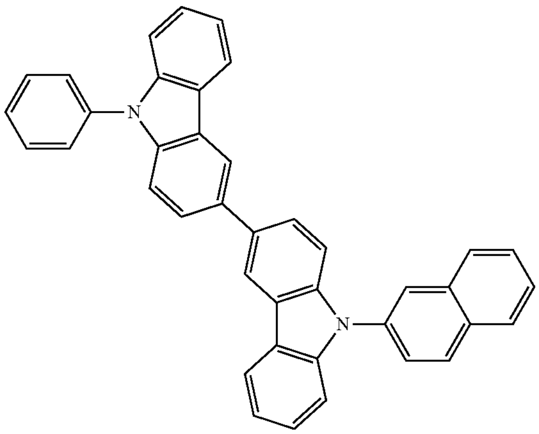

-continued

E-2-20

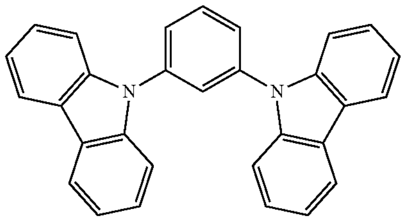

E-2-21

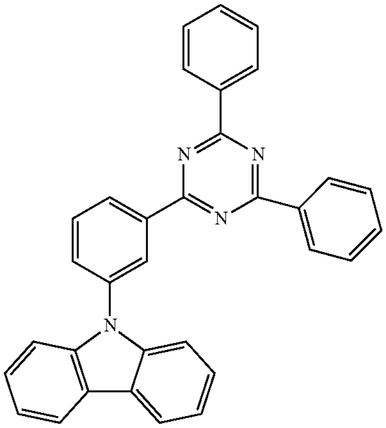

E-2-22

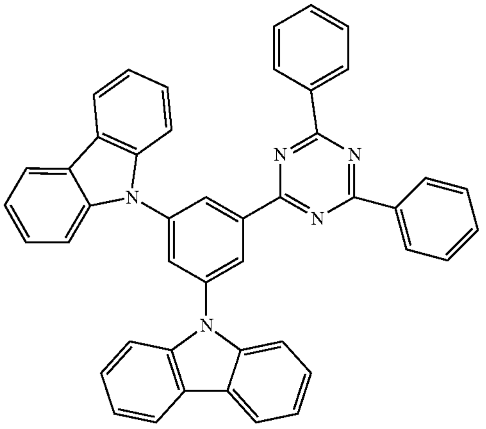

E-2-23

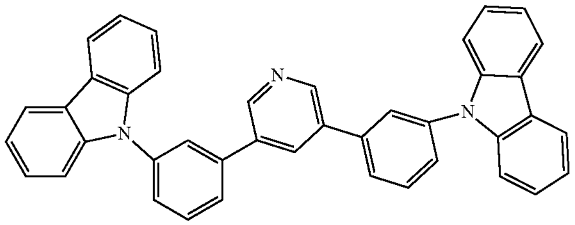

-continued

E-2-24

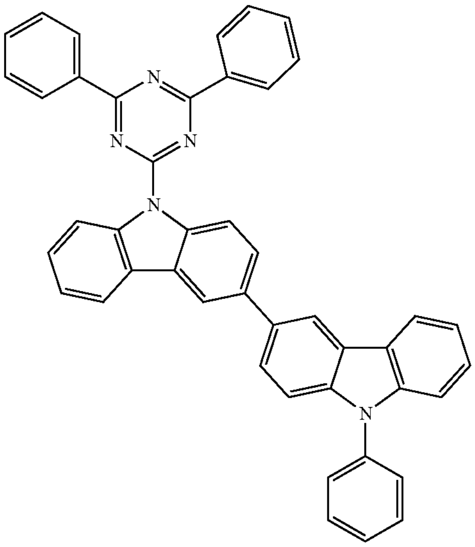

The emission layer EML may further include a material of the art as a host material. For example, the emission layer EML may include as a host material, at least one of bis (4-(9H-carbazol-9-yl)phenyl) diphenylsilane (BCPDS), (4-(1-(4-(diphenylamino) phenyl) cyclohexyl) phenyl) diphenyl-phosphine oxide (POPCPA), bis[2-(diphenylphosphino) phenyl]ether oxide (DPEPO), 4,41-bis(N-carbazolyl)-1,1'-biphenyl (CBP), 1,3-bis(carbazol yl)benzene (mCP), 2,8-bis (diphenylphosphoryl)dibenzo[b,d]furan (PPF), 4,4',4"-tris (carbazol-9-yl)-triphenyl amine (TCTA), or 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 9,10-di (naphthalene-2-yl)anthracene (ADN), 2-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula M-a or Formula M-b. The compound represented by Formula M-a or Formula M-b may be used as a phosphorescence dopant material.

[Formula M-a]

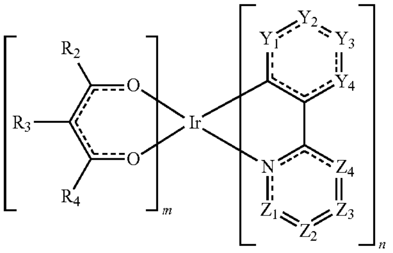

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be used as a phosphorescence dopant.

The compound represented by Formula M-a may be any one selected from Compounds M-a1 to M-a25. However, Compounds M-a1 to M-a25 are only examples, and the compound represented by Formula M-a is not limited to Compounds M-a1 to M-a25.

M-a1

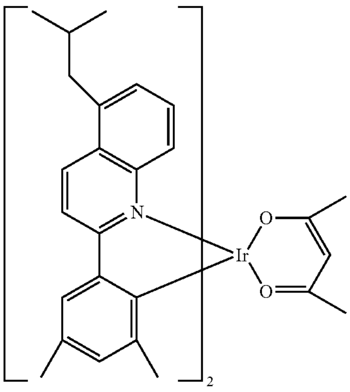

M-a2

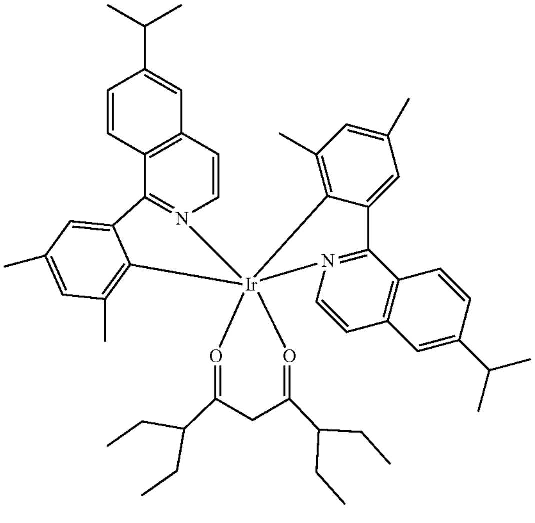

-continued

M-a3

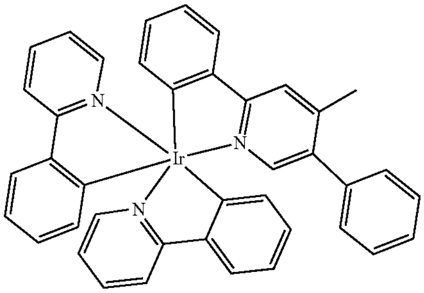

M-a4

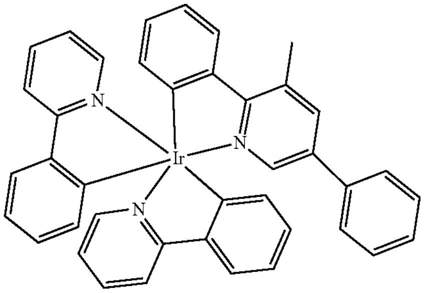

M-a5

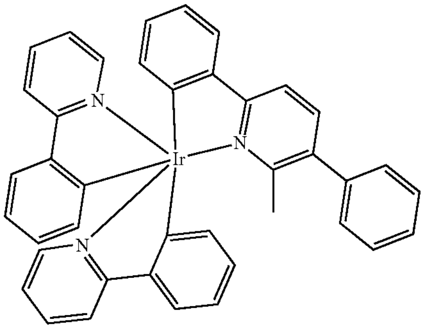

M-a6

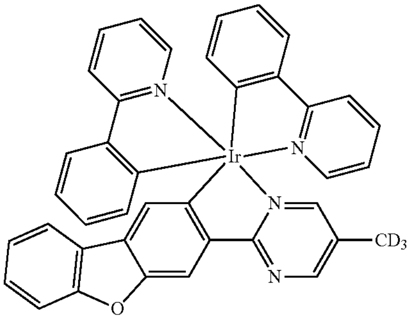

M-a7

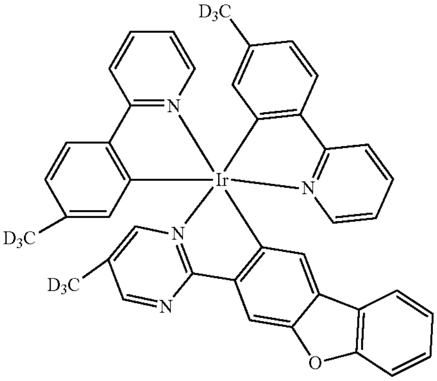

-continued
M-a8
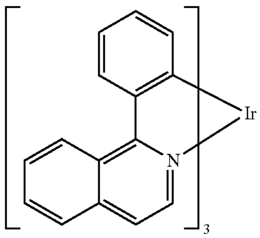
M-a9
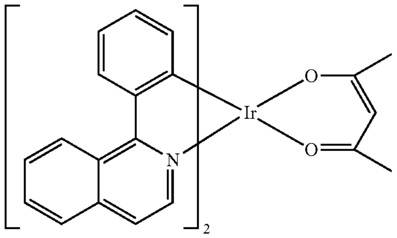
M-a10
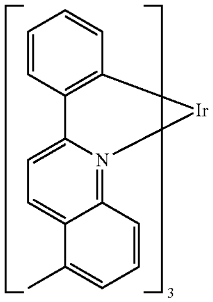
M-a11
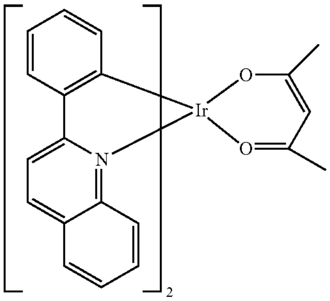
M-a12
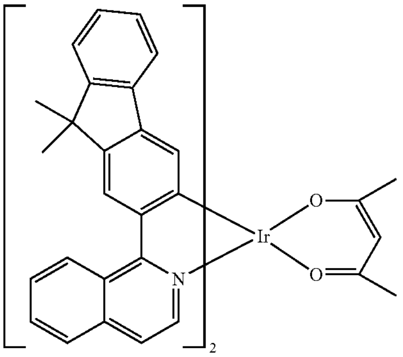
-continued
M-a13
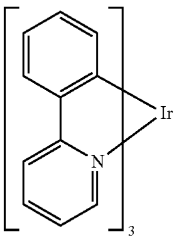
M-a14
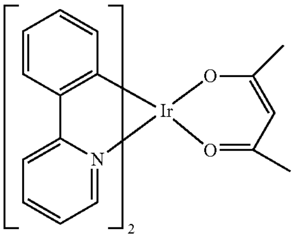
M-a15
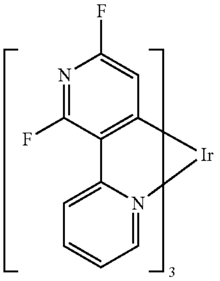
M-a16
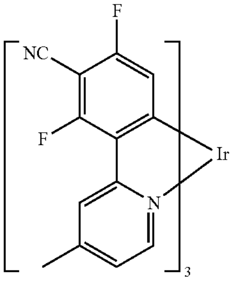
M-a17
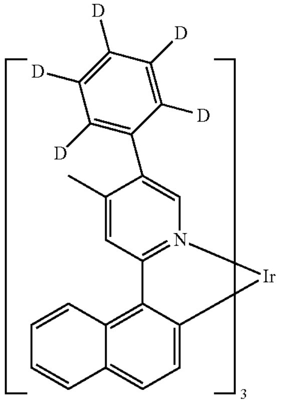

-continued
M-a18
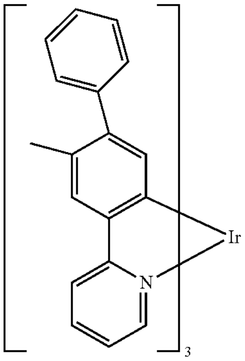
M-a19
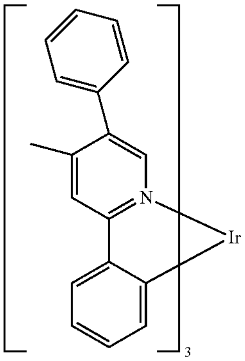
M-a20
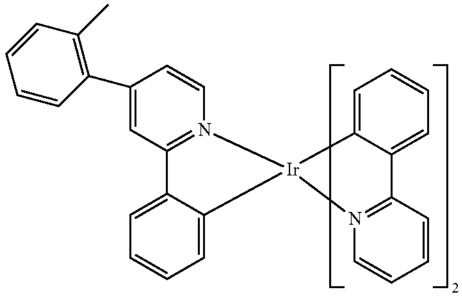
M-a21
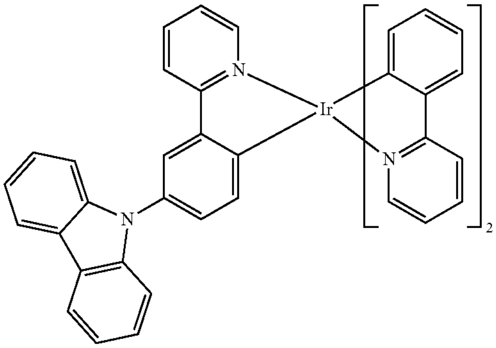
-continued
M-a22
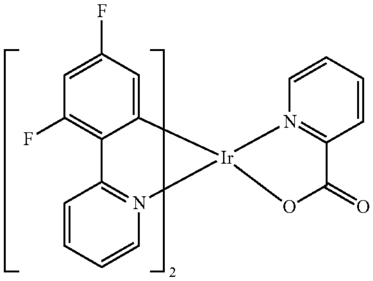
M-a23
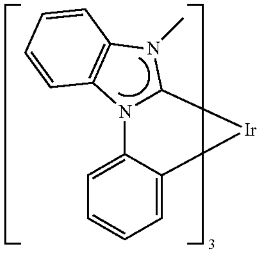
M-a24
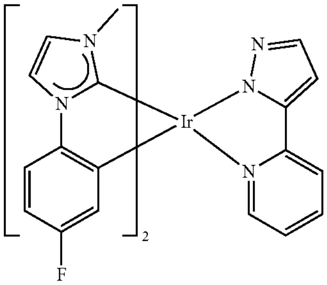
M-a25
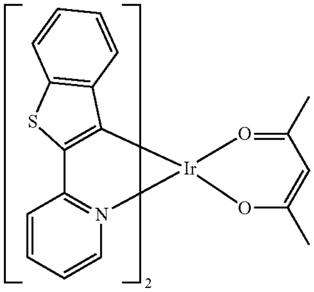
Compound M-a1 and Compound M-a2 may be used as red dopant materials, and
Compound M-a3 to Compound M-a7 may be used as green dopant materials.
[Formula M-b]
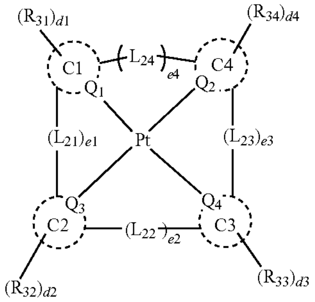

In Formula M-b, $Q_1$ to $Q_4$ may each independently be C or N, and C1 to C4 may each independently be a substituted or unsubstituted hydrocarbon ring of 5 to 30 ring-forming carbon atoms, or a substituted or unsubstituted heterocycle of 2 to 30 ring-forming carbon atoms. In Formula M-b, $L_{21}$ to $L_{24}$ may each independently be a direct linkage,

*—O—*, *—S—*, 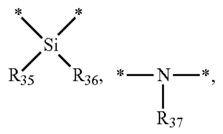

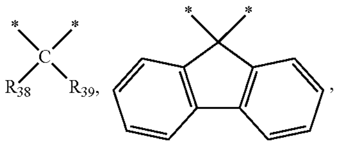

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and d1 to d4 may each independently be an integer from 0 to 4.

The compound represented by Formula M-b may be used as a blue phosphorescence dopant or as a green phosphorescence dopant.

The compound represented by Formula M-b may be any one selected from Compound M-b-1 to Compound M-b-12. However, Compound M-b-1 to Compound M-b-12 are only examples, and the compound represented by Formula M-b is not limited to Compound M-b-1 to Compound M-b-12.

M-b-1

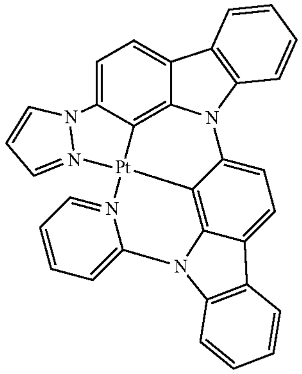

-continued

M-b-2

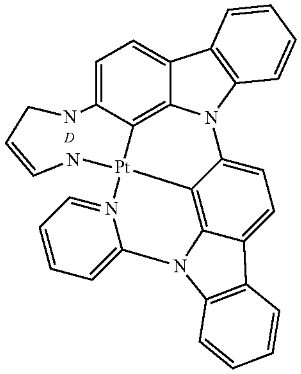

M-b-3

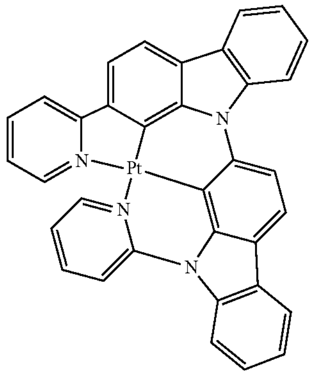

M-b-4

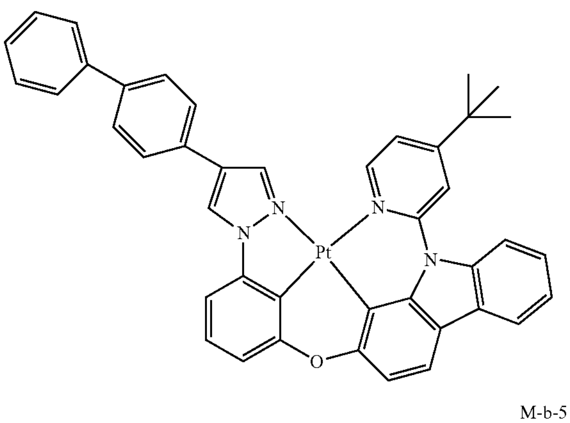

M-b-5

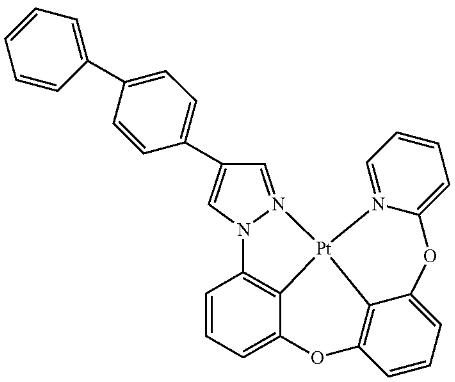

-continued

M-b-6

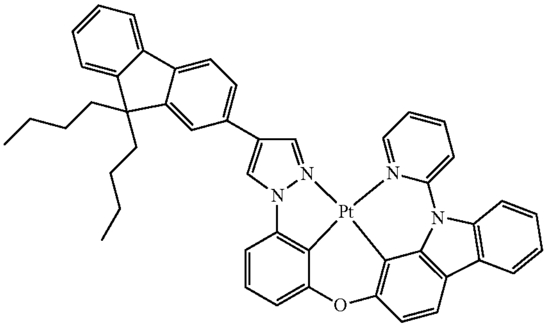

M-b-7

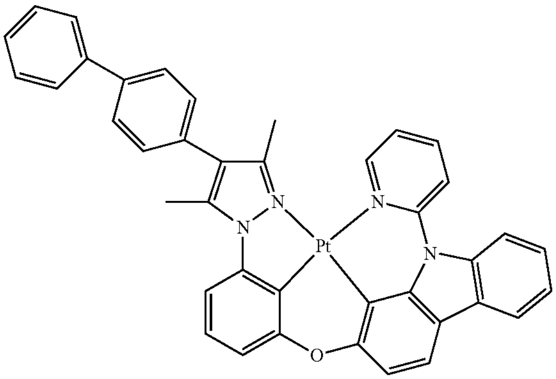

M-b-8

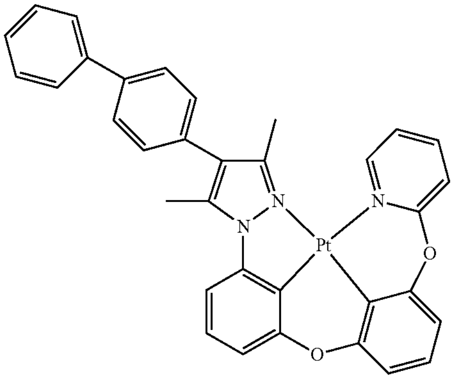

M-b-9

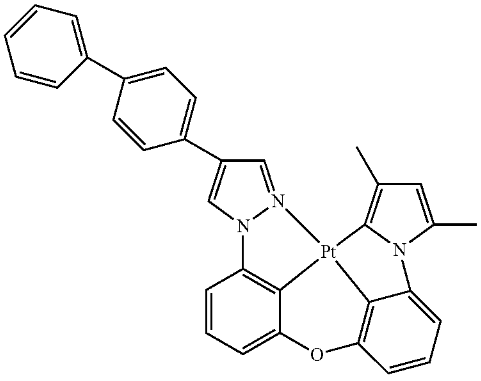

-continued

M-b-10

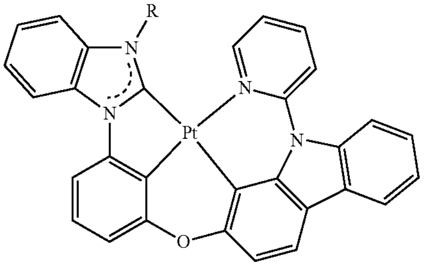

M-b-11

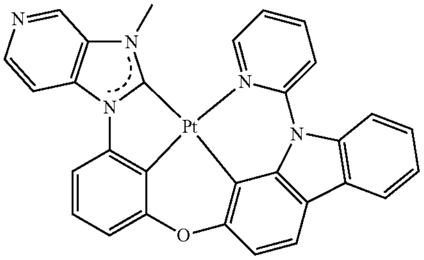

M-b-12

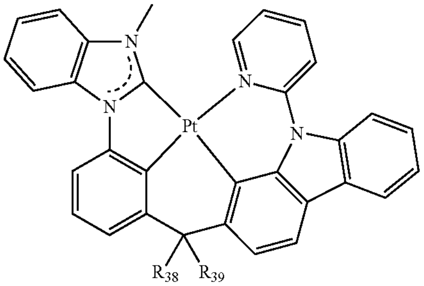

In Compound M-b-1 to Compound M-b-12, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include a compound represented by any one of Formula F-a to Formula F-c. The compounds represented by Formula F-a to Formula F-c may be used as fluorescence dopant materials.

[Formula F-a]

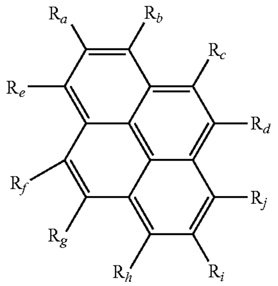

In Formula F-a, two of $R_a$ to may each independently be substituted with a group represented by $*-NAr_1Ar_2.$ The remainder of $R_a$ to $R_j$ not substituted with the group represented by $*-NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group represented by $*-NAr_1Ar_2,$ $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ of $Ar_2$ may be a heteroaryl group including O or S as a ring-forming atom.

[Formula F-b]

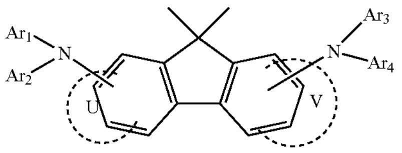

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, if the number of U or V is 1, a fused ring may be present at the part designated by U or V, and if the number of U or V is 0, a ring may not be present at the part designated by U or V. If the number of U is 0 and the number of V is 1, or if the number of U is 1 and the number of V is 0, a fused ring having the fluorene core of Formula F-b may be a ring compound with four rings. If the number of both U and V is 0, a fused ring having the fluorene core of Formula F-b may be a ring compound with three rings. If the number of U and V is each 1, a fused ring having the fluorene core of Formula F-b may be a ring compound with five rings.

[Formula F-c]

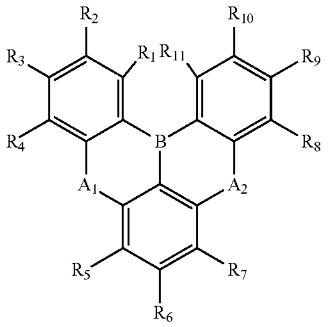

In Formula F-c, $A_1$ and $A_2$ may each independently be O, S, Se, or $N(R_m)$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $A_1$ and $A_2$ are each independently $N(R_m)$, $A_1$ may be combined with $R_4$ or $R_5$ to form a ring. For example, $A_2$ may be combined with $R_7$ or $R_8$ to form a ring.

In an embodiment, the emission layer EML may include as a dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl) naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The emission layer EML may include a phosphorescence dopant material. For example, the phosphorescence dopant may include a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), or platinum octaethyl porphyrin (PtOEP) may be used as the phosphorescence dopant. However, embodiments are not limited thereto.

The emission layer EML may include a quantum dot. The quantum dot may be a Group II-VI compound, a Group III-VI compound, a Group compound, a Group III-V compound, a Group III-II-V compound, a Group IV-VI compound, a Group IV element, a Group IV compound, or a combination thereof.

The Group II-VI compound may be selected from: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof; or any combination thereof.

The Group III-V compound may include a binary compound such as $In_2S_3$, and $In_2Se_3$; a ternary compound such as $InGaS_3$, and $InGaSe_3$; or any combination thereof.

The Group compound may be selected from: a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof; a quaternary compound such as $AgInGaS_2$, and $CuInGaS_2$; or any combination thereof.

The Group III-V compound may be selected from: a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof; or any combination thereof. The Group III-V compound may further include a Group II metal. For example, InZnP, etc. may be selected as a Group III-II-V compound.

The Group IV-VI compound may be selected from: a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; a quaternary compound selected from the group consisting of SnPbSSe, SnPbSeTe, SnPbSTe, and mixtures thereof; or any combination thereof. The group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration or may be present in a particle at a partially different concentration distribution state. In an embodiment, the quantum dot may have a core/shell structure in which a quantum dot surrounds another quantum dot. An interface between the core and the shell may have a concentration gradient in which the concentration of an element that is present in the shell decreases toward the center.

In embodiments, a quantum dot may have a core-shell structure including a core including a nanocrystal and a shell surrounding the core. The shell of the quantum dot may function as a protection layer that prevents chemical deformation of the core to maintain semiconductor properties and/or may function as a charging layer that imparts the quantum dot with electrophoretic properties. The shell may be a single layer or a multilayer. Examples of the shell of the quantum dot may include a metal oxide, a non-metal oxide, a semiconductor compound, or combinations thereof.

For example, the metal oxide or the non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO; or a ternary compound such as $MgAl_2O_4$, $CoFe_2O_4$, $NiFe_2O_4$ and $CoMn_2O_4$, but embodiments are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Color purity or color reproducibility may be improved within these ranges. Light emitted through the quantum dot may be emitted in all directions, so that light viewing angle properties may be improved.

The form of the quantum dot may be shapes which are in the art, without specific limitation. For example, the quantum dot may have a spherical shape, a pyramidal shape, a multi-arm shape, or a cubic shape, or the quantum dot may be in the form of a nanoparticle, a nanotube, a nanowire, a nanofiber, a nanoplate particle, etc.

The quantum dot may control the color of light emitted according to a particle size thereof, and accordingly, the quantum dot may have various emission colors such as blue, red, or green.

In the light emitting device ED of an embodiment, as shown in FIG. 3 to FIG. 6, the electron transport region ETR is provided on the emission layer EML. The electron transport region ETR may include at least one of an electron blocking layer HBL, an electron transport layer ETL, or an electron injection layer EIL. However, embodiments are not limited thereto.

The electron transport region ETR may be a layer formed of a single material, a layer formed of different materials, or a multilayer structure having layers formed of different materials.

For example, the electron transport region ETR may have a single layer structure of an electron injection layer EIL or an electron transport layer ETL, or a single layer structure formed of an electron injection material and an electron transport material. In other embodiments, the electron transport region ETR may have a single layer structure formed of different materials, or may have a structure in which an electron transport layer ETL/electron injection layer EIL, or a hole blocking layer HBL/electron transport layer ETL/electron injection layer EIL, are stacked in its respective stated order from the light emitting layer EML, but embodiments are not limited thereto. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1.

[Formula ET-1]

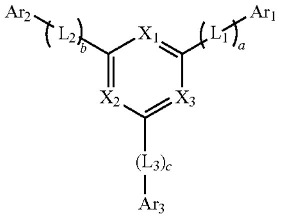

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to Ara may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If a to c are 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), diphenyl[4-(triphenyl silyl)phenyl]phosphine oxide (TSPO1), 1,3,5-tri[(3-pyridyl)-phen-3-yl]benzene, 2,4,6-tris (3'-(pyridin-3-yl)biphenyl-3-yl)-1,3,5-tri azine, 2-(4-(N-phenylbenzoimidazolyl yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl) anthracene (ADN), 1,3-bis[3,5-di(pyridin-3-yl)phenyl] benzene (BmPyPhB), and mixtures thereof, without limitation.

The electron transport region ETR may include at least one of Compounds ET1 to ET36.

ET1

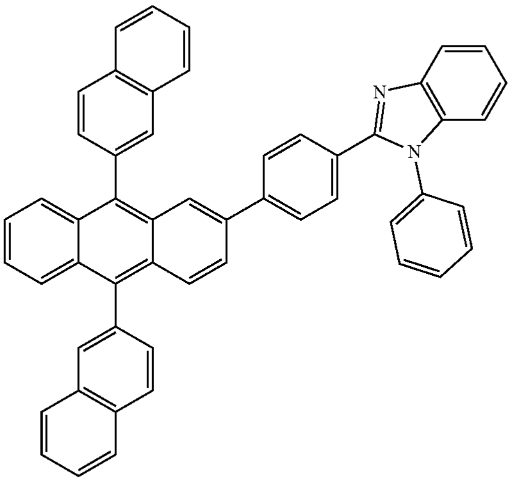

ET2

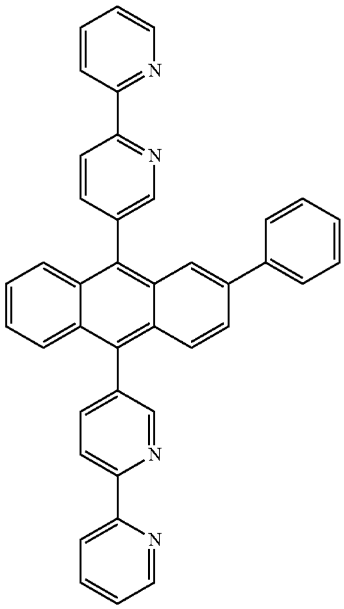

ET3

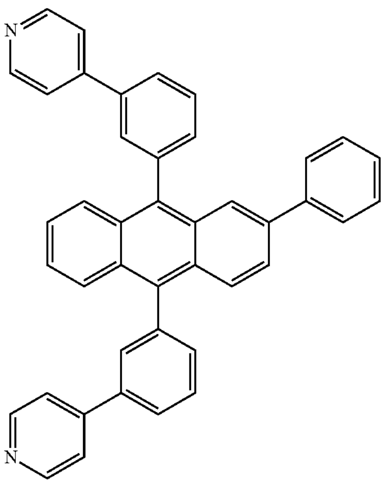

-continued
ET4
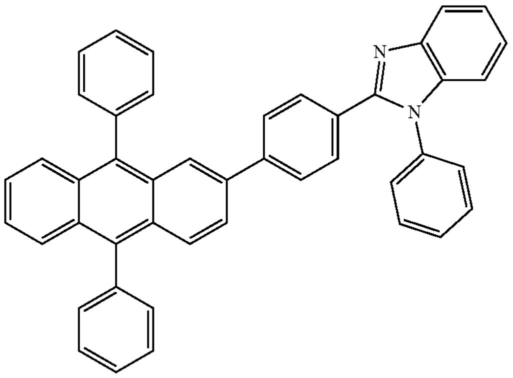
ET5
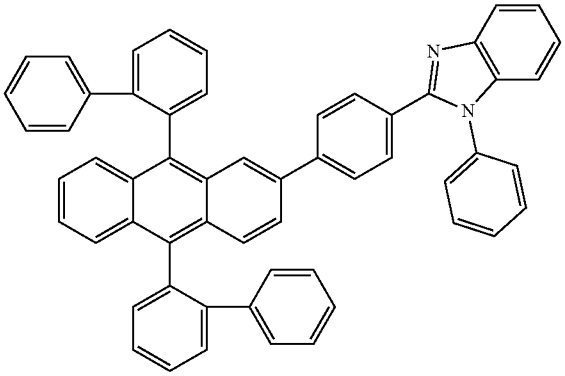
ET6
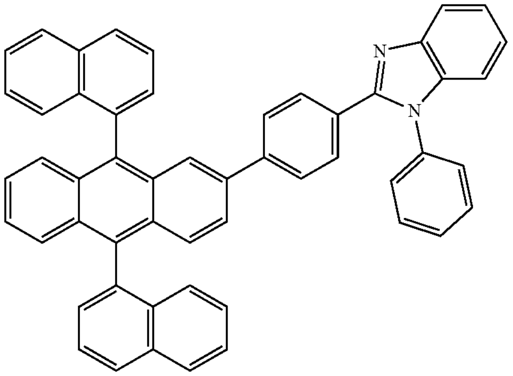
-continued
ET7
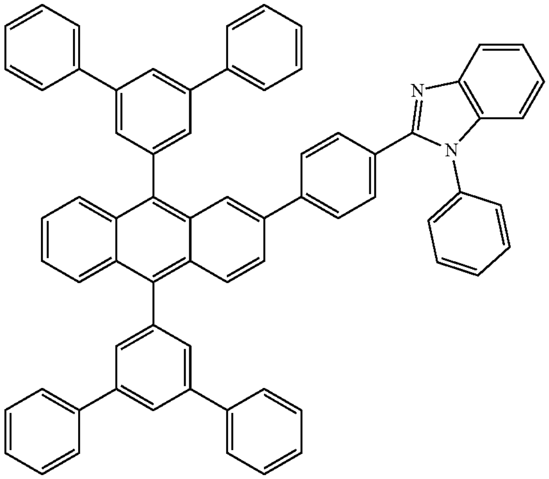
ET8
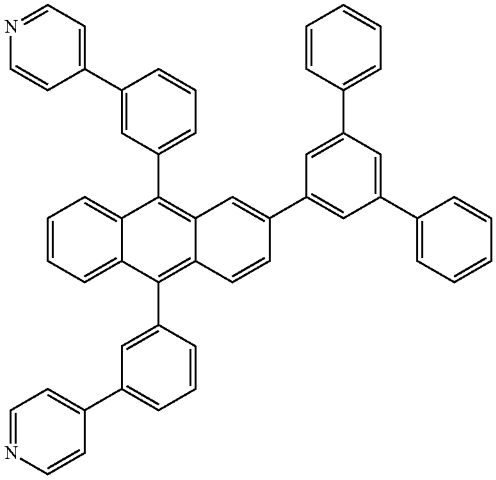
ET9
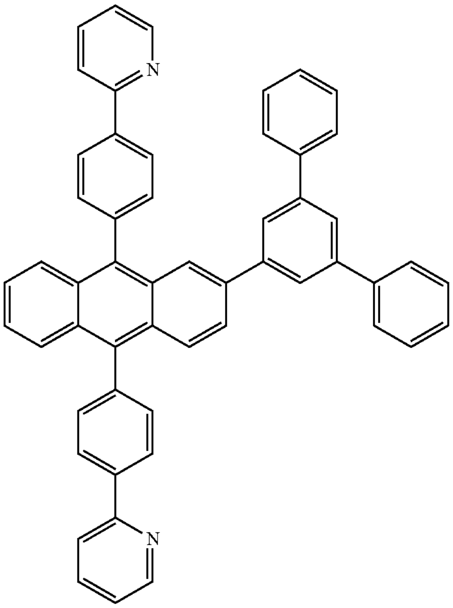

-continued
ET10
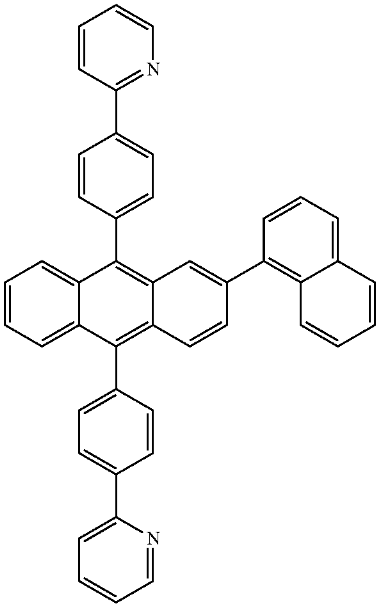
ET11
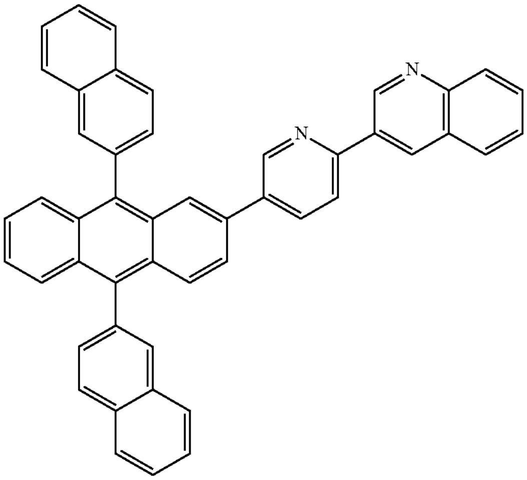
ET12
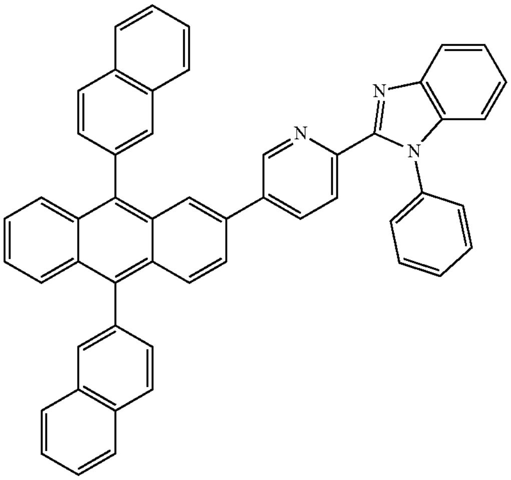
-continued
ET13
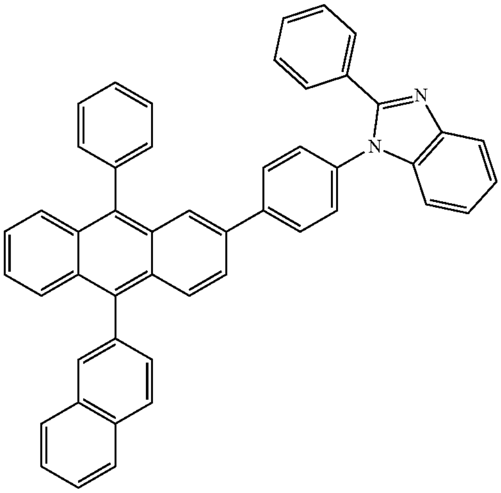
ET14
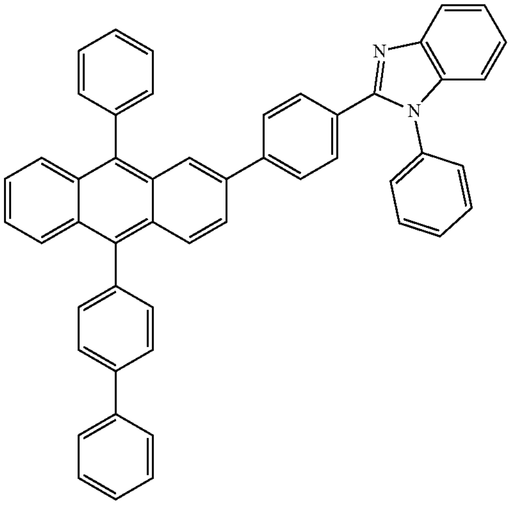
ET15
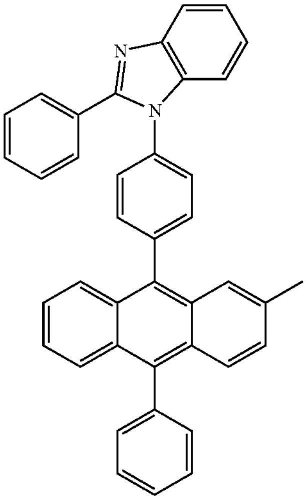

-continued
ET16
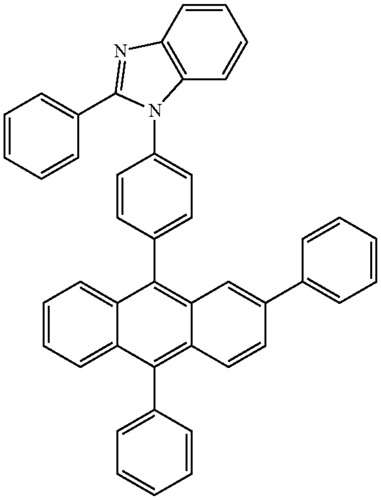
ET17
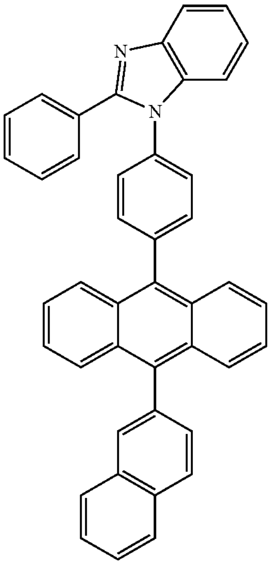
ET18
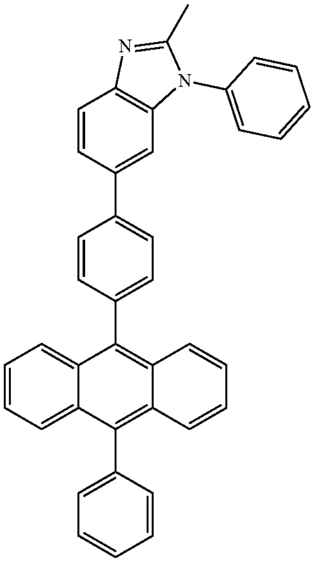
-continued
ET19
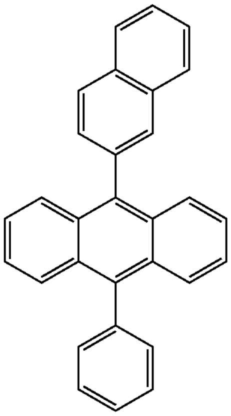
ET20
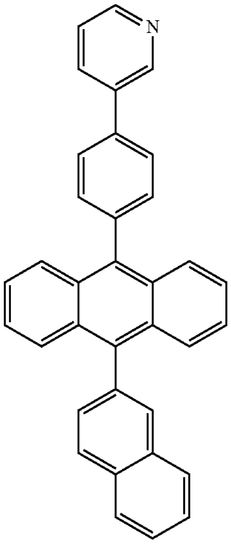
ET21
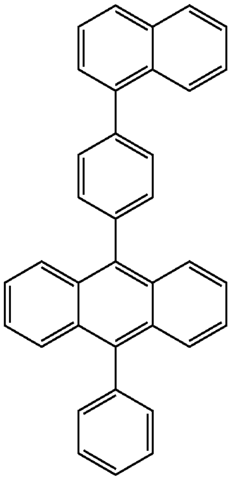

-continued
ET22
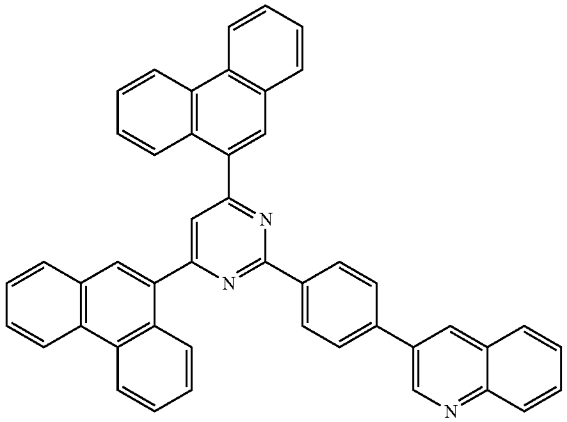
ET23
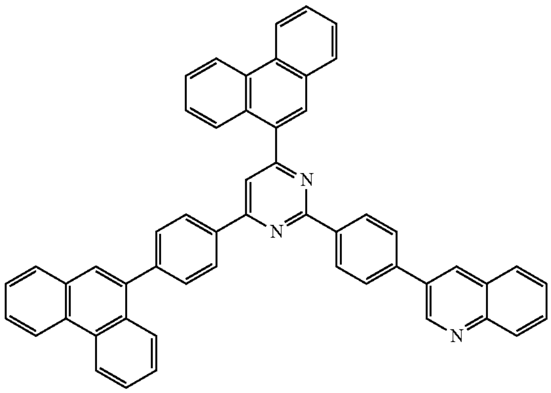
ET24
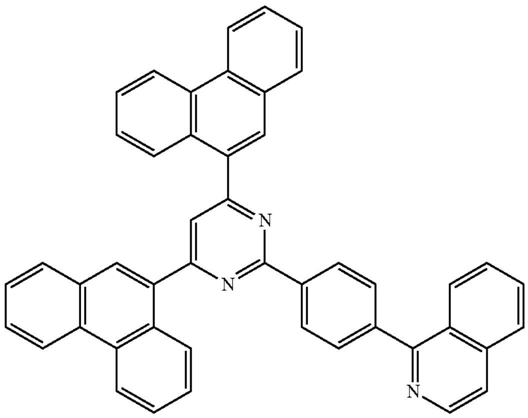
-continued
ET25
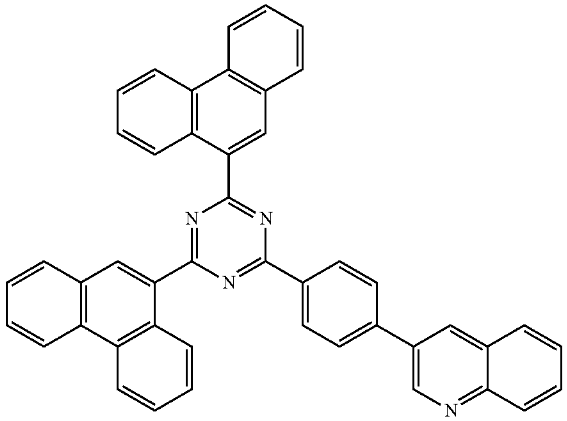
ET26
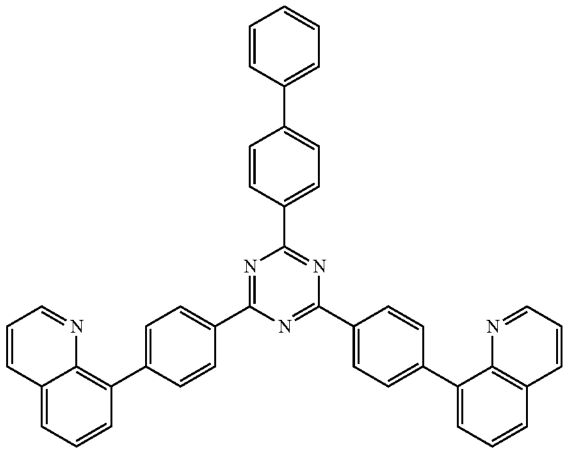
ET27
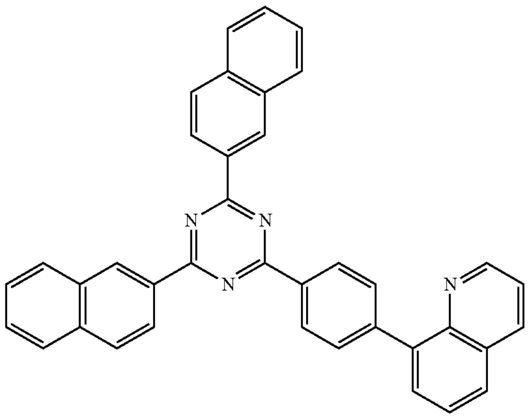

-continued
ET28
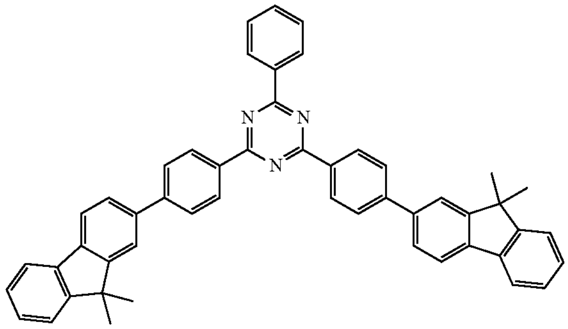
ET29
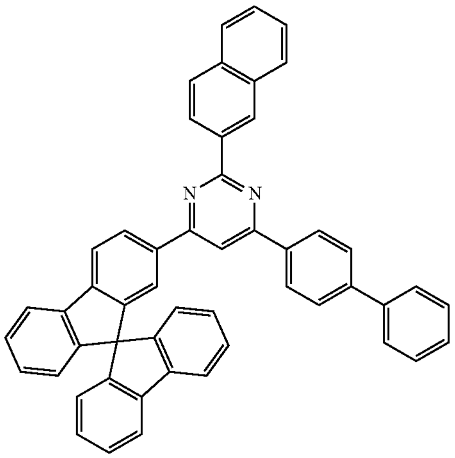
ET30
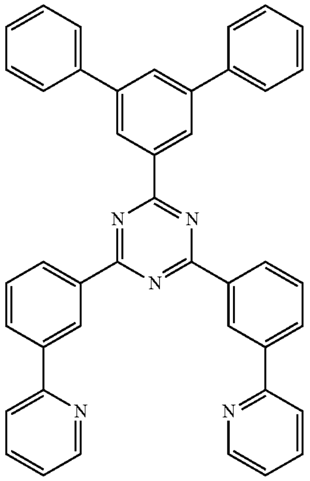
-continued
ET31
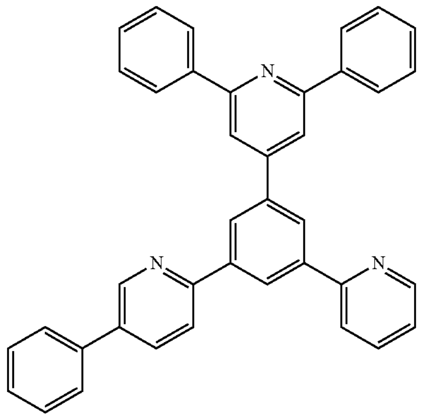
ET32
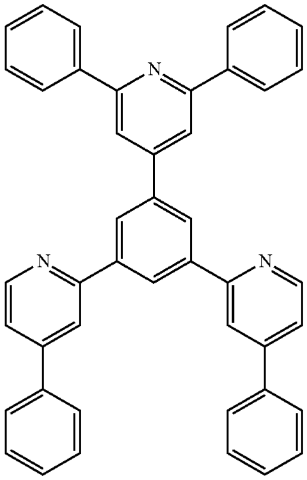
ET33
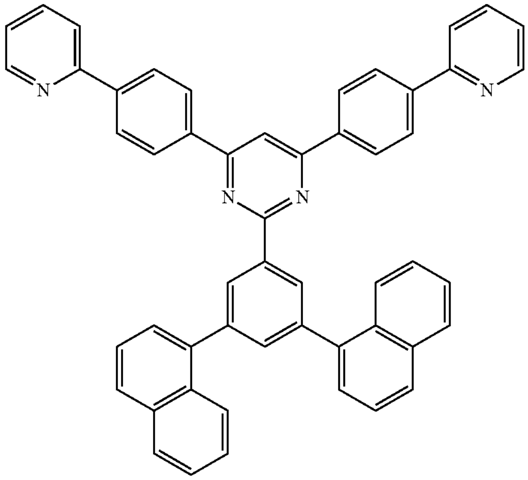

-continued

ET34

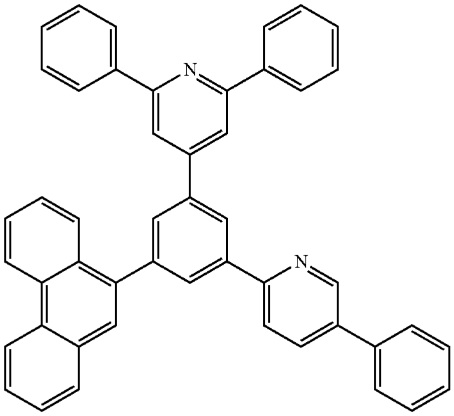

ET35

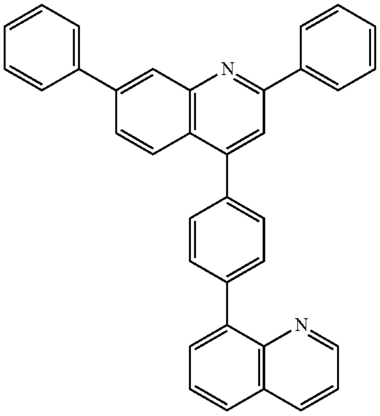

ET36

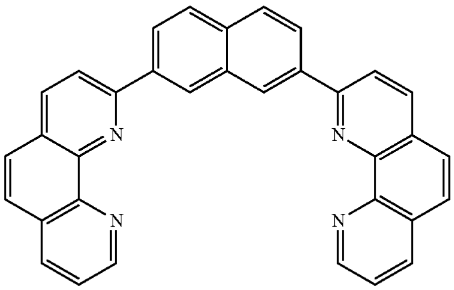

The electron transport region ETR may include a metal halide such as LiF, NaCl, CsF, RbCl, RbI, CuI and KI, a lanthanide such as Yb, or a co-depositing material of the metal halide and the lanthanide. For example, the electron transport region ETR may include KI:Yb, RbI:Yb, etc., as the co-depositing material. The electron transport region ETR may include a metal oxide such as $Li_2O$ and BaO, or 8-hydroxy-lithium quinolate (Liq). However, embodiments are not limited thereto. The electron transport region ETR also may be formed of a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, embodiments are not limited thereto.

The electron transport region ETR may include the compounds of the electron transport region in at least one of an electron injection layer EIL, an electron transport layer ETL, or a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without a substantial increase of driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without inducing a substantial increase of driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). In another embodiment, the second electrode EL2 may have a multi-layered structure including a reflective layer or a transflective layer formed of the above-described materials and a transparent conductive layer formed of ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting device ED may further include a capping layer CPL disposed on the second electrode EL2. The capping layer CPL may be a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), etc., or may include an epoxy resin, or acrylate such as methacrylate. The capping layer CPL may include at least one of Compounds P1 to P5, but embodiments are not limited thereto.

P1

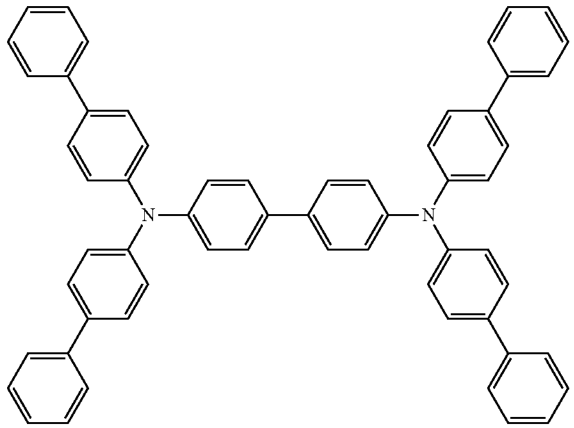

P2

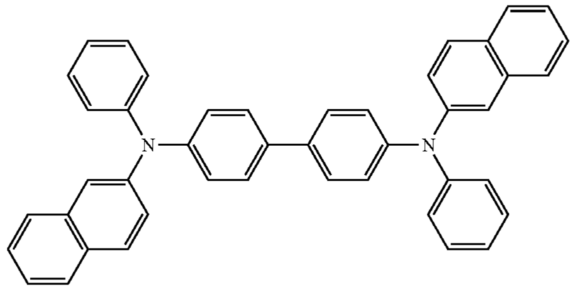

P3

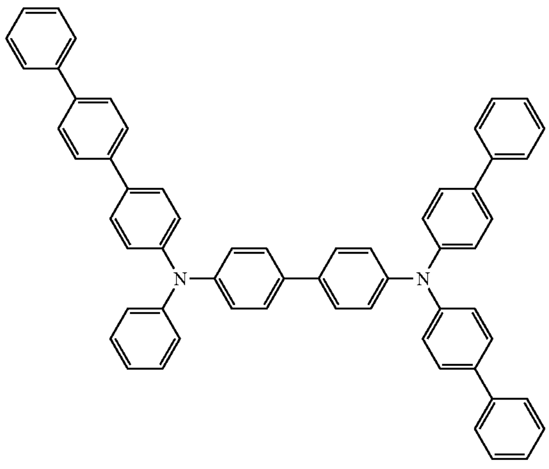

-continued

P4

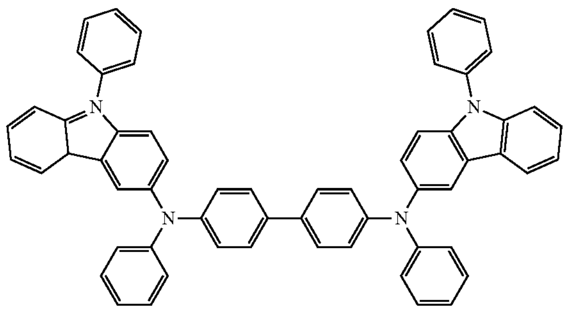

P5

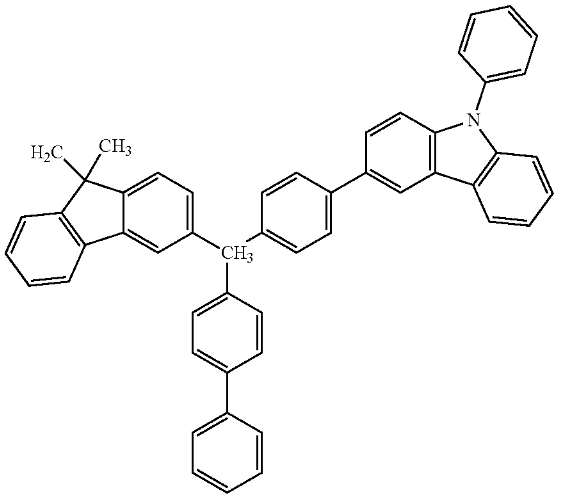

A refractive index of the capping layer CPL may be equal to or greater than about 1.6. For example, the refractive index of the capping layer CPL may be equal to or greater than about 1.6, with respect to light in a wavelength range of about 550 nm to about 660 nm.

Figure 7:
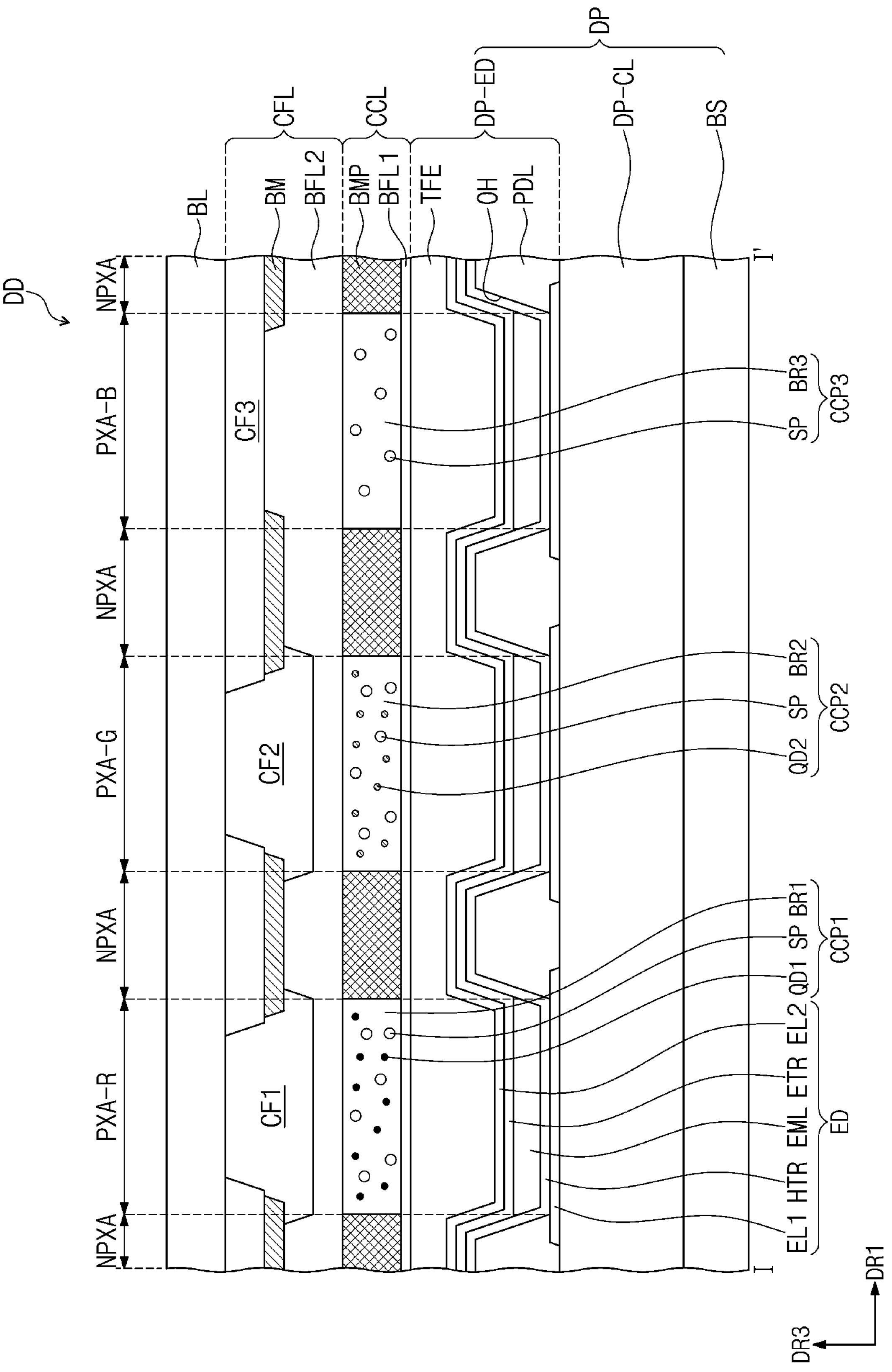
FIG. 7 is a schematic cross-sectional view of a display apparatus according to an embodiment.
Figure 8:
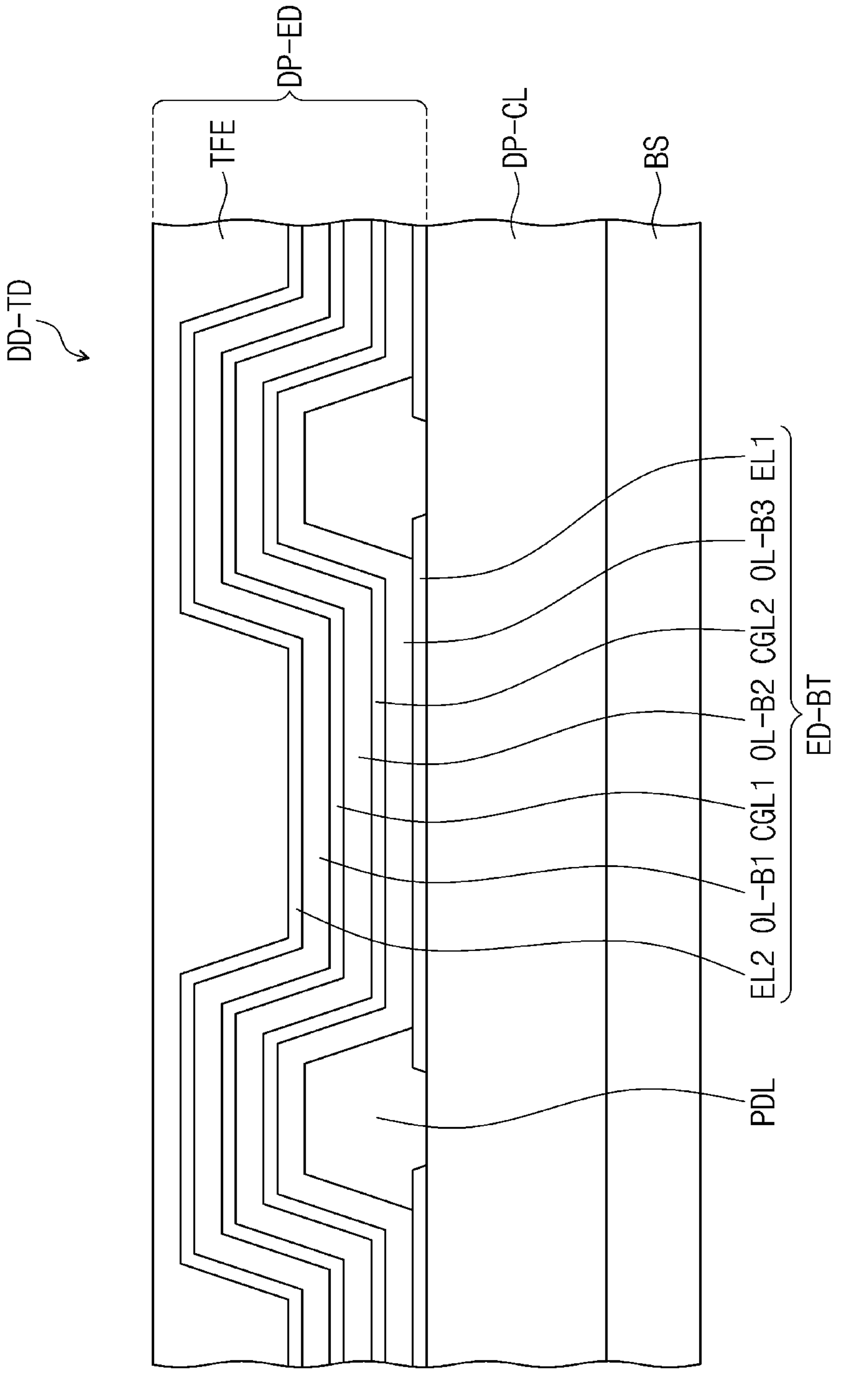
FIG. 8 is a schematic cross-sectional view of a display apparatus according to an embodiment.

FIG. 7 and FIG. 8 are each a schematic cross-sectional view of a display apparatus according to embodiments. In the explanation on the display apparatuses of embodiments, referring to FIG. 7 and FIG. 8, the overlapping parts with the explanation on FIG. 1 to FIG. 6 will not be explained again, and the differing features will be explained.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include a light emitting device ED.

The light emitting device ED may include a first electrode EL1, a hole transport region HTR disposed on the first electrode ELL an emission layer EML disposed on the hole transport region HTR, an electron transport region ETR disposed on the emission layer EML, and a second electrode EL2 disposed on the electron transport region ETR. A structure of the light emitting device according to FIG. 3 to FIG. 6 may be applied to the structure of the light emitting device ED shown in FIG. 7.

Referring to FIG. 7, the emission layer EML may be disposed in an opening OH defined in a pixel definition layer PDL. For example, the emission layer EML which is divided by the pixel definition layer PDL and correspondingly provided to each of the luminous areas PXA-R, PXA-G, and PXA-B may emit light in a same wavelength region. In the display apparatus DD of an embodiment, the emission layer EML may emit blue light. Although not shown in the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may include a quantum dot or a phosphor. The light converter may transform the wavelength of a provided light and may emit the transformed light. For example, the light controlling layer CCL may be a layer including a quantum dot or a layer including a phosphor.

The light controlling layer CCL may include light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. In FIG. 8, the partition pattern BMP is shown so that it does not overlap the light controlling parts CCP1, CCP2, and CCP3, but at least a portion of the edge of the light controlling parts CCP1, CCP2, and CCP3 may overlap the partition pattern BMP.

The light controlling layer CCL may include a first light controlling part CCP1 including a first quantum dot QD1 converting first color light provided from the light emitting device ED into second color light, a second light controlling part CCP2 including a second quantum dot QD2 converting first color light provided from the light emitting device ED into third color light, and a third light controlling part CCP3 transmitting first color light provided from the light emitting device ED.

In an embodiment, the first light controlling part CCP1 may provide red light which is the second color light, and the second light controlling part CCP2 may provide green light which is the third color light. The third color controlling part CCP3 may transmit and provide blue light which is the first color light provided from the light emitting device ED. For example, the first quantum dot QD1 may be a red quantum dot, and the second quantum dot QD2 may be a green quantum dot. The same description as provided above with respect to quantum dots may be applied to quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, or hollow silica. The scatterer SP may include at least one of $TiO_2$, ZnO, $Al_2O_3$, $SiO_2$, or hollow silica, or may be a mixture of two or more materials selected from $TiO_2$, ZnO, $Al_2O_3$, $SiO_2$, and hollow silica.

The first light controlling part CCP1, the second light controlling part CCP2, and the third light controlling part CCP3 may each include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2, and BR3 may each be a medium in which the quantum dots QD1 and QD2 and the scatterer SP are dispersed, and may be composed of various resin compositions which may be generally referred to as a binder. For example, the base resins BR1, BR2, and BR3 may each independently be acrylic resins, urethane-based resins, silicone-based resins, epoxy-based resins, etc. The base resins BR1, BR2, and BR3 may each be transparent resins. In an embodiment, the first base resin BR1, the second base resin BR2, and the third base resin BR3 may be the same as or different from each other.

The light controlling layer CCL may include a barrier layer BFL1. The barrier layer BFL1 may block the penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. A barrier layer BFL2 may be provided between the light controlling parts CCP1, CCP2, and CCP3 and a color filter layer CFL.

The barrier layers BFL1 and BFL2 may each include at least one inorganic layer. For example, the barrier layers BFL1 and BFL2 may each be formed of an inorganic material. For example, the barrier layers BFL1 and BFL2 may each include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film securing light transmittance. The barrier layers BFL1 and BFL2 may each further include an organic layer. The barrier layers BFL1 and BFL2 may be composed of a single layer or of multiple layers.

In the display apparatus DD of an embodiment, the color filter layer CFL may be disposed on the light controlling layer CCL. In an embodiment, the color filter layer CFL may be directly disposed on the light controlling layer CCL. For example, the barrier layer BFL2 may be omitted.

The color filter layer CFL may include a light blocking part BM and filters CF1, CF2, and CF3. The color filter layer CFL may include a first filter CF1 that transmits second color light, a second filter CF2 that transmits third color light, and a third filter CF3 that transmits first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and may not include a pigment or dye. The third filter CF3 may be transparent. The third filter CF3 may be formed of a transparent photosensitive resin.

In an embodiment, the first filter CF1 and the second filter CF2 may each be yellow filters. The first filter CF1 and the second filter CF2 may be provided in one body without distinction.

The light blocking part BM may be a black matrix. The light blocking part BM may include an organic light blocking material or an inorganic light blocking material including a black pigment or black dye. The light blocking part BM may prevent light leakage and may distinguish the boundaries between adjacent filters CF1, CF2, and CF3. In an embodiment, the light blocking part BM may be formed as a blue filter.

The first to third filters CF1, CF2, and CF3 may be disposed corresponding to each of a red luminous area PXA-R, green luminous area PXA-G, and blue luminous area PXA-B, respectively.

A base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view showing a portion of the display apparatus according to an embodiment. In a display apparatus DD-TD of an embodiment, the light emitting device ED-BT may include light emitting structures OL-B1, OL-B2, and OL-B3. The light emitting device ED-BT may include oppositely disposed first electrode EL1 and second electrode EL2, and the light emitting structures OL-B1, OL-B2, and OL-B3 stacked in a thickness direction (DR3 in FIGS. 1 and 7) and provided between the first electrode EL1 and the second electrode EL2. Each of the light emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure and including multiple emission layers.

In an embodiment shown in FIG. 8, light emitted from each of the light emitting structures OL-B1, OL-B2, and OL-B3 may be all blue light. However, embodiments are not limited thereto, and the wavelength regions of light emitted from the light emitting structures OL-B1, OL-B2, and OL-B3 may be different from each other. For example, the light emitting device ED-BT including the light emitting structures OL-B1, OL-B2, and OL-B3 emitting light in different wavelength regions may emit white light.

Charge generating layers CGL1 and CGL2 may be disposed between neighboring light emitting structures OL-B1, OL-B2, and OL-B3. The charge generating layers CGL1 and CGL2 may each independently include a p-type charge generating layer and/or an n-type charge generating layer.

Hereinafter, the organometallic compound will be explained with reference to the Examples and the Comparative Examples. The Examples are only provided as illustrations to assist in the understanding of the disclosure, and the scope of the disclosure is not limited thereto.

Synthesis Examples

Organometallic compounds according to embodiments may be synthesized, for example, as follows. However, the synthesis method of an organometallic compound according to an embodiment is not limited thereto.

(1) Synthesis of Common Compounds (C-Compounds) 1 and 2

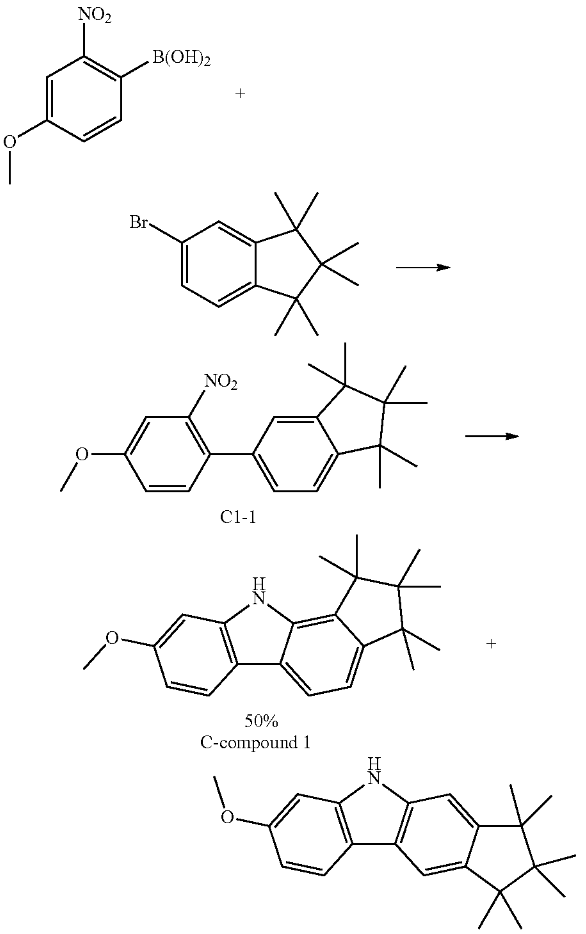

C1-1

50%
C-compound 1

50%
C-compound 2

(Synthesis of C1-1)

(4-methoxy-2-nitrophenyl)boronic acid (1.5 eq), 5-bromo-1,1,2,2,3,3-hexamethyl-2,3-dihydro-1H-indene (1 eq), $Pd(PPh_3)_4$ (0.05 eq), and 2 M $K_2CO_3$ (3 eq) were dissolved in toluene, followed by stirring at about 110° C. for about 12 hours. After finishing the reaction, the solvent was removed under a reduced pressure, and the resultant product was extracted with methylene chloride and distilled water. An extracted organic layer was dried with magnesium sulfate. The residue obtained by removing a solvent was separated using column chromatography to obtain Compound C1-1 in a yield of 85%.

(Synthesis of C-Compounds 1 and 2)

C1-1 (1 eq), and $PPh_3$ (3 eq) were dissolved in o-xylene, followed by stirring at about 190° C. for about 12 hours. After finishing the reaction, the solvent was removed under a reduced pressure, and the resultant product was extracted with methylene chloride and distilled water. An extracted organic layer was dried with magnesium sulfate. The residue obtained by removing a solvent was separated using column chromatography to obtain Common Compounds 1 and 2 in a total yield of 74% (Common Compound 1:Common Compound 2=1:1) as target compounds.

(2) Synthesis of Common Compounds (C-Compounds) 2 and 3

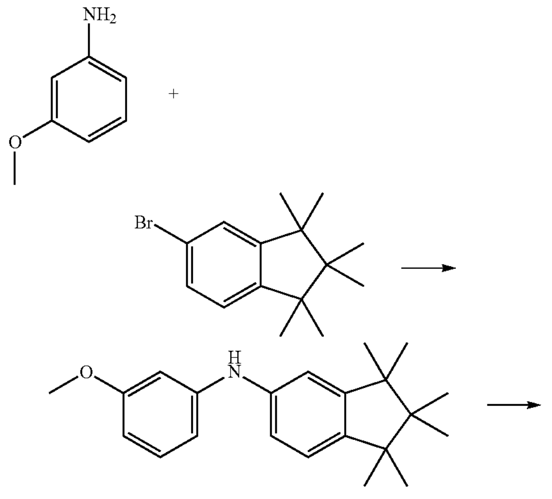

C2-1

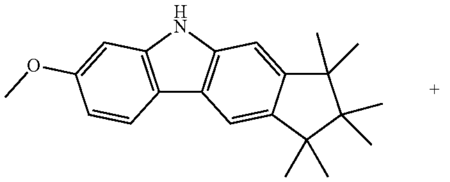

70%
compound 2

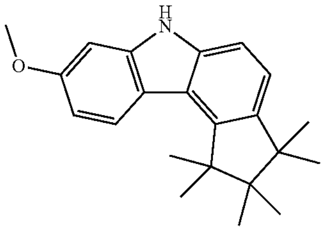

30%
compound 3

(Synthesis of C2-1)

3-methoxyaniline (1.5 eq), 5-bromo-1,1,2,2,3,3-hexamethyl-2,3-dihydro-1H-indene (1 eq), CuI (0.01 eq), $K_2CO_3$ (2.0 eq) and L-proline (0.02 eq) were dissolved in DMSO (0.1 M), followed by stirring at about 130° C. for about 24 hours. After cooling to room temperature, the reaction mixture was extracted with dichloromethane and water three times, and an organic layer was obtained. The organic layer thus obtained was dried with magnesium sulfate, concentrated, and separated using column chromatography to obtain Compound C2-1 in a yield of 65%.

(Synthesis of Compounds 2 and 3)

C2-1 (1 eq), $Cu(OAc)_2$ (0.5 eq), and $Pd(OAc)_2$ (0.05 eq) were dissolved in AcOH, followed by stirring at about 120° C. for about 24 hours. After finishing the reaction, the solvent was removed under a reduced pressure, and the resultant product was extracted with methylene chloride and distilled water. An extracted organic layer was dried with magnesium sulfate. The residue obtained by removing a solvent was separated using column chromatography to obtain Common Compounds 2 and 3 in a total yield of 60% (Common Compound 2:Common Compound 3=7:3) as target compounds.

Common compounds 1, 2 and 3 obtained through the above-described synthesis methods were used for the synthesis of the compounds below.

Common compounds 1, 2 and 3 were designated by C1, C2 and C3 in the synthesis methods below.

1. Synthesis of Compound 1

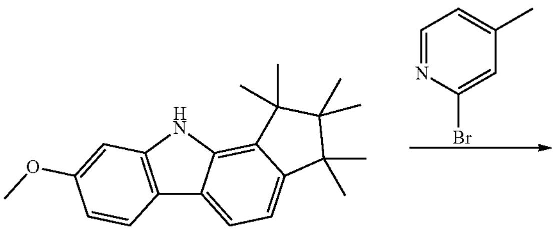

C1

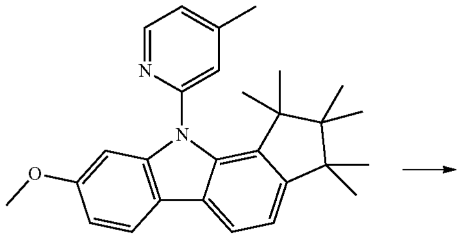

1-1

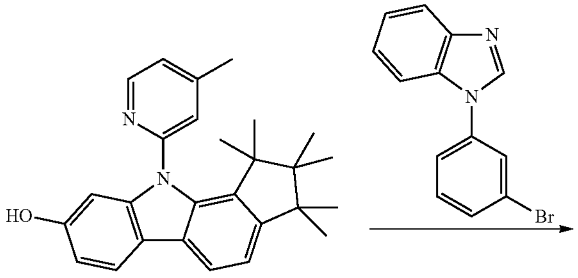

1-2

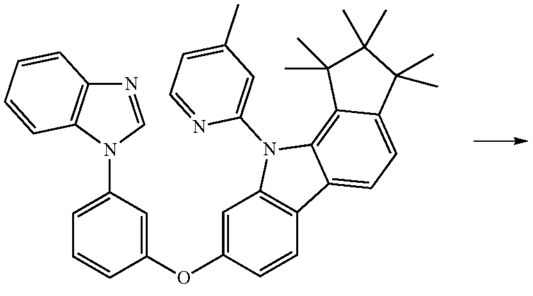

1-3

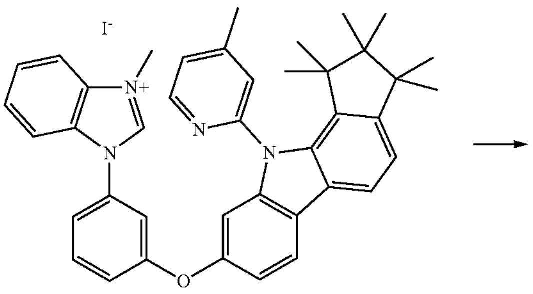

1-4

-continued

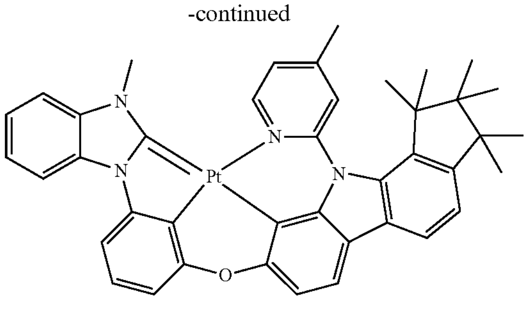

1

(Synthesis of Intermediate 1-1)

C1 (1 eq), 2-bromo-4-methylpyridine (1.2 eq), SPhos (0.07 eq), $Pd_2(dba)_3$ (0.05 eq), and sodium tert-butoxide (2.0 eq) were suspended in a toluene solvent, followed by heating to about 100° C. and stirring for about 12 hours. After finishing the reaction, the solvent was removed under a reduced pressure, and the resultant product was extracted with methylene chloride and distilled water. An extracted organic layer was washed with a saturated sodium chloride aqueous solution and dried with magnesium sulfate. The residue obtained by removing a solvent was separated using column chromatography to obtain a target compound in a yield of 80%.

(Synthesis of Intermediate 1-2)

Intermediate 1-1 (1.0 eq) was dissolved in methylene chloride, and a 1 M of $BBr_3$ (1.2 eq) was added thereto dropwise at about 0° C. After stirring at room temperature for about one hour, the resultant product was neutralized with an NaOH aqueous solution and extracted with methylene chloride and distilled water. An extracted organic layer was dried with magnesium sulfate. The residue obtained by removing a solvent was separated using column chromatography to obtain a target compound in a yield of 90%.

(Synthesis of Intermediate 1-3)

Intermediate 1-2 (1.0 eq), 1-(3-bromophenyl)-1H-benzo[d]imidazole (1.2 eq), CuI (0.01 eq), $K_2CO_3$ (2.0 eq) and L-proline (0.02 eq) were dissolved in DMSO (0.1 M), followed by stirring at about 130° C. for about 24 hours. After cooling to room temperature, the reaction mixture was extracted with dichloromethane and water three times, and an organic layer was obtained. The organic layer thus obtained was dried with magnesium sulfate, concentrated, and separated using column chromatography to obtain a target compound in a yield of 68%.

(Synthesis of Intermediate 1-4)

Intermediate 1-3 (1.0 eq), and iodomethane (3.0 eq) were dissolved in THF (1.0 M), followed by stirring at about 70° C. for about 12 hours. After cooling to room temperature, the reaction mixture was extracted with dichloromethane and water three times, and an organic layer was obtained. The organic layer thus obtained was dried with magnesium sulfate, concentrated, and separated using column chromatography to obtain a target compound in a yield of 78%.

(Synthesis of Compound 1)

Intermediate 1-4 (1.0 eq), dichloro(1,2-dicyclooctadiene) platinum ($Pt(COD)Cl_2$) (1.1 eq), and sodium acetate (2.0 eq) were dissolved in dioxane (0.1 M), followed by stirring at about 120° C. for about 72 hours. After cooling to room temperature, the reaction mixture was extracted with dichloromethane and water three times, and an organic layer was obtained. The organic layer thus obtained was dried with magnesium sulfate, concentrated, and separated using column chromatography to obtain Compound 1 (yield 21%).

2. Synthesis of Compound 15

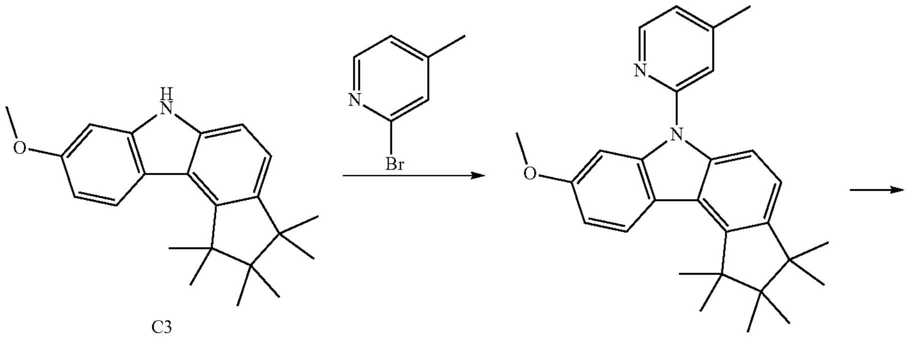

C3

15-1

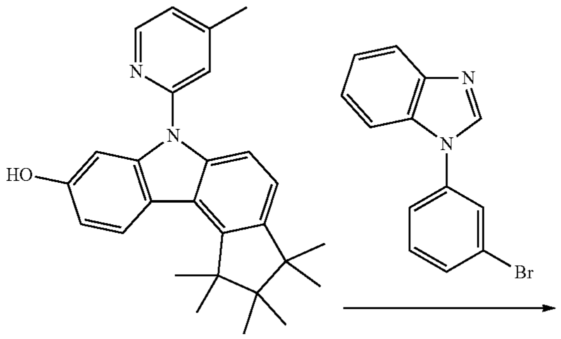

15-2

-continued

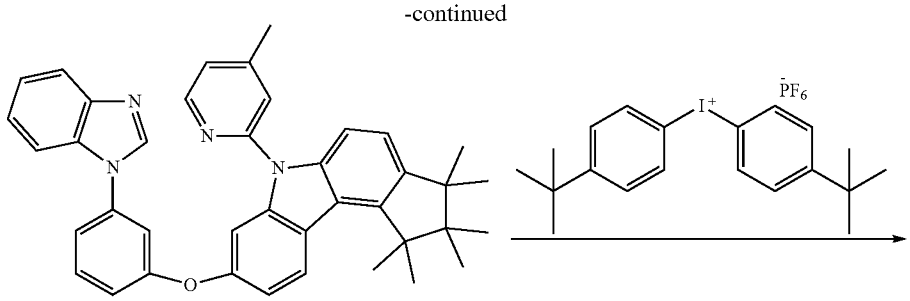

15-3

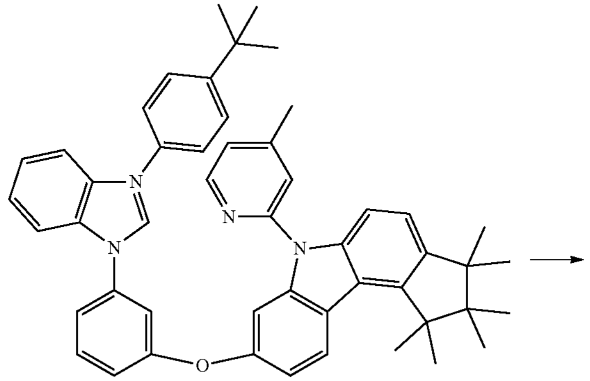

15-4

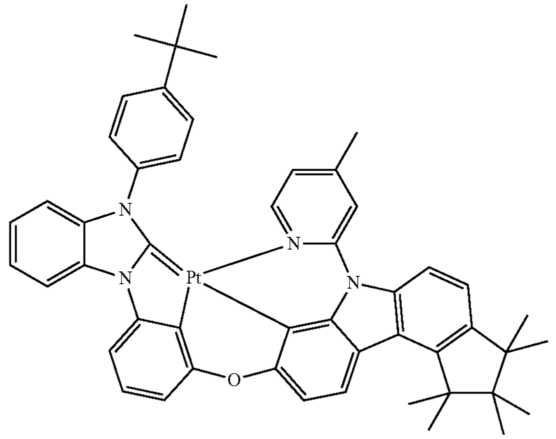

15

(Synthesis of Intermediate 15-1)

A target compound was obtained using the same method for Intermediate 1-1 of Synthesis Example 1 except for using Intermediate C3 instead of Intermediate C1.

(Synthesis of Intermediate 15-2)

A target compound was obtained using the same method for Intermediate 1-2 of Synthesis Example 1 except for using Intermediate 15-1 instead of Intermediate 1-1.

(Synthesis of Intermediate 15-3)

A target compound was obtained using the same method for Intermediate 1-3 of Synthesis Example 1 except for using Intermediate 15-2 instead of Intermediate 1-2.

(Synthesis of Intermediate 15-4)

Intermediate 1-3 (1.0 eq), $Cu(OAC)_2$ (0.1 eq), and bis(4-tert-butylphenyl)iodonium hexafluorophosphate (1.2 eq) were dissolved in DMF (0.1 M), followed by stirring at about 130° C. for about 12 hours. After cooling to room temperature, the reaction mixture was extracted with dichloromethane and water three times, and an organic layer was obtained. The organic layer thus obtained was dried with magnesium sulfate, concentrated, and separated using column chromatography to synthesize Intermediate 15-4 (yield 74%).

(Synthesis of Compound 15)

Intermediate 15-4 (1.0 eq), dichloro(1,2-dicyclooctadiene)platinum ($Pt(COD)Cl_2$) (1.1 eq), and sodium acetate (2.0 eq) were dissolved in dioxane (0.1 M), followed by stirring at about 120° C. for about 72 hours. After cooling to room temperature, the reaction mixture was extracted with dichloromethane and water three times, and an organic layer was obtained. The organic layer thus obtained was dried with magnesium sulfate, concentrated, and separated using column chromatography to synthesize Compound 15 (yield 34%).

3. Synthesis of Compound 41

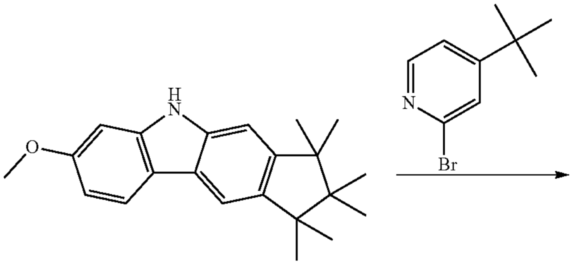

C2

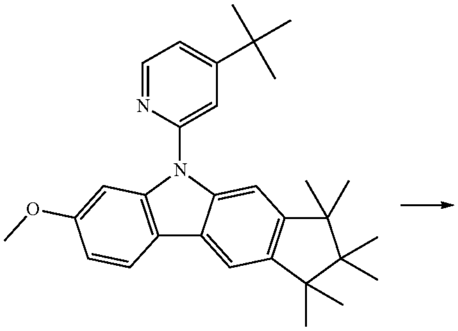

41-1

-continued

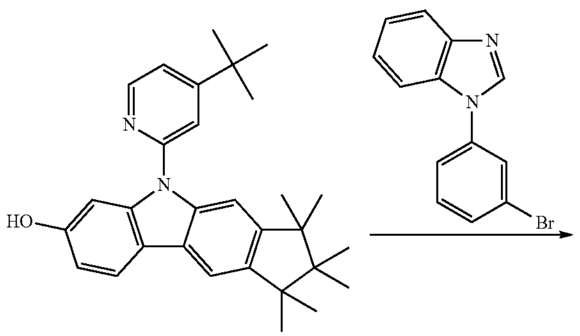

41-2

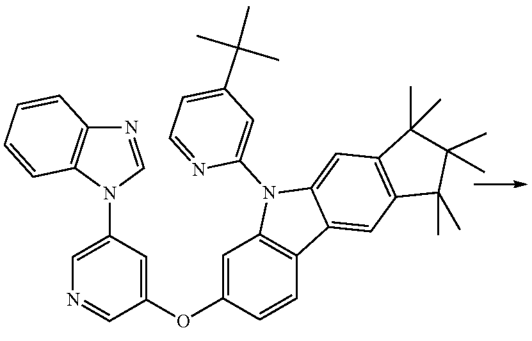

41-3

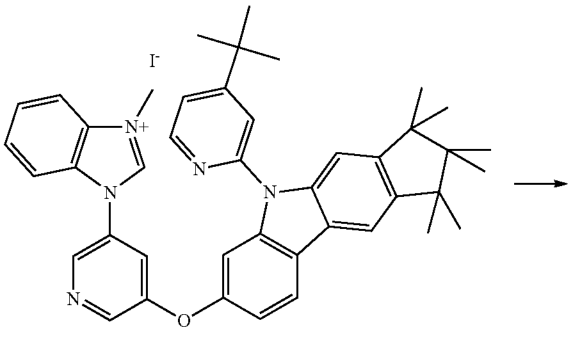

41-4

-continued

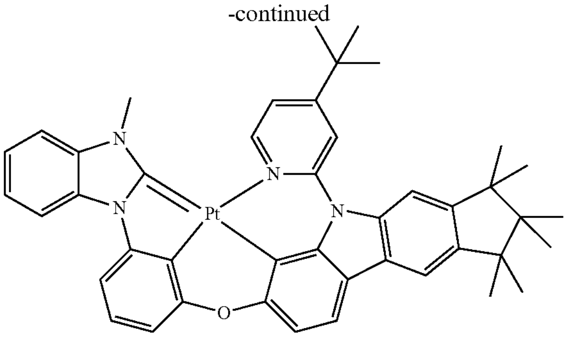

41

(Synthesis of Intermediate 41-1)

A target compound was obtained using the same method for Intermediate 1-1 of Synthesis Example 1 except for using Intermediate C2 instead of Intermediate (Synthesis of Intermediate 41-2)

A target compound was obtained using the same method for Intermediate 1-2 of Synthesis Example 1 except for using Intermediate 41-1 instead of Intermediate 1-1.

(Synthesis of Intermediate 41-3)

A target compound was obtained using the same method for Intermediate 1-3 of Synthesis Example 1 except for using Intermediate 41-2 instead of Intermediate 1-2, and using 1-(5-bromopyridin-3-yl)-1H-benzo[d]imidazole instead of 1-(3-bromophenyl)-1H-benzo[d]imidazole.

(Synthesis of Intermediate 41-4)

A target compound was obtained using the same method for Intermediate 1-4 of Synthesis Example 1 except for using Intermediate 41-3 instead of Intermediate 1-3.

(Synthesis of Compound 41)

Intermediate 41-4 (1.0 eq), dichloro(1,2-dicyclooctadiene)platinum ($Pt(COD)Cl_2$) (1.1 eq), and sodium acetate (2.0 eq) were dissolved in dioxane (0.1 M), followed by stirring at about 120° C. for about 72 hours. After cooling to room temperature, the reaction mixture was extracted with dichloromethane and water three times, and an organic layer was obtained. The organic layer thus obtained was dried with magnesium sulfate, concentrated, and separated using column chromatography to obtain Compound 41 (yield 41%).

4. Synthesis of Compound 63

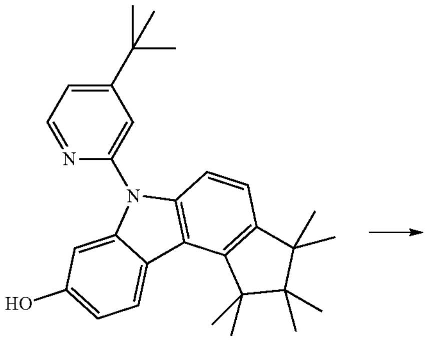

-continued
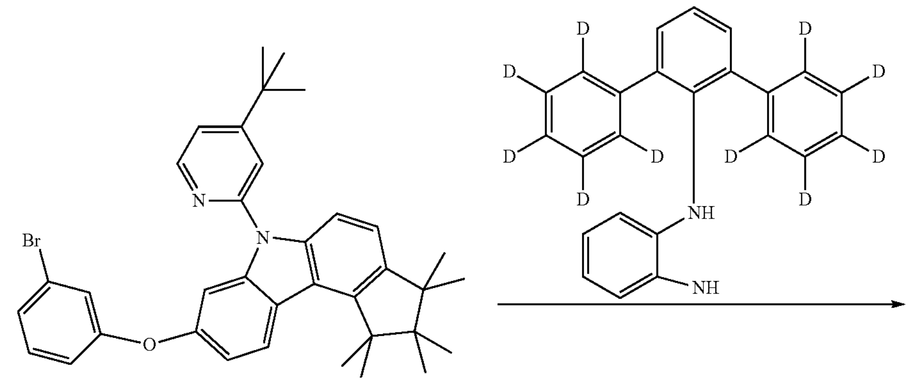
63-1
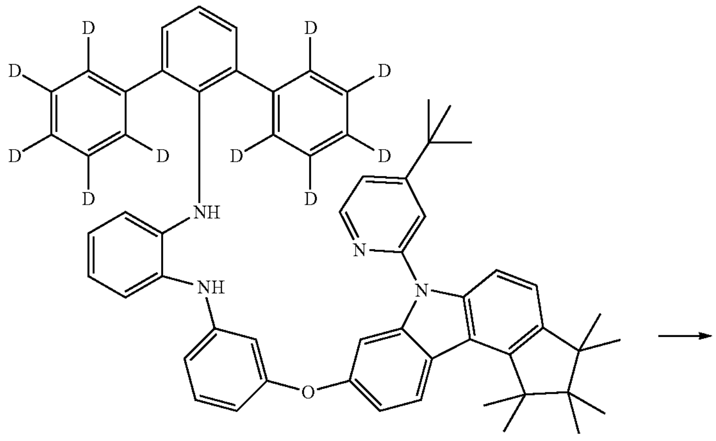
63-2
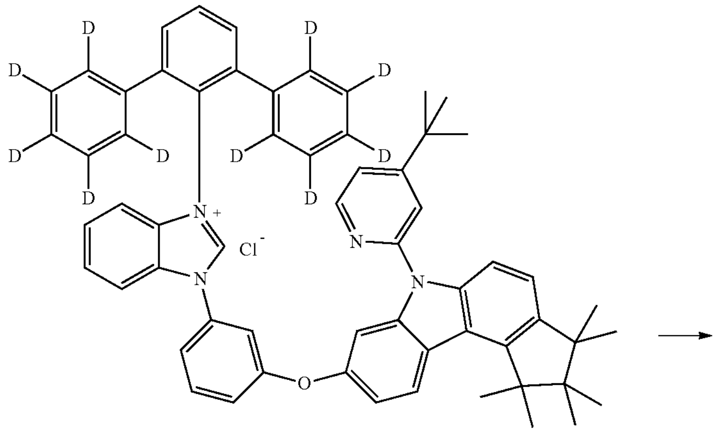
63-3

-continued

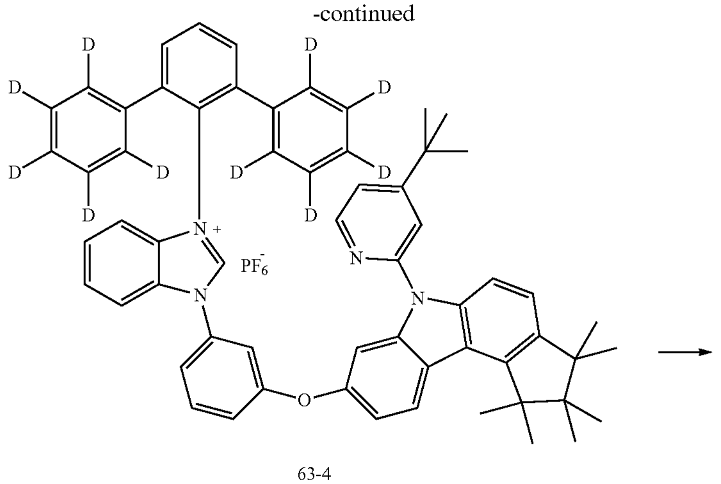

63-4

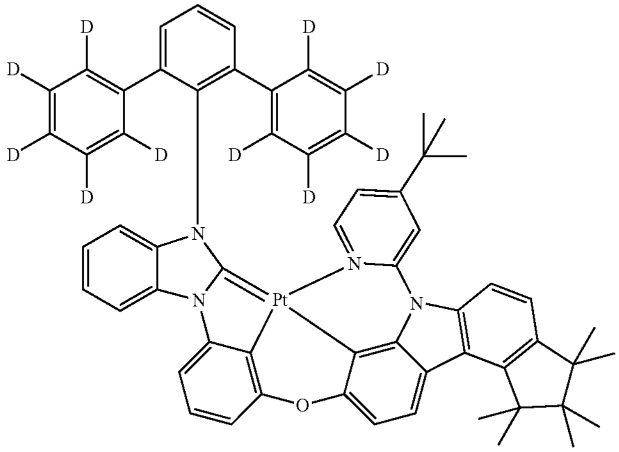

63

(Synthesis of Intermediate 63-1)

6-(4-(tert-butyl)pyridin-2-yl)-1,1,2,2,3,3-hexamethyl-1,2,3,6-tetrahydrocyclopenta[c]carbazol-8-ol (1.0 eq), 1,3-dibromobenzene (1.2 eq), CuI (0.01 eq), $K_2CO_3$ (2.0 eq) and L-proline (0.02 eq) were dissolved in DMSO (0.1 M), followed by stirring at about 130° C. for about 24 hours. After cooling to room temperature, the reaction mixture was extracted with dichloromethane and water three times, and an organic layer was obtained. The organic layer thus obtained was dried with magnesium sulfate, concentrated, and separated using column chromatography to obtain a target compound in a yield of 80%.

(Synthesis of Intermediate 63-2)

Intermediate 63-1 (1 eq), N1-([1,1':3',1"-terphenyl]-2'-yl-2,2",3,3",4,4",5,5",6,6"-d10)benzene-1,2-diamine (1.2 eq), SPhos (0.07 eq), $Pd_2(dba)_3$ (0.05 eq), and sodium tert-butoxide (2.0 eq) were suspended in a toluene solvent, followed by heating to about 100° C. and stirring for about 4 hours. After finishing the reaction, the solvent was removed under a reduced pressure, and the resultant product was extracted with methylene chloride and distilled water. An extracted organic layer was washed with a saturated sodium chloride aqueous solution and dried with magnesium sulfate. The residue obtained by removing a solvent was separated using column chromatography to obtain a target compound in a yield of 78%.

(Synthesis of Intermediate 63-3)

Intermediate 63-2 (1.0 eq), triethylorthoformate (50 eq), and HCl (25 eq) were dissolved and stirred at about 80° C. for about 12 hours. After cooling the reaction mixture to room temperature, triethylorthoformate was removed, and the resultant mixture was extracted with ethyl acetate and water three times to obtain an organic layer. The organic layer thus obtained was dried with magnesium sulfate, concentrated, and separated using column chromatography to obtain a target compound in a yield of 88%.

(Synthesis of Intermediate 63-4)

Intermediate 63-3 (1.0 eq) was dissolved in methanol (0.1 M), and distilled water (0.025 M) was slowly added thereto, followed by stirring. $NH_4PF_6$ (1.2 eq) was added and stirring was performed at room temperature for about 12 hours. The solid thus obtained was filtered, washed with diethyl ether three times, and dried to obtain a target compound in a yield of 92%.

(Synthesis of Compound 63)

Intermediate 63-4 (1.0 eq), dichloro(1,2-dicyclooctadiene)platinum ($Pt(COD)Cl_2$) (1.1 eq), and sodium acetate (2.0 eq) were dissolved in dioxane (0.1 M), followed by stirring at about 120° C. for about 72 hours. After cooling to room temperature, the reaction mixture was extracted with dichloromethane and water three times, and an organic layer was obtained. The organic layer thus obtained was dried with magnesium sulfate, concentrated, and separated using column chromatography to obtain Compound 63 (yield 28%).

5. Synthesis of Compound 89
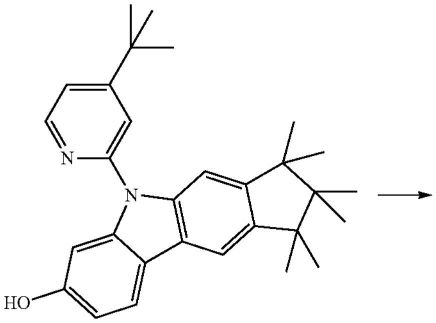
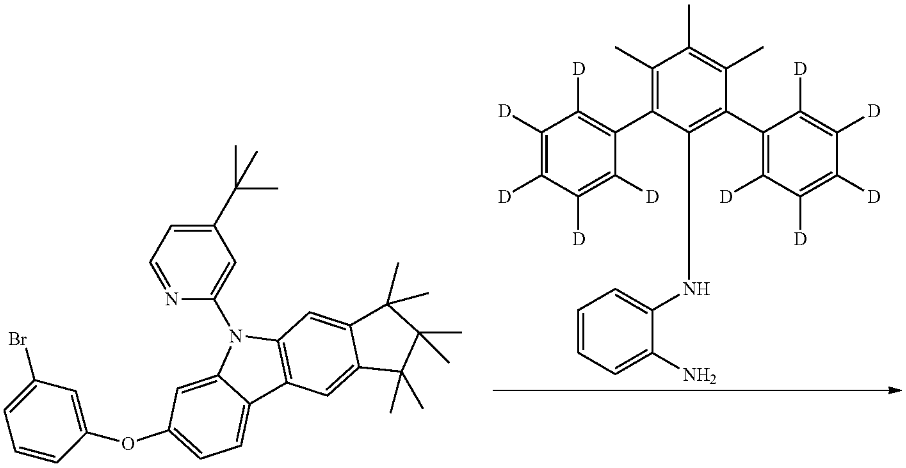
89-1
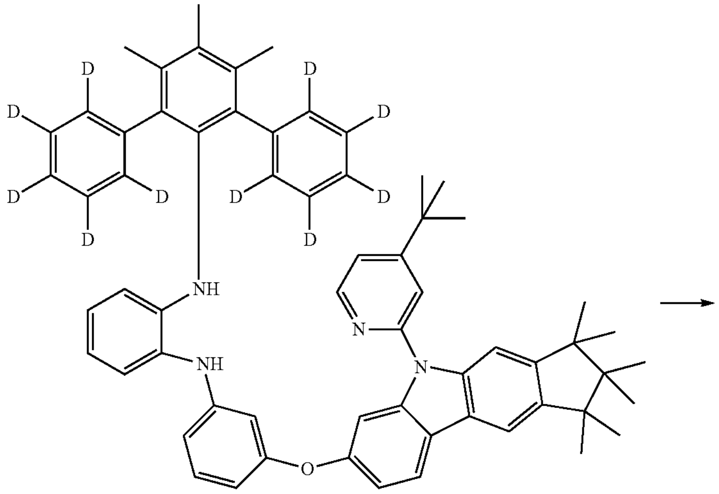
89-2

-continued

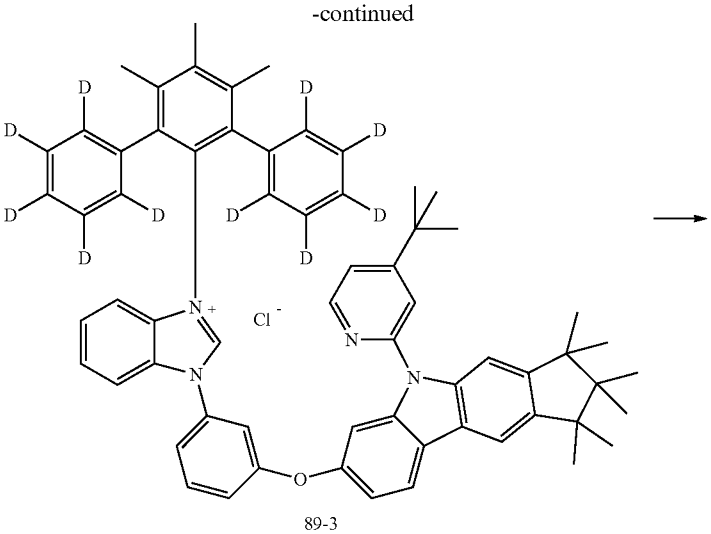

89-3

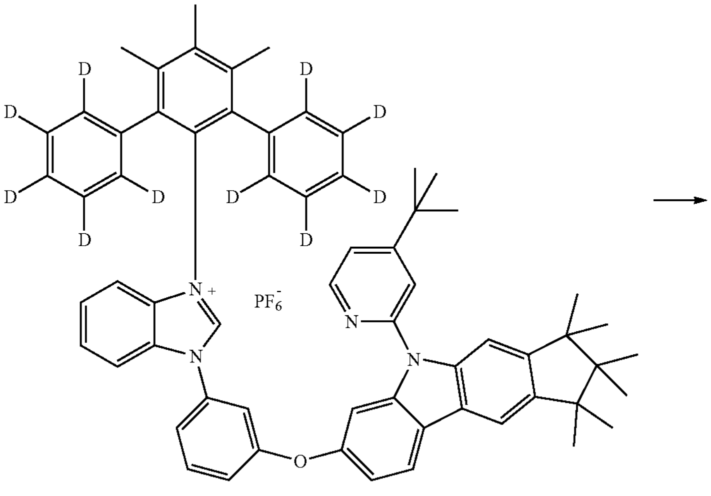

89-4

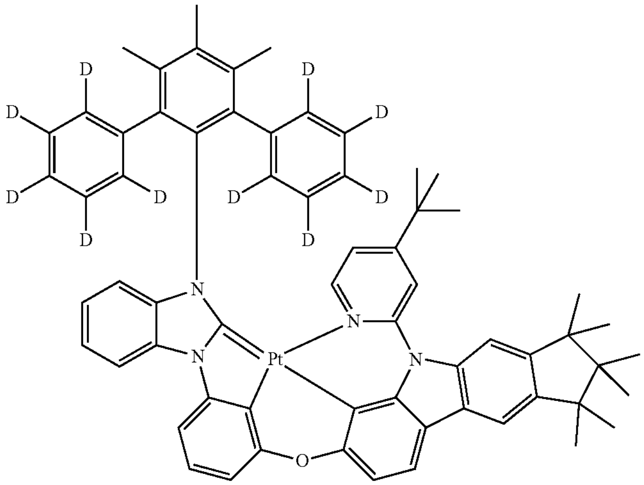

89

(Synthesis of Intermediate 89-1)

A target compound was obtained using the same method for Intermediate 63-1 of Synthesis Example 63 except for using 5-(4-(tert-butyl)pyridin-2-yl)-1,1,2,2,3,3-hexamethyl-1,2,3,5-tetrahydrocyclopenta[b]carbazol-7-ol instead of 6-(4-(tert-butyl)pyridin-2-yl)-1,1,2,2,3,3-hexamethyl-1,2,3,6-tetrahydrocyclopenta[c]carbazol-8-ol.

(Synthesis of Intermediate 89-2)

A target compound was obtained using the same method for Intermediate 63-2 of Synthesis Example 63 except for using N1-(4',5',6'-trimethyl-[1,1':3',1"-terphenyl]-2'-yl-2,2",3,3",4,4",5,5",6,6"-d10)benzene-1,2-diamine instead of N1-([1,1':3',1"-terphenyl]-2'-yl-2,2",3,3",4,4",5,5",6,6"-d10)benzene-1,2-diamine.

(Synthesis of Intermediate 89-3)

A target compound was obtained using the same method for Intermediate 63-3 of Synthesis Example 63 except for using Intermediate 89-2 instead of Intermediate 63-2.

(Synthesis of Intermediate 89-4)

A target compound was obtained using the same method for Intermediate 63-4 of Synthesis Example 63 except for using Intermediate 89-3 instead of Intermediate 63-3.

(Synthesis of Compound 89)

Intermediate 89-4 (1.0 eq), dichloro(1,2-dicyclooctadiene)platinum ($Pt(COD)Cl_2$) (1.1 eq), and sodium acetate (2.0 eq) were dissolved in dioxane (0.1 M), followed by stirring at about 120° C. for about 72 hours. After cooling to room temperature, the reaction mixture was extracted with dichloromethane and water three times, and an organic layer was obtained. The organic layer thus obtained was dried with magnesium sulfate, concentrated, and separated using column chromatography to obtain Compound 89 (yield 32%).

6. Synthesis of Compound 101

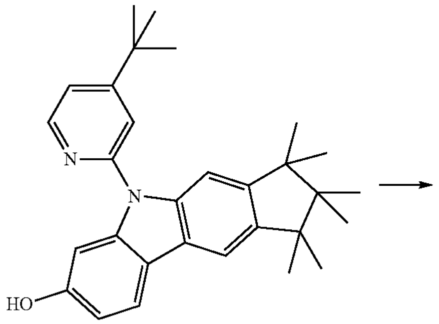

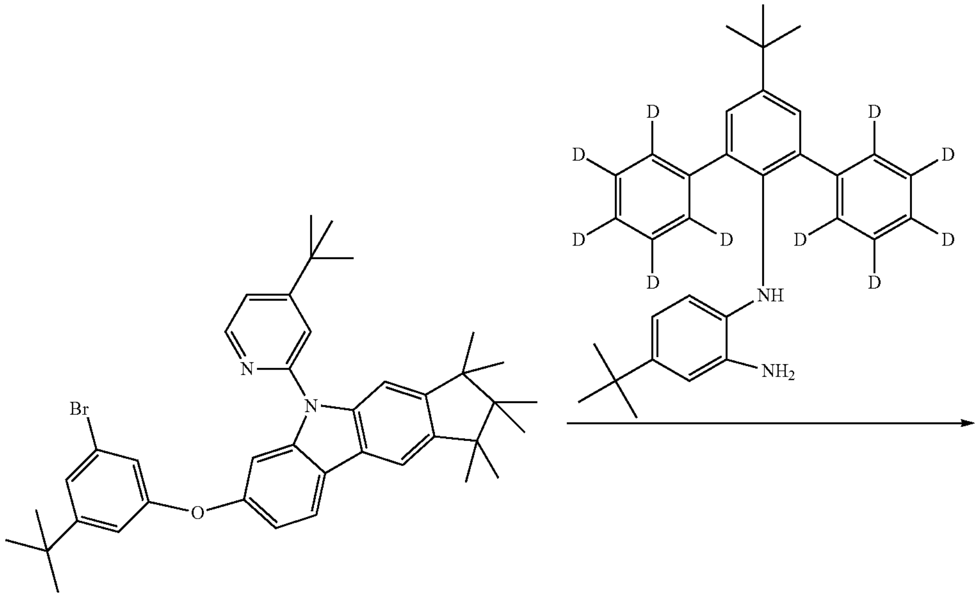

101-1

-continued
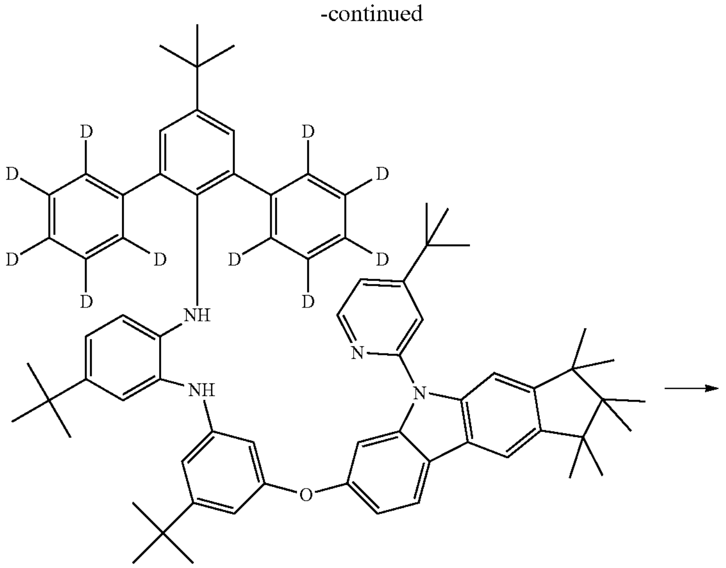
101-2
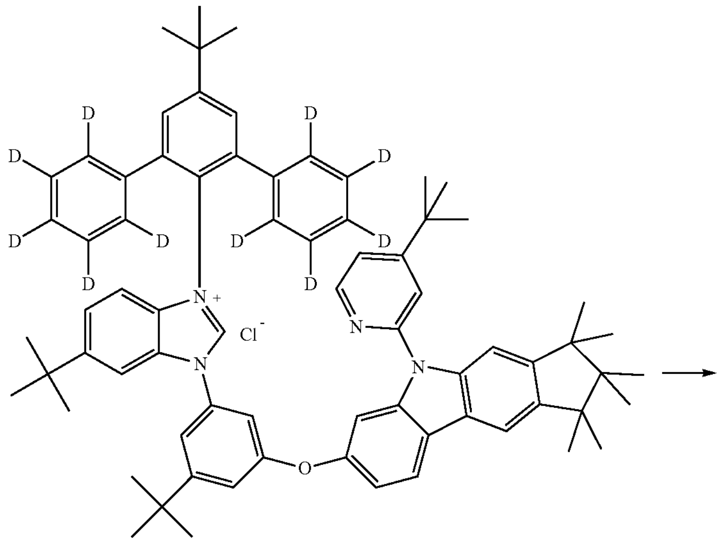
101-3
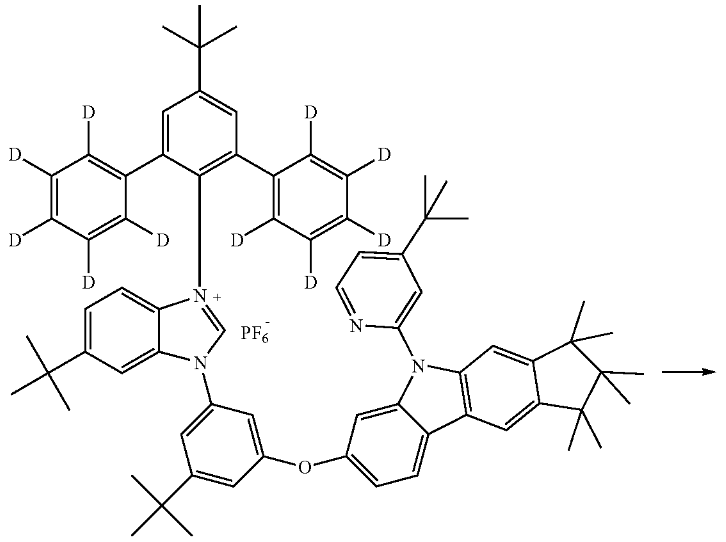
101-4

-continued

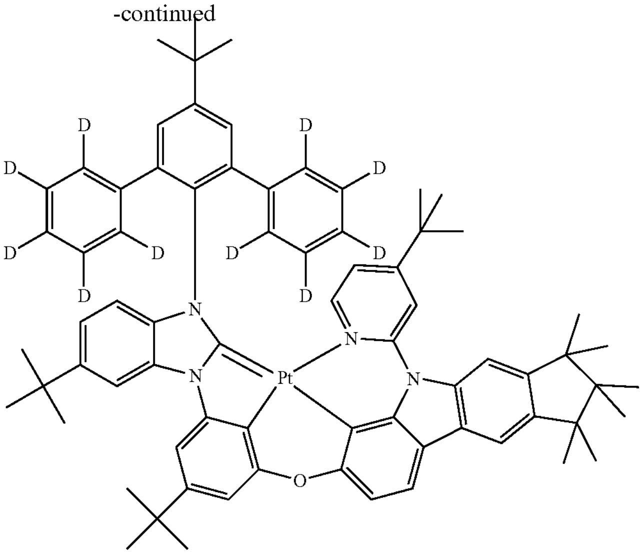

101

(Synthesis of Intermediate 101-1)

A target compound was obtained using the same method for Intermediate 89-1 of Synthesis Example 89 except for using 1,3-dibromo-5-(tert-butyl)benzene instead of 1,3-dibromobenzene.

(Synthesis of Intermediate 101-2)

A target compound was obtained using the same method for Intermediate 63-2 of Synthesis Example 63 except for using 4-(tert-butyl)-N1-(5'-(tert-butyl)-[1,1':3',1"-terphenyl]-2'-yl-2,2",3,3",4,4",5,5",6,6"-d10)benzene-1,2-diamine instead of N1-([1,1':3',1"-terphenyl]-2'-yl-2,2",3,3",4,4",5,5",6,6"-d10)benzene-1,2-diamine.

(Synthesis of Intermediate 101-3)

A target compound was obtained using the same method for Intermediate 63-3 of Synthesis Example 63 except for using Intermediate 101-2 instead of Intermediate 63-2.

(Synthesis of Intermediate 101-4)

A target compound was obtained using the same method for Intermediate 63-4 of Synthesis Example 63 except for using Intermediate 101-3 instead of Intermediate 63-3.

(Synthesis of Compound 101)

Intermediate 101-4 (1.0 eq), dichloro(1,2-dicyclooctadiene)platinum ($Pt(COD)Cl_2$) (1.1 eq), and sodium acetate (2.0 eq) were dissolved in dioxane (0.1 M), followed by stirring at about 120° C. for about 72 hours. After cooling to room temperature, the reaction mixture was extracted with dichloromethane and water three times, and an organic layer was obtained. The organic layer thus obtained was dried with magnesium sulfate, concentrated, and separated using column chromatography to obtain Compound 101 (yield 26%).

(Manufacture of Light Emitting Device 1)

Example Compounds and Comparative Compounds are as follows.

[Example Compounds]

1

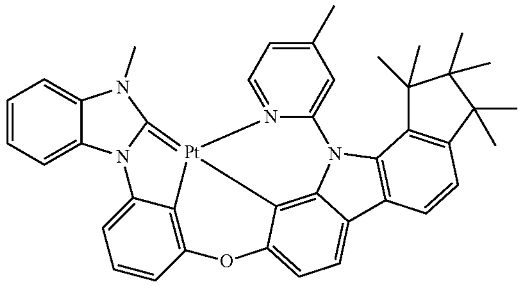

16

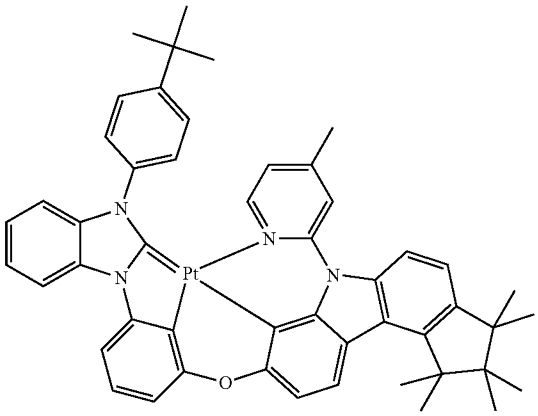

-continued

41

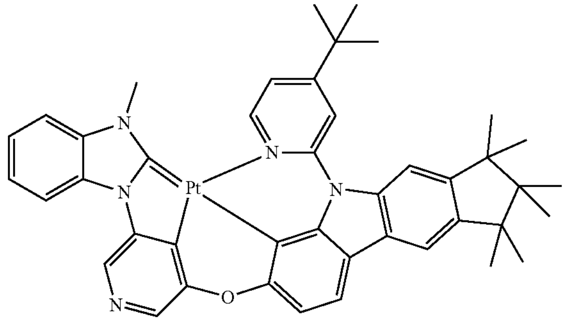

63

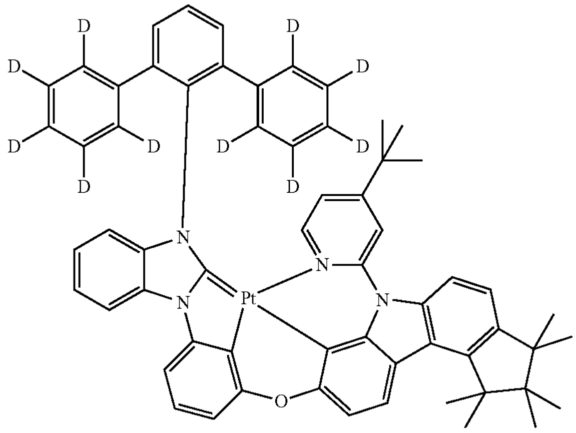

89

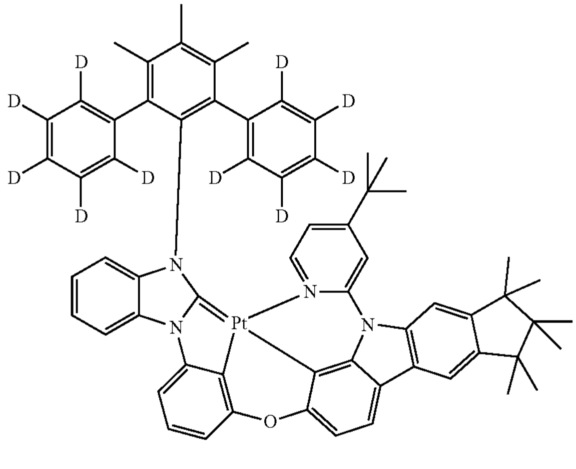

-continued

101

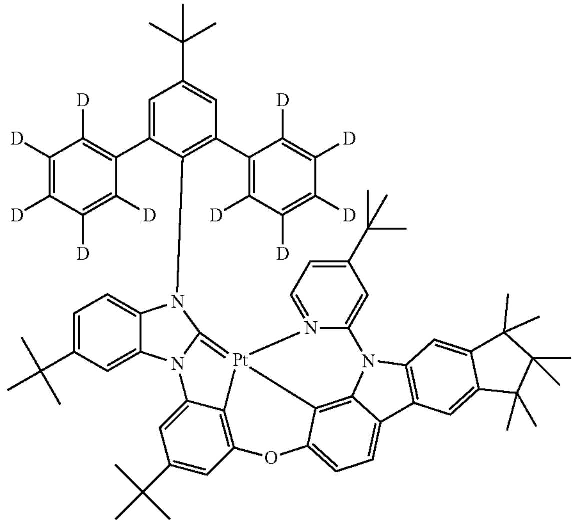

[Comparative Compounds]

BD1

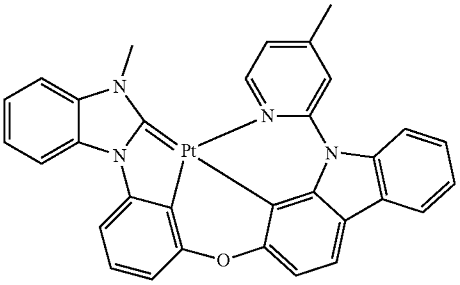

BD2

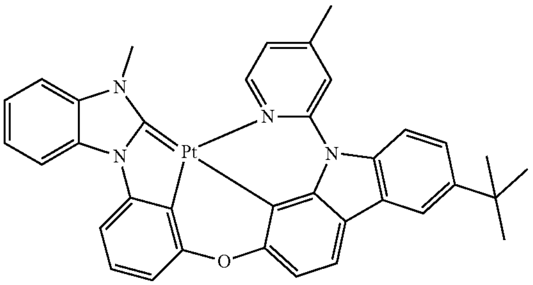

A light emitting device of an embodiment, including the organometallic compound of an embodiment in an emission layer was manufactured by a method below. Light emitting devices were manufactured using the Example Compounds and the Comparative Compounds as dopant materials of an emission layer, as shown in Table 1.

A glass substrate on which ITO with about 15 Ω/cm$^2$ (1200 Å) of Corning Co. was formed, as a substrate and an anode, was cut into a size of 50 mm×50 mm×0.7 mm, washed with ultrasonic waves using isopropyl alcohol and pure water for about five minutes for each, exposed to ultraviolet rays for about 30 minutes, and cleansed by exposing to ozone. The glass substrate was installed on a vacuum deposition apparatus.

On the ITO anode formed on the glass substrate, 2-TNATA was vacuum deposited to form a hole injection layer with a thickness of about 600 Å, and NPB was vacuum deposited on the hole injection layer to form a hole transport layer with a thickness of about 300 Å.

On the hole transport layer, ETH2 and HTH29 (weight ratio of about 1:1), which were co-hosts, and the Example Compound or Comparative Compound, which was a dopant, were co-deposited in a weight ratio satisfying the weight ratio of the co-hosts and the dopant became about 90:10, to form an emission layer having a thickness of about 300 Å.

On the emission layer, ETH2 was deposited to form a hole blocking layer with a thickness of about 50 Å, and on the hole blocking layer, $Alq_3$ was deposited to form an electron transport layer with a thickness of about 300 Å. On the electron transport layer, LiF was deposited to form an electron injection layer with a thickness of about 10 Å, and on the electron injection layer, A1 was vacuum deposited to form a cathode with a thickness of about 3,000 Å, and a light emitting device was manufactured.

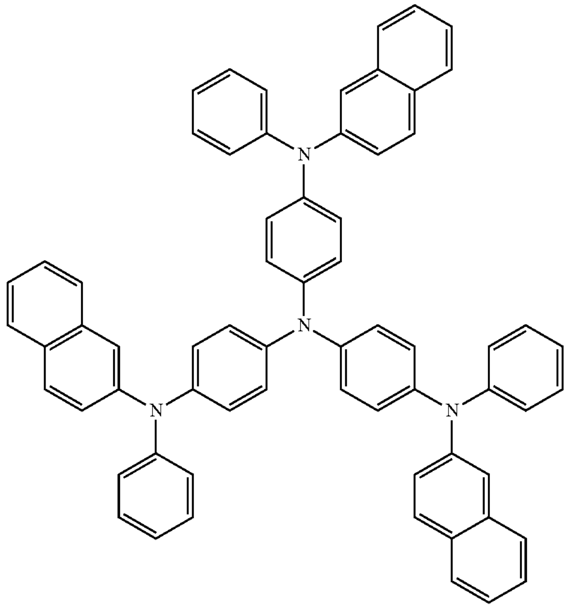

2-TNATA

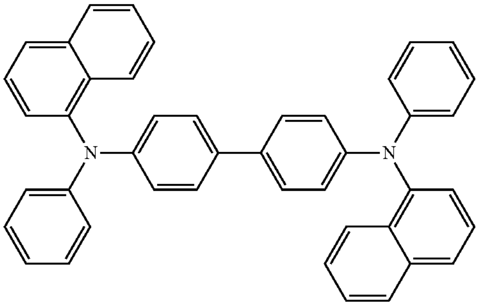

NPB

-continued

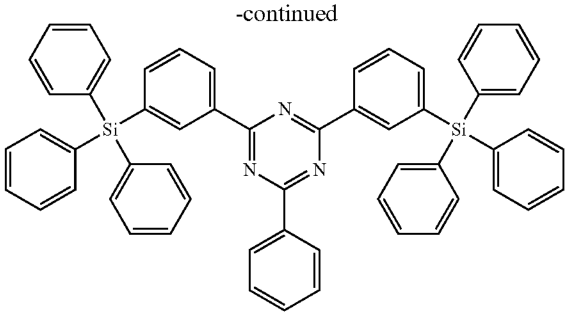

ETH2

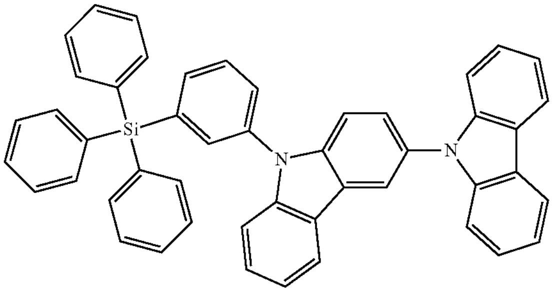

HTH29

Experimental Example 1

The device efficiency of the light emitting devices manufactured using Example Compounds 1, 15, 41, 63, 89, and 101, and Comparative Compounds BD1 and BD4 were evaluated. The evaluation results are shown in Table 1. For the evaluation of the devices, a driving voltage at a current density of about 10 $mA/cm^2$, and emission efficiency (cd/A) were measured. The device life was obtained by measuring a time from a point with an initiation luminance of about 1000 $cd/m^3$ to a point with a luminance of about 90%.

TABLE 1

| | Dopant | Luminance ($cd/m^2$) | Driving voltage (V) | Emission efficiency (cd/A) | Maximum emission wavelength (nm) | Device life (T90, h) (at 1000 $cd/m^2$) |
|---|---|---|---|---|---|---|
| Example 1 | Example Compound 1 | 1000 | 4.7 | 24.1 | 464 | 74 |
| Example 2 | Example Compound 15 | 1000 | 4.8 | 26.2 | 465 | 97 |
| Example 3 | Example Compound 41 | 1000 | 4.5 | 22.3 | 463 | 77 |

TABLE 1-continued

| | Dopant | Luminance ($cd/m^2$) | Driving voltage (V) | Emission efficiency (cd/A) | Maximum emission wavelength (nm) | Device life (T90, h) (at 1000 $cd/m^2$) |
|---|---|---|---|---|---|---|
| Example 4 | Example Compound 63 | 1000 | 4.6 | 26.7 | 463 | 77 |
| Example 5 | Example Compound 89 | 1000 | 4.7 | 25.8 | 458 | 58 |
| Example 6 | Example Compound 101 | 1000 | 4.6 | 23.2 | 464 | 80 |
| Comparative Example 1 | Comparative Compound BD1 | 1000 | 5.2 | 20.1 | 471 | 50 |
| Comparative Example 2 | Comparative Compound BD2 | 1000 | 5.3 | 19.9 | 471 | 30 |

Referring to the results of Table 1, it could be confirmed that the Examples of the light emitting devices using the organometallic compounds according to embodiments as light emitting dopants maintained emission wavelengths of blue light and showed reduced driving voltages and improved emission efficiency and device life when compared to the Comparative Examples.

(Manufacture of Light Emitting Device 2)

Organic light emitting devices were manufactured by the same method as Example 1 except for vacuum depositing the Example Compound (first compound, sensitizer), Compound ETH2 (second compound), Compound HTH41 (third compound) and Compound DFD1 (forth compound, light-emitting body) instead of Example Compound 1, Compound ETH2 (second compound) and Compound HTH29 (third compound) on the hole transport layer, during forming an emission layer. The amount of Compound 1 was 10 wt % per the total weight (100 wt %) of the emission layer, the amount of Compound DFD1 was 0.5 wt % per the total weight (100 wt %) of the emission layer, and a weight ratio of Compound ETH2 and HTH41 was controlled to about 3:7.

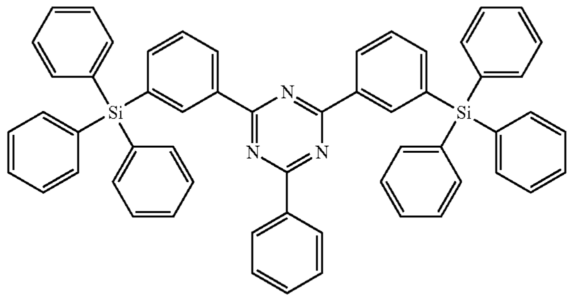

ETH2

-continued

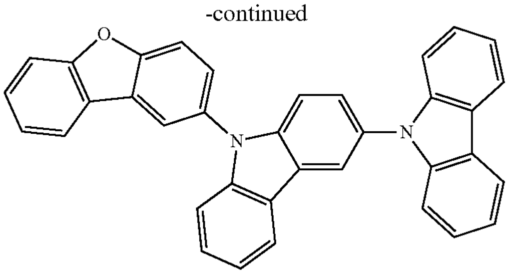

HTH41

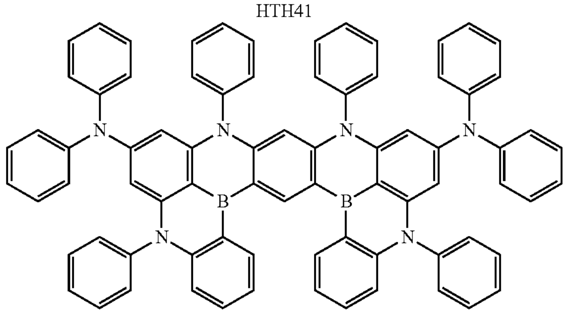

DFD1

Experimental Example 2

The device efficiency of the light emitting devices manufactured using Example Compounds 1, 15, 41, 63, 89, and 101 were evaluated. The evaluation results are shown in Table 2. For the evaluation of the devices, a driving voltage at a current density of about 10 $mA/cm^2$, and emission efficiency (cd/A) were measured. The device life was obtained by measuring a time from a point with an initiation luminance of about 1000 $cd/m^3$ to a point with a luminance of about 90%.

TABLE 2

| No. | Sensitizer First compound | Host Second compound | Host Third compound | Light-emitting body Fourth compound | Luminance ($cd/m^2$) | Driving voltage (V) | Color purity (CIEx, y) | Emission efficiency (cd/A) | Color transformation efficiency (cd/A/y) | Maximum emission efficiency (nm) | Life ($T_{95}$) (Hr) |
|---|---|---|---|---|---|---|---|---|---|---|---|
| Example 7 | Example Compound 1 | ETH2 | HTH41 | DFD1 | 1000 | 4.5 | (0.14, 0.14) | 20.1 | 150.1 | 460 | 97.1 |
| Example 8 | Example Compound 15 | ETH2 | HTH41 | DFD1 | 1000 | 4.6 | (0.14, 0.14) | 16.2 | 121.1 | 460 | 84.4 |

TABLE 2-continued

| No. | Sensitizer First compound | Host Second compound | Host Third compound | Light-emitting body Fourth compound | Luminance ($cd/m^2$) | Driving voltage (V) | Color purity (CIEx, y) | Emission efficiency (cd/A) | Color transformation efficiency (cd/A/y) | Maximum emission efficiency (nm) | Life ($T_{95}$) (Hr) |
|---|---|---|---|---|---|---|---|---|---|---|---|
| Example 9 | Example Compound 41 | ETH2 | HTH41 | DFD1 | 1000 | 4.6 | (0.14, 0.13) | 17.4 | 123.3 | 460 | 91.4 |
| Example 10 | Example Compound 63 | ETH2 | HTH41 | DFD1 | 1000 | 4.5 | (0.14, 0.15) | 16.6 | 134.4 | 460 | 95.6 |
| Example 11 | Example Compound 89 | ETH2 | HTH41 | DFD1 | 1000 | 4.5 | (0.14, 0.16) | 17.1 | 126.7 | 461 | 100.1 |
| Example 12 | Example Compound 101 | ETH2 | HTH41 | DFD1 | 1000 | 4.3 | (0.14, 0.13) | 18.8 | 138.4 | 460 | 99.4 |

Referring to the results of Table 2, it could be confirmed that the Examples of the light emitting devices using the organometallic compounds according to embodiments as sensitizers showed high emission efficiency and color transformation efficiency in a blue emission wavelength region and excellent device life. The light emitting device of an embodiment included the organometallic compound of an embodiment and could achieve a low driving voltage, and improved emission efficiency and life simultaneously. In the organometallic compound of an embodiment, cyclopentane which is substituted with six methyl groups is combined, to enrich the electrons of ring A3 which corresponds to the lowest unoccupied molecular orbital (LUMO) to reinforce the bonding force with a central metal. The light emitting device of an embodiment includes the organometallic compound of an embodiment as the dopant material or a sensitizer material of an emission layer, and a low driving voltage, and improved emission efficiency and life of the light emitting device in a blue wavelength region may be achieved simultaneously.

The light emitting device according to an embodiment shows excellent efficiency.

The organometallic compound according to an embodiment may be used as a material of the emission layer of a light emitting device, and by using thereof, the efficiency of the light emitting device may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device, comprising:

a first electrode;

a hole transport region disposed on the first electrode;

an emission layer disposed on the hole transport region;

an electron transport region disposed on the emission layer; and a second electrode disposed on the electron transport region, wherein the emission layer comprises an organometallic compound represented by Formula 1:

[Formula 1]

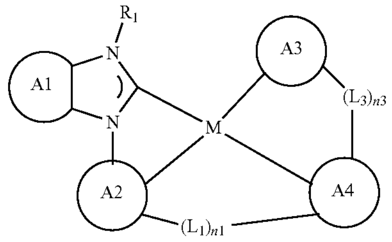

wherein in Formula 1,

M is Pt, Pd, Cu, Ag, Au, Rh, Ir, Ru, or Os, rings A1, A2, and A3 are each independently a substituted or unsubstituted hydrocarbon ring group of 5 to 60 ring-forming carbon atoms, or a substituted or unsubstituted heterocyclic group of 1 to 60 ring-forming carbon atoms, $L_1$ and $L_3$ are each independently a direct linkage, *—O—*', *—S—*', *—C($R_{a1}$)($R_{a2}$)—*', *—C($R_{a3}$)=*', *=C($R_{a4}$)—*', *—C($R_{a5}$)=C($R_{a6}$)—*', *—C(=O)—*', *—C(=S)—*', *—C≡C—*', *—B($R_{a7}$)—*', *—N($R_{a8}$)—*', *—P($R_{a9}$)—*', *—Si($R_{a10}$)($R_{a11}$)*', *—P($R_{a12}$)($R_{a13}$)—*', or *—Ge($R_{a14}$)($R_{a15}$)—*', where * and *' are each a bonding site, $R_1$, and Ral to $R_{a15}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n1 and n3 are each independently 0 or 1, and ring A4 is a group represented by one of Formula 2-1 to Formula 2-3:

[Formula 2-1]

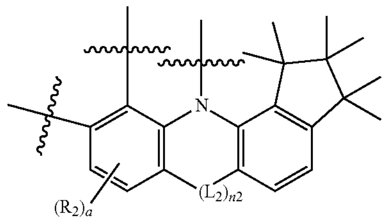

-continued

[Formula 2-2]

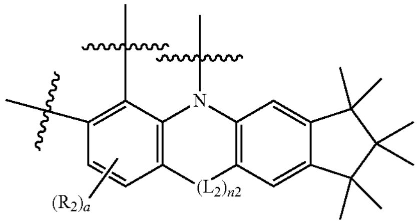

[Formula 2-3]

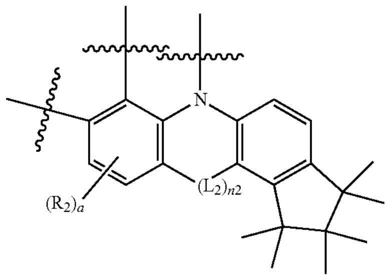

wherein in Formula 2-1 to Formula 2-3,

is a bonding site, $L_2$ is a direct linkage, *—O*', *—S—*', *—C($R_{a1'}$)($R_{a2'}$)—*', *—C($R_{a3'}$)=*', *=C($R_{a4'}$)—*', *—C($R_{a5'}$)=C($R_{a6'}$)*', *—C(=O)—*', *—C(=S)—*', *—C≡C—*', *—B($R_{a7'}$)—*', *—N($R_{a8'}$)*', *—P($R_{a9'}$)—*', * Si($R_{a10'}$)($R_{a11'}$)—*', *—P($R_{a12'}$)($R_{a13'}$)—*', or *—Ge($R_{a14'}$)($R_{a15'}$)*', where * and *' are each a bonding site, $R_2$, and $R_{a1'}$ to $R_{a15'}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, a is an integer from 0 to 2, and n2 is 0 or 1.

2. The light emitting device of claim 1, wherein the emission layer emits phosphorescence.

3. The light emitting device of claim 1, wherein the emission layer comprises a host and a dopant, and the dopant comprises the organometallic compound represented by Formula 1.

4. The light emitting device of claim 1, wherein the emission layer comprises a host, a dopant, and a sensitizer, and the sensitizer comprises the organometallic compound represented by Formula 1.

5. The light emitting device of claim 1, wherein ring A2 is a group represented by one of Formula A-1 to Formula A-3:

[Formula A-1]

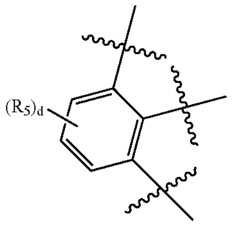

[Formula A-2]

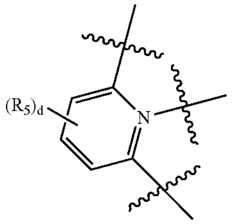

[Formula A-3]

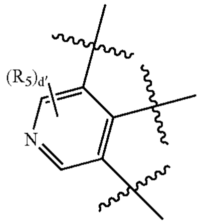

wherein in Formula A-1 to Formula A-3,

is a bonding site, $R_5$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, d is an integer from 0 to 3, and d' is an integer from 0 to 2.

6. The light emitting device of claim 1, wherein ring A3 is a group represented by one of Formula B-1 to Formula B-4:

[Formula B-1]

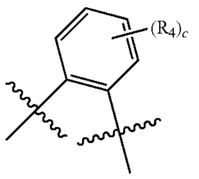

-continued

[Formula B-2]

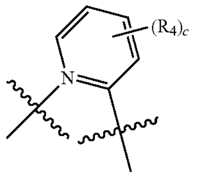

[Formula B-3]

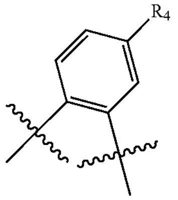

[Formula B-4]

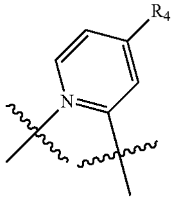

wherein in Formula B-1 to Formula B-4,

is a bonding site, $R_4$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and c is an integer from 0 to 4.

7. The light emitting device of claim 1, wherein the organometallic compound represented by Formula 1 is represented by Formula 3:

[Formula 3]

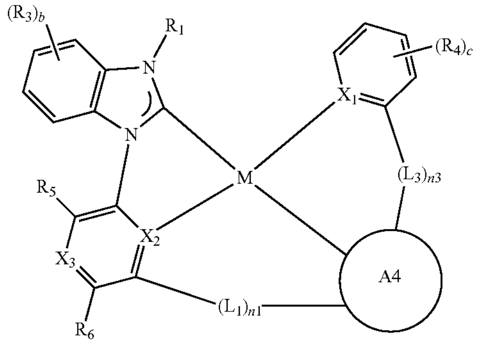

wherein in Formula 3, $X_1$ to $X_3$ are each independently N or $C(R_b)$, wherein one of $X_1$ or $X_2$ is N, $R_3$ to $R_6$ and $R_b$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, b and c are each independently an integer from 0 to 4, and M, ring A4, $L_1$, $L_3$, n1, n3, and $R_1$ are the same as defined in Formula 1.

8. The light emitting device of claim 7, wherein the organometallic compound represented by Formula 3 is represented by Formula 4:

[Formula 4]

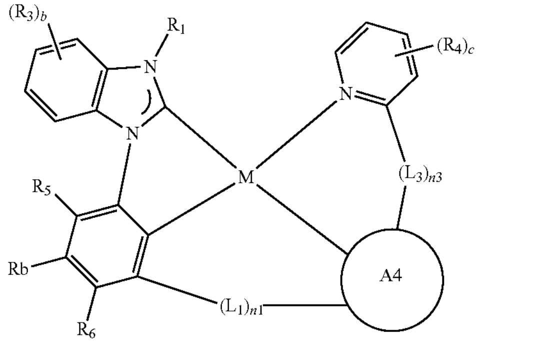

wherein in Formula 4,

M, ring A4, $L_1$, $L_3$, n1, n3, b, c, $R_1$, $R_3$ to $R_6$, and $R_b$ are the same as defined in Formula 3.

9. The light emitting device of claim 8, wherein $R_5$ and $R_6$ are each a hydrogen atom, and $R_b$ is a substituted or unsubstituted alkyl group of 1 to 20 carbon atoms.

10. The light emitting device of claim 7, wherein the organometallic compound represented by Formula 3 is represented by Formula 5:

[Formula 5]

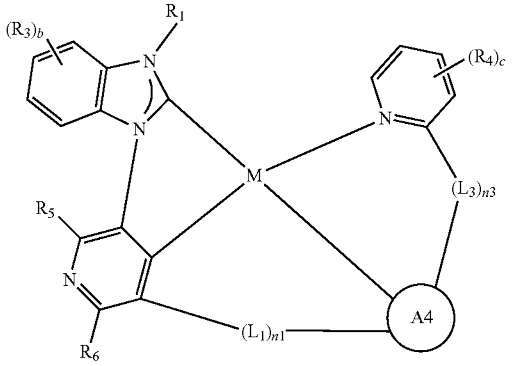

wherein in Formula 5,

M, ring A4, $L_1$, $L_3$, n1, n3, b, c, $R_1$, $R_3$ to $R_6$ are the same as defined in Formula 3.

11. The light emitting device of claim 7, wherein the organometallic compound represented by Formula 3 is represented by Formula 6:

[Formula 6]

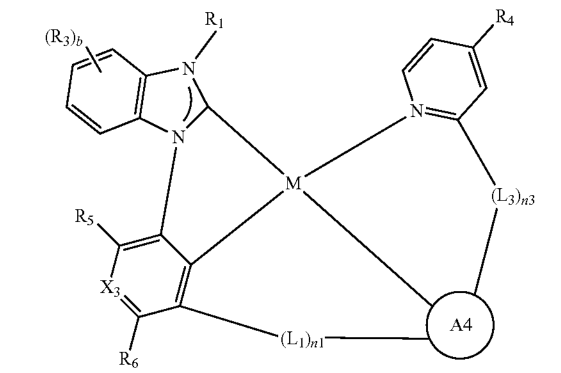

wherein in Formula 6, $R_4$ is a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and M, ring A4, $L_1$, $L_3$, n1, n3, b, $X_3$, $R_1$, $R_3$, $R_5$, and $R_6$ are the same as defined in Formula 3.

12. The light emitting device of claim 7, wherein the organometallic compound represented by Formula 3 is represented by one of Formula 7-1 to Formula 7-3:

[Formula7-1]

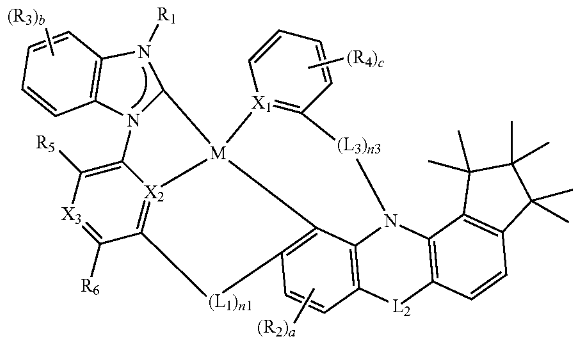

[Formula7-2]

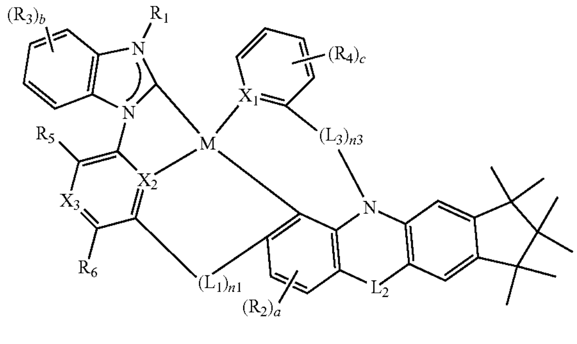

-continued

[Formula7-3]

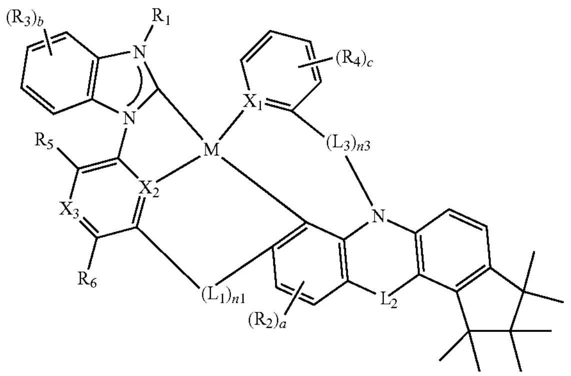

wherein in Formula 7-1 to Formula 7-3, $L_2$ is a direct linkage, *—O—*', or *—C($R_{a1'}$)($R_{a2'}$)—*', where * and *' are each a bonding site, $R_2$, $R_{a1'}$, and $R_{a2'}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, a is an integer from 0 to 2, and M, $L_1$, $L_3$, n1, n3, b, c, Ri, and $R_3$ to $R_6$ are the same as defined in Formula 3.

13. The light emitting device of claim 1, wherein the organometallic compound represented by Formula 1 is at least one selected from Compound Group 1:

[Compound Group 1]

1

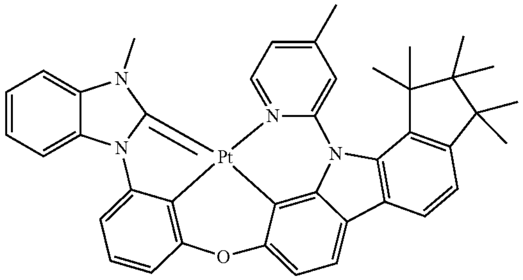

2

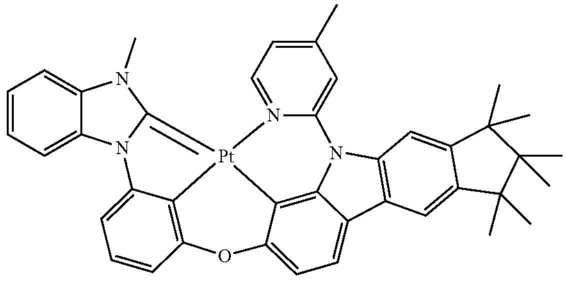

-continued
3
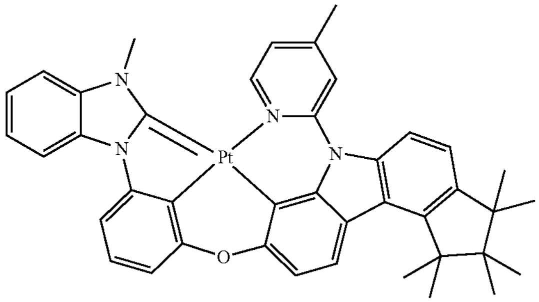
4
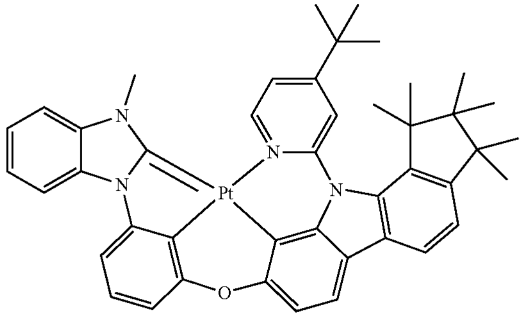
5
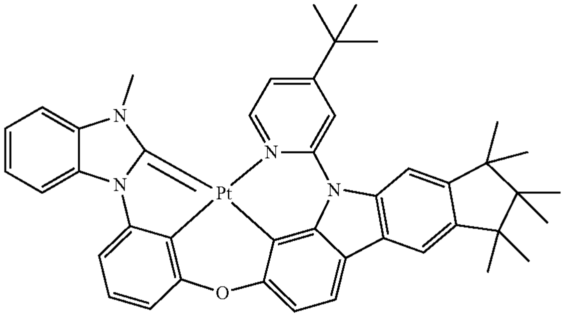
6
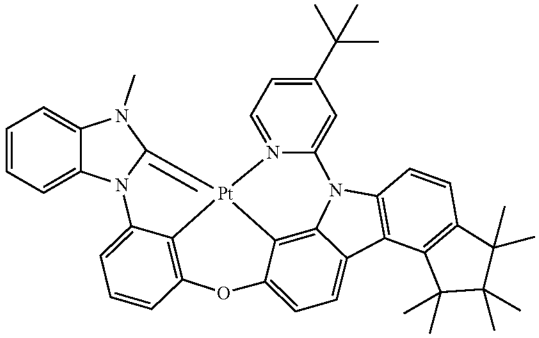
-continued
7
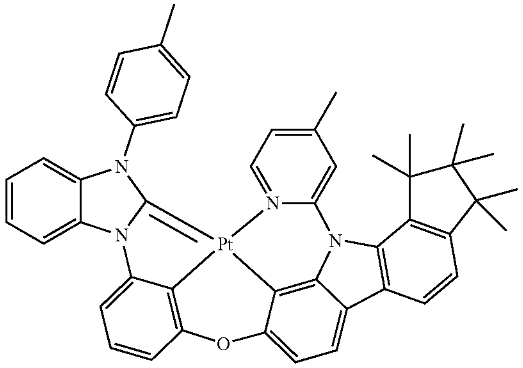
8
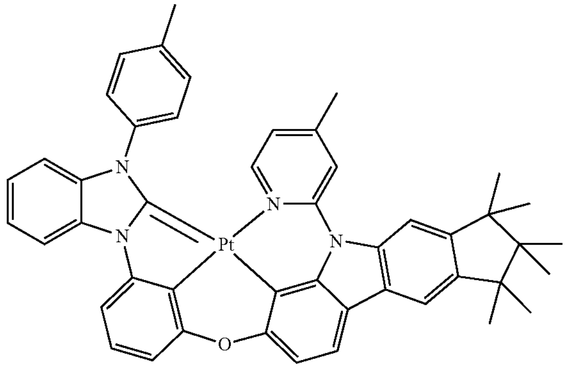
9
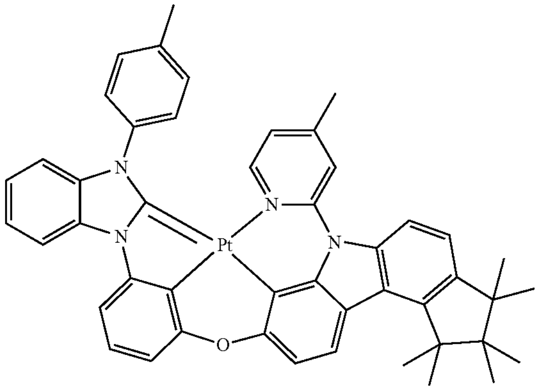
10
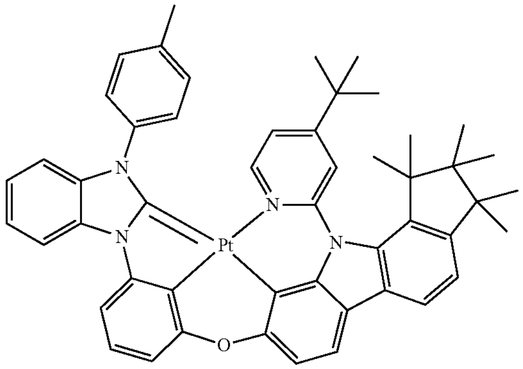

-continued
11
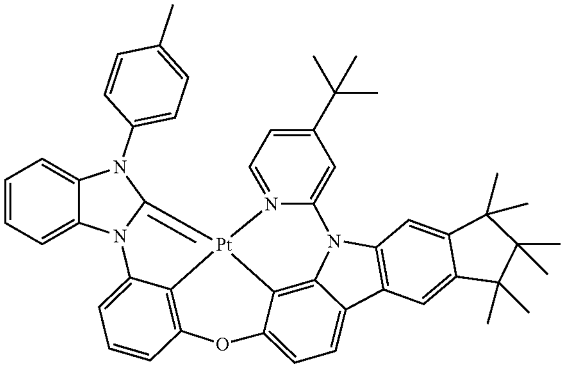
12
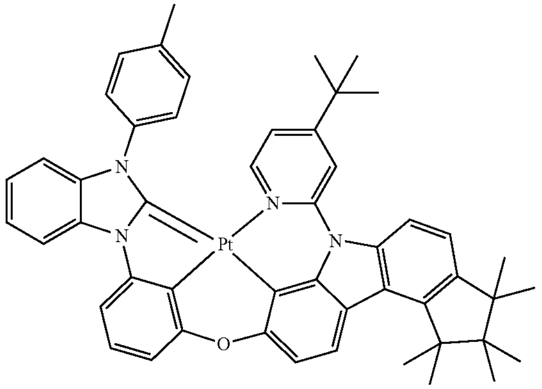
13
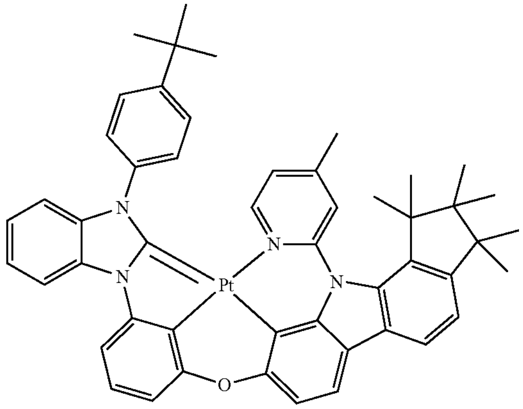
14
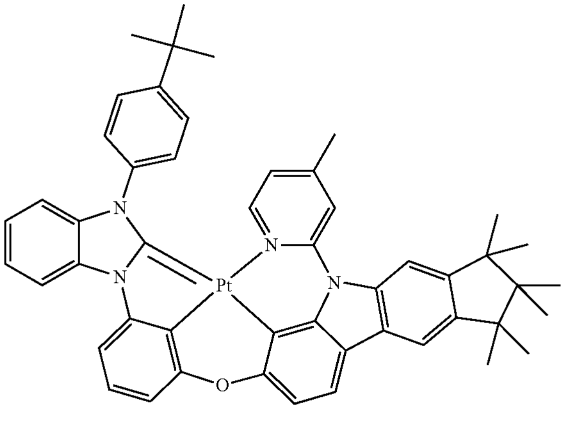
-continued
15
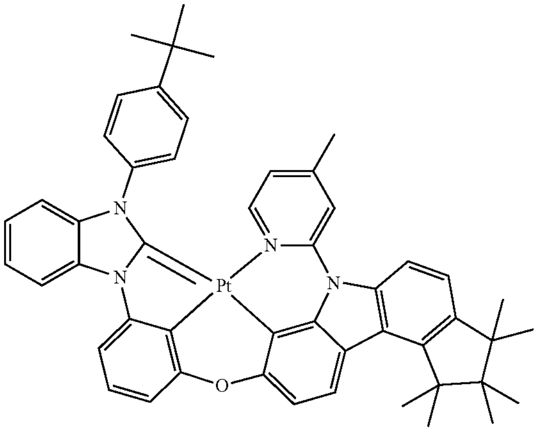
16
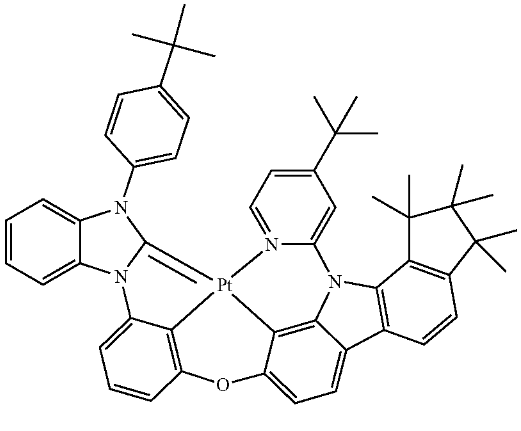
17
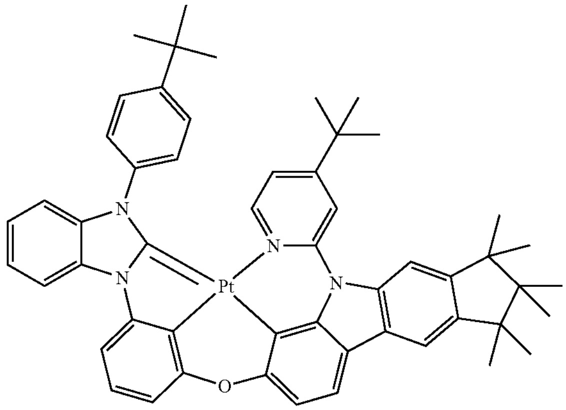

-continued
18
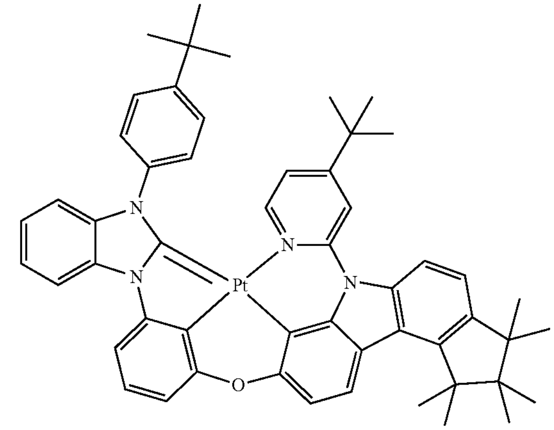
19
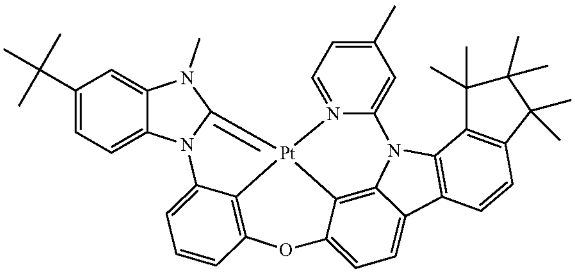
20
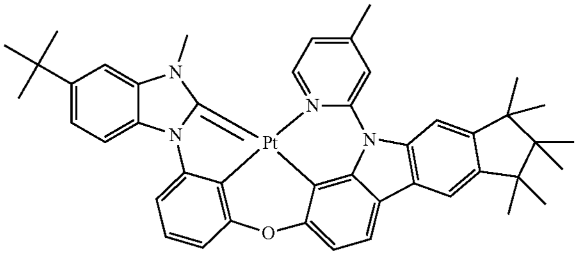
21
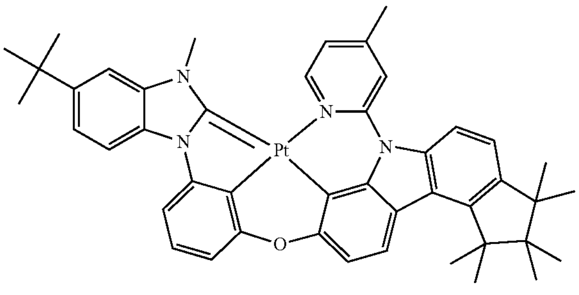
-continued
22
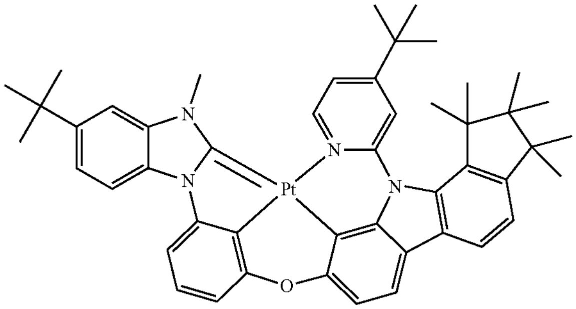
23
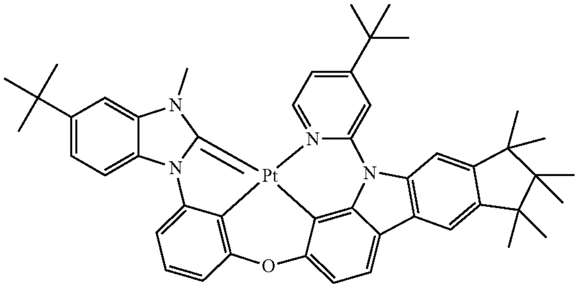
24
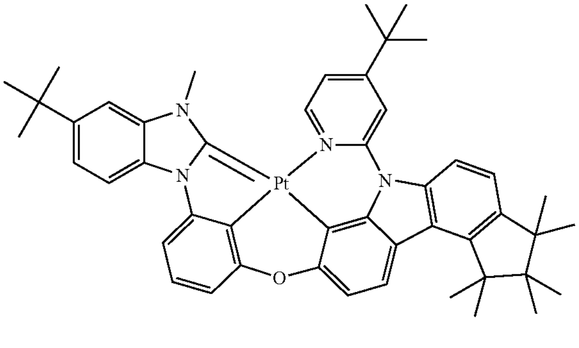
25
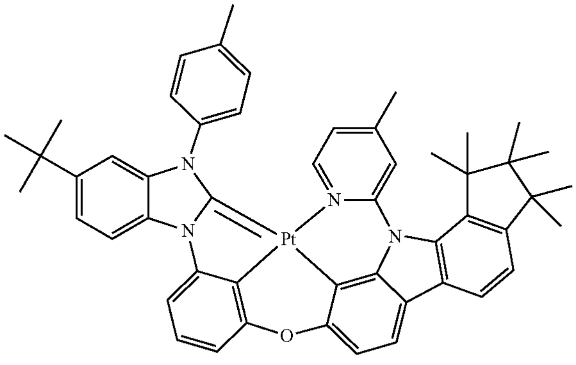

-continued
26
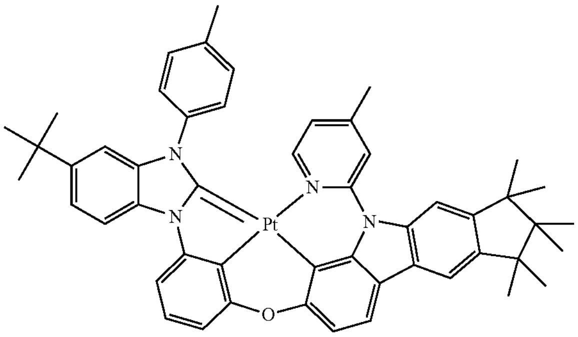
27
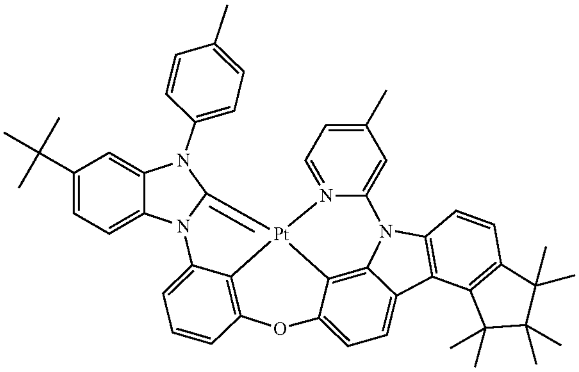
28
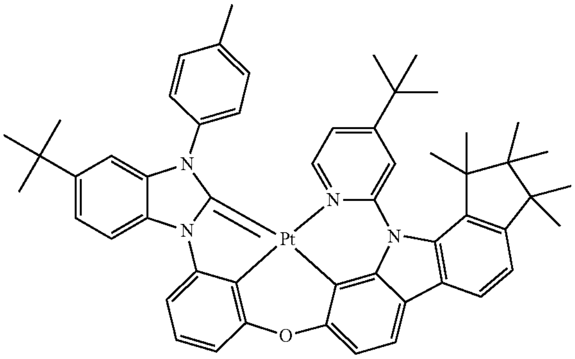
29
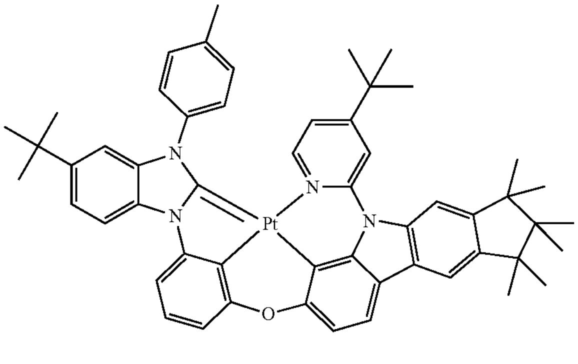
-continued
30
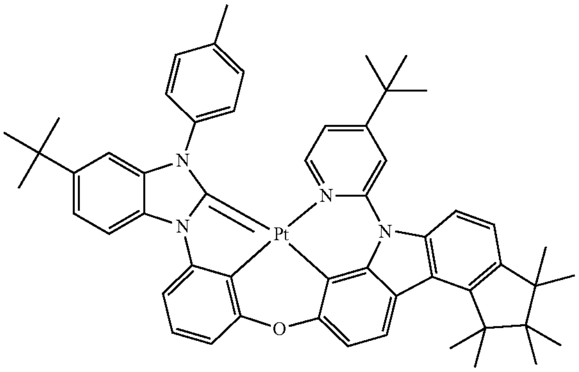
31
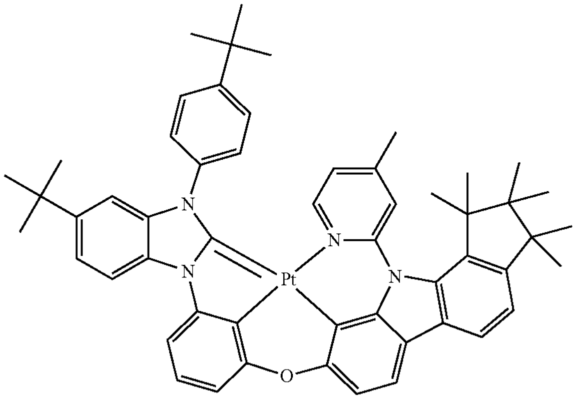
32
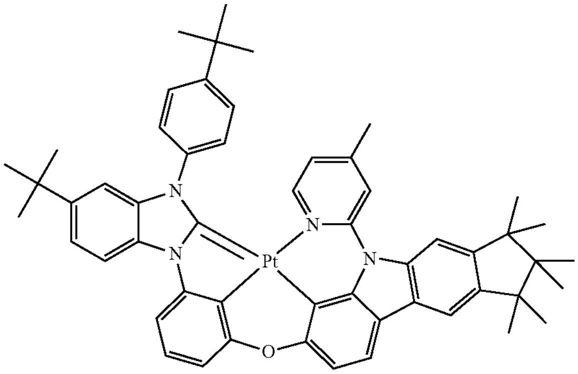
33
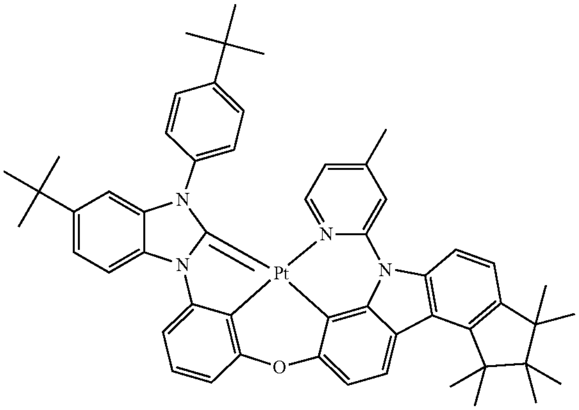

-continued
34
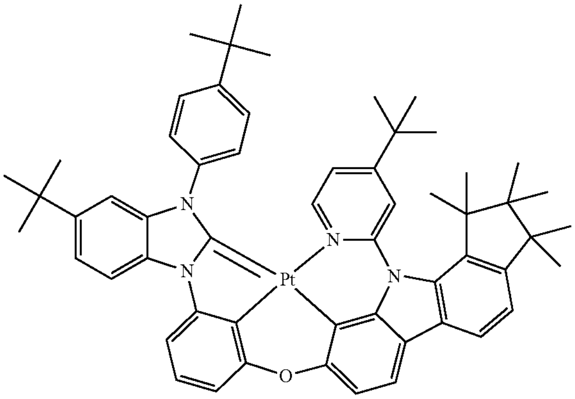
35
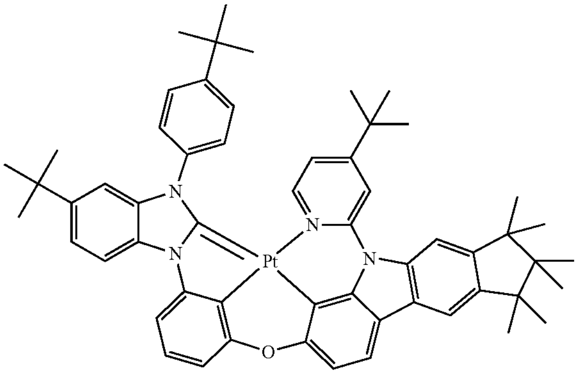
36
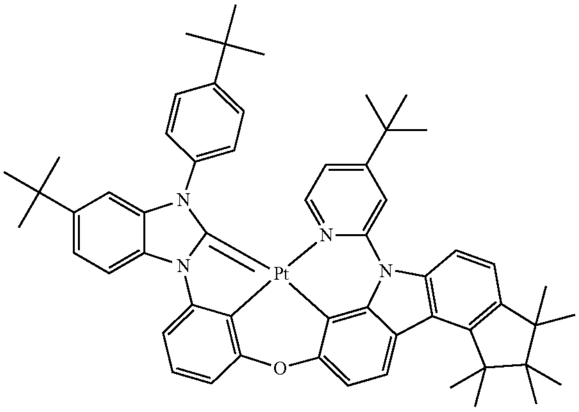
37
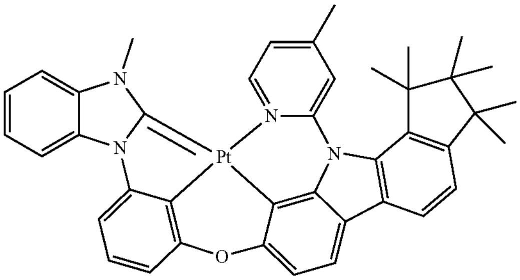
-continued
38
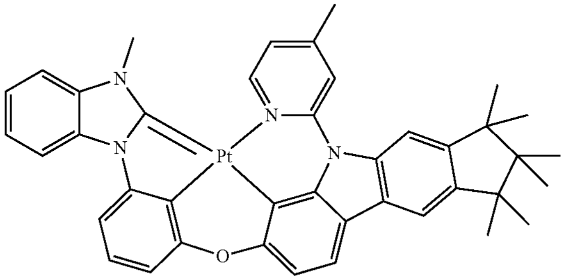
39
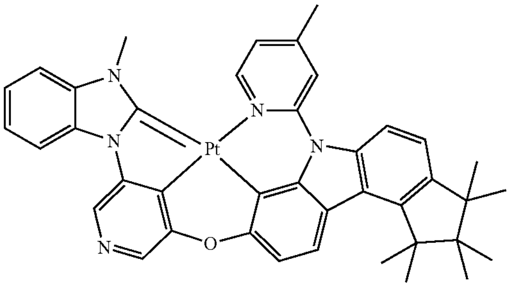
40
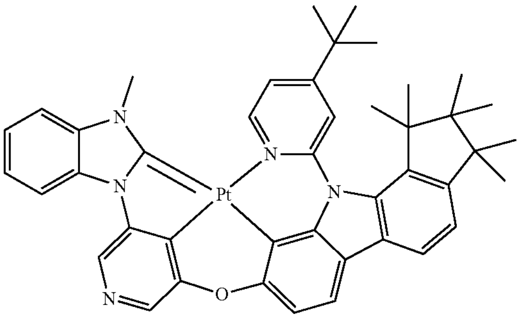
41
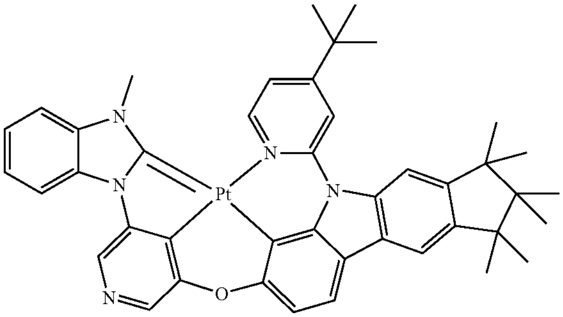
42
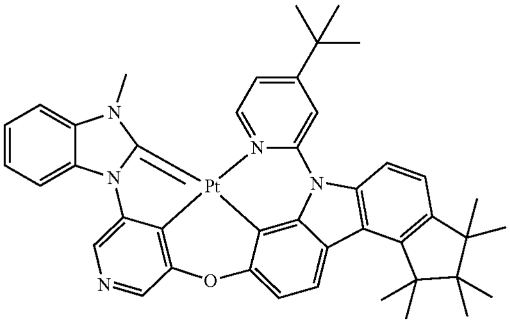

43
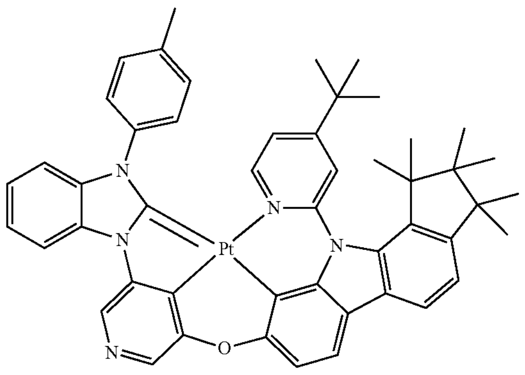
44
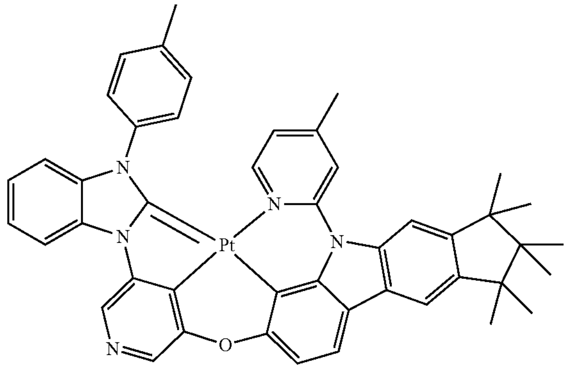
45
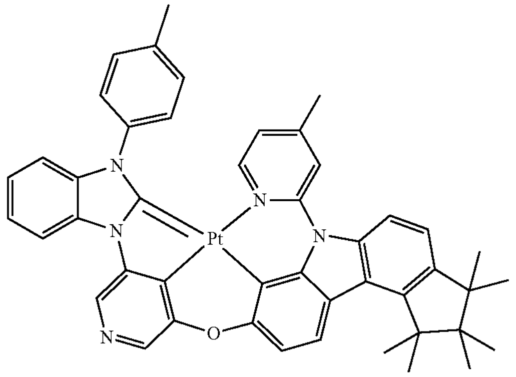
46
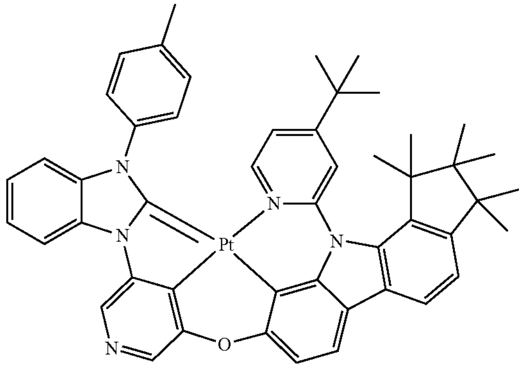
-continued
47
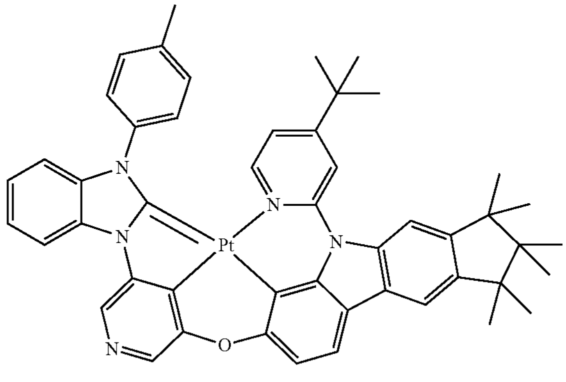
48
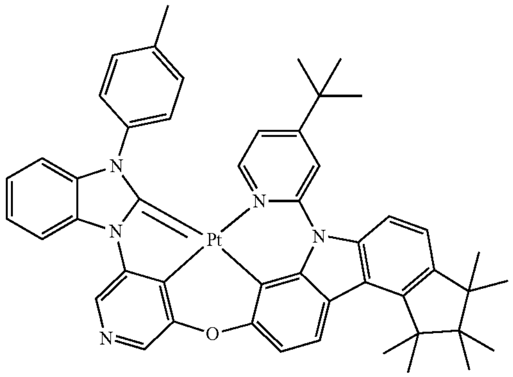
49
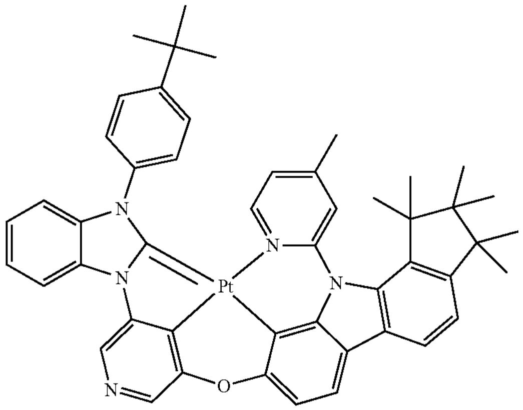
50
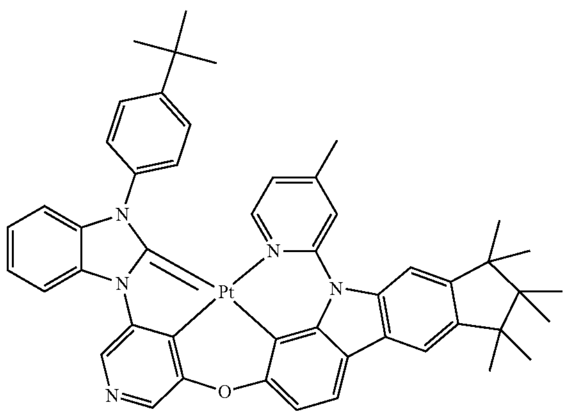

-continued
51
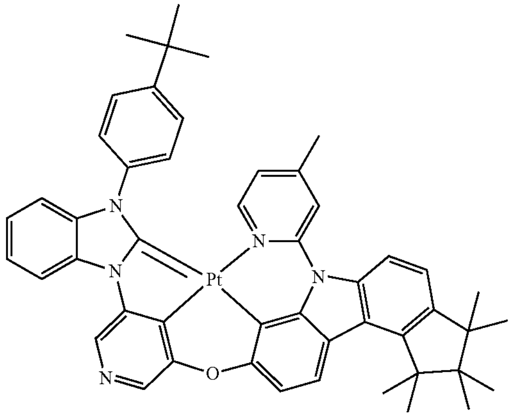
52
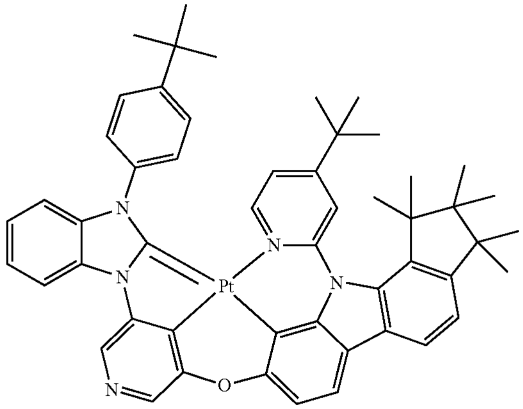
53
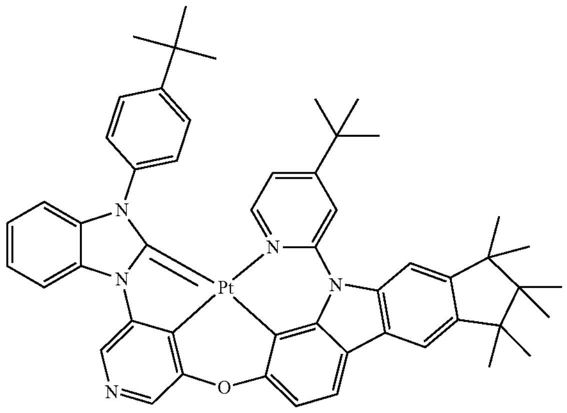
-continued
54
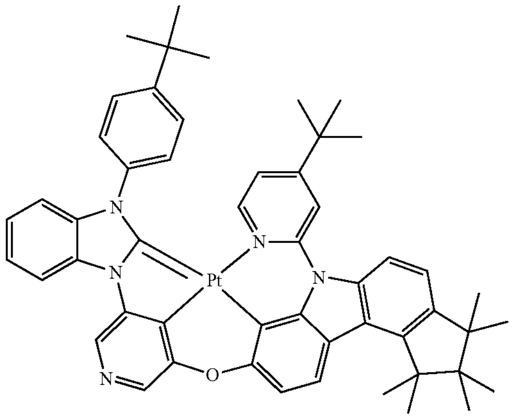
55
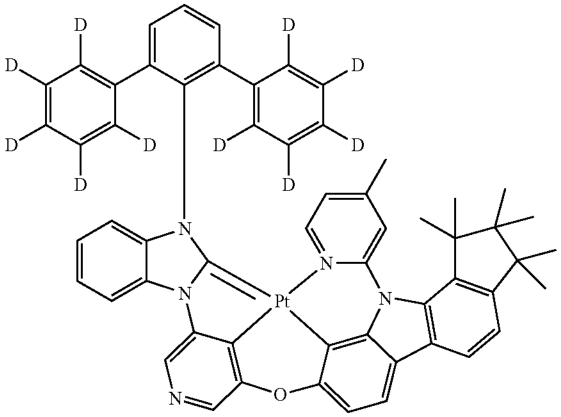
56
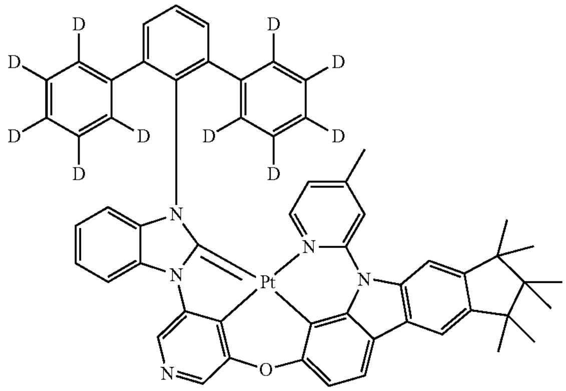

-continued
57
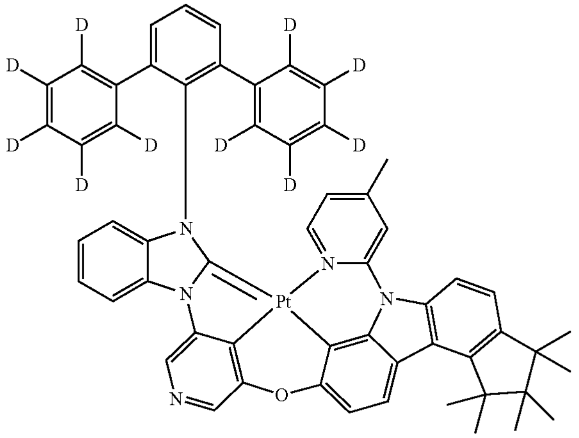
58
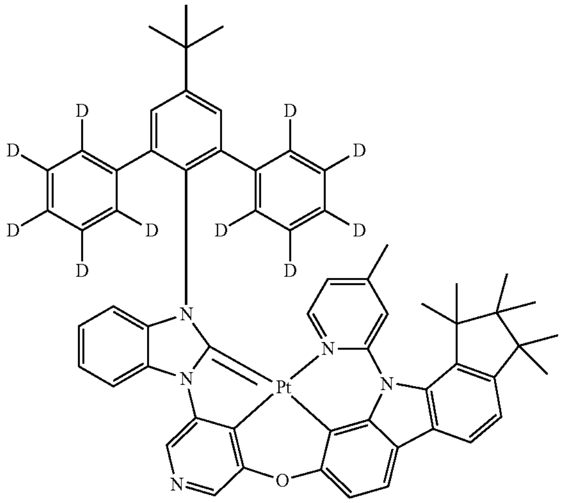
59
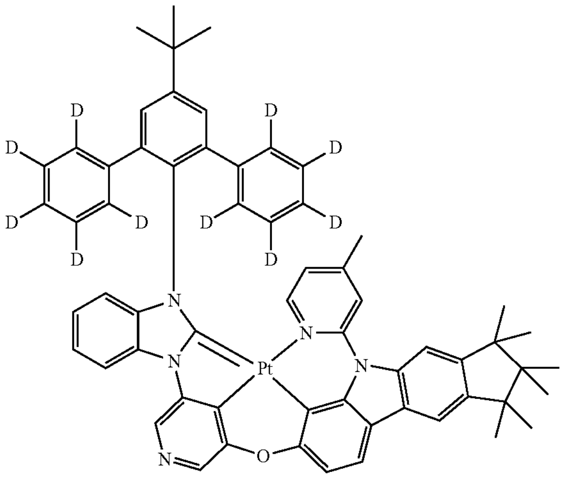
-continued
60
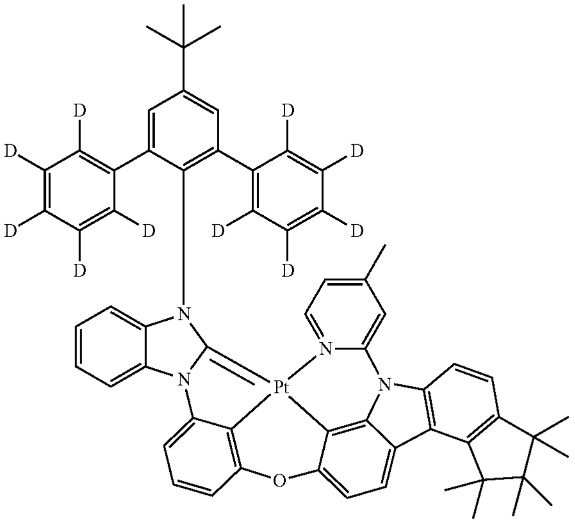
61
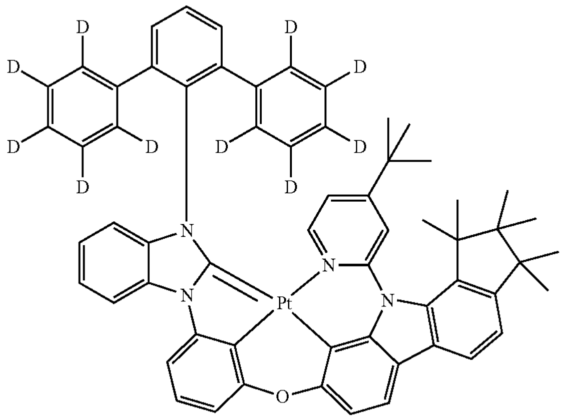
62
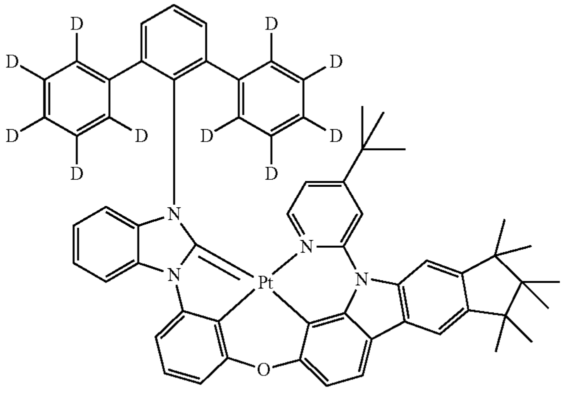

-continued
63
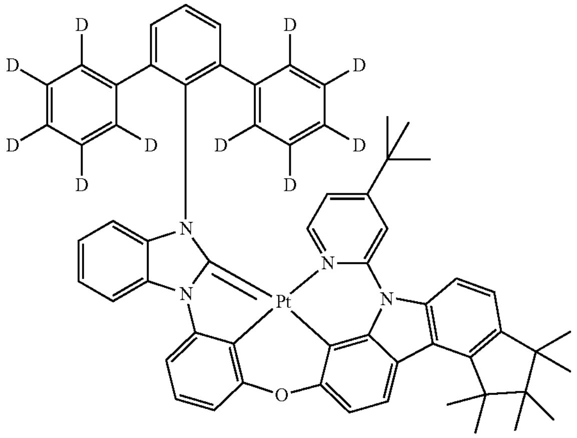
64
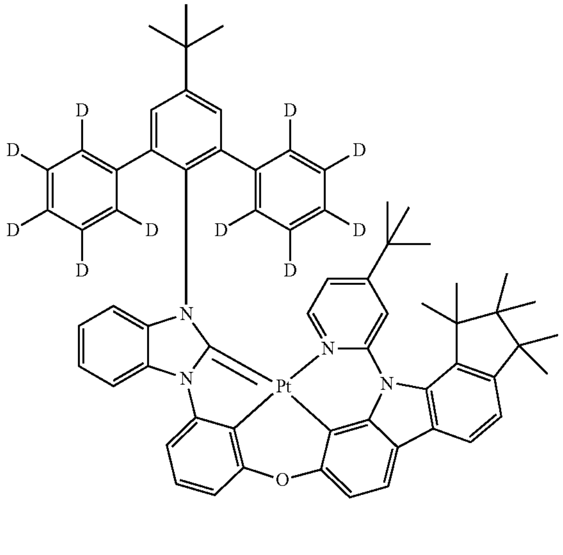
65
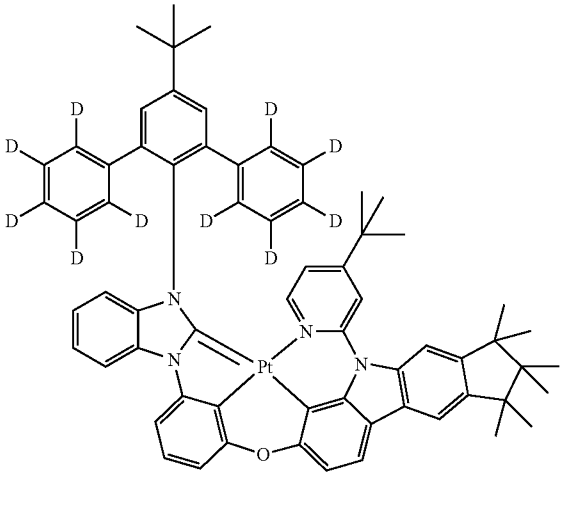
-continued
66
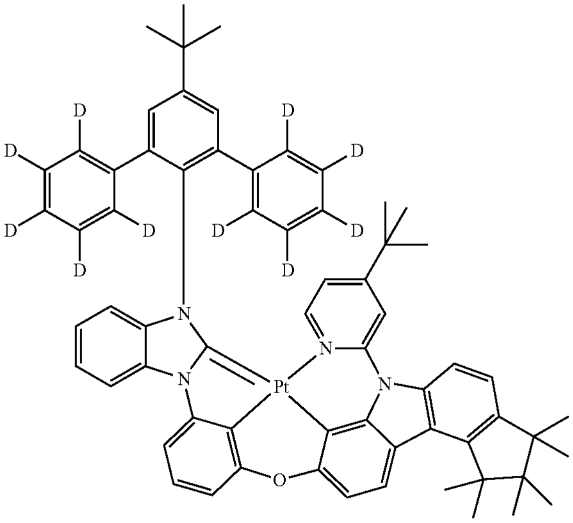
67
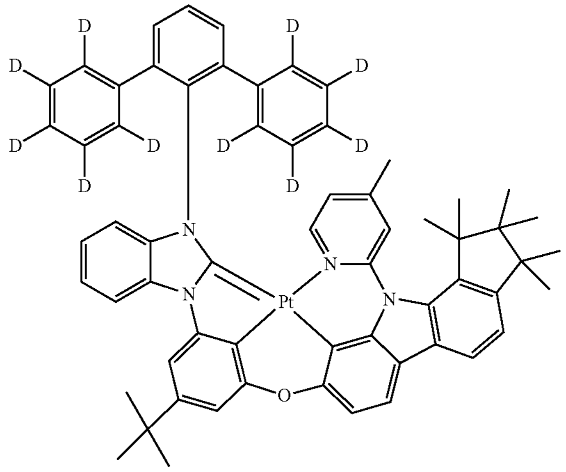
68
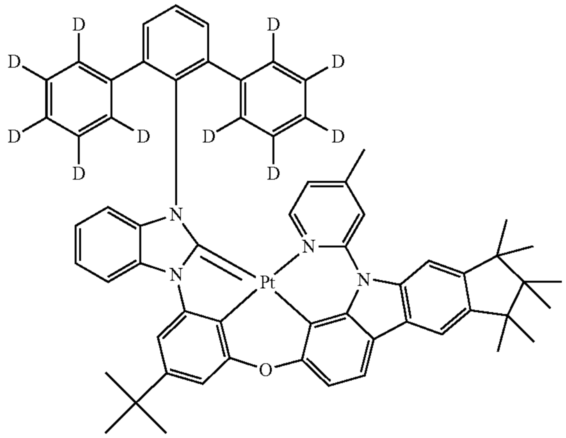

69
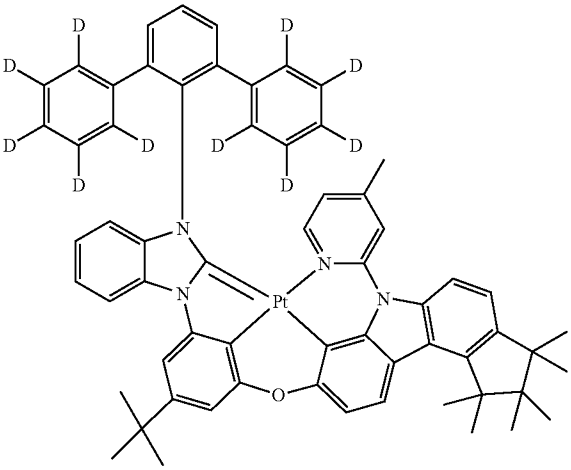
70
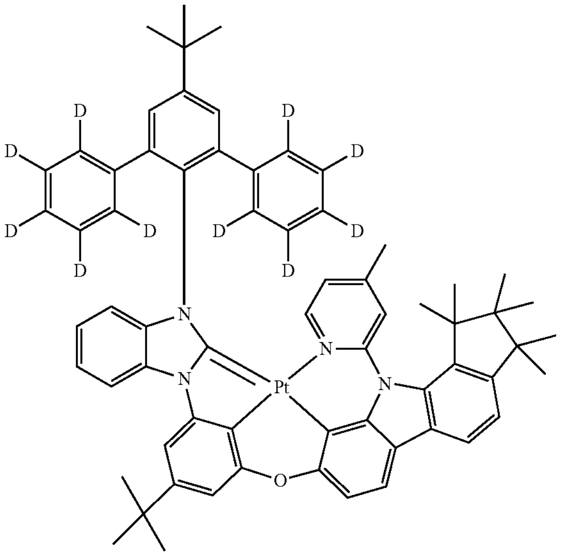
71
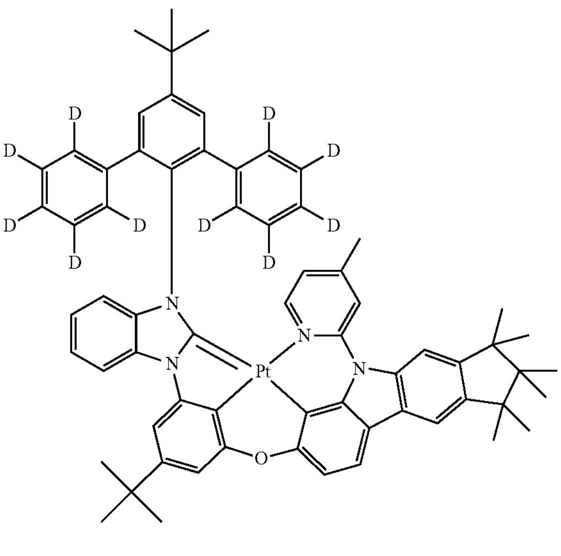
72
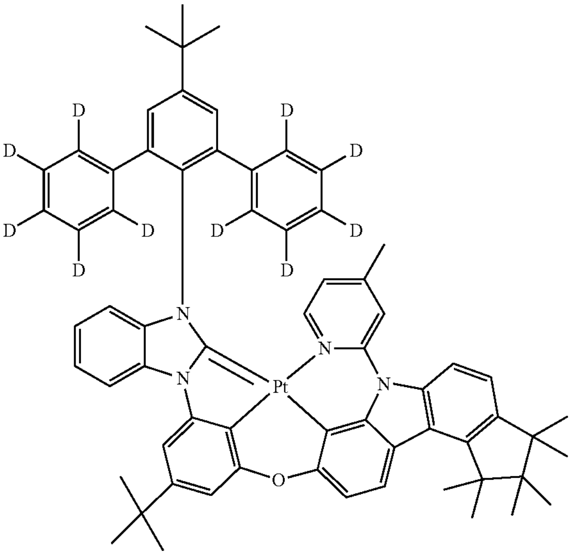
73
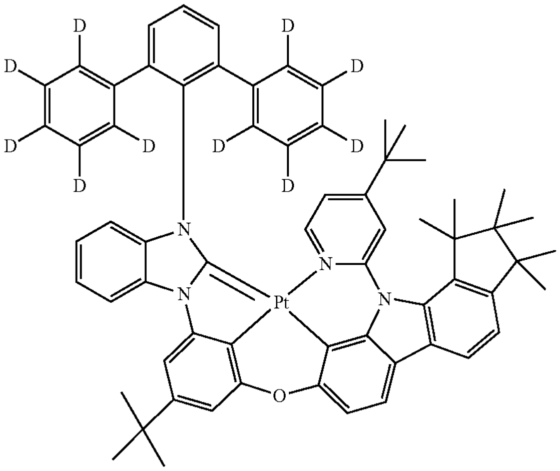
74
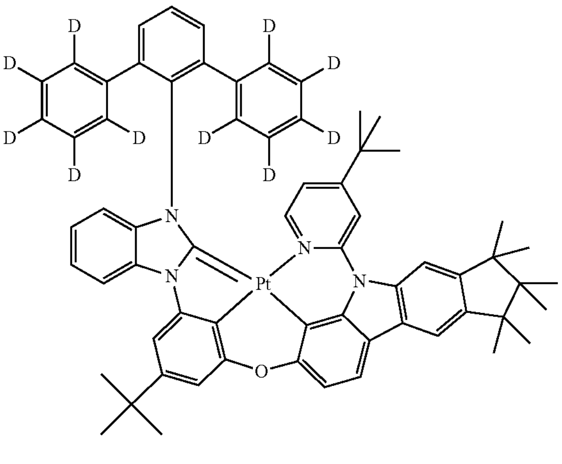

-continued
75
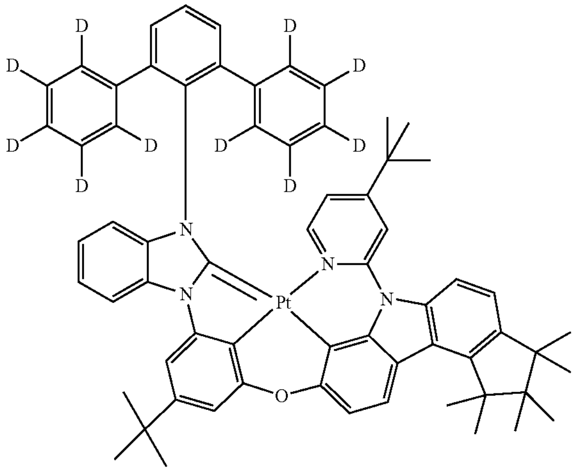
76
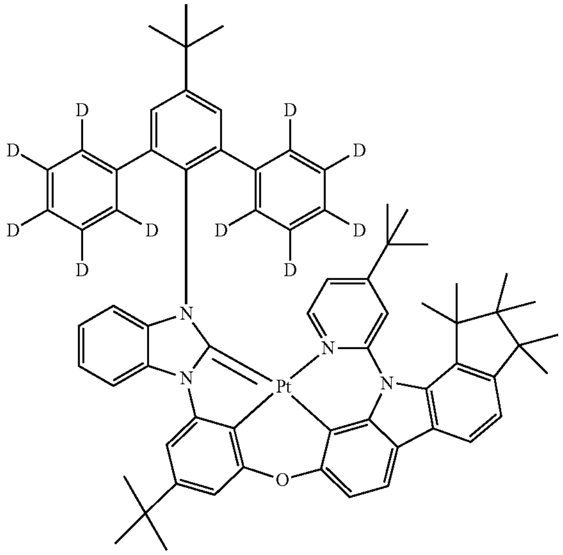
77
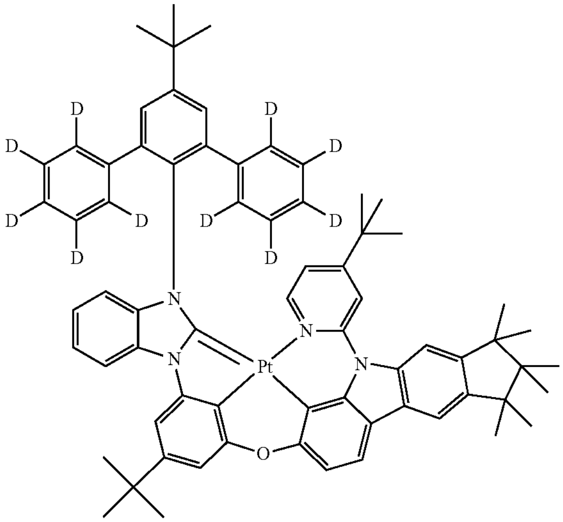
-continued
78
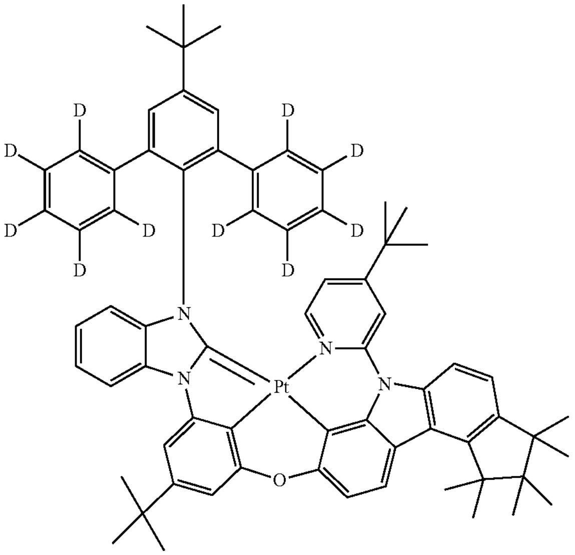
79
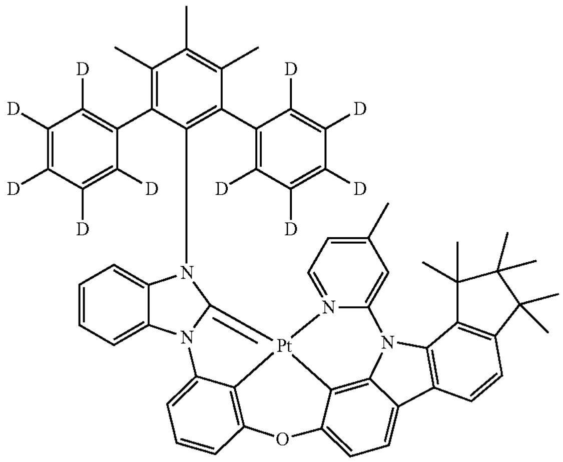
80
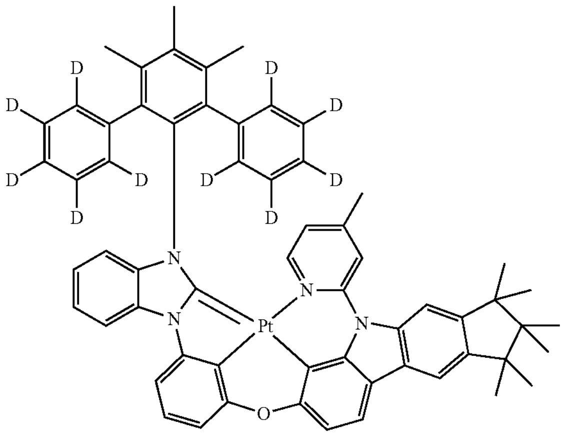

-continued
81
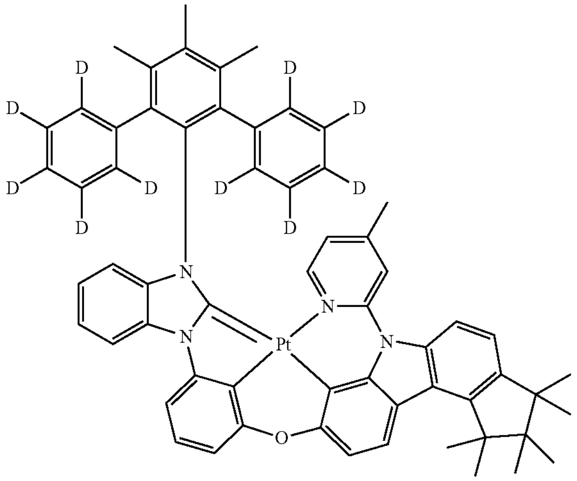
82
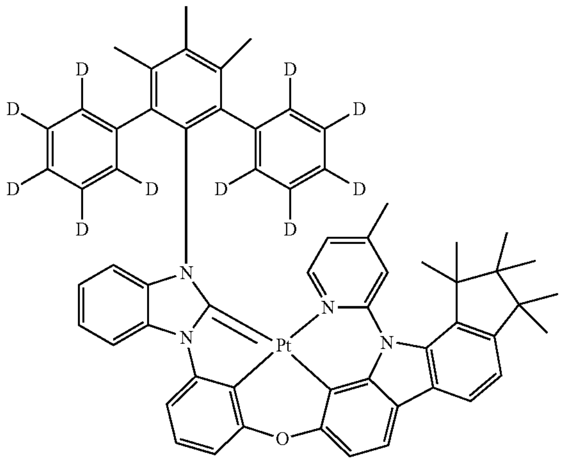
83
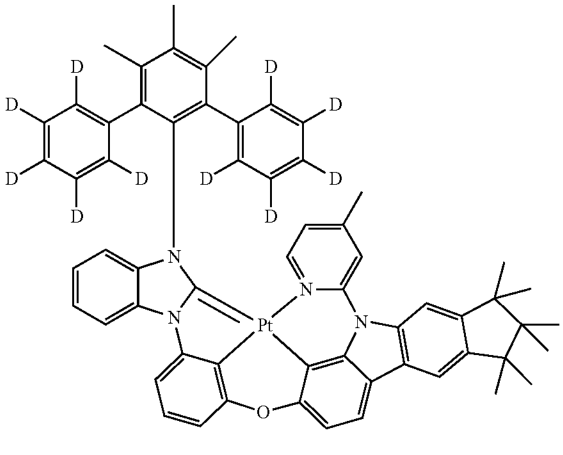
-continued
84
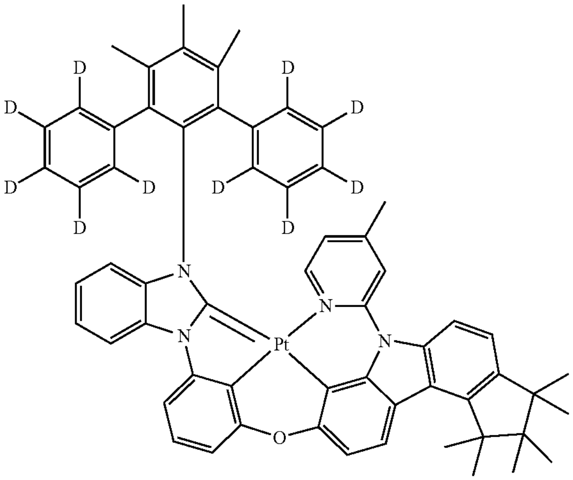
85
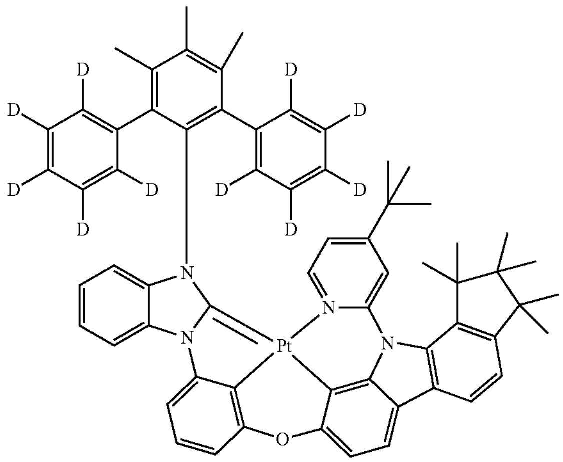
86
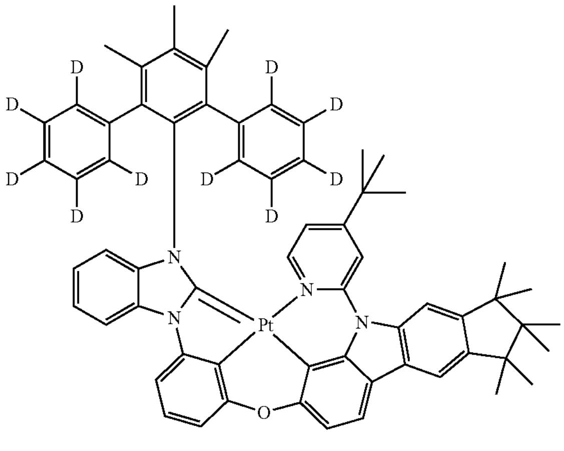

-continued
87
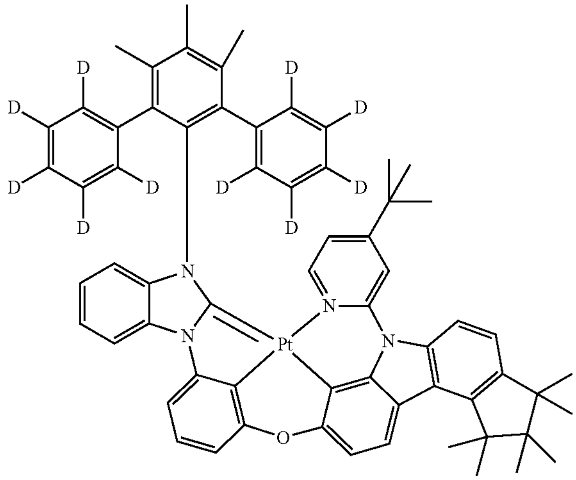
88
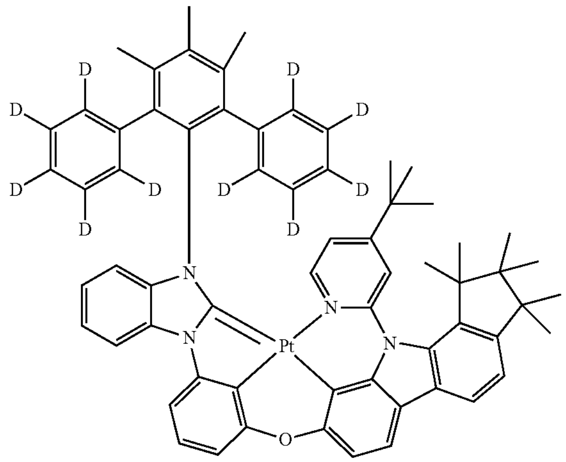
89
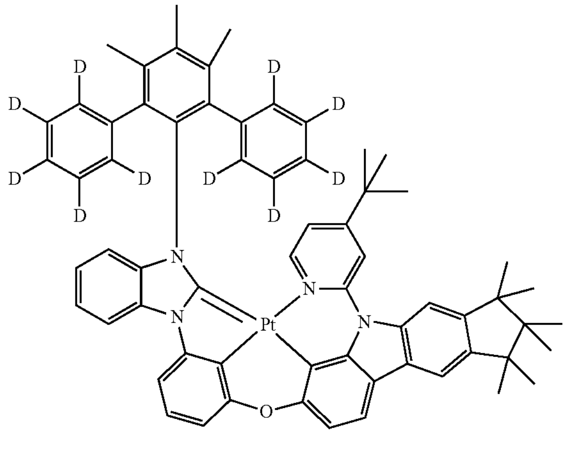
-continued
90
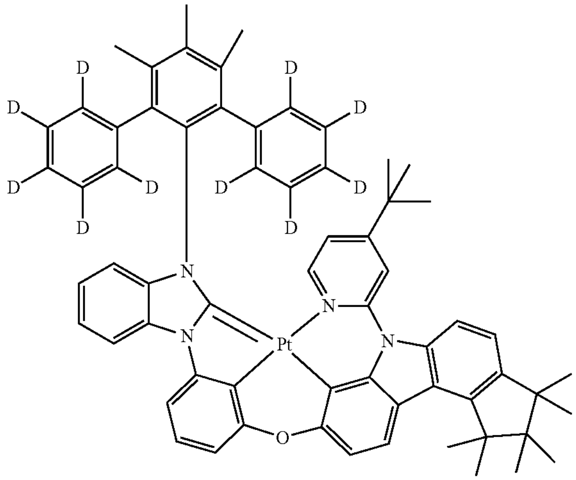
91
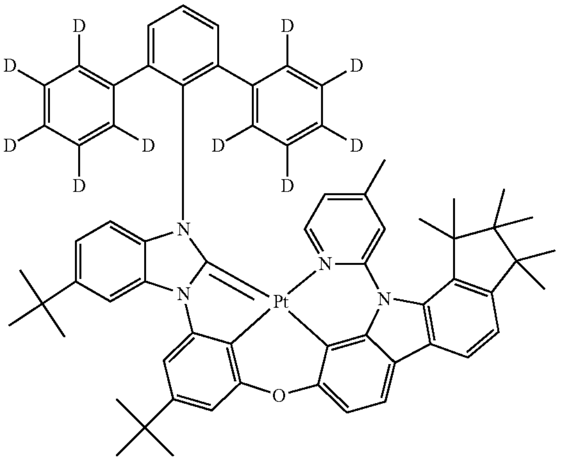
92
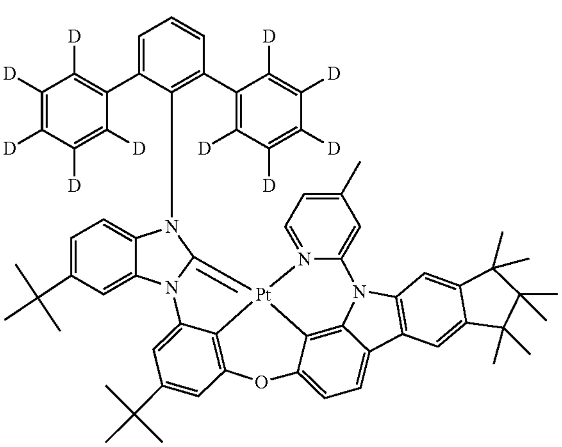

-continued
93
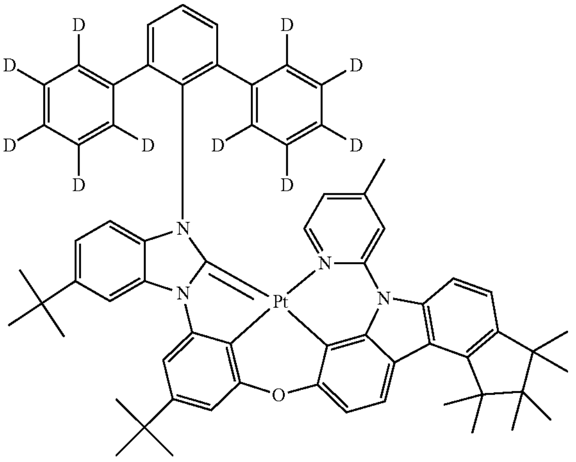
94
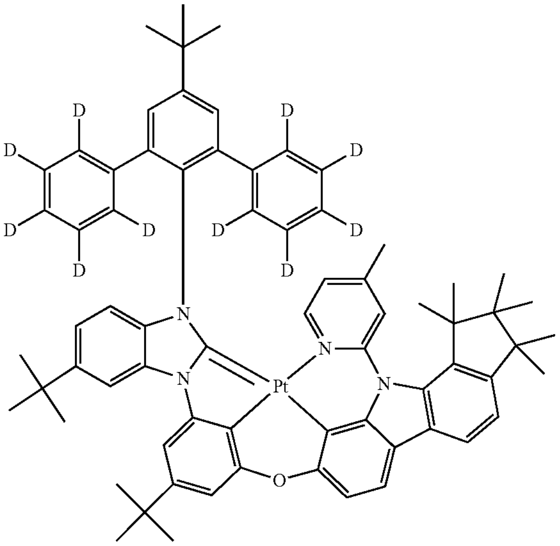
95
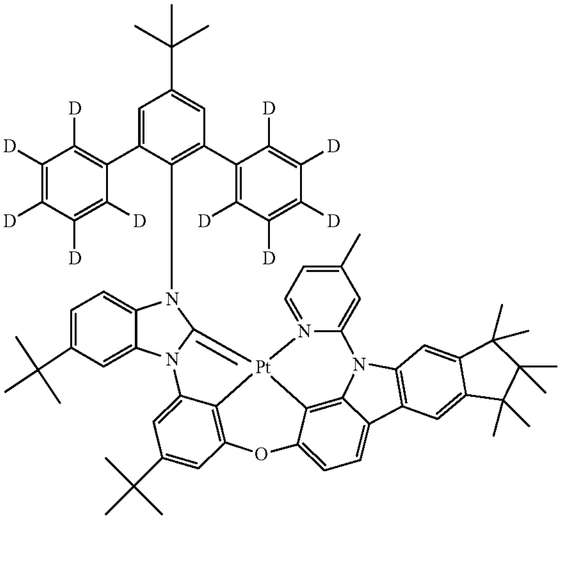
-continued
96
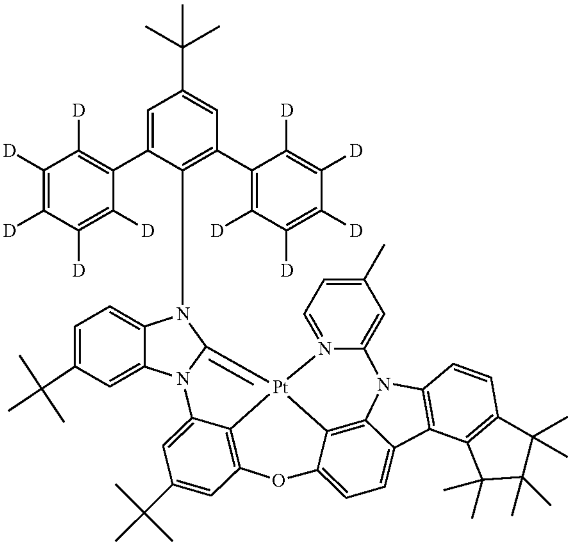
97
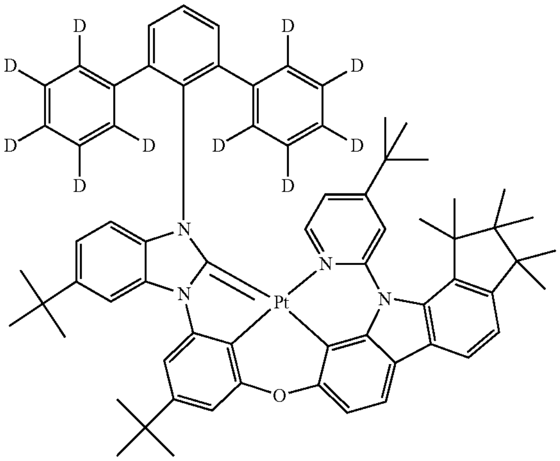
98
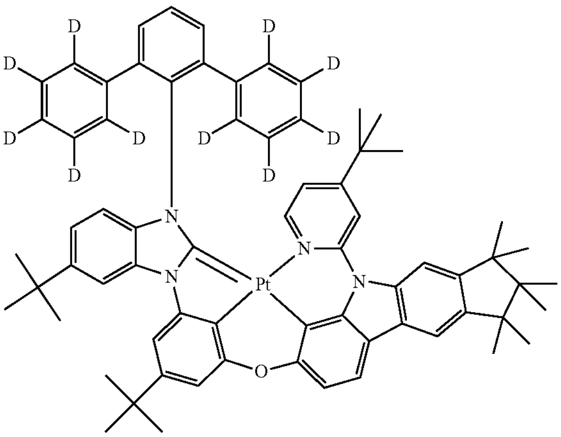

-continued
99
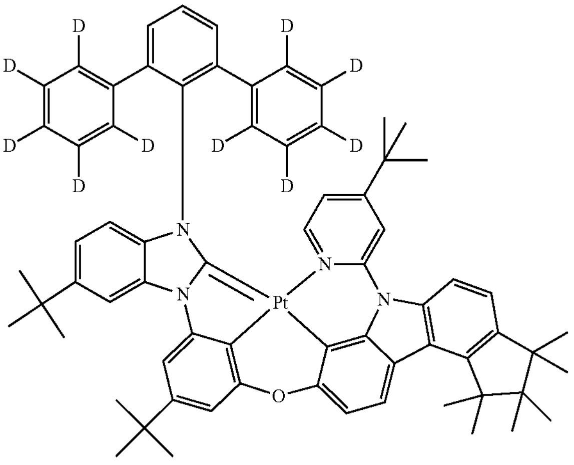
100
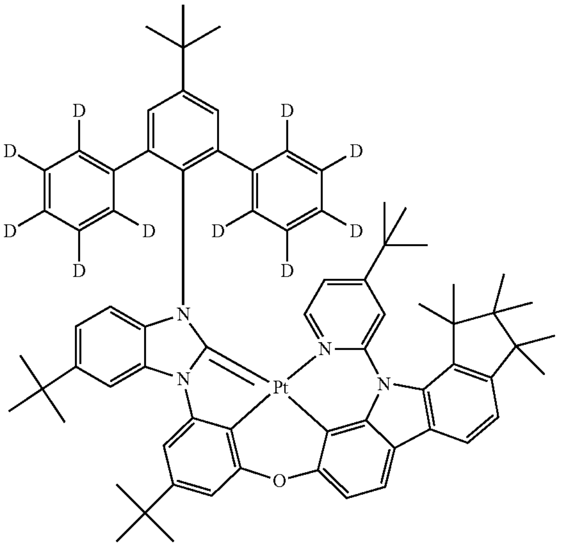
101
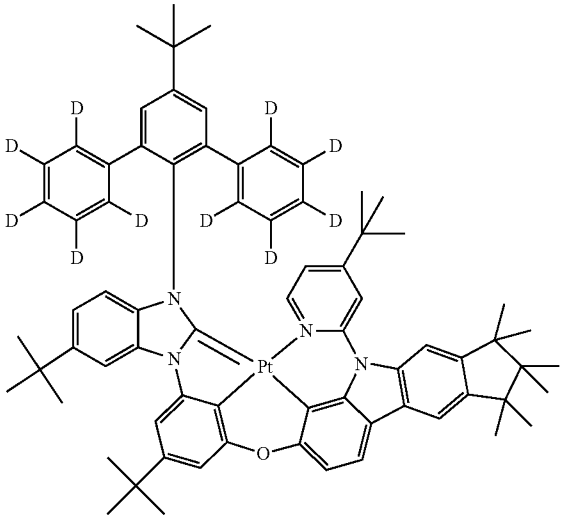
-continued
102
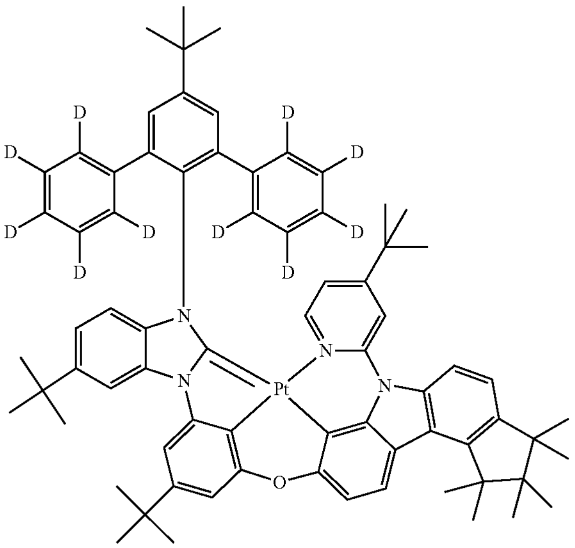
103
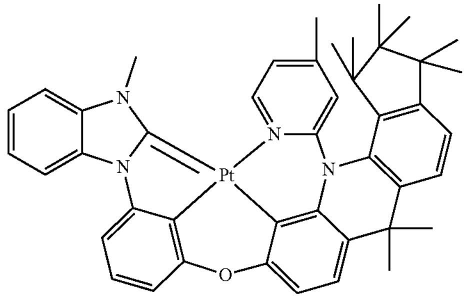
104
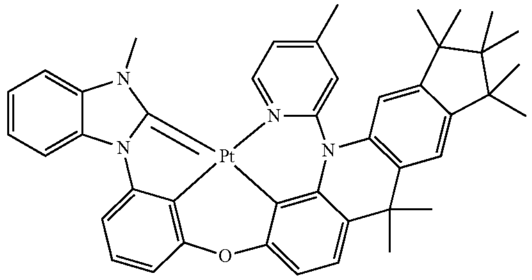
105
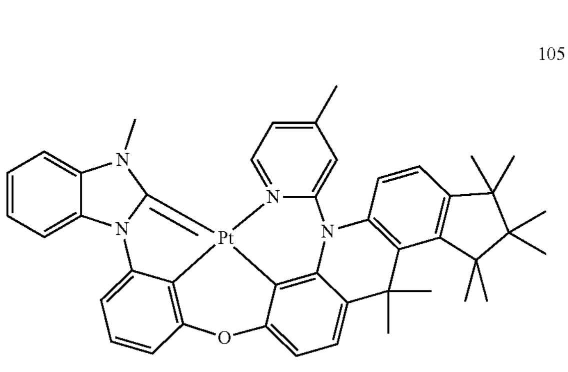

106
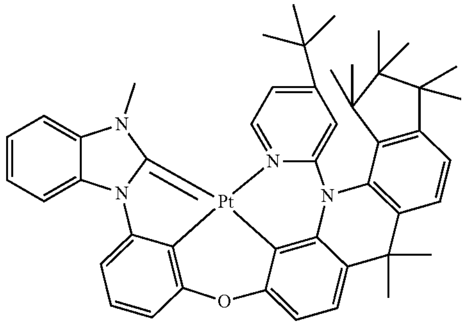
107
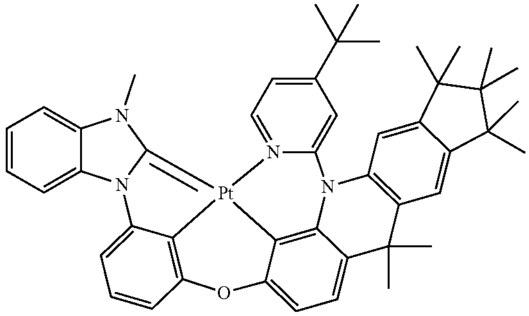
108
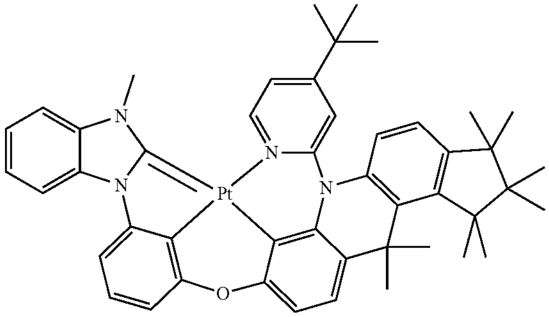
109
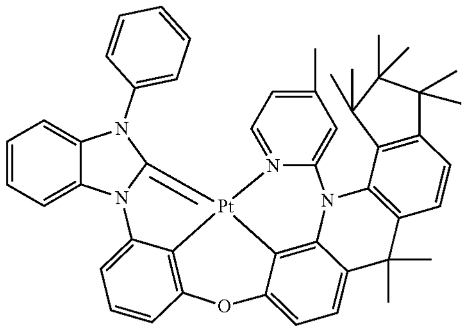
110
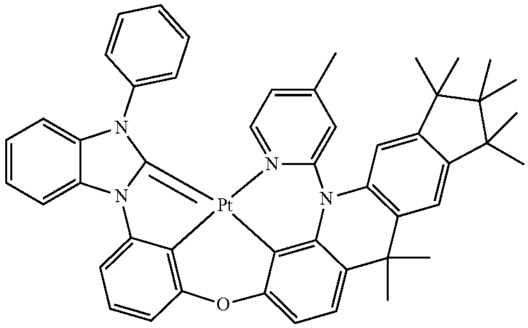
111
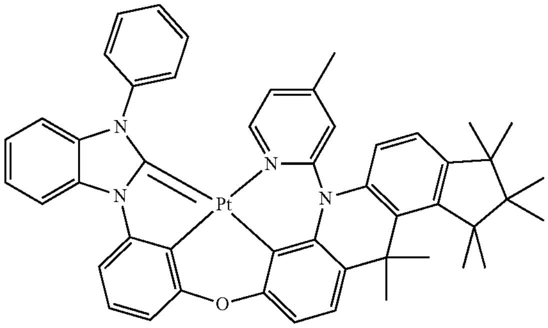
112
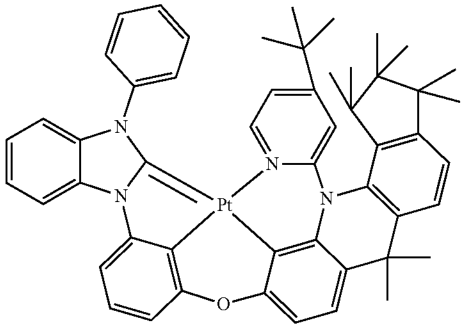
113
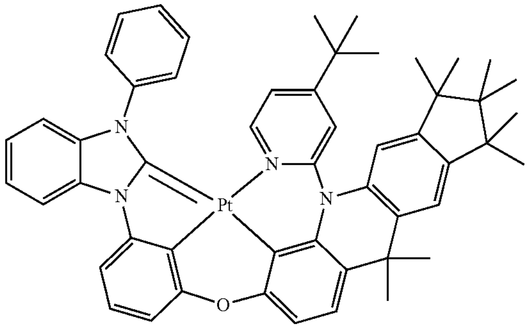

-continued
114
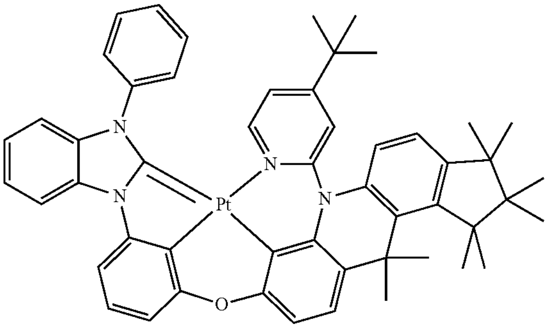
115
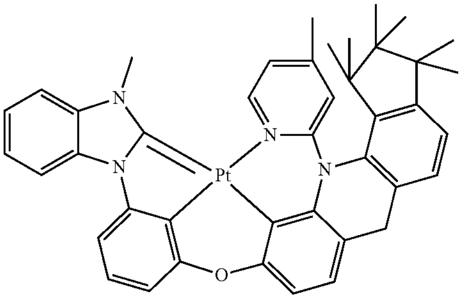
116
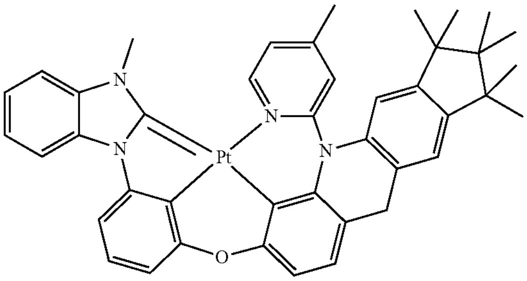
117
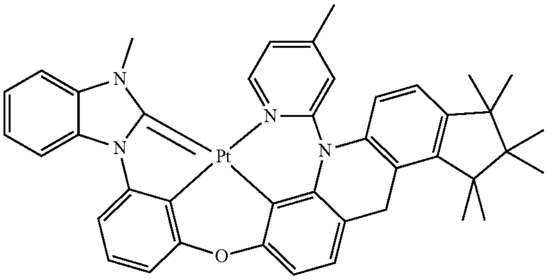
118
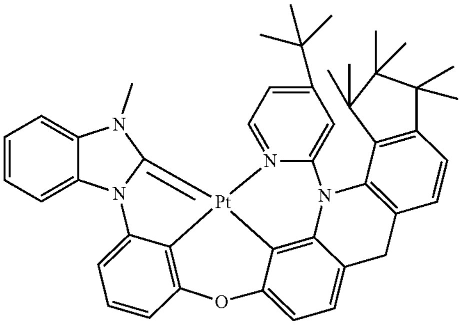
-continued
119
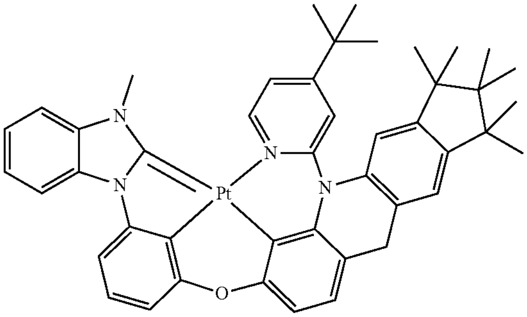
120
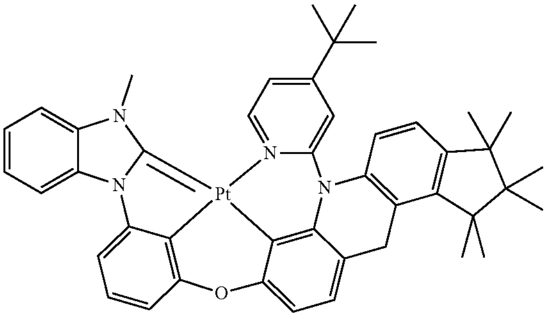
121
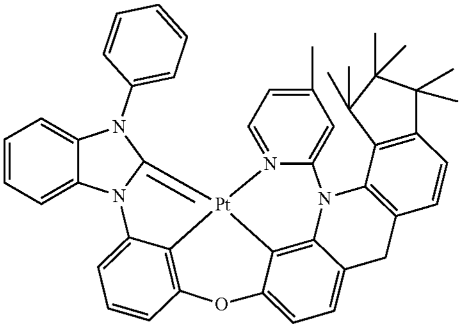
122
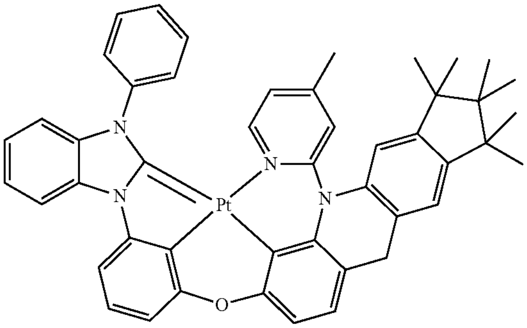

-continued

123

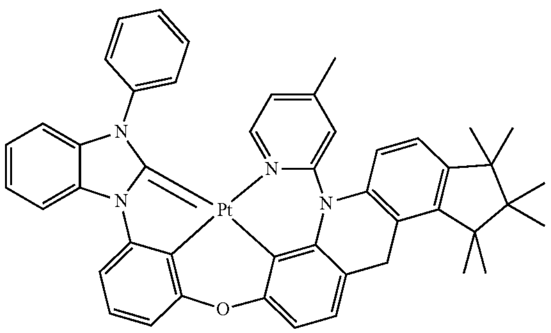

124

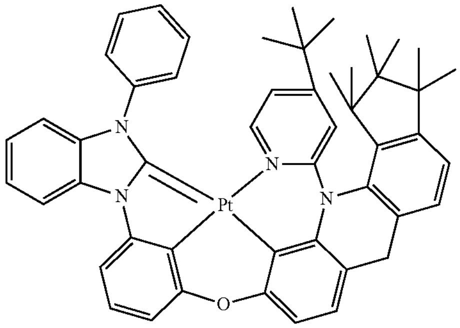

125

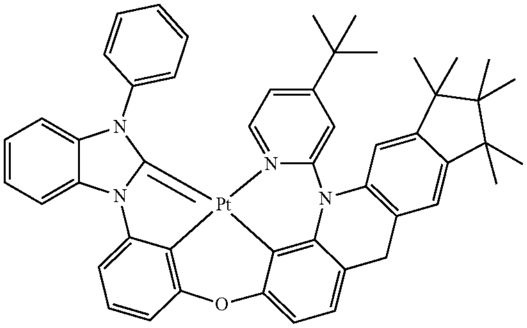

126

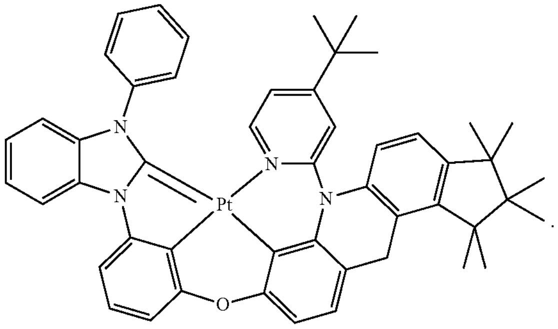

14. An organometallic compound represented by Formula 1:

[Formula 1]

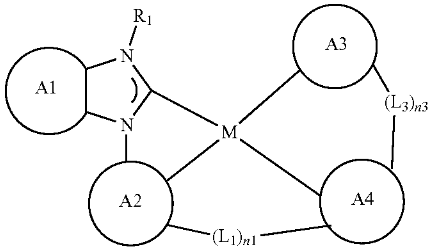

wherein in Formula 1,

M is Pt, Pd, Cu, Ag, Au, Rh, Ir, Ru, or Os, rings A1, A2, and A3 are each independently a substituted or unsubstituted hydrocarbon ring group of 5 to 60 ring-forming carbon atoms, or a substituted or unsubstituted heterocyclic group of 1 to 60 ring-forming carbon atoms, $L_1$ and $L_3$ are each independently a direct linkage, *—O—*', *—S—*', *—C($R_{a1}$)($R_{a2}$)—*', *—C($R_{a3}$)=*', *=C($R_{a4}$)—*', *—C($R_{a8}$)═C($R_{a6}$)—*', *—C(═O)—*', *—C(═S)—*', *—C≡C—*', *—B($R_{a7}$)—*', *—N($R_{a8}$)—*', *—P($R_{a9}$)—*', *—Si($R_{a10}$)($R_{a1}$)*', *—P($R_{a12}$)($R_{a13}$)—*', or *—Ge($R_{a14}$)($R_{a1}$)—*', where * and *' are each a bonding site, $R_1$, and Ral to $R_{a15}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n1 and n3 are each independently 0 or 1, and ring A4 is a group represented by one of Formula 2-1 to Formula 2-3:

[Formula 2-1]

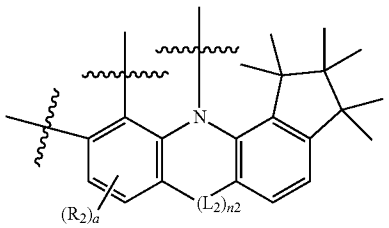

[Formula 2-2]

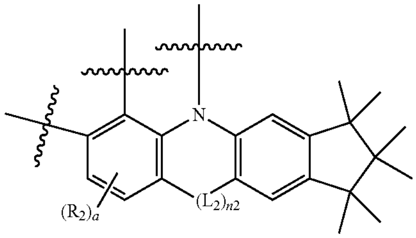

-continued

[Formula 2-3]

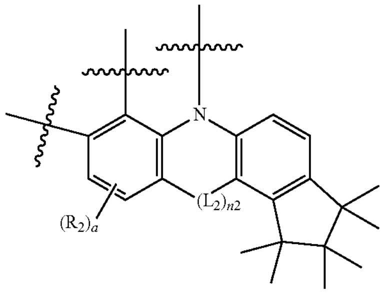

wherein in Formula 2-1 to Formula 2-3,

is a bonding site, $L_2$ is a direct linkage, *—O*', *—S—*', *—C($R_{a1'}$)($R_{a2'}$)—*', *—C($R_{a3'}$)=*', *=C($R_{a4'}$)—*', *—C($R_{a5'}$)=C($R_{a6'}$)*', *—C(=O)—*', *—C(=S)—*', *—C≡C—*', *—B($R_{a7'}$)—*', *—N($R_{a5'}$)*', *—P($R_{a9'}$)—*', * Si($R_{a10'}$)($R_{a11'}$)—*', *—P($R_{a12'}$)($R_{a13'}$)-*' or *—Ge($R_{a14'}$)($R_{a15'}$)—*', where * and *' are each a bonding site, $R_2$, and $R_{a1'}$ to $R_{a15'}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, a is an integer from 0 to 2, and n2 is 0 or 1.

15. The organometallic compound of claim 14, wherein ring A2 is a group represented by one of Formula A-1 to Formula A-3:

[Formula A-1]

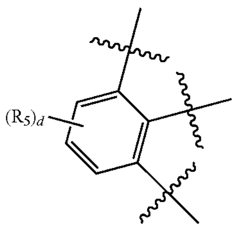

[Formula A-2]

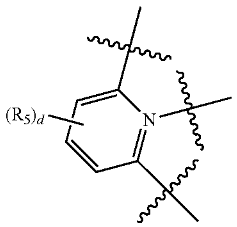

-continued

[Formula A-3]

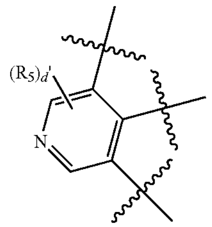

wherein in Formula A-1 to Formula A-3,

is a bonding site, $R_5$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, d is an integer from 0 to 3, and d' is an integer from 0 to 2.

16. The organometallic compound of claim 14, wherein ring A3 is a group represented by one of Formula B-1 to Formula B-4:

[Formula B-1]

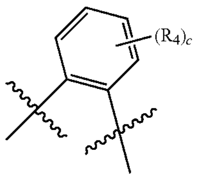

[Formula B-2]

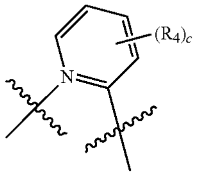

[Formula B-3]

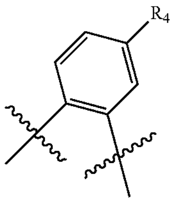

[Formula B-4]

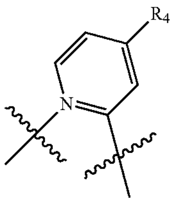

wherein in Formula B-1 to Formula B-4,

is a bonding site, $R_4$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and c is an integer of 0 to 4.

17. The organometallic compound of claim 14, wherein the organometallic compound represented by Formula 1 is represented by Formula 3:

[Formula 3]

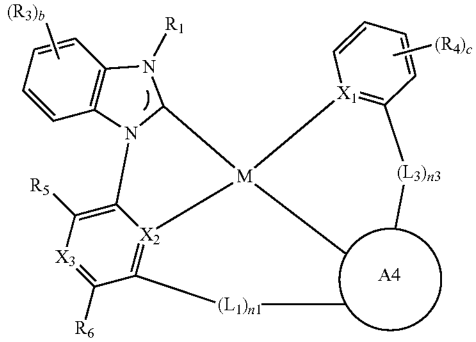

wherein in Formula 3, $X_1$ to $X_3$ are each independently N or $C(R_b)$, wherein one of $X_1$ or $X_2$ is N, $R_3$ to $R_6$ and $R_b$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, b and c are each independently an integer from 0 to 4, and M, ring A4, $L_1$, $L_3$, n1, n3, and Ri are the same as defined in Formula 1.

18. The organometallic compound of claim 17, wherein the organometallic compound represented by Formula 3 is represented by Formula 4:

[Formula 4]

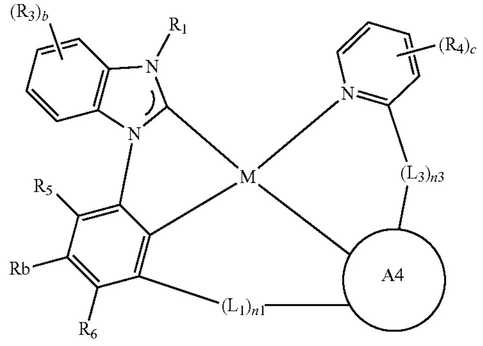

wherein in Formula 4,

M, ring A4, $L_1$, $L_3$, n1, n3, b, c, $R_1$, $R_3$ to $R_6$, and $R_b$ are the same as defined in Formula 3.

19. The organometallic compound of claim 17, wherein the organometallic compound represented by Formula 3 is represented by Formula 5:

[Formula 5}

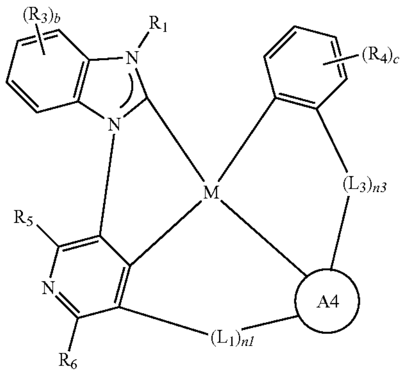

wherein in Formula 5,

M, ring A4, $L_1$, $L_3$, n1, n3, b, c, $R_1$, and $R_3$ to $R_6$ are the same as defined in Formula 3.

20. The organometallic compound of claim 14, wherein the organometallic compound represented by Formula 1 is at least one selected from Compound Group 1:

[Compound Group 1]

1

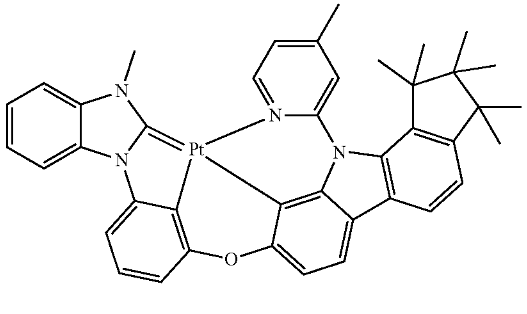

2
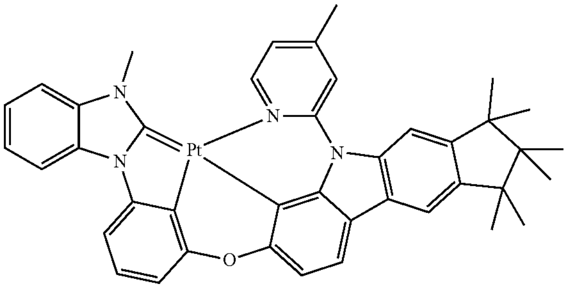
3
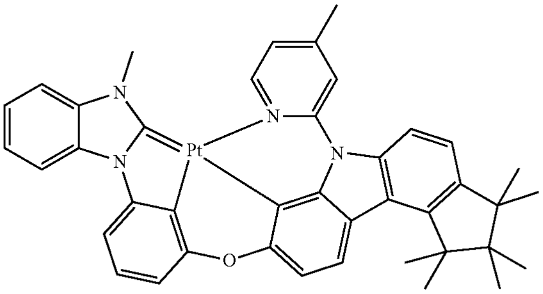
4
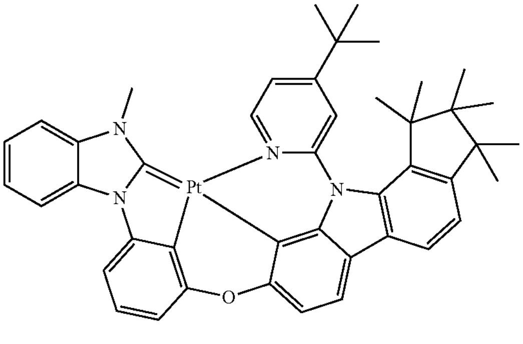
5
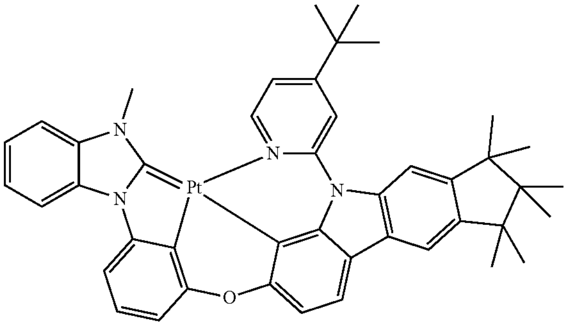
6
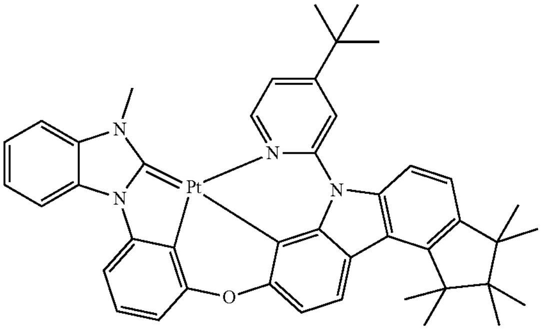
7
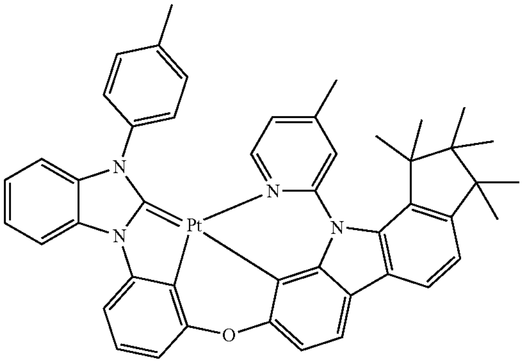
8
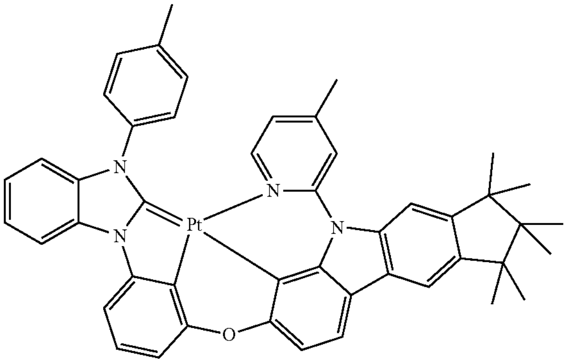
9
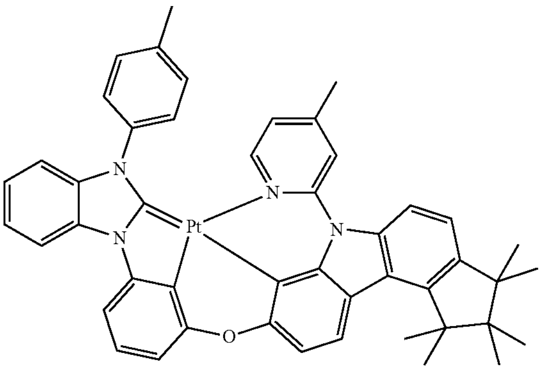

-continued
10
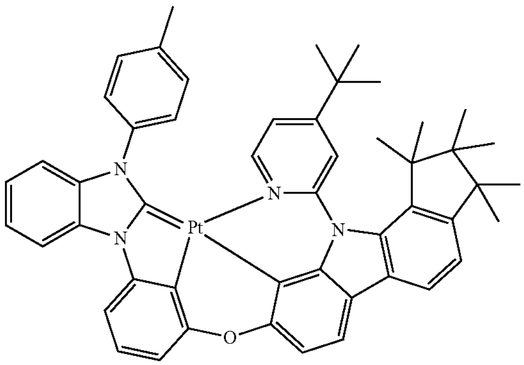
11
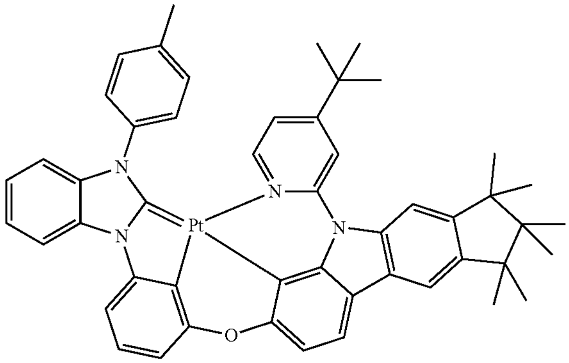
12
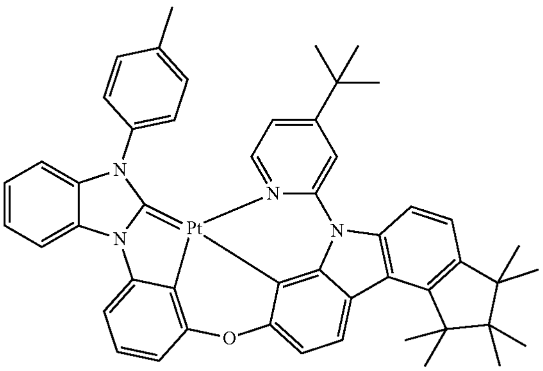
-continued
73
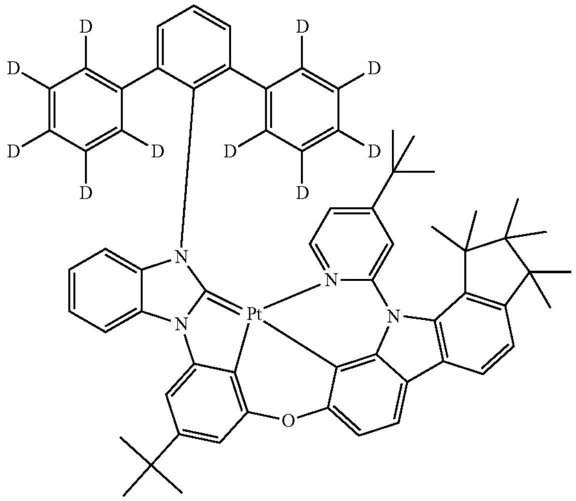
74
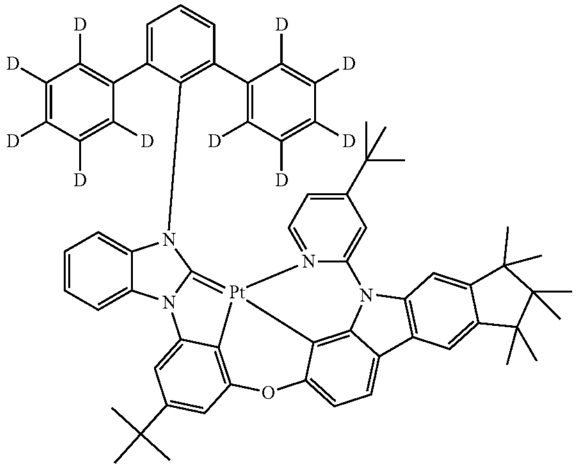
75
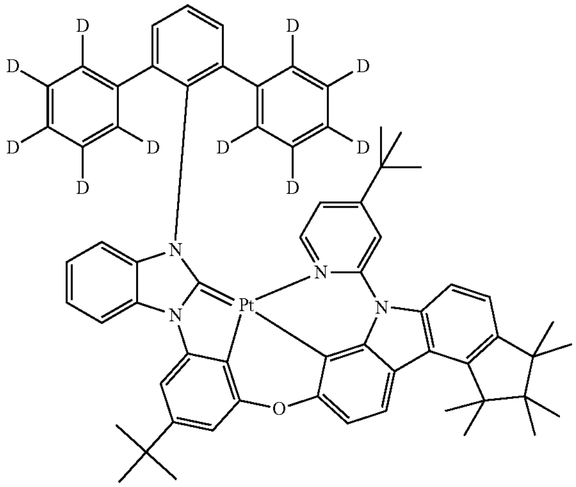

-continued
76
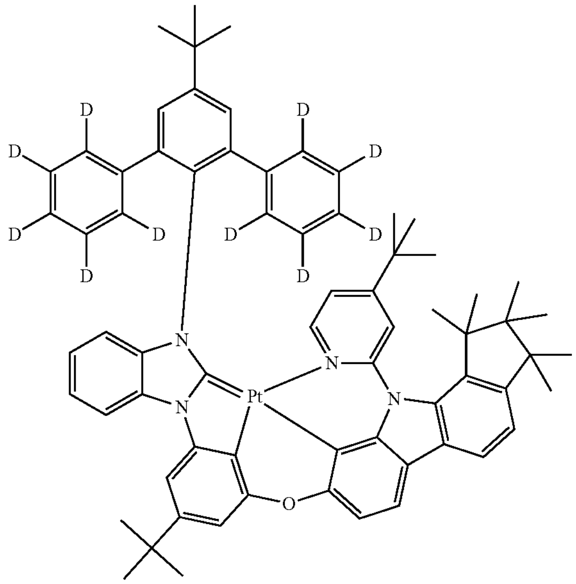
77
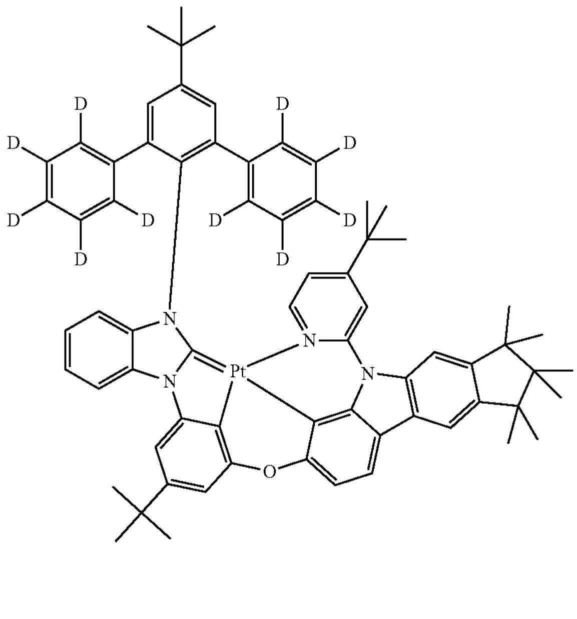
-continued
78
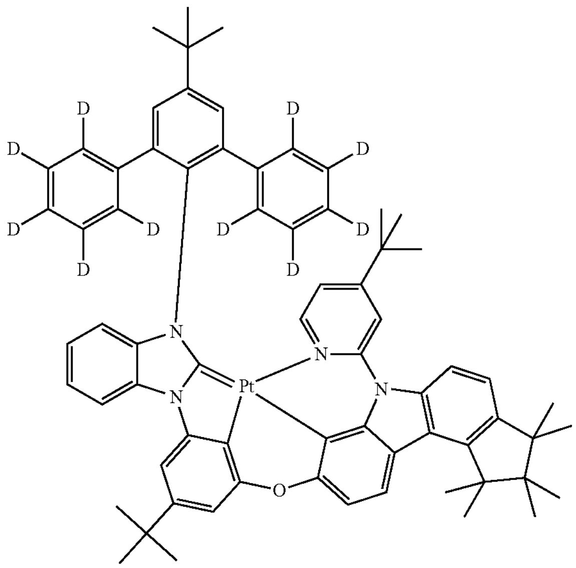
79
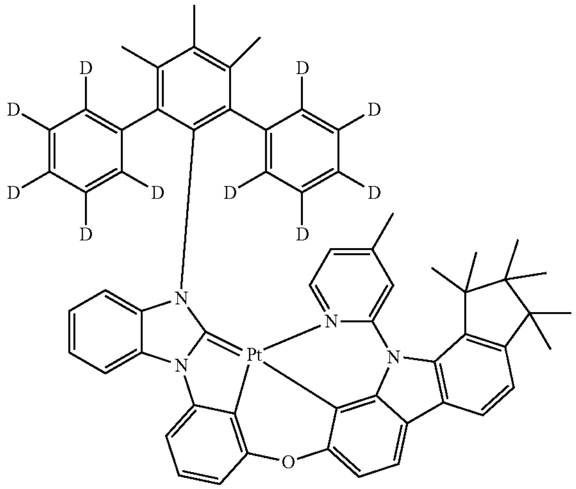
80
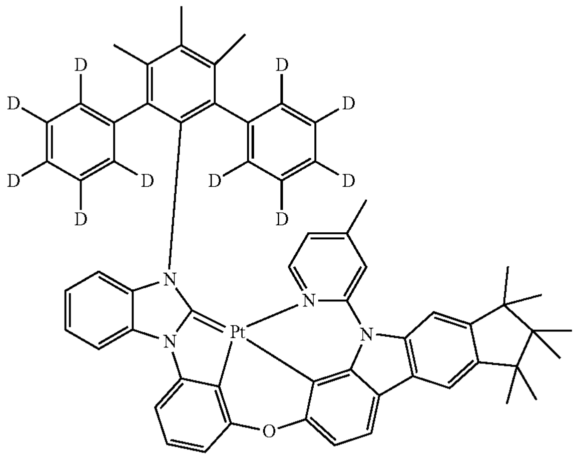

-continued
81
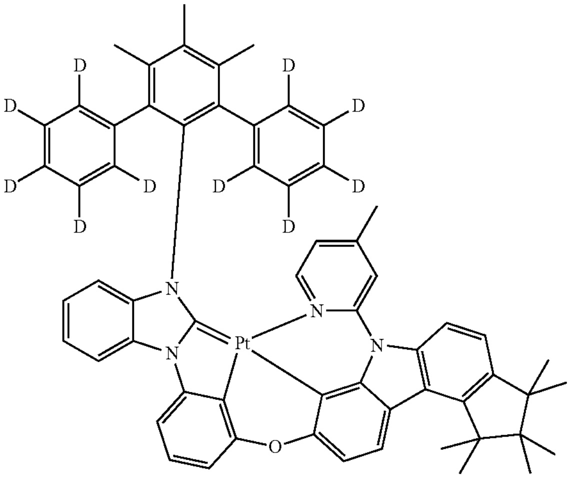
82
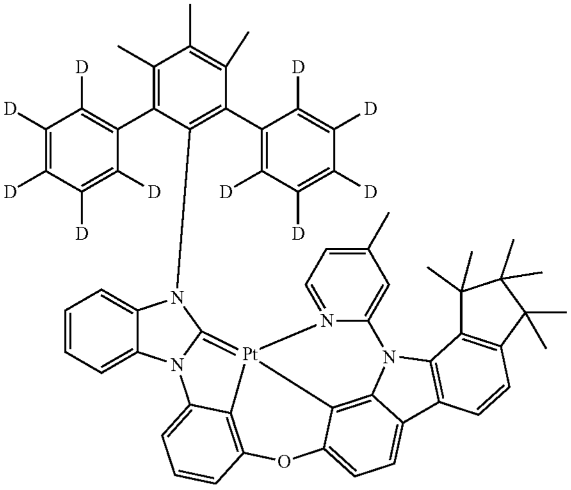
83
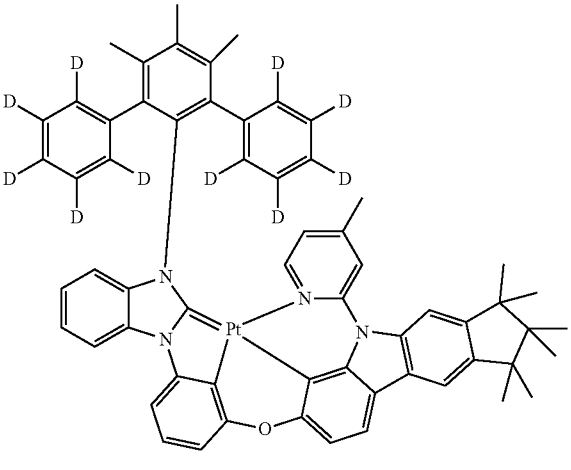
-continued
84
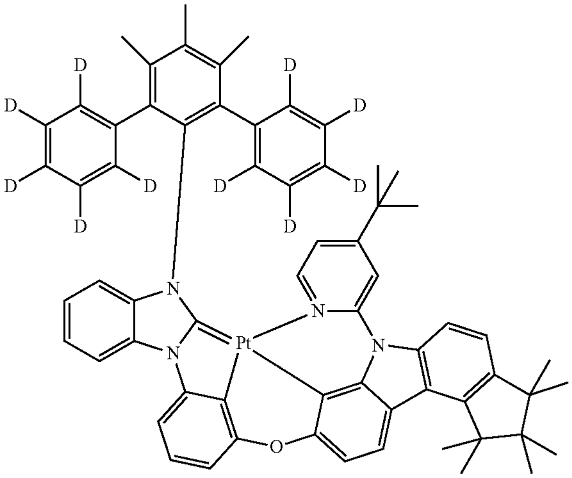
85
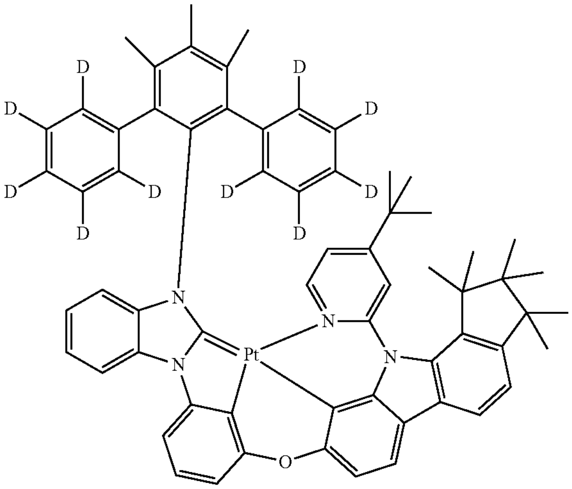
86
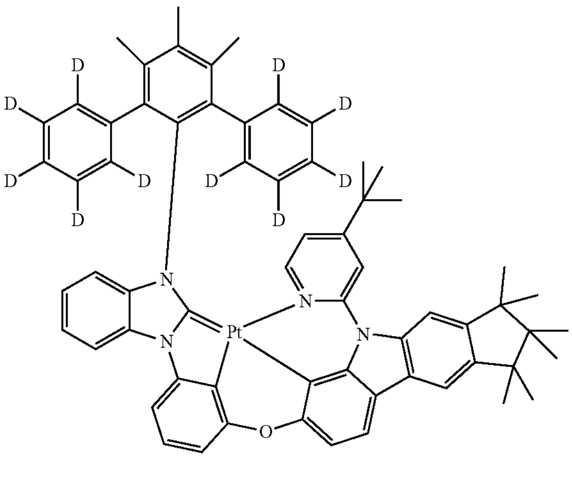

87
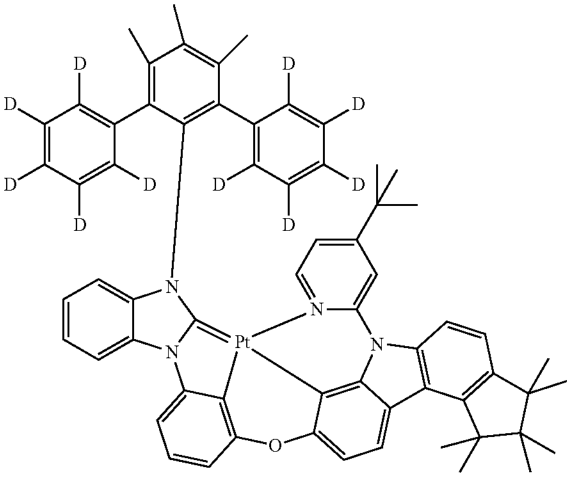
88
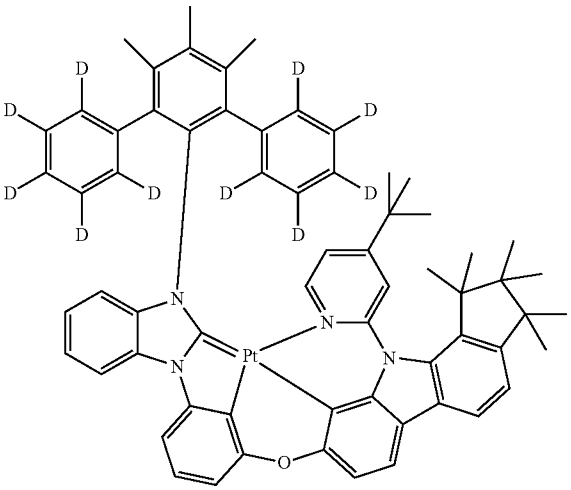
89
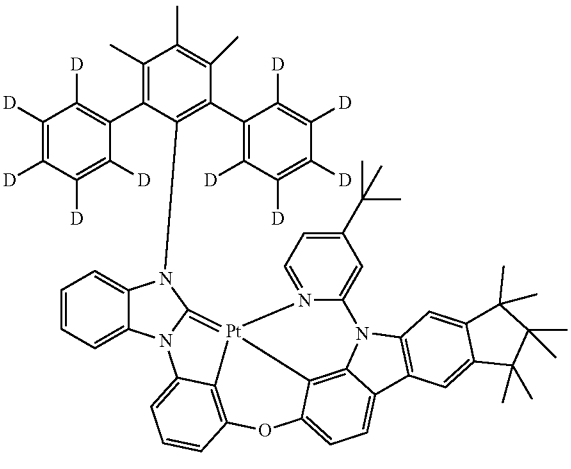
90
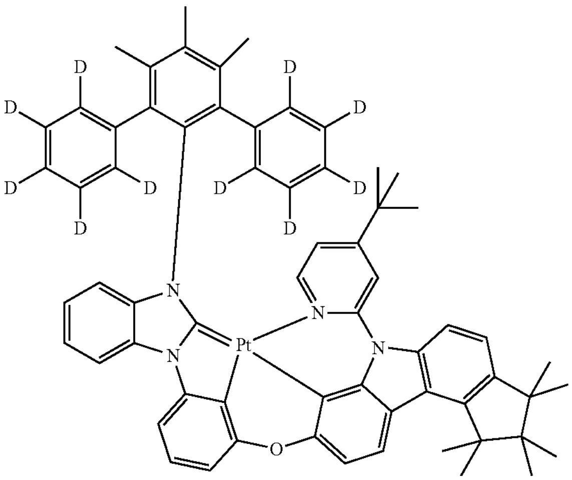
91
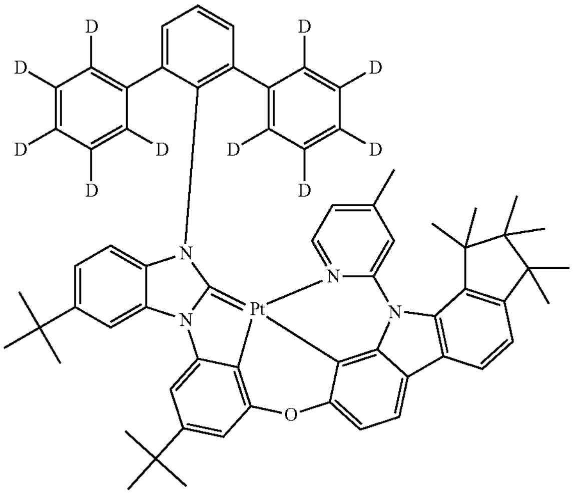
92
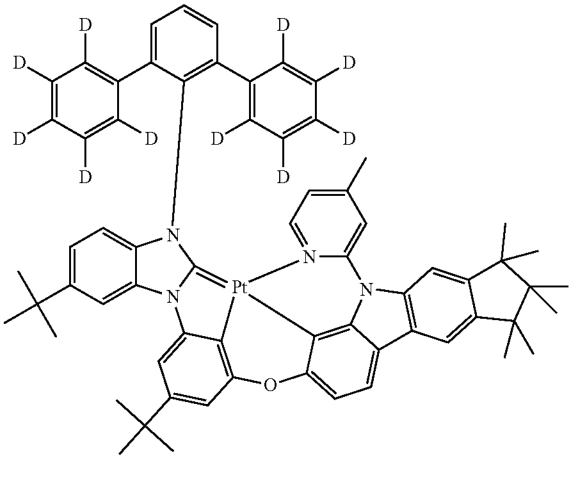

-continued
93
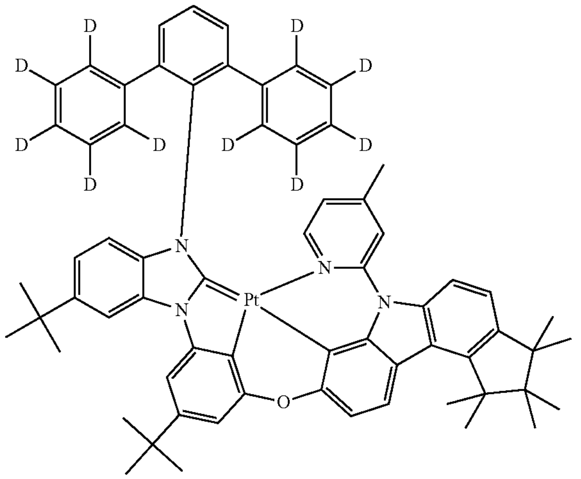
94
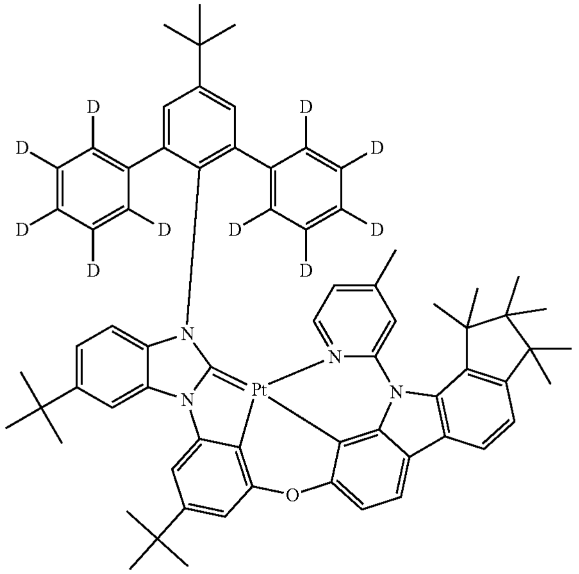
95
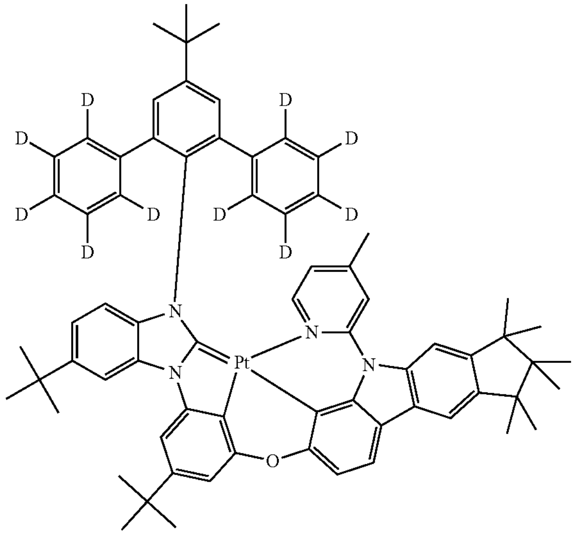
-continued
96
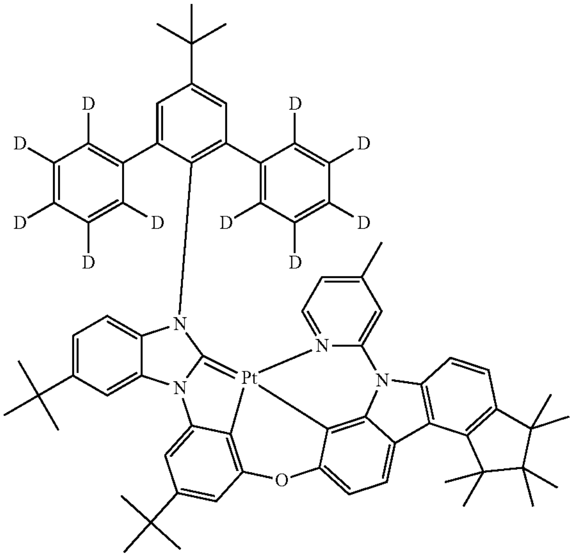
97
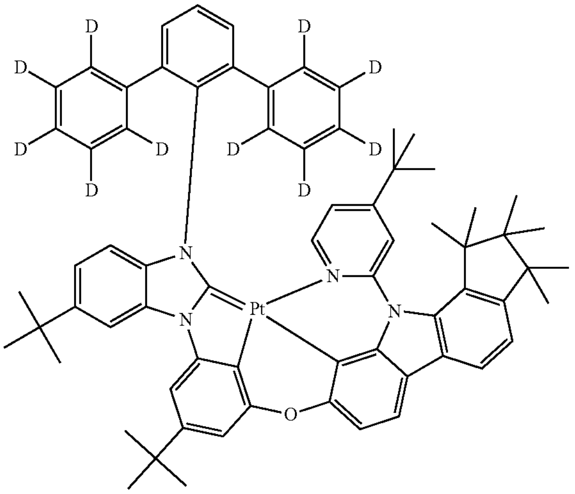
98
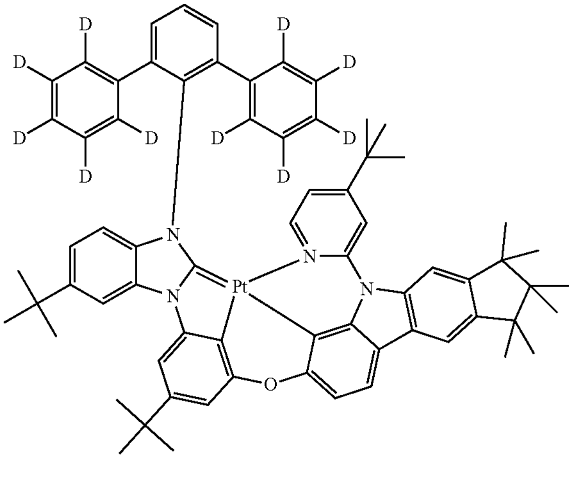

-continued
99
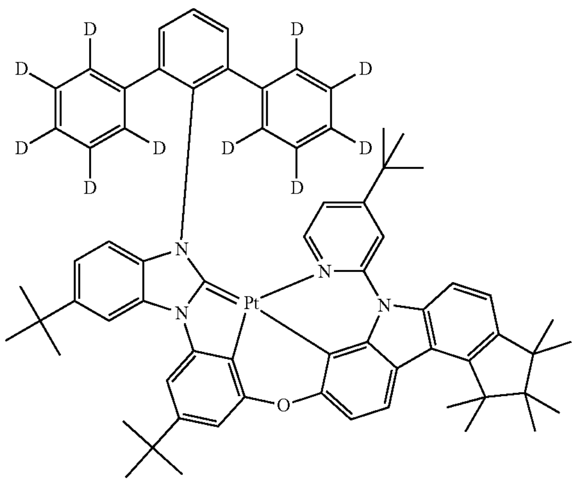
100
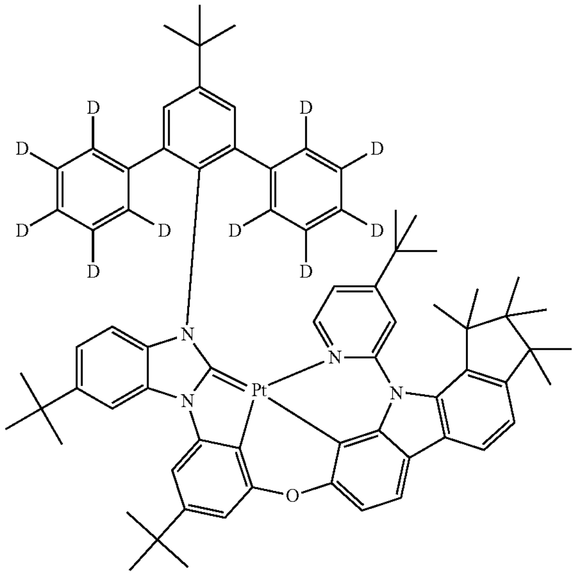
101
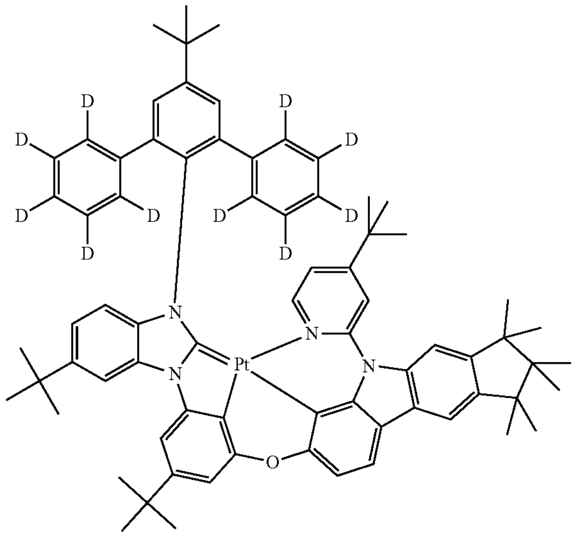
-continued
102
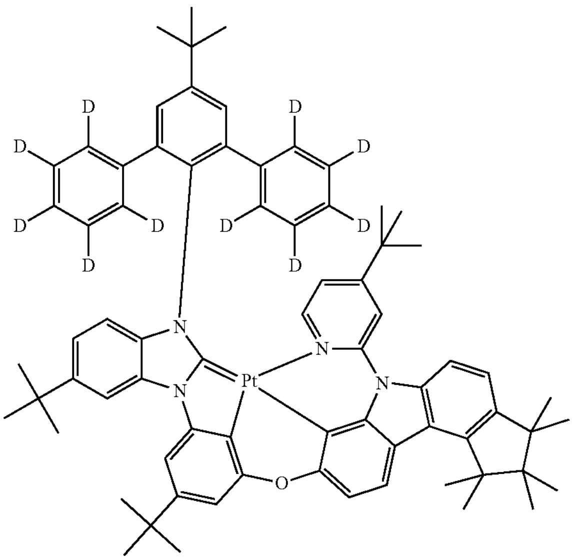
103
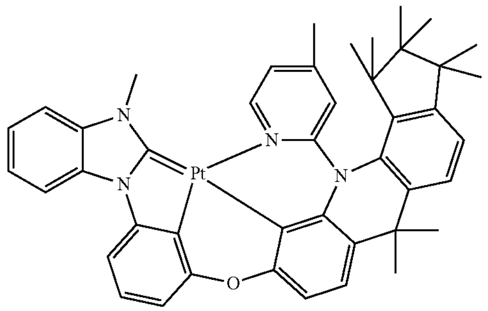
104
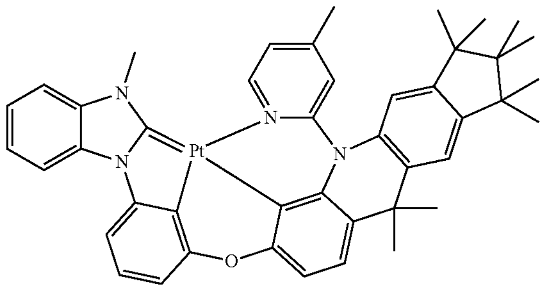
105
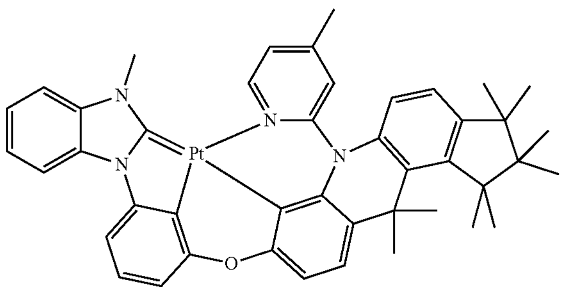

-continued
106
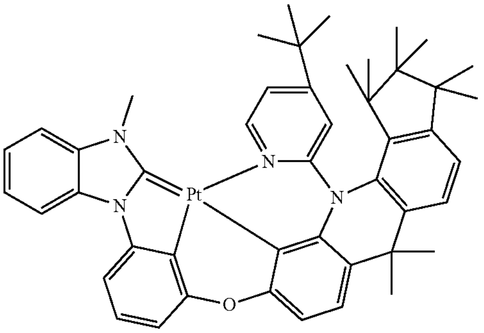
107
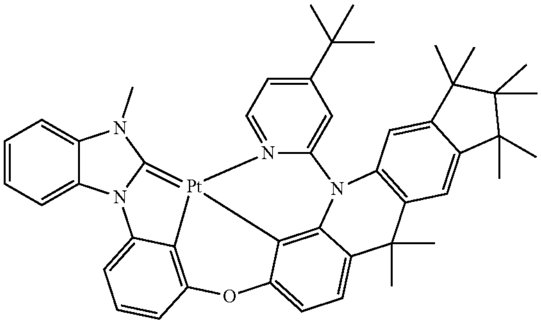
108
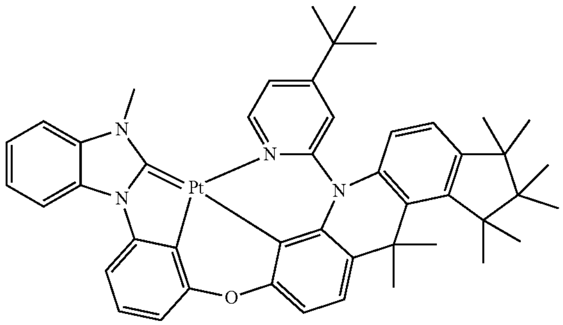
109
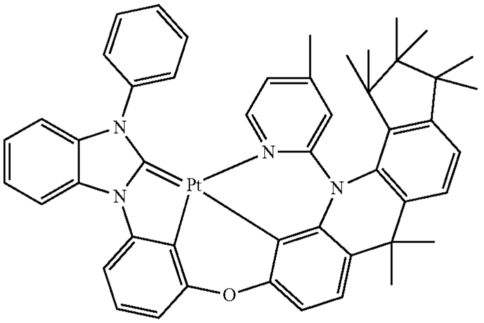
-continued
110
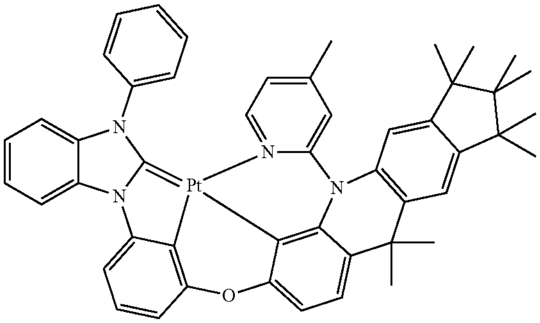
111
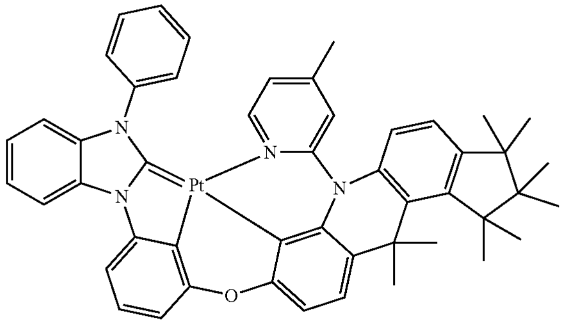
112
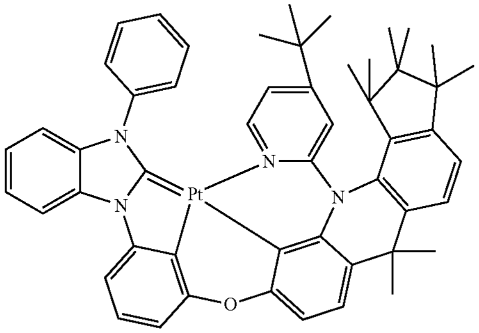
113
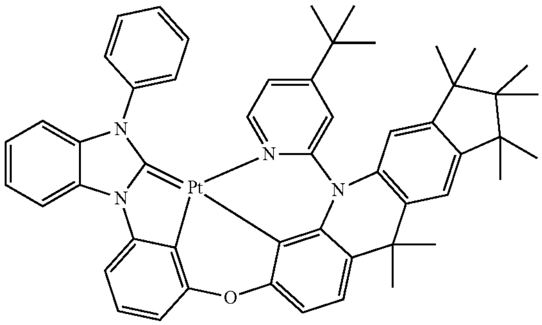

-continued
114
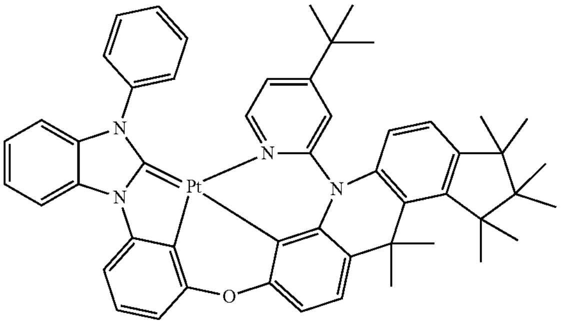
115
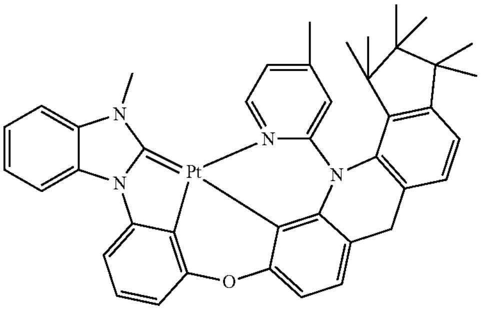
116
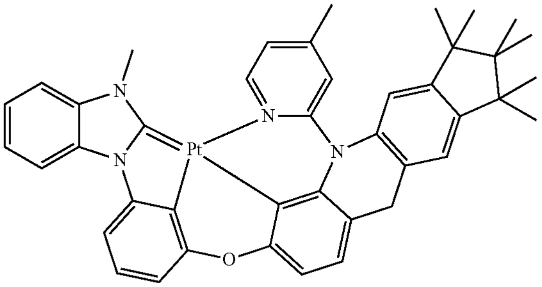
117
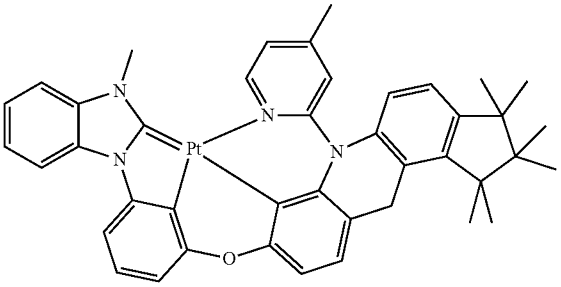
118
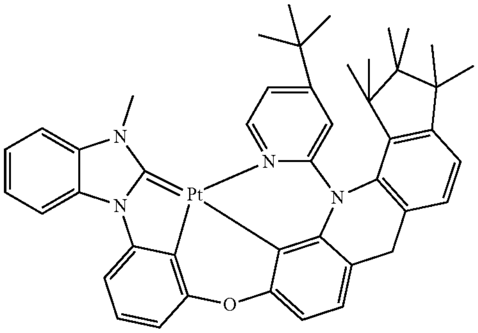
-continued
119
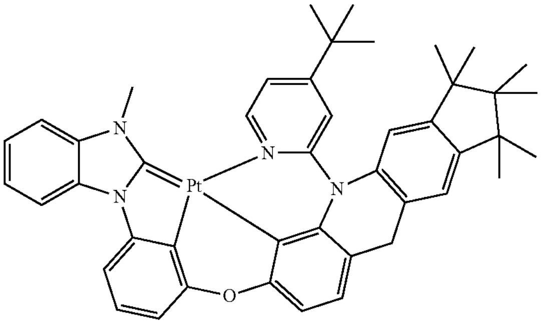
120
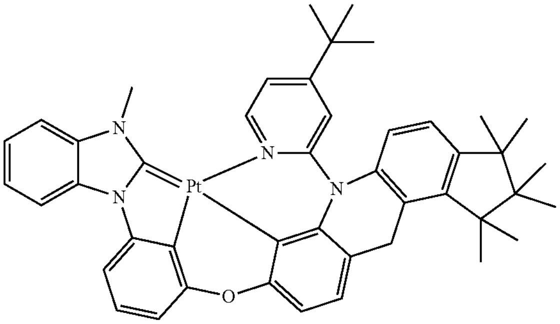
121
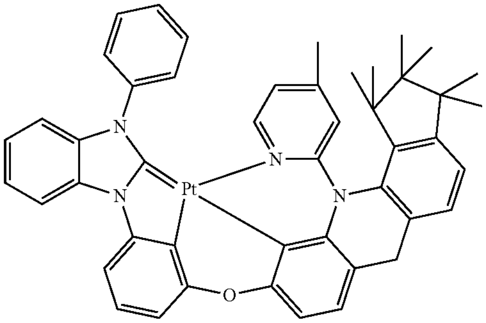
122
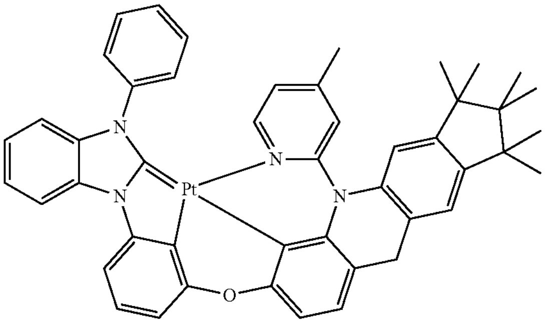

-continued
123
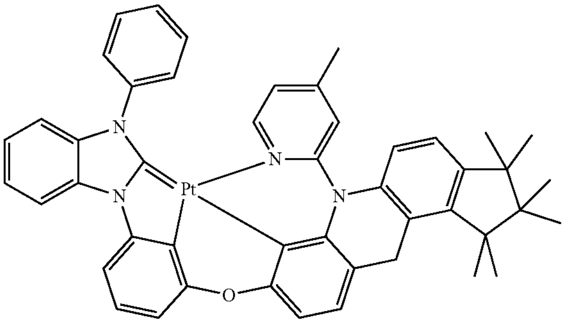
124
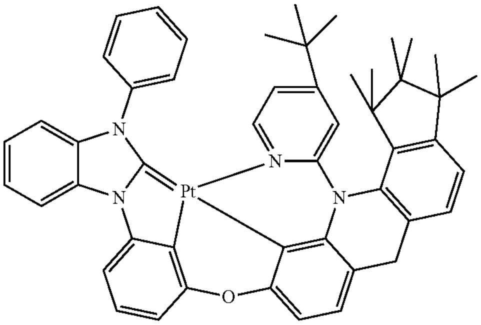
-continued
125
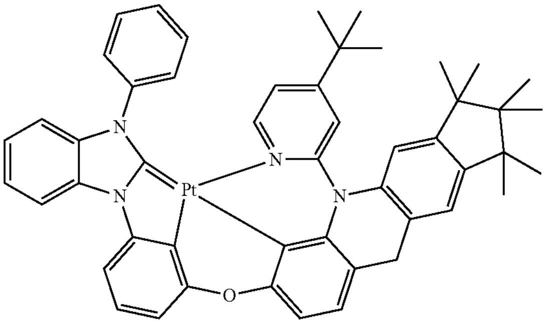
126
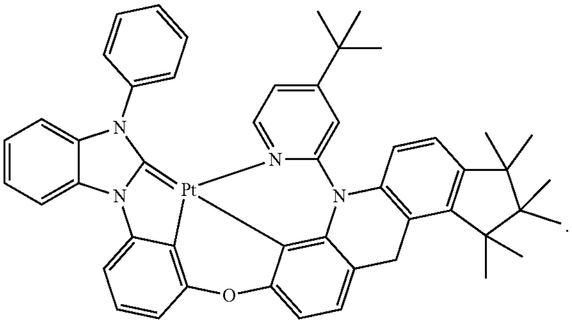
* * * * *